US006103558A

United States Patent [19]

Yamanaka et al.

[11] Patent Number: 6,103,558

[45] Date of Patent: Aug. 15, 2000

[54] PROCESS FOR PRODUCING ELECTROOPTICAL APPARATUS AND PROCESS FOR PRODUCING DRIVING SUBSTRATE FOR ELECTROOPTICAL APPARATUS

[75] Inventors: Hideo Yamanaka; Hisayoshi Yamoto; Yuichi Sato, all of Kanagawa; Hajime Yagi, Tokyo, all of Japan

[73] Assignee: Sony Corporation, Tokyo, Japan

[21] Appl. No.: 09/408,130

[22] Filed: Sep. 29, 1999

[30] Foreign Application Priority Data

Sep. 30, 1998 [JP] Japan .................................. 10-277797

[51] Int. Cl.[7] ..................................................... H01L 21/84

[52] U.S. Cl. ............................. 438/166; 438/30; 349/161

[58] Field of Search .................................. 438/22, 30, 34, 438/39, 41, 47, 164, 166; 117/54, 56, 64, 67, 70, 73, 74, 86; 349/161

[56] References Cited

U.S. PATENT DOCUMENTS 5,162,892 11/1992 Hayashi et al. ........................... 257/65

5,835,179 11/1998 Yamanaka ............................... 349/161

6,025,217 2/2000 Kanaya et al. .......................... 438/166

*Primary Examiner*—Mary Wilczewski

*Assistant Examiner*—Calvin Lee

*Attorney, Agent, or Firm*—Hill & Simpson

[57] ABSTRACT

A single crystal silicon thin film having a high electron/hole mobility is uniformly formed at a relatively low temperature, so that production of an active matrix substrate having a built-in high performance driver and an electrooptical apparatus, such as a thin film semiconductor apparatus for display, becomes possible. A single crystal silicon layer is formed by hetero-epitaxial growth from a molten liquid layer of a low melting point metal having silicon dissolved therein by using a crystalline sapphire film formed on a substrate as a seed, and the single crystal silicon layer is used in a top gate type MOS TFT of an electrooptical apparatus, such as an LCD, in which a display part and a peripheral driving circuit are integrated.

48 Claims, 118 Drawing Sheets

SCHEMATIC LAYOUT OF ACTIVE MATRIX LIQUID CRYSTAL DISPLAY USING THREE-TERMINAL DEVICE (TFT)

SEALING OF LIQUID CRYSTAL BETWEEN FACING SUBSTRATES (COMPLETION OF CELL FABRICATION): DISPLAY PART OF REFLECTION TYPE LIQUID CRYSTAL DISPLAY DEVICE (LCD) HAVING TOP GATE TYPE MOS TFT

Si-In PHASE DIAGRAM

Si-Ga PHASE DIAGRAM

SCHEMATIC LAYOUT OF ACTIVE MATRIX LIQUID CRYSTAL DISPLAY USING THREE-TERMINAL DEVICE (TFT)

EQUIVALENT CIRCUIT OF ACTIVE MATRIX LIQUID CRYSTAL DISPLAY USING THREE-TERMINAL DEVICE (TFT)

FIG.4

SCHEMATIC DIAGRAM OF LIQUID CRSYTAL DISPLAY HAVING PERIPHECAL DRIVING CIRCUIT OF DOT SEQUENTIAL ANALOG SYSTEM

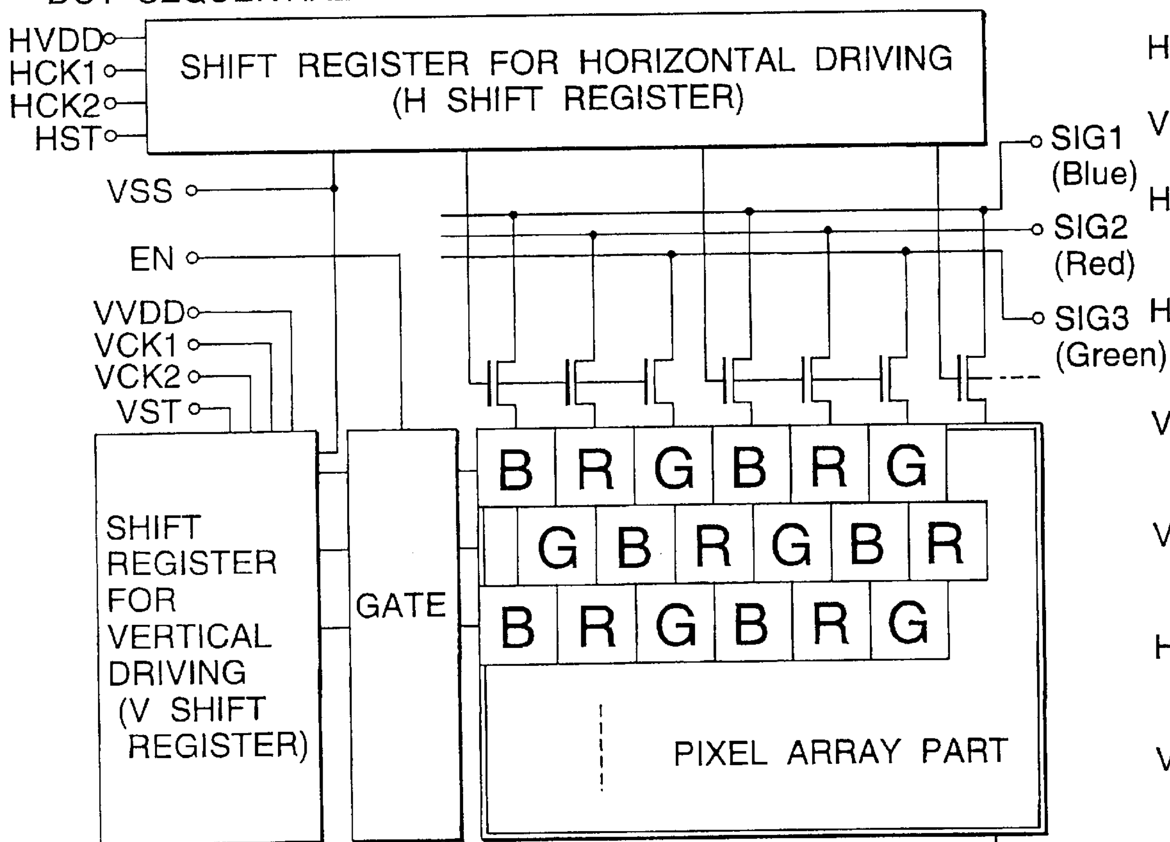

SIG1: VIDEO SIGNAL INPUT TERMINAL VOLTAGE (Blue)
SIG2: VIDEO SIGNAL INPUT TERMINAL VOLTAGE (Red)
SIG3: VIDEO SIGNAL INPUT TERMINAL VOLTAGE (Green)

$V_{COM}$: COMMON ELECTRODE VOLTAGE
HVDD: POWER SOURCE INPUT TERMINAL FOR H DRIVER
VVDD: POWER SOURCE INPUT TERMINAL FOR V DRIVER
HCK1: CLOCK INPUT TERMINAL FOR DRIVING H SHIFT REGISTER
HCK2: CLOCK INPUT TERMINAL FOR DRIVING H SHIFT REGISTER
VCK1: CLOCK INPUT TERMINAL FOR DRIVING V SHIFT REGISTER
VCK2: CLOCK INPUT TERMINAL FOR DRIVING V SHIFT REGISTER
HST: START PULSE INPUT TERMINAL FOR DRIVING H SHIFT REGISTER
VST: START PULSE INPUT TERMINAL FOR DRIVING V SHIFT REGISTER
VSS: GND TERMINAL FOR H AND V DRIVERS

FIRST EMBODIMENT: REFLECTION TYPE LIQUID CRYSTAL DISPLAY DEVICE HAVING TOP GATE TYPE MOS TFT BY HETERO-EPITAXIAL GROWTH OF STEP + CRYSTALLINE SAPPHIRE FILM + INDIUM (OR INDIUM GALLIUM)-SILICON MOLTEN LIQUID + HIGH TEMPERATURE (OR LOW TEMPERATURE)

(DISPLAY PART) (cMOS PERIPHERAL DRIVING CIRCUIT PART)

FORMATION OF STEP ON SUBSTRATE

FIRST EMBODIMENT: REFLECTION TYPE LIQUID CRYSTAL DISPLAY DEVICE HAVING TOP GATE TYPE MOS TFT BY HETERO-EPITAXIAL GROWTH OF STEP + CRYSTALLINE SAPPHIRE FILM + INDIUM (OR INDIUM GALLIUM)-SILICON MOLTEN LIQUID + HIGH TEMPERATURE (OR LOW TEMPERATURE)

(DISPLAY PART) (cMOS PERIPHERAL DRIVING CIRCUIT PART)

FORMATION OF CRYSTALLINE SAPPHIRE FILM

FIRST EMBODIMENT: REFLECTION TYPE LIQUID CRYSTAL DISPLAY DEVICE HAVING TOP GATE TYPE MOS TFT BY HETERO-EPITAXIAL GROWTH OF STEP + CRYSTALLINE SAPPHIRE FILM + INDIUM (OR INDIUM GALLIUM)-SILICON MOLTEN LIQUID + HIGH TEMPERATURE (OR LOW TEMPERATURE)

(DISPLAY PART) (cMOS PERIPHERAL DRIVING CIRCUIT PART)

FIG.5C

COATING OF INDIUM (OR INDIUM GALLIUM)-SILICON MOLTEN LIQUID nMOS LDD-TFT PART pMOS TFT PART nMOS TFT PART

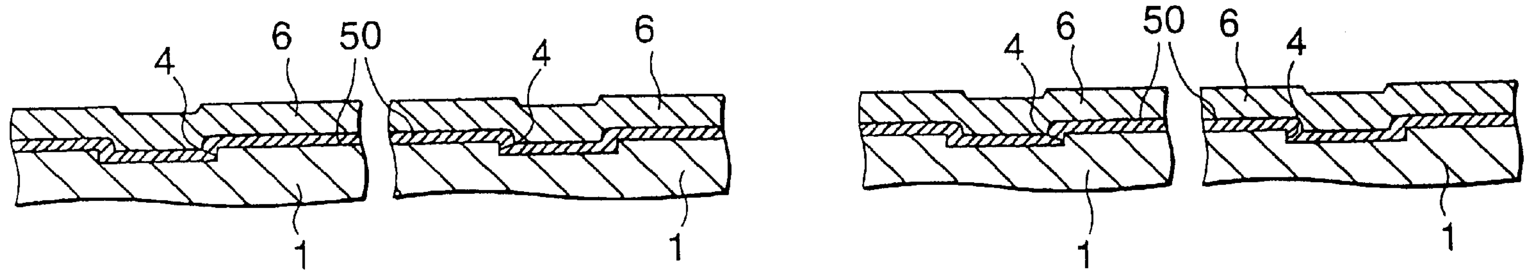

HETERO-EPITAXIAL GROWTH AT HIGH TEMPERATURE (OR LOW TEMPERATURE)

REMOVAL OF INDIUM (OR INDIMU GALLIUM OR GALLIUM) FILM

FORMATION OF PHOTORESIST, ADJUSTMENT OF SPECIFIC RESISTANCE, AND FORMATION OF N-TYPE WELL

FORMATION OF SiN/$SiO_2$ FILM AND FORMATION OF MOLYBDENUM TANTALUM ALLOY FILM

FORMATION OF GATE INSULATING FILM (NITRIDE FILM/OXIDE FILM) AND GATE ELECTRODE (Mo-Ta)

FORMATION OF PHOTORESIST AND FORMATION OF LDD OF nMOS TFT

FORMATION OF SOURCE/DRAIN PART OF nMOS TFT

FORMATION OF SOURCE/DRAIN PART OF pMOS TFT OF PERIPHERAL DRIVING CIRCUIT PART

FORMATION OF ISLAND OF ACTIVE ELEMENT PART AND PASSIVE ELEMENT PART

FORMATION OF PROTECTIVE FILM ($PSG/SiO_2$) AND ACTIVATION TREATMENT

FORMATION OF CONTACT HOLES IN SOURCE PART OF DISPLAY PART AND SOURCE/DRAIN PART OF PERIPHERAL DRIVING CIRCUIT PART, AND FORMATION OF SOURCE ELECTRODE OF DISPLAY PART AND SOURCE/DRAIN ELECTRODE OF PERIPHERAL DRIVING CIRCUIT PART

FORMATION OF SiN/PSG FILM

FORMATION OF CONTACT HOLE IN DRAIN PART OF DISPLAY PART, AND FORMATION OF PHOTOSENSITIVE RESIN FILM

SEALING OF LIQUID CRYSTAL BETWEEN FACING SUBSTRATES (COMPLETION OF CELL FABRICATION) : DISPLAY PART OF REFLECTION TYPE LIQUID CRYSTAL DISPLAY DEVICE (LCD) HAVING TOP GATE TYPE MOS TFT

CRYSTAL GROWTH ON AMORPHOUS SUBSTRATE

VARIOUS RELIEF AND CRYSTAL GROWTH AZIMUTH

SECOND EMBODIMENT:
DISPLAY PART OF TRANSMISSION TYPE
LIQUID CRYSTAL DISPLAY DEVICE HAVING
TOP GATE TYPE MOS TFT

FORMATION OF CONTACT HOLE IN DRAIN PART

FORMATION OF TRANSPARENT FLATTENING FILM,
AND FORMATION OF CONTACT HOLE IN DRAIN PART

FORMATION OF TRANSPARENT ELECTRODE
(FOR EXAMPLE, ITO ELECTRODE)

DISPLAY PART OF TRANSMISSION TYPE LIQUID CRYSTAL DISPLAY DEVICE HAVING TOP GATE TYPE MOS TFT

DISPLAY PART OF LIQUID CRYSTAL DISPLAY DEVICE HAVING COLOR FILTER LAYER AND BLACK MATRIX LAYER

FORMATION OF CONTACT HOLE IN SOURCE/DRAIN PART, FORMATION OF ELECTRODE, AND FORMATION OF SiN/PSG FILM

FORMATION OF COLOR FILTER LAYER

DISPLAY PART OF LIQUID CRYSTAL DISPLAY DEVICE HAVING COLOR FILTER LAYER AND BLACK MATRIX LAYER

FORMATION OF CONTACT HOLE IN DRAIN PART, AND FORMATION OF BLACK MATRIX LAYER

FORMATION OF FLATTENING FILM, AND FORMATION OF PIXEL ELECTRODE

FIFTH EMBODIMENT: COMBINATION OF TFT'S OF VARIOUS PARTS (DISPLAY PART (REFLECTION TYPE)) — TOP GATE TYPE (PERIPHERAL DRIVING CIRCUIT PART) — TOP GATE TYPE

FIFTH EMBODIMENT: COMBINATION OF TFT'S OF VARIOUS PARTS (DISPLAY PART (REFLECTION TYPE))

DUAL GATE TYPE (PERIPHERAL DRIVING CIRCUIT PART)

TOP GATE TYPE

〈DISPLAY PART〉
REFLECTION TYPE LIQUID CRYSTAL DISPLAY DEVICE HAVING BOTTOM GATE TYPE MOS TFT OF HETERO-EPITAXIAL GROWTH OF STEP + CRYSTALLINE SAPPHIRE FILM + INDIUM (OR INDIUM GALLIUM)-SILICON MOLTEN LIQUID + HIGH TEMPERATURE(OR LOW TEMPERATURE)

FIG.18A

FORMATION OF GATE ELECTRODE MATERIAL FILM (Mo-Ta) ON SUBSTRATE

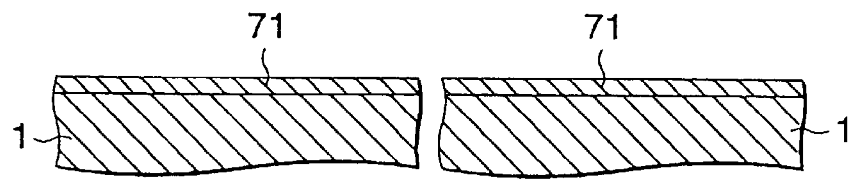

FIG.18B

TAPER ETCHING OF GATE ELECTRODE MATERIAL FILM(FORMATION OF GATE ELECTRODE)

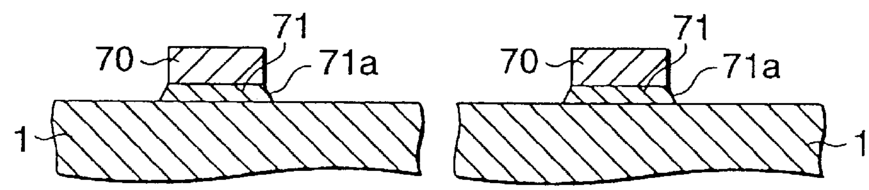

FIG.18C

FORMATION OF GATE INSULATING FILM ($SiO_2$/SiN FILM)

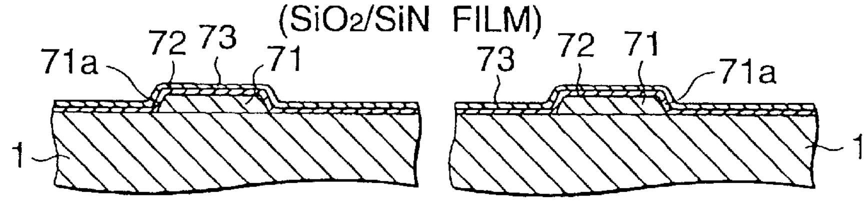

<DISPLAY PART>
REFLECTION TYPE LIQUID CRYSTAL DISPLAY DEVICE HAVING BOTTOM GATE TYPE MOS TFT OF HETERO-EPITAXIAL GROWTH OF STEP + CRYSTALLINE SAPPHIRE FILM + INDIUM (OR INDIUM GALLIUM)-SILICON MOLTEN LIQUID + HIGH TEMPERATURE(OR LOW TEMPERATURE)

FORMATION OF STEP ON SUBSTRATE

FORMATION OF CRYSTALLINE SAPPHIRE FILM

COATING OF INDIUM
(OR INDIUM GALLIUM)-SILICON MOLTEN LIQUID

HETERO-EPITAXIAL GROWTH AT HIGH
TEMPERATURE(OR LOW TEMPERATURE)

FORMATION OF SOURCE/DRAIN PART OF nMOS TFT

FORMATION OF RESIST

FORMATION OF ISLAND OF ACTIVE ELEMENT PART AND PASSIVE ELEMENT PART

FORMATION OF PROTECTIVE FILM (PSG/$SiO_2$) AND ACTIVATION TREATMENT

FORMATION OF CONTACT HOLE IN SOURCE PART, AND FORMATION OF SOURCE ELECTRODE

FORMATION OF PROTECTIVE FILM (SiN/PSG), AND FORMATION OF CONTACT HOLE IN DRAIN PART

FORMATION OF PHOTOSENSITIVE RESIN FILM

ROUGHENING OF PHOTOSENSITIVE RESIN FILM, FORMATION OF CONTACT HOLE IN DRAIN PART, AND FORMATION OF REFLECTION FILM(FOR EXAMPLE, ALUMINUM FILM)

BOTTOM GATE TYPE MOS TFT HAVING GATE INSULATING FILM BY ANODIC OXIDATION
(DISPLAY PART)

FORMATION OF GATE INSULATING FILM BY ANODIC OXIDATION

FORMATION OF SINGLE CRYSTAL SILICON FILM

ROUGHENING OF PHOTOSENSITIVE RESIN FILM, FORMATION OF CONTACT HOLE IN DRAIN PART, AND FORMATION OF REFLECTION FILM (FOR EXAMPLE, ALUMINUM FILM)

REFLECTION TYPE LIQUID CRYSTAL DISPLAY DEVICE HAVING DUAL GATE TYPE MOS TFT BY HETERO-EPITAXIAL GROWTH OF STEP + CRYSTALLINE SAPPHIRE FILM + INDIUM (OR INDIUM GALLIUM)-SILICON MOLTEN LIQUID + HIGH TEMPERATURE(OR LOW TEMPERATURE)

(DISPLAY PART)

FIG.23A

FORMATION OF TOP GATE INSULATING FILM AND TOP GATE ELECTRODE MATERIAL FILM

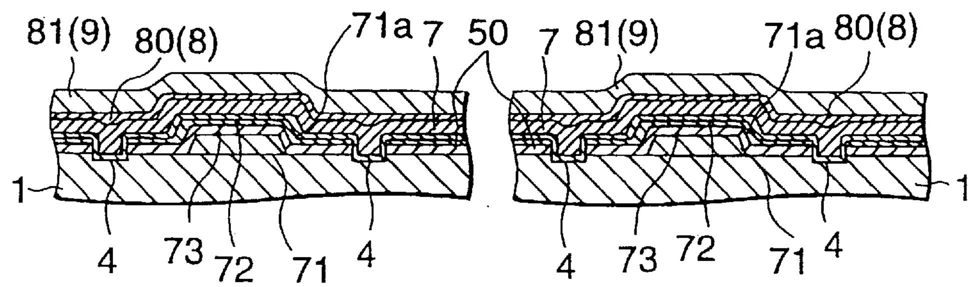

FIG.23B

PATTERNING OF TOP GATE INSULATING FILM AND TOP GATE ELECTRODE

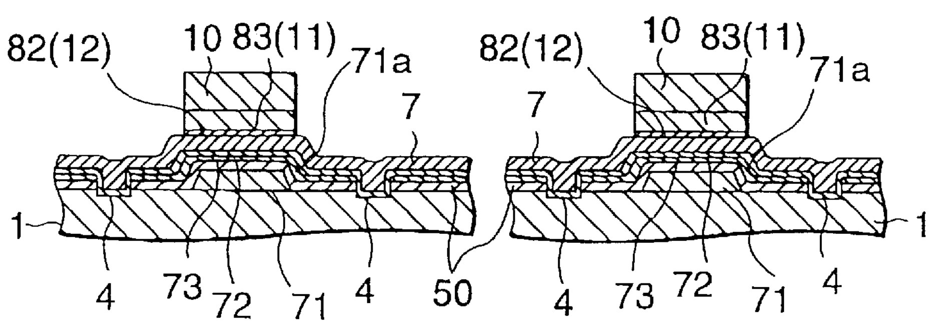

REFLECTION TYPE LIQUID CRYSTAL DISPLAY DEVICE HAVING DUAL GATE TYPE MOS TFT BY HETERO-EPITAXIAL GROWTH OF STEP + CRYSTALLINE SAPPHIRE FILM + INDIUM (OR INDIUM GALLIUM)-SILICON MOLTEN LIQUID + HIGH TEMPERATURE(OR LOW TEMPERATURE)

(DISPLAY PART)

FORMATION OF RESIST

FORMATION OF ISLAND OF ACTIVE ELEMENT PART AND PASSIVE ELEMENT PART

FORMATION OF PROTECTIVE FILM (PSG/$SiO_2$), AND ACTIVATION TREATMENT

FORMATION OF CONTACT HOLE IN SOURCE PART, AND FORMATION OF SOURCE ELECTRODE

FORMATION OF INSULATING FILM (SiN/PSG), AND FORMATION OF CONTACT HOLE IN DRAIN PART

FORMATION OF PHOTOSENSITIVE RESIN FILM

SIXTH EMBODIMENT: TOP GATE TYPE MOS TFT HAVING GATE ELECTRODE MATERIAL COMPRISING ALUMINUM BY HETERO-EPITAXIAL GROWTH OF STEP + CRYSTALLINE SAPPHIRE FILM + INDIUM (OR INDIUM GALLIUM)-SILICON MOLTEN LIQUID + HIGH TEMPERATURE (OR LOW TEMPERATURE)

(DISPLAY PART) (cMOS PERIPHERAL DRIVING CIRCUIT PART)

FORMATION OF PHOTORESIST, AND FORMATION OF N-TYPE WELL

SIXTH EMBODIMENT: TOP GATE TYPE MOS TFT HAVING GATE ELECTRODE MATERIAL COMPRISING ALUMINUM BY HETERO-EPITAXIAL GROWTH OF STEP + CRYSTALLINE SAPPHIRE FILM + INDIUM (OR INDIUM GALLIUM)-SILICON MOLTEN LIQUID + HIGH TEMPERATURE (OR LOW TEMPERATURE)

(DISPLAY PART) (cMOS PERIPHERAL DRIVING CIRCUIT PART)

FORMATION OF LDD OF nMOS TFT

ACTIVATION TREATMENT, AND FORMATION OF TOP GATE INSULATING FILM ($SiO_2$/SiN) AND GATE ELECTRODE MATERIAL LAYER (FOR EXAMPLE, ALUMINUM LAYER)

FORMATION OF GATE ELECTRODE OF DISPLAY PART AND PERIPHERAL DRIVING CIRCUIT PART, AND FORMATION OF PROTECTIVE FILM ($SiO_2$/PSG)

FORMATION OF CONTACT HOLES IN SOURCE/DRAIN PART OF DISPLAY PART, SOURCE PART AND PERIPHERAL DRIVING CIRCUIT PART, AND FORMATION OF SOURCE ELECTRODE OF DISPLAY PART AND SOURCE/DRAIN ELECTRODE OF PERIPHERAL DRIVING CIRCUIT PART

TOP GATE TYPE MOS TFT AND DUAL GATE TYPE MOS TFT HAVING GATE ELECTRODE MATERIAL COMPRISING ALUMINUM BY HETERO-EPITAXIAL GROWTH OF STEP + CRYSTALLINE SAPPHIRE FILM + INDIUM (OR INDIUM GALLIUM)-SILICON MOLTEN LIQUID + HIGH TEMPERATURE (OR LOW TEMPERATURE)

(DISPLAY PART)

(cMOS PHERIPHERAL DRIVING CIRCUIT PART)

DUAL GATE TYPE nMOS LDD-TFT PART

TOP GATE TYPE pMOS TFT PART

TOP GATE TYPE nMOS TFT PART

FIG.29H

FORMATION OF BOTTOM GATE ELECTRODE AND GATE INSULATING FILM, AND HETERO-EPITAXIAL GROWTH AT HIGH TEMPERATURE (OR LOW TEMPERATURE)

FORMATION OF N-TYPE WELL

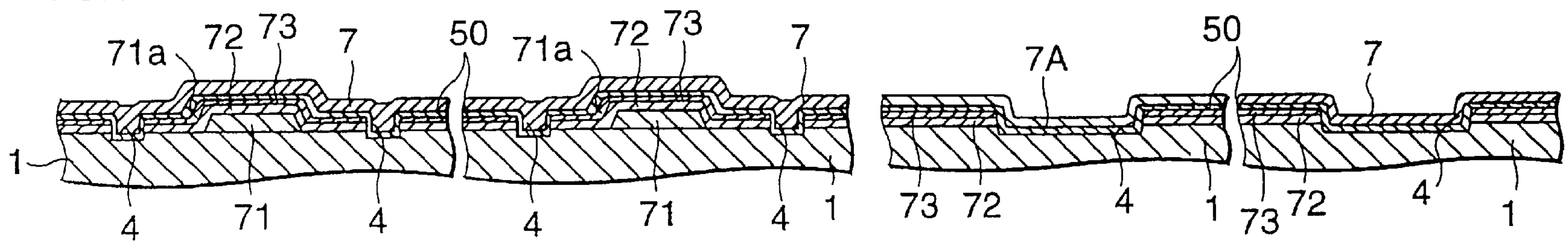

TOP GATE TYPE MOS TFT AND DUAL GATE TYPE MOS TFT HAVING GATE ELECTRODE MATERIAL COMPRISING ALUMINUM BY HETERO-EPITAXIAL GROWTH OF STEP + CRYSTALLINE SAPPHIRE FILM + INDIUM (OR INDIUM GALLIUM)-SILICON MOLTEN LIQUID + HIGH TEMPERATURE (OR LOW TEMPERATURE)

(DISPLAY PART)

(cMOS PHERIPHERAL DRIVING CIRCUIT PART)

DUAL GATE TYPE nMOS LDD-TFT PART

TOP GATE TYPE pMOS TFT PART

TOP GATE TYPE nMOS TFT PART

FIG.29I

FORMATION OF BOTTOM GATE ELECTRODE AND GATE INSULATING FILM, AND HETERO-EPITAXIAL GROWTH AT HIGH TEMPERATURE (OR LOW TEMPERATURE)

FORMATION OF LDD LAYER OF nMOS TFT FOR DISPLAY

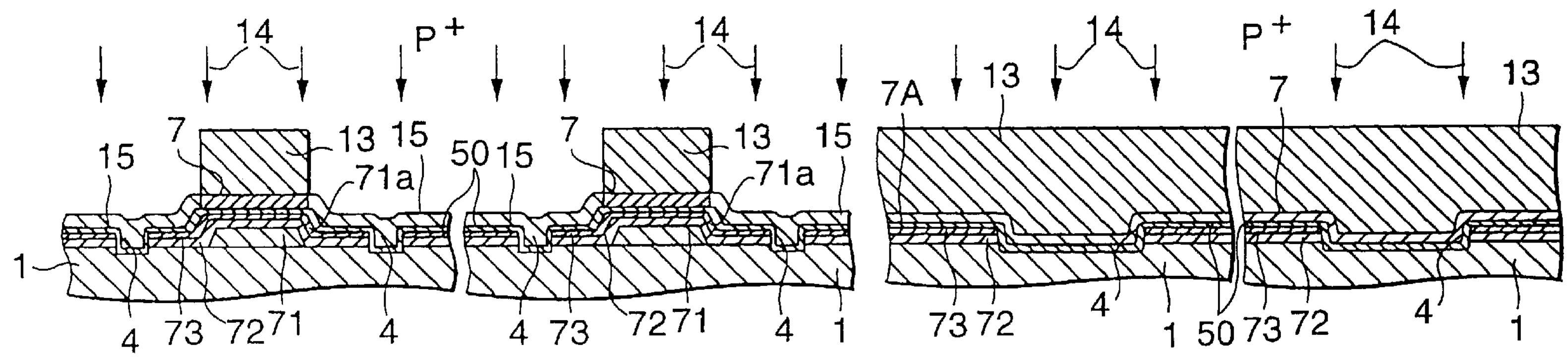

FORMATION OF SOURCE/DRAIN PART OF nMOS TFT

FORMATION OF SOURCE/DRAIN PART O pMOS TFT OF PERIPHERAL DRIVING CIRCUIT PART

FORMATION OF PROTECTIVE FILM (SiN/PSG), FORMATION OF CONTACT HOLES IN SOURCE PART OF DISPLAY PART AND SOURCE/DRAIN PART OF PERIPHERAL DRIVING CIRCUIT PART AND FORMATION OF SOURCE ELECTRODE OF DISPLAY PART AND SOURCE/DRAIN ELECTRODE OF PERIPHERAL DRIVING CIRCUIT PART

FORMATION OF STEP ON GLASS SUBSTRATE

FORMATION OF STEP ON SiN FILM OR CRYSTALLINE SAPPHIRE FILM

SEVENTH EMBODIMENT:
VARIOUS GATE TYPE TFT'S OUTSIDE STEP

TOP GATE TYPE MOS TFT OUTSIDE STEP PROVIDED ON OR INSIDE CRYSTALLINE SAPPHIRE FILM ON GLASS SUBSTRATE

SEVENTH EMBODIMENT:
VARIOUS GATE TYPE TFT'S OUTSIDE STEP

TOP GATE TYPE MOS TFT OUTSIDE STEP PROVIDED ON OR INSIDE CRYSTALLINE SAPPHIRE FILM ON GLASS SUBSTRATE

BOTTOM GATE TYPE MOS TFT OUTSIDE STEP PROVIDED ON OR INSIDE CRYSTALLINE SAPPHIRE FILM ON GLASS SUBSTRATE

DUAL GATE TYPE MOS TFT OUTSIDE
STEP PROVIDED ON OR INSIDE CRYSTALLINE
SAPPHIRE FILM ON GLASS SUBSTRATE

FIG.37
EIGHTH EMBODIMENT:
DOUBLE LDD DOUBLE GATE TYPE MOS TFT
EXAMPLE OF TOP GATE TYPE nMOS TFT
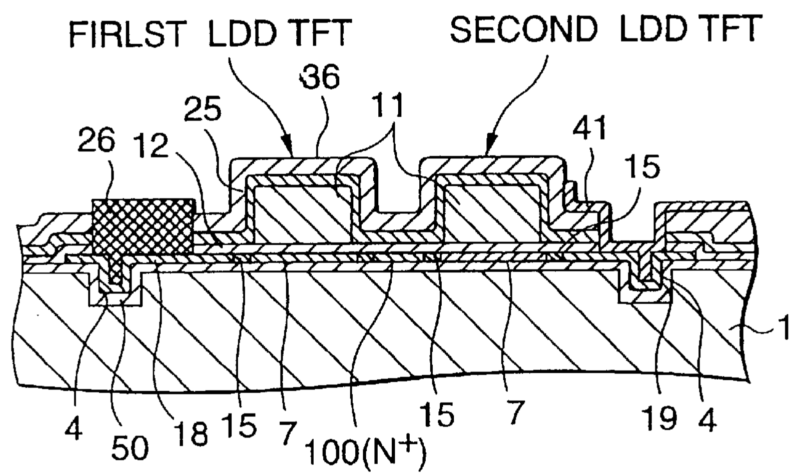
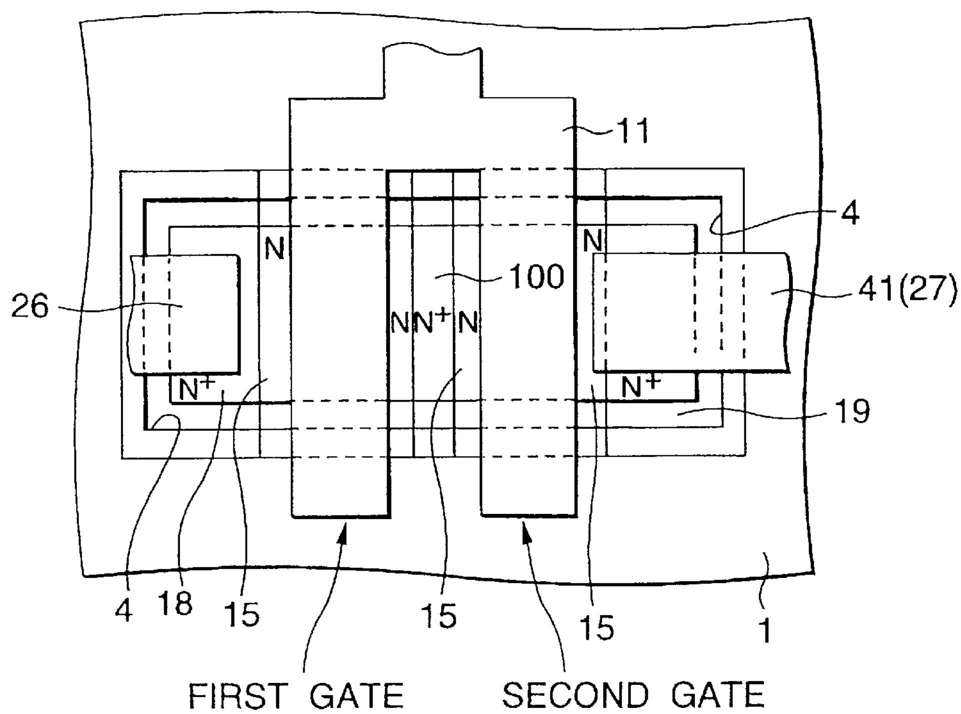

DOUBLE GATE TYPE MOS TFT

EXAMPLE OF BOTTOM GATE TYPE nMOS TFT

EXAMPLE OF DUAL GATE TYPE nMOS TFT

NINTH EMBODIMENT: APPLICATION OF DUAL GATE TYPE nMOS TFT

USED AS BOTTOM GATE TYPE nMOS TFT

USED AS TOP GATE TYPE nMOS TFT

TENTH EMBODIMENT: REFLECTION TYPE LIQUID DISPLAY DEVICE HAVING TOP GATE TYPE MOS TFT BY HETERO-EPITAXIAL GROWTH OF CRYSTALLINE SAPPHIRE FILM + INDIUM (OR INDIUM GALLIUM)-SILICON MOLTEN LIQUID + HIGH TEMPERATURE (OR LOW TEMPERATURE)

(DISPLAY PART) (cMOS PERIPHERAL DRIVING CIRCUIT PART)

TENTH EMBODIMENT: REFLECTION TYPE LIQUID DISPLAY DEVICE HAVING TOP GATE TYPE MOS TFT BY HETERO-EPITAXIAL GROWTH OF CRYSTALLINE SAPPHIRE FILM + INDIUM (OR INDIUM GALLIUM)-SILICON MOLTEN LIQUID + HIGH TEMPERATURE (OR LOW TEMPERATURE)

(DISPLAY PART) (cMOS PERIPHERAL DRIVING CIRCUIT PART)

HETERO-EPITAXIAL GROWTH AT HIGH TEMPERATURE (OR LOW TEMPERATURE)

FORMATION OF SiN/$SiO_2$ FILM,
AND FORMATION OF MOLYBDENUM TANTALUM ALLOY FILM

FORMATION OF GATE INSULATING FILM
(NITRIDE FILM/OXIDE FILM) AND GATE ELECTRODE (Mo-Ta)

FORMATION OF SOURCE/DRAIN PART OF pMOS TFT OF PERIPHERAL DRIVING CIRCUIT PART

FORMATION OF CONTACT HOLES IN SOUREC PAR OF DISPLAY PART AND SOURCE/DRAIN PART OF PERIPHERAL DRIVING CIRCUIT PART, FORMATION OF SOURCE ELECTRODE OF DISPLAY PART AND SOURCE/DRAIN ELECTRODE OF PERIPHERAL DRIVING CIRCUIT PART

FORMATION OF SiN/PSG FILM

SEALING OF LIQUID CRYSTAL BETWEEN FACING SUBSTRATES (COMPLETION OF CELL FABRICATION): DISPLAY PART OF REFLECTION TYPE LIQUID CRYSTAL DISPLAY DEVICE (LCD) HAVING TOP GATE TYPE MOS TFT

ELEVENTH EMBODIMENT: DISPLAY PART OF TRANSMISSION TYPE LIQUID CRYSTAL DISPLAY DEVICE HAVING TOP GATE TYPE MOS TFT

FORMATION OF CONTACT HOLE IN DRAIN PART

FORMATION OF TRANSPARENT FLATTENING FILM, AND FORMATION OF CONTACT HOLE IN DRAIN PART

FORMATION OF TRANSPARENT ELECTRODE (FOR EXAMPLE, ITO ELECTRODE)

DISPLAY PART OF TRANSMISSION TYPE LIQUID CRYSTAL DISPLAY DEVICE HAVING TOP GATE TYPE MOS TFT

DISPLAY PART OF LIQUID CRYSTAL DISPLAY DEVICE HAVING COLOR FILTER LAYER AND BLACK MATRIX LAYER

FORMATION OF CONTACT HOLE
IN SOURCE/DRAIN PART, FORMATION OF ELECTRODE,
AND FORMATION OF SiN/PSG FILM

FORMATION OF COLOR FILTER LAYER

DISPLAY PART OF LIQUID CRYSTAL DISPLAY DEVICE HAVING COLOR FILTER LAYER AND BLACK MATRIX LAYER

FORMATION OF CONTACT HOLE IN DRAIN PART, AND FORMATION OF BLACK MATRIX LAYER

FORMATION OF FLATTENING FILM, AND FORMATION OF PIXEL ELECTRODE

TWELFTH EMBODIMENT: COMBINATION OF VARIOUS TFT'S (DISPLAY PART (REFLECTION TYPE)) (PERIPHERAL DRIVING CIRCUIT PART)

DUAL GATE TYPE TOP GATE TYPE

〈DISPLAY PART〉
REFLECTION TYPE LIQUID DISPLAY DEVICE HAVING BOTTOM GATE TYPE MOS TFT BY HETERO-EPITAXIAL GROWTH OF CRYSTALLINE SAPPHIRE FILM + INDIUM (OR INDIUM GALLIUM)-SILICON MOLTEN LIQUID + HIGH TEMPERATURE(OR LOW TEMPERATURE)

FIG.51A

FORMATION OF GATE ELECTRODE MATERIAL FILM (Mo-Ta) ON SUBSTRATE

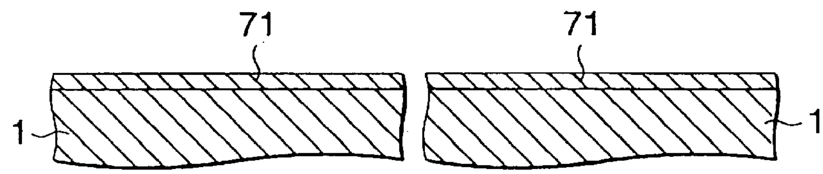

FIG.51B

TAPER ETCHING OF GATE ELECTRODE MATERIAL FILM(FORMATION OF GATE ELECTRODE)

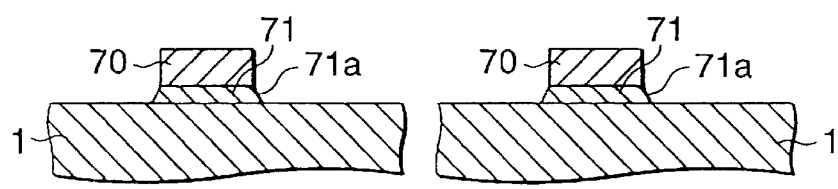

FIG.51C

FORMATION OF GATE INSULATING FILM ($SiO_2$/SiN FILM)

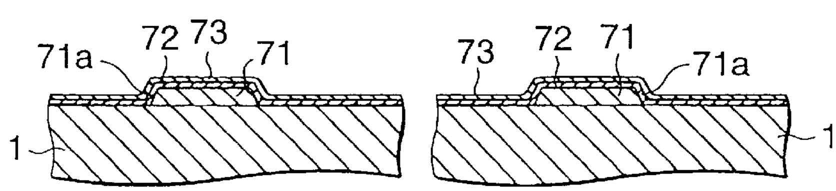

FORMATION OF CRYSTALLINE SAPPHIRE FILM ON SUBSTRATE

HETERO-EPITAXIAL GROWTH OF SINGLE CRYSTAL SILICON

FORMATION OF LDD LAYER OF nMOS TFT FOR DISPLAY

FORMATION OF SOURCE/DRAIN PART OF nMOS TFT

FORMATION OF RESIST

FORMATION OF ISLAND OF ACTIEV ELEMENT PART ANE PASSIVE ELEMENT PART

FORMATION OF PROTECTIVE FILM (PSG/$SiO_2$), AND ACTIVATION TREATMENT

FORMATION OF CONTACT HOLE IN SOURCE PART, AND FORMATION OF SOURCE ELECTRODE

FORMATION OF PROTECTIVE FILM (SiN/PSG), AND FORMATION OF CONTACT HOLE IN DRAIN PART

FORMATION OF PHOTOSENSITIVE RESIN FILM

ROUGHENING OF PHOTOSENSITIVE RESIN FILM, FORMATION OF CONTACT HOLE IN DRAIN PART, AND FORMATION OF REFLECTION FILM (FOR EXAMPLE, ALUMINUM FILM)

BOTTOM GATE TYPE MOS TFT HAVING GATE INSULATING FILM BY ANODIC OXIDATION (DISPLAY PART)

FORMATION OF GATE INSULATING FILM BY ANODIC OXIDATION

HETERO-EPOTAXIAL GROWTH OF SINGLE CRYSTAL SILICON

ROUGHENING OF PHOTOSENSITIVE RESIN FILM, FORMATION OF CONTACT HOLE IN DRAIN PART, AND FORMATION OF REFLECTION FILM (FOR EXAMPLE, ALUMINUM FILM)

REFLECTION TYPE LIQUID DISPLAY DEVICE HAVING DUAL GATE TYPE MOS TFT BY HETERO-EPITAXIAL GROWTH OF CRYSTALLINE SAPPHIRE FILM + INDIUM (OR INDIUM GALLIUM)-SILICON MOLTEN LIQUID + HIGH TEMPERATURE (OR LOW TEMPERATURE)

(DISPLAY PART)

FIG.56D

FORMATION OF TOP GATE INSULATING FILM AND TOP GATE ELECTRODE MATERIAL FILM

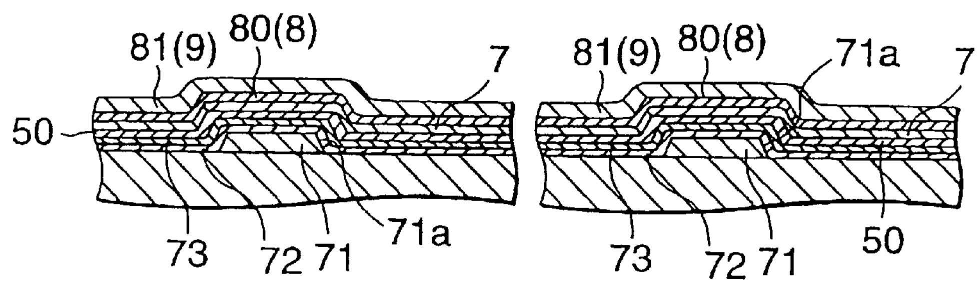

FIG.56E

PATTERNING OF TOP GATE INSULATING FILM AND TOP GATE ELECTRODE

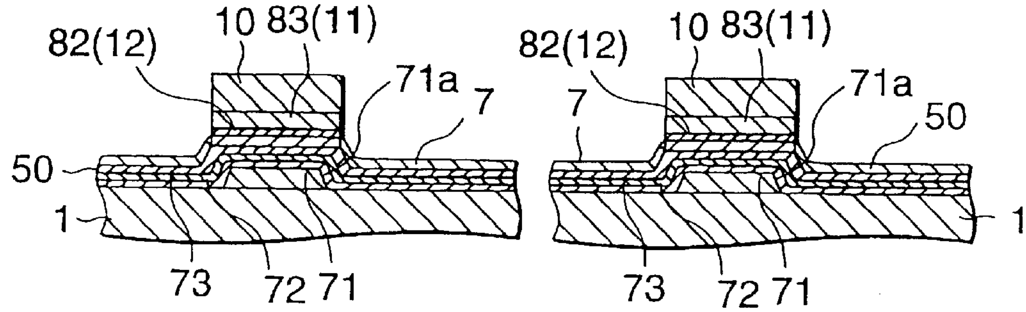

REFLECTION TYPE LIQUID DISPLAY DEVICE HAVING DUAL GATE TYPE MOS TFT BY HETERO-EPITAXIAL GROWTH OF CRYSTALLINE SAPPHIRE FILM + INDIUM (OR INDIUM GALLIUM)-SILICON MOLTEN LIQUID + HIGH TEMPERATURE (OR LOW TEMPERATURE)

(DISPLAY PART)

FORMATION OF LDD LAYER OF nMOS TFT FOR DISPLAY

FORMATION OF SOURCE/DRAIN PART OF nMOS TFT

FORMATION OF RESIST

FORMATION OF ISLAND OF ACTIVE ELEMENT PART AND PASSIVE ELEMENT PART

FORMATION OF PROTECTIVE FILM ($PSG/SiO_2$), AND ACTIVATION TREATMENT

FORMATION OF CONTACT HOLE IN SOURCE PART, AND FORMATION OF SOURCE ELECTRODE

FORMATION OF INSULATING FILM (SiN/PSG), AND FORMATION OF CONTACT HOLE IN DRAIN PART OF DISPLAY PAR

FORMATION OF PHOTOSENSITIVE RESIN FILM

ROUGHENING OF PHOTOSENSITIVE RESIN FILM, FORMATION OF CONTACT HOLE IN DRAIN PART, AND FORMATION OF REFLECTION FILM (FOR EXAMPLE, ALUMINUM FILM)

THIRTEENTH EMBODIMENT: TOP GATE TYPE MOS TFT HAVING GATE ELECTRODE MATERIAL COMPRISING ALUMINUM BY HETERO-EPITAXIAL GROWTH OF CRYSTALLINE SAPPHIRE FILM + INDIUM (OR INDIUM GALLIUM)-SILICON MOLTEN LIQUID + HIGH TEMPERATURE (OR LOW TEMPERATURE)

(DISPLAY PART)

(cMOS PERIPHERAL DRIVING CIRCUIT PART)

FIG.59A

FORMATION OF PHOTORESIST, ADJUSTMENT OF SPECIFIC RESISTANCE, AND FORMATION OF N-TYPE WELL nMOS LDD TFT PART pMOS TFT PART nMOS TFT PART

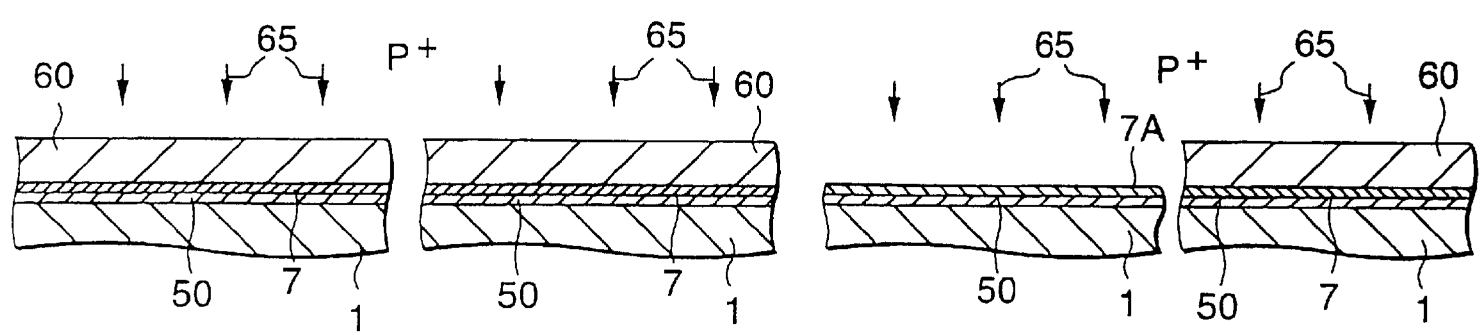

THIRTEENTH EMBODIMENT: TOP GATE TYPE MOS TFT HAVING GATE ELECTRODE MATERIAL COMPRISING ALUMINUM BY HETERO-EPITAXIAL GROWTH OF CRYSTALLINE SAPPHIRE FILM + INDIUM (OR INDIUM GALLIUM)-SILICON MOLTEN LIQUID + HIGH TEMPERATURE (OR LOW TEMPERATURE)

(DISPLAY PART)

(cMOS PERIPHERAL DRIVING CIRCUIT PART)

FORMATION OF LDD OF nMOS TFT

FORMATION OF SOURCE/DRAIN PART OF nMOS TFT

FORMATION OF SOURCE/DRAIN PART OF pMOS TFT OF PERIPHERAL DRIVING CIRCUIT PART

ACTIVATION TREATMENT, AND FORMATION OF TOP GATE INSULATING FILM ($SiO_2$/SiN) AND GATE ELECTRODE MATERIAL LAYER (FOR EXAMPLE, ALUMINUM LAYER)

FORMATION OF GATE ELECTRODE OF DISPLAY PART AND PERIPHERAL DRIVING CIRCUIT PART, AND FORMATION OF PROTECTIVE FILM ($SiO_2$/PSG)

FORMATION OF CONTACT HOLES IN SOURCE PART OF DISPLAY PART AND SOURCE/DRAIN PART OF PERIPHERAL DRIVING CIRCUIT PART, AND FORMATION OF SOURCE ELECTRODE AND GETE·ELECTRODE OF DISPLAY APRT, AND SOURCE/DRAIN ELECTRODE AND GATE ELECTRODE OF PERIPHERAL DRIVING CIRCUIT PART

FIG.62
FOURTEENTH EMBODIMENT
DOUBLE LDD DOUBLE GATE TYPE MOS TFT
EXAMPLE OF TOP GATE TYPE nMOS TFT
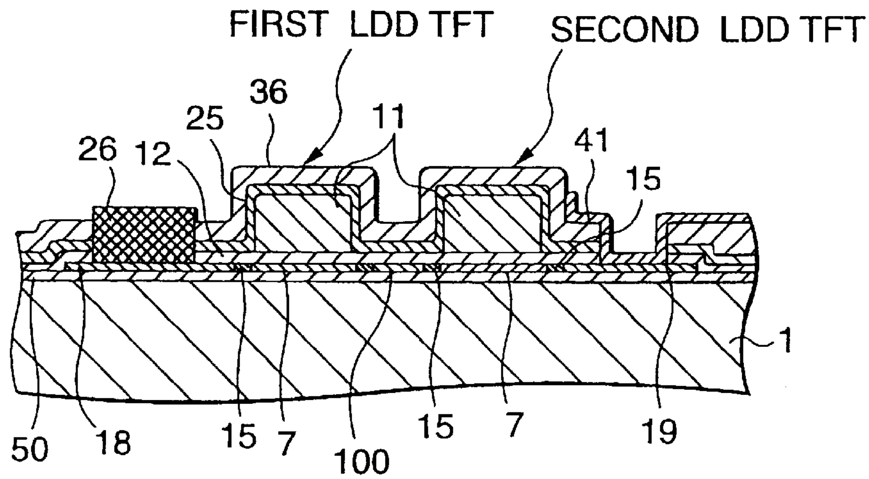
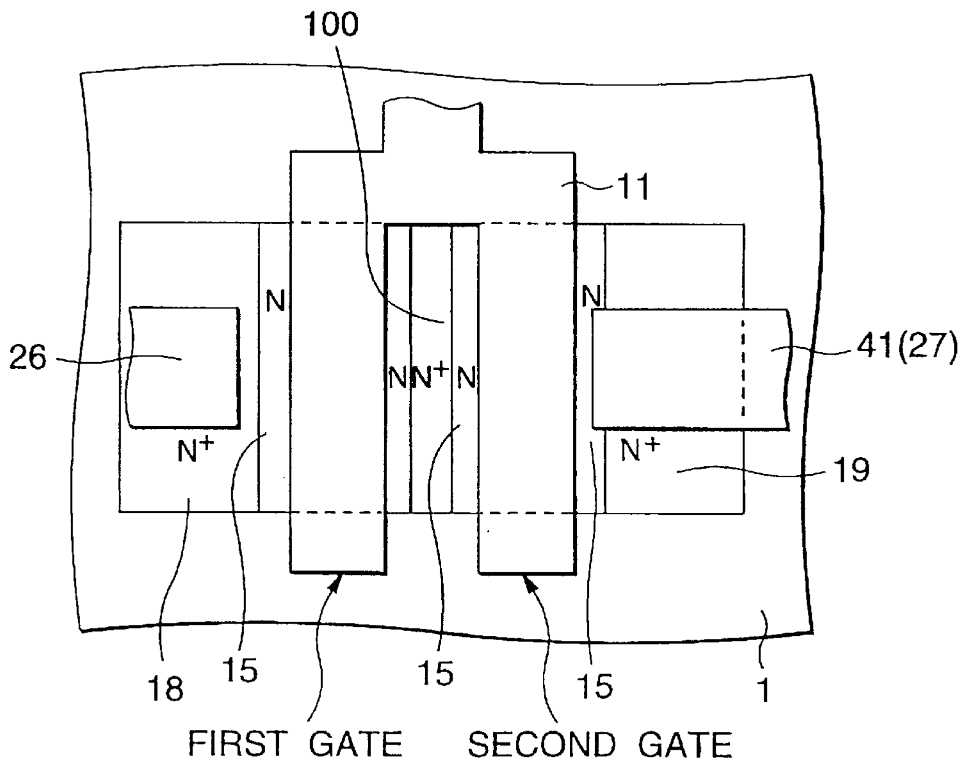

DOUBLE GATE TYPE MOS TFT

EXAMPLE OF BOTTOM GATE TYPE nMOS TFT

EXAMPLE OF DUAL GATE TYPE nMOS TFT

FIG.64

FIFTEENTH EMBODIMENT

COMBINATION OF MOS TFT OF VARIOUS PART

| NO. | PERIPHERAL DRIVER CIRCUIT PART | DISPLAY PART |
|---|---|---|
| 1 | TOP GATE TYPE | TOP GATE TYPE |
| 2 | TOP GATE TYPE | BOTTOM GATE TYPE |
| 3 | TOP GATE TYPE | DUAL GATE TYPE |
| 4 | TOP GATE TYPE + BOTTOM GATE TYPE | TOP GATE TYPE |
| 5 | TOP GATE TYPE + BOTTOM GATE TYPE | BOTTOM GATE TYPE |
| 6 | TOP GATE TYPE + BOTTOM GATE TYPE | DUAL GATE TYPE |
| 7 | TOP GATE TYPE + DUAL GATE TYPE | TOP GATE TYPE |
| 8 | TOP GATE TYPE + DUAL GATE TYPE | BOTTOM GATE TYPE |
| 9 | TOP GATE TYPE + DUAL GATE TYPE | DUAL GATE TYPE |
| 10 | TOP GATE TYPE + BOTTOM GATE TYPE + DUAL GATE TYPE | TOP GATE TYPE |
| 11 | TOP GATE TYPE + BOTTOM GATE TYPE + DUAL GATE TYPE | BOTTOM GATE TYPE |
| 12 | TOP GATE TYPE + BOTTOM GATE TYPE + DUAL GATE TYPE | DUAL GATE TYPE |

FIG.65

⟨NO LDD STRUCTURE PRESENT IN MOS TFT OF DISPLAY PART⟩

| | TFT'S OF PERIPHERAL DRIVING CIRCUIT PART | | TFT OF DISPLAY PART | |
|---|---|---|---|---|
| NO. | GATE STRUCTURE | CHANNEL CON-DUCTIVE TYPE | GATE STRUCTURE | CHANNEL CON-DUCTIVE TYPE |
| 1 | TOP GATE | p | TOP GATE | p |
| 2 | TOP GATE | p | TOP GATE | n |
| 3 | TOP GATE | n | TOP GATE | n |
| 4 | TOP GATE | n | TOP GATE | p |
| 5 | TOP GATE | c | TOP GATE | p |
| 6 | TOP GATE | c | TOP GATE | n |
| 7 | TOP GATE | c | TOP GATE | c |
| 8 | TOP GATE | p | TOP GATE | c |
| 9 | TOP GATE | n | TOP GATE | c |
| 10 | TOP GATE | p | BOTTOM GATE | p |
| 11 | TOP GATE | p | BOTTOM GATE | n |
| 12 | TOP GATE | n | BOTTOM GATE | n |
| 13 | TOP GATE | n | BOTTOM GATE | p |
| 14 | TOP GATE | c | BOTTOM GATE | p |
| 15 | TOP GATE | c | BOTTOM GATE | n |
| 16 | TOP GATE | c | BOTTOM GATE | c |
| 17 | TOP GATE | p | BOTTOM GATE | c |
| 18 | TOP GATE | n | BOTTOM GATE | c |
| 19 | TOP GATE | p | DUAL GATE | p |
| 20 | TOP GATE | p | DUAL GATE | n |
| 21 | TOP GATE | n | DUAL GATE | n |
| 22 | TOP GATE | n | DUAL GATE | p |
| 23 | TOP GATE | c | DUAL GATE | p |
| 24 | TOP GATE | c | DUAL GATE | n |
| 25 | TOP GATE | c | DUAL GATE | c |
| 26 | TOP GATE | p | DUAL GATE | c |
| 27 | TOP GATE | n | DUAL GATE | c |

p: P-CHANNEL TYPE n: N-CHANNEL TYPE c: COMPLEMENTARY TYPE COMBINING P-CHANNEL TYPE AND N-CHANNEL TYPE(HEREINAFTER SAME)

FIG.66

⟨NO LDD STRUCTURE PRESENT IN MOS TFT OF DISPLAY PART⟩

| | TFT'S OF PERIPHERAL DRIVING CIRCUIT PART | | TFT OF DISPLAY PART | |
|---|---|---|---|---|
| NO. | GATE STRUCTURE | CHANNEL CON-DUCTIVE TYPE | GATE STRUCTURE | CHANNEL CON-DUCTIVE TYPE |
| 28 | TOP GATE | c+n | TOP GATE | p |
| 29 | TOP GATE | c+n | TOP GATE | n |
| 30 | TOP GATE | c+n | TOP GATE | c |
| 31 | TOP GATE | c+p | TOP GATE | p |
| 32 | TOP GATE | c+p | TOP GATE | n |
| 33 | TOP GATE | c+p | TOP GATE | c |
| 34 | TOP GATE | c+n+p | TOP GATE | p |
| 35 | TOP GATE | c+n+p | TOP GATE | n |
| 36 | TOP GATE | c+n+p | TOP GATE | c |
| 37 | TOP GATE | c+n | BOTTOM GATE | p |
| 38 | TOP GATE | c+n | BOTTOM GATE | n |
| 39 | TOP GATE | c+n | BOTTOM GATE | c |
| 40 | TOP GATE | c+p | BOTTOM GATE | p |
| 41 | TOP GATE | c+p | BOTTOM GATE | n |
| 42 | TOP GATE | c+p | BOTTOM GATE | c |
| 43 | TOP GATE | c+n+p | BOTTOM GATE | p |
| 44 | TOP GATE | c+n+p | BOTTOM GATE | n |
| 45 | TOP GATE | c+n+p | BOTTOM GATE | c |
| 46 | TOP GATE | c+n | DUAL GATE | p |
| 47 | TOP GATE | c+n | DUAL GATE | n |
| 48 | TOP GATE | c+n | DUAL GATE | c |
| 49 | TOP GATE | c+p | DUAL GATE | p |
| 50 | TOP GATE | c+p | DUAL GATE | n |
| 51 | TOP GATE | c+p | DUAL GATE | c |
| 52 | TOP GATE | c+n+p | DUAL GATE | p |
| 53 | TOP GATE | c+n+p | DUAL GATE | n |
| 54 | TOP GATE | c+n+p | DUAL GATE | c |

FIG.67

⟨LDD STRUCTURE PRESENT IN MOS TFT OF DISPLAY PART⟩

| | TFT'S OF PERIPHERAL DRIVING CIRCUIT PART | | TFT OF DISPLAY PART | |
|---|---|---|---|---|
| NO. | GATE STRUCTURE | CHANNEL CON-DUCTIVE TYPE | GATE STRUCTURE | CHANNEL CON-DUCTIVE TYPE |
| 55 | TOP GATE | p | TOP GATE | p |
| 56 | TOP GATE | p | TOP GATE | n |
| 57 | TOP GATE | n | TOP GATE | n |
| 58 | TOP GATE | n | TOP GATE | p |
| 59 | TOP GATE | c | TOP GATE | p |
| 60 | TOP GATE | c | TOP GATE | n |
| 61 | TOP GATE | c | TOP GATE | c |
| 62 | TOP GATE | p | TOP GATE | c |
| 63 | TOP GATE | n | TOP GATE | c |
| 64 | TOP GATE | p | BOTTOM GATE | p |
| 65 | TOP GATE | p | BOTTOM GATE | n |
| 66 | TOP GATE | n | BOTTOM GATE | n |
| 67 | TOP GATE | n | BOTTOM GATE | p |
| 68 | TOP GATE | c | BOTTOM GATE | p |
| 69 | TOP GATE | c | BOTTOM GATE | n |
| 70 | TOP GATE | c | BOTTOM GATE | c |
| 71 | TOP GATE | p | BOTTOM GATE | c |
| 72 | TOP GATE | n | BOTTOM GATE | c |
| 73 | TOP GATE | p | DUAL GATE | p |
| 74 | TOP GATE | p | DUAL GATE | n |
| 75 | TOP GATE | n | DUAL GATE | n |
| 76 | TOP GATE | n | DUAL GATE | p |
| 77 | TOP GATE | c | DUAL GATE | p |
| 78 | TOP GATE | c | DUAL GATE | n |
| 79 | TOP GATE | c | DUAL GATE | c |
| 80 | TOP GATE | p | DUAL GATE | c |
| 81 | TOP GATE | n | DUAL GATE | c |

FIG.68

⟨LDD STRUCTURE PRESENT IN MOS TFT OF DISPLAY PART⟩

| | TFT'S OF PERIPHERAL DRIVING CIRCUIT PART | | TFT OF DISPLAY PART | |
|---|---|---|---|---|
| NO. | GATE STRUCTURE | CHANNEL CON-DUCTIVE TYPE | GATE STRUCTURE | CHANNEL CON-DUCTIVE TYPE |
| 82 | TOP GATE | c+n | TOP GATE | p |
| 83 | TOP GATE | c+n | TOP GATE | n |
| 84 | TOP GATE | c+n | TOP GATE | c |
| 85 | TOP GATE | c+p | TOP GATE | p |
| 86 | TOP GATE | c+p | TOP GATE | n |
| 87 | TOP GATE | c+p | TOP GATE | c |
| 88 | TOP GATE | c+n+p | TOP GATE | p |
| 89 | TOP GATE | c+n+p | TOP GATE | n |
| 90 | TOP GATE | c+n+p | TOP GATE | c |
| 91 | TOP GATE | c+n | BOTTOM GATE | p |
| 92 | TOP GATE | c+n | BOTTOM GATE | n |
| 93 | TOP GATE | c+n | BOTTOM GATE | c |
| 94 | TOP GATE | c+p | BOTTOM GATE | p |
| 95 | TOP GATE | c+p | BOTTOM GATE | n |
| 96 | TOP GATE | c+p | BOTTOM GATE | c |
| 97 | TOP GATE | c+n+p | BOTTOM GATE | p |
| 98 | TOP GATE | c+n+p | BOTTOM GATE | n |
| 99 | TOP GATE | c+n+p | BOTTOM GATE | c |
| 100 | TOP GATE | c+n | DUAL GATE | p |
| 101 | TOP GATE | c+n | DUAL GATE | n |
| 102 | TOP GATE | c+n | DUAL GATE | c |
| 103 | TOP GATE | c+p | DUAL GATE | p |
| 104 | TOP GATE | c+p | DUAL GATE | n |
| 105 | TOP GATE | c+p | DUAL GATE | c |
| 106 | TOP GATE | c+n+p | DUAL GATE | p |
| 107 | TOP GATE | c+n+p | DUAL GATE | n |
| 108 | TOP GATE | c+n+p | DUAL GATE | c |

FIG.69

<LDD STRUCTURE PARTLY PRESENT IN MOS TFT OF DISPLAY PART>

| | TFT'S OF PERIPHERAL DRIVING CIRCUIT PART | | TFT OF DISPLAY PART | |
|---|---|---|---|---|
| NO. | GATE STRUCTURE | CHANNEL CON-DUCTIVE TYPE | GATE STRUCTURE | CHANNEL CON-DUCTIVE TYPE |
| 109 | TOP GATE | p | TOP GATE | p |
| 110 | TOP GATE | p | TOP GATE | n |
| 111 | TOP GATE | n | TOP GATE | n |
| 112 | TOP GATE | n | TOP GATE | p |
| 113 | TOP GATE | c | TOP GATE | p |
| 114 | TOP GATE | c | TOP GATE | n |
| 115 | TOP GATE | c | TOP GATE | c |
| 116 | TOP GATE | p | TOP GATE | c |
| 117 | TOP GATE | n | TOP GATE | c |
| 118 | TOP GATE | p | BOTTOM GATE | p |
| 119 | TOP GATE | p | BOTTOM GATE | n |
| 120 | TOP GATE | n | BOTTOM GATE | n |
| 121 | TOP GATE | n | BOTTOM GATE | p |
| 122 | TOP GATE | c | BOTTOM GATE | p |
| 123 | TOP GATE | c | BOTTOM GATE | n |
| 124 | TOP GATE | c | BOTTOM GATE | c |
| 125 | TOP GATE | p | BOTTOM GATE | c |
| 126 | TOP GATE | n | BOTTOM GATE | c |
| 127 | TOP GATE | p | DUAL GATE | p |
| 128 | TOP GATE | p | DUAL GATE | n |
| 129 | TOP GATE | n | DUAL GATE | n |
| 130 | TOP GATE | n | DUAL GATE | p |
| 131 | TOP GATE | c | DUAL GATE | p |
| 132 | TOP GATE | c | DUAL GATE | n |
| 133 | TOP GATE | c | DUAL GATE | c |
| 134 | TOP GATE | p | DUAL GATE | c |
| 135 | TOP GATE | n | DUAL GATE | c |

FIG.70

⟨LDD STRUCTURE PARTLY PRESENT IN MOS TFT OF DISPLAY PART⟩

| | TFT'S OF PERIPHERAL DRIVING CIRCUIT PART | | TFT OF DISPLAY PART | |
|---|---|---|---|---|
| NO. | GATE STRUCTURE | CHANNEL CON-DUCTIVE TYPE | GATE STRUCTURE | CHANNEL CON-DUCTIVE TYPE |
| 136 | TOP GATE | c+n | TOP GATE | p |
| 137 | TOP GATE | c+n | TOP GATE | n |
| 138 | TOP GATE | c+n | TOP GATE | c |
| 139 | TOP GATE | c+p | TOP GATE | p |
| 140 | TOP GATE | c+p | TOP GATE | n |
| 141 | TOP GATE | c+p | TOP GATE | c |
| 142 | TOP GATE | c+n+p | TOP GATE | p |
| 143 | TOP GATE | c+n+p | TOP GATE | n |
| 144 | TOP GATE | c+n+p | TOP GATE | c |
| 145 | TOP GATE | c+n | BOTTOM GATE | p |
| 146 | TOP GATE | c+n | BOTTOM GATE | n |
| 147 | TOP GATE | c+n | BOTTOM GATE | c |
| 148 | TOP GATE | c+p | BOTTOM GATE | p |
| 149 | TOP GATE | c+p | BOTTOM GATE | n |
| 150 | TOP GATE | c+p | BOTTOM GATE | c |
| 151 | TOP GATE | c+n+p | BOTTOM GATE | p |
| 152 | TOP GATE | c+n+p | BOTTOM GATE | n |
| 153 | TOP GATE | c+n+p | BOTTOM GATE | c |
| 154 | TOP GATE | c+n | DUAL GATE | p |
| 155 | TOP GATE | c+n | DUAL GATE | n |
| 156 | TOP GATE | c+n | DUAL GATE | c |
| 157 | TOP GATE | c+p | DUAL GATE | p |
| 158 | TOP GATE | c+p | DUAL GATE | n |
| 159 | TOP GATE | c+p | DUAL GATE | c |
| 160 | TOP GATE | c+n+p | DUAL GATE | p |
| 161 | TOP GATE | c+n+p | DUAL GATE | n |
| 162 | TOP GATE | c+n+p | DUAL GATE | c |

FIG.71

〈LDD STRUCTURE PRESENT IN MOS TFT OF PERIPHERAL DISPLAY PART AND MOS TFT OF DISPLAY PART〉

| | TFT'S OF PERIPHERAL DRIVING CIRCUIT PART | | TFT OF DISPLAY PART | |
|---|---|---|---|---|
| NO. | GATE STRUCTURE | CHANNEL CON-DUCTIVE TYPE | GATE STRUCTURE | CHANNEL CON-DUCTIVE TYPE |
| 163 | TOP GATE | p | TOP GATE | p |
| 164 | TOP GATE | p | TOP GATE | n |
| 165 | TOP GATE | n | TOP GATE | n |
| 166 | TOP GATE | n | TOP GATE | p |
| 167 | TOP GATE | c | TOP GATE | p |
| 168 | TOP GATE | c | TOP GATE | n |
| 169 | TOP GATE | c | TOP GATE | c |
| 170 | TOP GATE | p | TOP GATE | c |
| 171 | TOP GATE | n | TOP GATE | c |
| 172 | TOP GATE | p | BOTTOM GATE | p |
| 173 | TOP GATE | p | BOTTOM GATE | n |
| 174 | TOP GATE | n | BOTTOM GATE | n |
| 175 | TOP GATE | n | BOTTOM GATE | p |
| 176 | TOP GATE | c | BOTTOM GATE | p |
| 177 | TOP GATE | c | BOTTOM GATE | n |
| 178 | TOP GATE | c | BOTTOM GATE | c |
| 179 | TOP GATE | p | BOTTOM GATE | c |
| 180 | TOP GATE | n | BOTTOM GATE | c |
| 181 | TOP GATE | p | DUAL GATE | p |
| 182 | TOP GATE | p | DUAL GATE | n |
| 183 | TOP GATE | n | DUAL GATE | n |
| 184 | TOP GATE | n | DUAL GATE | p |
| 185 | TOP GATE | c | DUAL GATE | p |
| 186 | TOP GATE | c | DUAL GATE | n |
| 187 | TOP GATE | c | DUAL GATE | c |
| 188 | TOP GATE | p | DUAL GATE | c |
| 189 | TOP GATE | n | DUAL GATE | c |

FIG.72

<LDD STRUCTURE PRESENT IN MOS TFT OF PERIPHERAL DISPLAY PART AND MOS TFT OF DISPLAY PART>

| | TFT'S OF PERIPHERAL DRIVING CIRCUIT PART | | TFT OF DISPLAY PART | |
|---|---|---|---|---|
| NO. | GATE STRUCTURE | CHANNEL CON-DUCTIVE TYPE | GATE STRUCTURE | CHANNEL CON-DUCTIVE TYPE |
| 190 | TOP GATE | c+n | TOP GATE | p |
| 191 | TOP GATE | c+n | TOP GATE | n |
| 192 | TOP GATE | c+n | TOP GATE | c |
| 193 | TOP GATE | c+p | TOP GATE | p |
| 194 | TOP GATE | c+p | TOP GATE | n |
| 195 | TOP GATE | c+p | TOP GATE | c |
| 196 | TOP GATE | c+n+p | TOP GATE | p |
| 197 | TOP GATE | c+n+p | TOP GATE | n |
| 198 | TOP GATE | c+n+p | TOP GATE | c |
| 199 | TOP GATE | c+n | BOTTOM GATE | p |
| 200 | TOP GATE | c+n | BOTTOM GATE | n |
| 201 | TOP GATE | c+n | BOTTOM GATE | c |
| 202 | TOP GATE | c+p | BOTTOM GATE | p |
| 203 | TOP GATE | c+p | BOTTOM GATE | n |
| 204 | TOP GATE | c+p | BOTTOM GATE | c |
| 205 | TOP GATE | c+n+p | BOTTOM GATE | p |
| 206 | TOP GATE | c+n+p | BOTTOM GATE | n |
| 207 | TOP GATE | c+n+p | BOTTOM GATE | c |
| 208 | TOP GATE | c+n | DUAL GATE | p |
| 209 | TOP GATE | c+n | DUAL GATE | n |
| 210 | TOP GATE | c+n | DUAL GATE | c |
| 211 | TOP GATE | c+p | DUAL GATE | p |
| 212 | TOP GATE | c+p | DUAL GATE | n |
| 213 | TOP GATE | c+p | DUAL GATE | c |
| 214 | TOP GATE | c+n+p | DUAL GATE | p |
| 215 | TOP GATE | c+n+p | DUAL GATE | n |
| 216 | TOP GATE | c+n+p | DUAL GATE | c |

SIXTEENTH EMBODIMENT
COMBINATION OF VARIOUS MOS TFT OF VARIOUS PART

SIXTEENTH EMBODIMENT
COMBINATION OF VARIOUS MOS TFT OF VARIOUS PART

FIG.74

DRIVING MODE OF ACTIVE MATRIX

| CRYSTALLINTY OF MOS TFT | TYPE OF MOS TFT | |
|---|---|---|
| | PERIPHERAL DRIVING CIRCUIT PART | DISPLAY PART |
| SINGLE CRYSTAL SILICON | cMOS OR n OR pMOS OR cMOS + pMOS + nMOS | n OR pMOS OR cMOS |
| POLYCRYSTALLINE SILICON | cMOS OR n OR pMOS OR cMOS + pMOS + nMOS | n OR pMOS OR cMOS |
| AMORPHOUS SILICON | — | n OR pMOS OR cMOS |

EIGHTEENTH EMBODIMENT: APPLICATION OTHER THAN LCD

EL (EXAMPLE OF ACTIVE MATRIX DRIVING)

FED (EXAMPLE OF PASSIVE MATRIX DRIVING)

PROCESS FOR PRODUCING ELECTROOPTICAL APPARATUS AND PROCESS FOR PRODUCING DRIVING SUBSTRATE FOR ELECTROOPTICAL APPARATUS

RELATED APPLICATION DATA

The present application claims priority to Japanese Application No. P10-277797 filed Sep. 30, 1998 which application is incorporated herein by reference to the extent permitted by law.

FIELD OF THE INVENTION

The present invention relates to a process for producing an electrooptical apparatus and a process for producing a driving substrate for an electrooptical apparatus, and particularly relates to a process suitable for a liquid crystal display device having a top gate type thin film insulating gate type field effect transistor using, as an active region, a single crystal silicon layer formed by hetero-epitaxial growth on an insulating substrate (hereinafter referred to as a top gate type MOS TFT), and a passive region. (The top gate type includes a stagger type and a coplanar type.)

BACKGROUND OF THE INVENTION

As an active matrix type liquid crystal display device, one comprising a display part using amorphous silicon in TFT, and an IC for an external driving circuit; an integrated type comprising a display part using polycrystalline silicon by a solid phase growing method in TFT, and a driving circuit (as described in JP-A-6-242433); and an integrated type comprising a display part using polycrystalline silicon having been subjected to excimer laser annealing in TFT, and a driving circuit (as described in JP-A-7-131030) have been known.

However, although the conventional amorphous silicon TFT exhibits good productivity, the electron mobility is as low as about from 0.5 to 1.0 $cm^2/v \cdot sec$, and a MOS TFT of p-channel (hereinafter referred to as a pMOS TFT) cannot be produced. Therefore, because a peripheral driving part using a pMOS TFT cannot be formed on the same glass substrate as one, on which a display part is formed, a driver IC is externally attached as mounted by a TAB method, and thus the production cost is difficult to be reduced. There is also a limit to increase the minuteness because of the same reasons. Furthermore, because the electron mobility is as low as about from 0.5 to 1.0 $cm^2/v \cdot sec$, a sufficient on electric current cannot be ensured, and in the case where it is used as a display part, the size of the transistor necessarily becomes large, and thus it is disadvantageous for increasing the opening ration of a pixel.

Because the conventional polycrystalline silicon TFT has an electron mobility of from 70 to 100 $cm^2/v \cdot sec$ and can cope with high minuteness, an LCD (liquid crystal display device) of a driving circuit integrated type using a polycrystalline silicon TFT receives attention. However, in the case of a large LCD of 15 inches or larger, because the electron mobility of polycrystalline silicon is from 70 to 100 $cm^2/v \cdot sec$, the driving performance becomes insufficient, and as a result, an IC for an external driving circuit becomes necessary.

In the case of the conventional TFT using polycrystalline silicon formed in to a film by a solid phase growing method, because the annealing at 600° C. or more for several tens hours and the formation of gate $SiO_2$ by thermal oxidation at about 1,000° C., it is necessary to employ an apparatus for producing a semiconductor. Therefore, there is a limit in size of a wafer of from 8 to 12 inches, and furthermore quartz glass, which is of high heat resistance but expensive, is necessarily employed, which bars reduction in production cost. Therefore, the usage thereof is limited to an EVF and a data/AV projector.

The conventional polycrystalline silicon TFT by excimer laser annealing involves many problems, for example, in stability of excimer laser output, productivity, increase in apparatus cost due to a large-scale apparatus, and reduction in yield and product quality.

Particularly, in the case of a large-scale glass substrate, such as 1 m square, the problems are enhanced, and increase in performance and quality, and reduction in cost become difficult.

SUMMARY OF THE INVENTION

An object of the invention is to make possible to produce an active matrix substrate having a built-in high performance driver by uniformly forming a single crystal silicon layer having a high electron/hole mobility at a relatively low temperature particularly in a peripheral driving circuit, and an electrooptical apparatus, such as a display thin film semiconductor device, using the same; to make possible to produce a constitution in that a display part comprising an n-channel MOS TFT (hereinafter referred to as an nMOS TFT) or a pMOS TFT of an LDD structure (lightly doped drain structure) having high switching characteristics and a low leakage electric current, or a complementary thin film insulated gate field effect transistor (hereinafter referred to as a cMOS TFT) having a high driving performance, and a peripheral driving circuit comprising the cMOS TFT, the nMOS TFT, the pMOS TFT or mixtures thereof; to make possible to produce a display panel of high image quality, high minuteness, a small frame, high efficiency and a large image area; to make possible to use a large scale glass substrate having a relatively low distortion point; to make possible to reduce the production cost by high productivity and no expensive production equipment; and possible to realize high speed operation and a large image area by easy adjustment of the threshold value and a low resistance.

The invention relates to a process for producing an electrooptical apparatus and a driving substrate for the electrooptical apparatus comprising a first substrate (i.e., a driving substrate, hereinafter the same) having thereon a display part comprising a pixel electrode (for example, plural pixel electrodes arranged in a matrix form, hereinafter the same) arranged therein and a peripheral driving circuit part arranged in a periphery of the display part, and a prescribed optical material (for example, a liquid crystal) intervening between the first substrate and a second substrate (i.e., a counter substrate), the process comprising

- a step of forming, on one surface of the first substrate, a substance layer comprising a substance having good lattice matching with a single crystal semiconductor (for example, single crystal silicon) to be formed;
- a step of forming, on a surface of the first substrate including the substance layer, a molten liquid layer of a low melting point metal containing a semiconductor material (for example, silicon);
- a step of depositing a single crystal semiconductor layer (for example, single crystal silicon layer) through hetero-epitaxial growth by a cooling treatment (preferably a gradual cooling treatment) using the substance layer as a seed; and a step of forming, in the single crystal semiconductor layer, an active element (for example, a step comprising, after depositing the single crystal semiconductor layer, subjecting the single crystal semiconductor layer to a prescribed treatment to form a channel region, a source region and drain region, and forming a gate part comprising a gate insulating film and a gate electrode and source and drain electrodes above the channel region, so as to form a first thin film transistor of a top gate type (particularly a MOS FET, hereinafter the same) as an active element, constituting at least a part of the peripheral driving circuit.

In the invention, the single crystal semiconductor layer is a concept including not only a single crystal silicon layer, but also a single crystal compound semiconductor layer (hereinafter the same). The active element is a concept including an element, such as a thin film transistor and a diode (hereinafter the same). The thin film transistor, which is a representative example of the active element, is classified into a field effect transistor (FET) (including a MOS type and a junction type, both of which are included in the invention) and a bipolar transistor, and the invention can be applied to both types of transistors (hereinafter the same). The passive element used herein is a concept including an element, such as a resistance, an inductance and a capacitance, including, for example, a capacitance formed by sandwiching a high dielectric film, such as silicon nitride (hereinafter called as SiN), with the single crystal silicon layer having a low resistance (i.e., an electrode).

Particularly, in the invention, a single crystal semiconductor thin film, such as a single crystal silicon thin film, is formed by hetero-epitaxial growth from a molten liquid of a low melting point metal containing a semiconductor, such as silicon, using the substance layer having good lattice matching with the single crystal silicon, such as a crystalline sapphire film, as a seed, and the epitaxially grown layer is used as an active element, such as a top gate type MOS TFT of a peripheral driving circuit of a driving substrate, such as an active matrix substrate, and a top gate type MOS TFT of a peripheral driving circuit of an electrooptical apparatus, such as an LCD of a display part-peripheral driving circuit integrated type. Therefore, the following considerable effects (A) to (G) can be obtained.

(A) A single crystal semiconductor layer, such as a single crystal silicon thin film having a high electron mobility of 540 $cm^2/v \cdot sec$ or more, is obtained by forming a substance layer having good lattice matching with the single crystal silicon (such as a crystalline sapphire film) on a substrate, and conducting hetero-epitaxial growth by using the substance layer as a seed. Therefore, an electrooptical apparatus, such as a thin film semiconductor device for display having a built-in high performance driver can be produced.

(B) In particular, because the single crystal silicon layer exhibits high electron and hole mobility equivalent to those of a single crystal silicon substrate in comparison to the conventional amorphous silicon layer and polycrystalline silicon layer, a single crystal silicon top gate type MOS TFT using the same can have a constitution in that a display part comprising an nMOS TFT, a pMOS TFT or a CMOS TFT having high switching characteristics (preferably further having an LDD (lightly doped drain) structure, which relaxes the electric field intensity to lower the leakage electric current) and a peripheral driving circuit part comprising the cMOS TFT, the nMOS TFT, the pMOS TFT having a high driving capacity or mixtures thereof are united, so as to realize a display panel of high image quality, high minuteness, a small frame, high efficiency and a large image area. Although a pMOS TFT having a high hole mobility as a TFT for an LCD is difficult to produce with polycrystalline silicon, because the single crystal silicon layer of the invention exhibits a sufficiently high mobility for a hole, a peripheral driving circuit driving an electron or a hole solely or both of them can be produced, and thus a panel comprising a TFT for a display part having an LDD structure of nMOS, pMOS or cMOS united thereto the peripheral driving circuit can be realized. In the case of a small scale to medium scale panel, there is a possibility of omitting one of the pair of peripheral vertical driving circuits.

(C) Because the substance layer is used as a seed for hetero-epitaxial growth, and the molten liquid of a low melting point metal can be prepared on the substance layer at a low temperature (for example, 350° C.) and coated on the substrate at a temperature slightly higher than that temperature, a silicon single crystal film can be uniformly formed at a relatively low temperature (for example, from 300 to 400° C.).

(D) Because annealing for a long period of time at a medium temperature (about 600° C. for several tens hours) as in a solid phase growing method, and excimer laser annealing can be omitted, the productivity can be increased, and the production cost can be decreased since an expensive production equipment is not necessary.

(E) In the hetero-epitaxial growth, because a single crystal silicon layer having wide ranges of the concentration of a p-type impurity and a high mobility can be obtained by adjusting the crystallinity of the substance layer, such as a crystalline sapphire film, the compositional ratio of the molten liquid, the temperature of the molten liquid, the heating temperature of the substrate and the cooling rate, the adjustment of Vth (threshold value) can be easily conducted, and high speed operation due to a low resistance can be realized.

(F) When an impurity element of Group 3 or Group 5 (such as boron, phosphorous, antimony, arsenic, bismuth and aluminum) is separately doped in the molten liquid layer of a low melting point metal containing silicon, the species and/or the concentration of the impurity contained in the single crystal silicon thin film on the hetero-epitaxial growth, i.e., the conductive type of p-type or n-type and/or the carrier concentration, can be arbitrarily controlled.

(G) Since the substance layer, such as a crystalline sapphire film, functions as a diffusion barrier of various atoms, diffusion of an impurity from the glass substrate can be suppressed.

BRIEF DESCRIPTION OF THE DRAWINGS

FIG. 1A is a phase diagram of Si—In.

FIG. 4 is a schematic constitutional diagram of the same LCD.

FIGS. 5A to 5C are cross sectional views stepwise showing the production process of the LCD according to the first embodiment of the invention.

FIGS. 18A to 18E are cross sectional views stepwise showing the production process of the same LCD.

FIGS. 23A to 23D are cross sectional views stepwise showing the production process of the same LCD.

FIGS. 29H and 29I are cross sectional views stepwise showing the production process of the same LCD.

FIG. 37 is a cross sectional view and a plan view showing an important part of the LCD according to the eighth embodiment of the invention.

FIGS. 51A to 51C are cross sectional views stepwise showing the production process of the same LCD.

FIGS. 56D to 56G are cross sectional views stepwise showing the production process of the same LCD.

FIGS. 59A and 59B are cross sectional views stepwise showing the production process of an LCD according to the thirteenth embodiment of the invention.

FIG. 62 is a cross sectional view and a plan view showing an important part of the LCD according to the fourteenth embodiment of the invention.

FIG. 64 is a diagram showing combinations of the respective TFTs of the LCD according to the fifteenth embodiment of the invention.

FIG. 65 is a diagram showing combinations of the respective TFTs of the same LCD.

FIG. 66 is a diagram showing combinations of the respective TFTs of the same LCD.

FIG. 67 is a diagram showing combinations of the respective TFTs of the same LCD.

FIG. 68 is a diagram showing combinations of the respective TFTs of the same LCD.

FIG. 69 is a diagram showing combinations of the respective TFTs of the same LCD.

FIG. 70 is a diagram showing combinations of the respective TFTs of the same LCD.

FIG. 71 is a diagram showing combinations of the respective TFTs of the same LCD.

FIG. 72 is a diagram showing combinations of the respective TFTs of the same LCD.

FIG. 74 is a diagram showing the combinations of respective TFTs of the same LCD.

DESCRIPTION OF THE PREFERRED EMBODIMENTS

In the invention, it is preferred that the single crystal silicon layer is subjected to a prescribed treatment to form a channel region, a source region and a drain region, and a first thin film transistor of a top gate type having a gate part constitutes at least a part of the peripheral driving circuit above the channel region.

It is also preferred that an insulating substrate is used as the first substrate, and the substance layer is formed with a substance selected from the group consisting of sapphire ($Al_2O_3$), a spinel structure (for example, $MgO.Al_2O_3$), calcium fluoride ($CaF_2$), strontium fluoride ($SrF_2$), barium fluoride ($BaF_2$), boron phosphide (BP), yttrium oxide ($(Y_2O_3)_m$) and zirconium oxide ($(ZrO_2)_{1-m}$) It is preferred that, on the substance layer, a molten liquid of a low melting point metal containing from 0.005 to 2.0% by weight, for example, 1% by weight, of silicon is coated on the heated insulating substrate, and after maintaining for a prescribed period of time (from several minutes to several tens minutes), the cooling treatment is conducted. According to the procedures, a single crystal silicon film having a thickness of from 0.005 $\mu$m to several micrometers, for example 1 $\mu$m, can be obtained.

As the substrate, an insulating substrate, such as a glass substrate and a heat resistant organic substrate, can be used, and as the low melting point metal, at least one species selected from the group consisting of indium, gallium, tin, bismuth, lead, zinc, antimony and aluminum.

In the case where indium is used as the low melting point metal, the molten liquid can be coated on the insulating substrate heated to a temperature of from 850 to 1,100° C., preferably from 900 to 950° C. In the case where indium-gallium or gallium is used as the low melting point metal, the molten liquid can be coated on the insulating substrate heated to a temperature of from 300 to 1,100° C., preferably from 350 to 600° C., or from 400 to 1,100° C., preferably from 420 to 600° C. A method for heating of the substrate includes a method in which the whole substrate is uniformly heated by an electric furnace or a lamp, as well as a method in which a prescribed part of the substrate is locally heated by laser light or an electron beam.

Figure 1A:
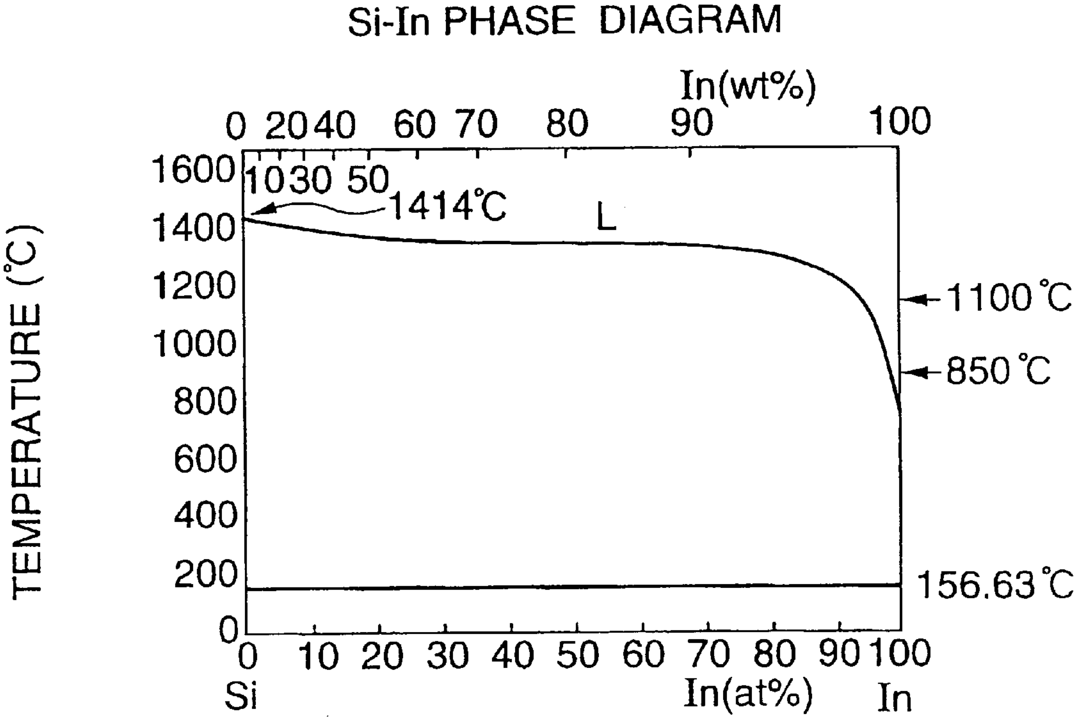
Figure 1B:
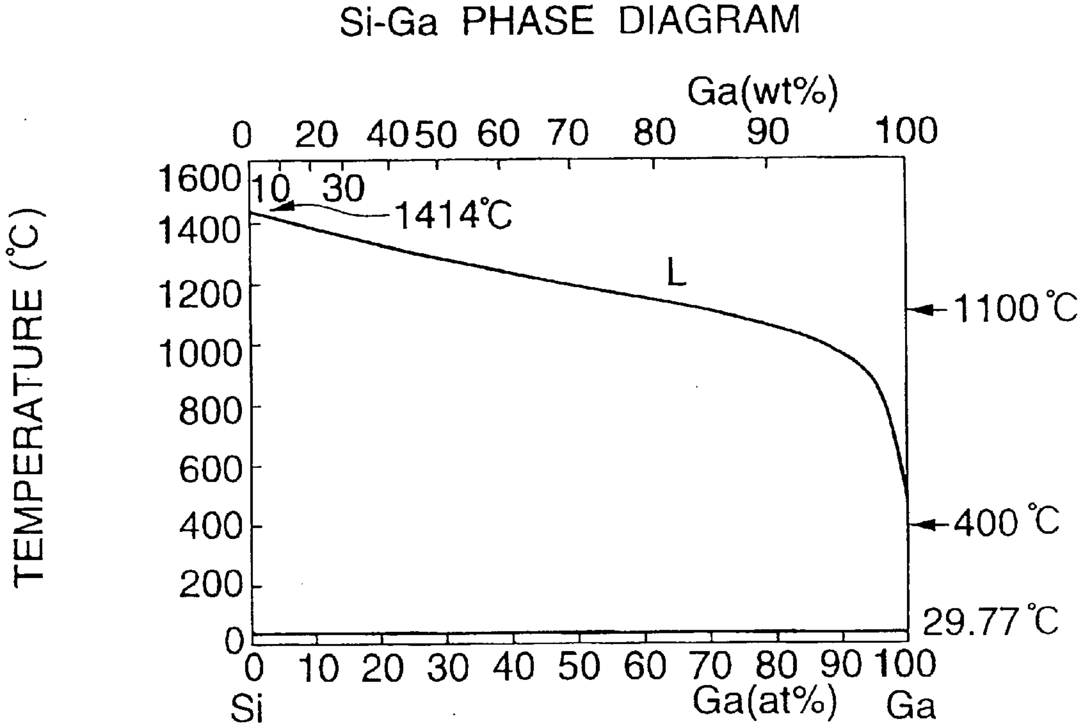
FIG. 1B is a phase diagram of Si—Ga.

As apparent from FIGS. 1A and 1B, the melting point of the low melting point metal containing silicon is decreased corresponding to the proportion of the low melting point metal. In the case where indium is used, an indium molten liquid layer containing silicon (for example, in a concentration of 1% by weight) can be formed at a substrate temperature of from 850 to 1,100° C. This is because quartz glass can be used as the substrate until about 1,000° C., and glass having lower heat resistance, such as crystalline glass, can be used until the range of from 850 to 1,100° C. In the case where gallium is used, a gallium molten liquid layer containing silicon (for example, in a concentration of 1% by weight) can be formed at a substrate temperature of from 400 to 1,100° C.

In the latter case (the case of indium-gallium-silicon or gallium-silicon), a glass substrate or a heat resistant organic substrate having a relatively low distortion point can be used, and thus the semiconductor crystalline layer can be formed on a large scale glass substrate (having an area of 1 $m^2$ or more). As such a substrate, an inexpensive glass plate in the form of a continuous web that is easily formed into a thin plate can be produced. By using the procedures, the single crystal silicon thin film can be continuously or non-continuously produced by the hetero-epitaxial growth on a glass plate in the form of a continuous web or a heat resistant organic substrate.

In the method of coating the molten liquid, gradual cooling is conducted after maintaining a prescribed period of time (from several minutes to several tens minutes). Alternatively, a dipping method in which the glass substrate is dipped in the molten liquid, and after maintaining a prescribed period of time (from several minutes to several tens minutes), it is gradually drawn off, and a floating method in which the substrate is moved at a suitable speed in the molten liquid or on the surface of the molten liquid to conduct gradual cooling can also be employed. The thickness and the concentration of the carrier impurity of the hetero-epitaxially grown layer can be controlled by the composition and the temperature of the molten liquid and the withdrawing speed. In the coating method, the dipping method and the floating method, the substrate can be continuously processed or processed with an interval supply of the substrate, and thus mass productivity can be improved.

Because a constitutional element of glass having a low distortion point is liable to diffuse from the interior of the glass to the upper layer, in order to prevent the diffusion, it is preferred to form a film, such as a thin film of a diffusion barrier layer (for example, a film of silicon nitride (SiN) having a thickness of about from 50 to 200 nm). In this case, therefore, the polycrystalline, amorphous silicon layer or the low melting point metal layer containing silicon is formed on the diffusion barrier layer.

After depositing the single crystal silicon layer by the hetero-epitaxial growth from the low melting point metal containing silicon using the substance layer as a seed by gradual cooling, the layer of the low melting point metal is dissolved and removed with, for example, hydrochloric acid, and then the single crystal silicon layer is subjected to a prescribed treatment to produce a passive element and an active element.

The low melting point metal thin film such as indium deposited on the single crystal silicon layer after gradual cooling is dissolved and removed with hydrochloric acid, and since the single crystal silicon film can be formed with indium remaining in the silicon layer only in a slight amount (about $10^{16}$ atoms/cc), a semiconductor of a P-type single crystal silicon thin film is formed immediately after the production. Therefore, it is advantageous for producing an nMOS TFT. However, an N-type single crystal silicon thin film can be formed on the whole surface or can be selectively formed by such a manner that a suitable amount of an N-type impurity, such as a phosphorous atom, is added to the whole surface or selectively added by ion implantation, and therefore a PMOS TFT can also be produced. Accordingly, a cMOS TFT can also be produced. Upon formation of the polycrystalline or amorphous silicon layer or the low melting point metal layer containing silicon, when an impurity element of Group 3 or Group 5 having a large solubility (such as boron, phosphorous, antimony, arsenic and bismuth) is separately doped in a suitable amount, the species of the impurity in the growing silicon-epitaxial growth layer and/or the concentration thereof, i.e., P-type or N-type and/or the carrier concentration, can be arbitrarily controlled.

Accordingly, the single crystal silicon layer formed on the substrate by the hetero-epitaxial growth is applied to the channel region, the source region and the drain region of the top gate type MOS TFT constituting at least a part of the peripheral driving circuit, so that the species of the impurity and/or the concentration thereof of those regions can be controlled.

The thin film transistor of the display part and the peripheral driving circuit part may constitute an insulating gate field effect transistor of an n-channel type, a p-channel type or a complementary type, and it may be constituted with a combination of the complementary type and the n-channel type, a combination of the complementary type and the p-channel type, or a combination of the complementary type, the n-channel type and the p-channel type. It is preferred that at least a part of the thin film transistor of the peripheral driving circuit part and/or the display part has an LDD (lightly doped drain) structure. The LDD structure may be formed not only between the gate and the drain, but also between the gate and the source, or both between the gate and source and between the gate and drain (which is called as a double LDD structure).

Particularly, it is preferred that an LDD type TFT of nMOS, PMOS or CMOS is constituted in the display part of the MOS TFT, and a TFT of nMOS, pMOS, CMOS or mixtures thereof is constituted in the peripheral driving circuit part thereof.

It is preferred in the invention that a step is formed on the substrate and/or a film formed thereon to be a concave part, in which the side wall and the bottom surface in the cross section thereof form a bottom angle of 90° or smaller toward the lower end, and the step is formed on the insulating substrate or the film formed thereon, such as SiN, (or both of them). It is considered that the step becomes a seed on the hetero-epitaxial growth of the single crystal silicon layer, which increases the crystallinity of the single crystal silicon film and accelerates the growth thereof. It is preferred that the step is formed along at least one edge of the element region, which is formed by the channel region, the source region and the drain region of the active element, such as a thin film transistor. It is also preferred that the step is formed along at least one edge of the element region, in which the passive element, such as a resistance, is formed.

In this case, the step having the prescribed shape, which becomes a seed of the hetero-epitaxial growth, increases the crystallinity of the single crystal silicon film, and accelerates the growth thereof, is formed at the prescribed position of the insulating substrate, as the substrate, and the substance layer can be formed on the insulating substrate including the step.

Alternatively, the step having the same prescribed shape is formed on the substance layer, and then the single crystal silicon layer can be formed on the substance layer including the step.

In these cases, because the step also functions as a seed of the hetero-epitaxial growth in addition to the substance layer, a single crystal silicon layer having a higher crystallinity can be formed, and the growth thereof can be accelerated.

While the first thin film transistor, such as the MOS TFT, may be formed in the concave part in the substrate formed by the step, it may be formed in the vicinity outside the concave part, or in both of them. The step may be formed by dry etching, such as reactive ion etching.

In this case, it is possible that after the step is formed on one surface of the first substrate, the crystalline sapphire film and the single crystal, polycrystalline or amorphous silicon layer are formed on the substrate including the step and the second thin film transistor is formed by forming a channel region, a source region and a drain region in the single crystal, polycrystalline or amorphous silicon layer, so as to form a top gate type, a bottom gate type or a dual gate type having a gate part above and/or under the channel region.

In this case, it is also preferred that the step is formed to be a concave part, in which the side wall and the bottom surface in the cross section thereof form a bottom angle of 90° or smaller toward the lower end, and the step becomes a seed on the hetero-epitaxial growth of the single crystal silicon layer, which accelerates the growth of the single crystal silicon film and increases the crystallinity thereof.

The second thin film transistor may be formed inside and/or outside the concave part formed by the step formed on the first substrate and/or the film formed thereon, and a source region, a drain region and a channel region of the second thin film transistor may be formed by using the single crystal silicon layer formed by the hetero-epitaxial growth as similar to the first thin film transistor.

It is also possible in the second thin film transistor that the species and/or the concentration of the impurity of Group 3 or Group 5 in the single crystal, polycrystalline or amorphous silicon layer are controlled, and the step is formed along at least one edge of the element region, which is formed by the channel region, the source region and the drain region of the second thin film transistor. It is preferred that the gate electrode under the single crystal, polycrystalline or amorphous silicon layer has a side edge part having a trapezoidal shape. It is also preferred that there provides the diffusion barrier layer between the first substrate and the single crystal, or between polycrystalline and amorphous silicon layer.

It is preferred that the source or drain electrode of the first and/or second thin film transistor is formed on the region containing the step.

It is possible that the first thin film transistor is formed as a top gate type selected from a top gate type, a bottom gate type and a dual gate type, which have a gate part above and/or under the channel region, and a switching element switching the pixel electrode in the display part is formed as the second thin film transistor of the top gate type, the bottom gate type or the dual gate type.

In this case, it is possible that the gate electrode formed under the channel region is formed with a heat resistant material, and the upper gate electrode of the second thin film transistor and the gate electrode of the first thin film transistor may be formed with a common material.

In the peripheral driving circuit part, in addition to the first thin film transistor, elements may be formed, such as a thin film transistor of a top gate type, a bottom gate type or a dual gate type comprising a channel region formed in a polycrystalline or amorphous silicon layer, and a gate part formed above and/or under the channel region, a diode using the single crystal or polycrystalline silicon layer or an amorphous silicon layer, a resistance, a capacitance and an inductance.

The thin film transistor of the peripheral driving circuit part and/or the display part may be constituted as single gate or multi-gate.

In the case where the n- or p-channel type thin film transistor of the peripheral driving circuit part and/or the display part is of the dual gate type, it is preferred that it functions as a thin film transistor of a bottom gate type or a top gate type by such a manner that the upper and lower gate electrodes are made electrically open, or an arbitrary negative voltage (in the case of the n-channel type) or positive voltage (in the case of the p-channel type) is applied thereto.

In the case where the thin film transistor of the peripheral driving circuit part is formed as the first thin film transistor of an n-channel type, a p-channel type or a complementary type, when the channel region of the thin film transistor of the display part is formed in the single crystal silicon layer, it may be an n-channel type, a p-channel type or a complementary type; when the channel region is formed in the polycrystalline silicon layer, it may be an n-channel type, a p-channel type or a complementary type; and when the channel region is formed in the amorphous silicon layer, it may be an n-channel type, a p-channel type or a complementary type.

It is possible in the invention that after growing the single crystal silicon layer, an upper gate part comprising a gate insulating film and a gate electrode is formed on the single crystal silicon layer, and the channel region, the source region and the drain region are formed by introducing an impurity element of Group 3 or Group 5 to the single crystal silicon layer using the upper gate part as a mask.

In the case where the second thin film transistor is of the bottom gate type or the dual gate type, after forming the lower gate electrode comprising a heat resistant material under the channel region and forming a lower gate part by forming a gate insulating film on the gate electrode, the second thin film transistor may be formed in the common procedure as the first thin film transistor including the formation step of the step. In this case, the upper gate electrode of the second thin film transistor and the gate electrode of the first thin film transistor may be formed with the same material.

It is possible that after forming the single crystal silicon layer on the lower gate part, an impurity element of Group 3 or Group 5 is introduced into the single crystal silicon layer, and after forming the source and drain regions, an activation treatment is conducted.

It is also possible that after forming the single crystal silicon layer, the source and drain regions of the first and second thin film transistors are formed by ion implantation of the impurity element by using a resist as a mask; the activation treatment is conducted after the ion implantation; and after forming a gate insulating film, the gate electrode of the first thin film transistor and, if necessary, the upper gate electrode of the second thin film transistor are formed.

In the case where the thin film transistor is of the top gate type, it is possible that after forming the single crystal silicon layer, the source and drain regions of the first and second thin film transistors are formed by ion implantation of the impurity element using a resist as a mask; the activation treatment is conducted after the ion implantation; and thereafter the gate parts each comprising the gate insulating film and the gate electrode of the first and second thin film transistors are formed.

Alternatively, in the case where the thin film transistor is of the top gate type, it is also possible that after forming the single crystal silicon layer, the gate insulating films and the gate electrodes comprising a heat resistant material of the first and second thin film transistors are formed to form the gate parts; the source and drain regions are formed by ion implantation of the impurity element using the gate parts as a mask; and after the ion implantation, the activation treatment is conducted.

It is also possible that the resist mask used on forming the LDD structure is left, and the ion implantation for forming the source region and the drain region is conducted by using a resist mask covering the same.

The substrate may be optically opaque or transparent, and a pixel electrode for the display part of a reflection type or a transmission type may be provided.

When the display part has a laminated structure comprising the pixel electrode and a color filter layer, the opening ratio and the illuminance of the display panel, omission of a color filter substrate, and reduction in cost by improvement of productivity are realized by forming a color filter above the display array part.

In this case, it is preferred that when the pixel electrode is a reflection electrode, unevenness giving suitable reflection characteristics and viewing angle characteristics to the resin film is formed, and the pixel electrode is provided thereon, and when the pixel electrode is a transparent electrode, the surface is flattened by a transparent flattening film, and the pixel electrode is provided on the flattening surface.

It is possible that the display part is so constituted that emission and control of light are conducted by driving of the MOS TFT, and for example, a liquid crystal display device (LCD), an electroluminescence display device (EL), a field emission display device (FED), a light emitting polymer display device (LEPD) and a light emission diode display device (LED) are fabricated. In this case, it is possible that plurality of the pixel electrodes are arranged in a matrix form in the display part, and the switching elements each are connected to the respective pixel electrodes.

Preferred embodiments of the invention will be described in more detail below.

First Embodiment

FIGS. 1A to 13F show the first embodiment of the invention. This embodiment relates to an active matrix reflection type liquid crystal display device (LCD), in which the substance layer (for example, a crystalline sapphire film) is formed on a surface of a heat resistant substrate including the step (concave part) formed thereon, and a single crystal silicon layer is grown by high temperature hetero-epitaxial growth from an indium-silicon molten liquid by using the substance layer as a seed, to constitute a top gate type MOS TFT using the same. The layout of the reflection type LCD will be described with reference to FIGS. 2 to 4.

Figure 2:
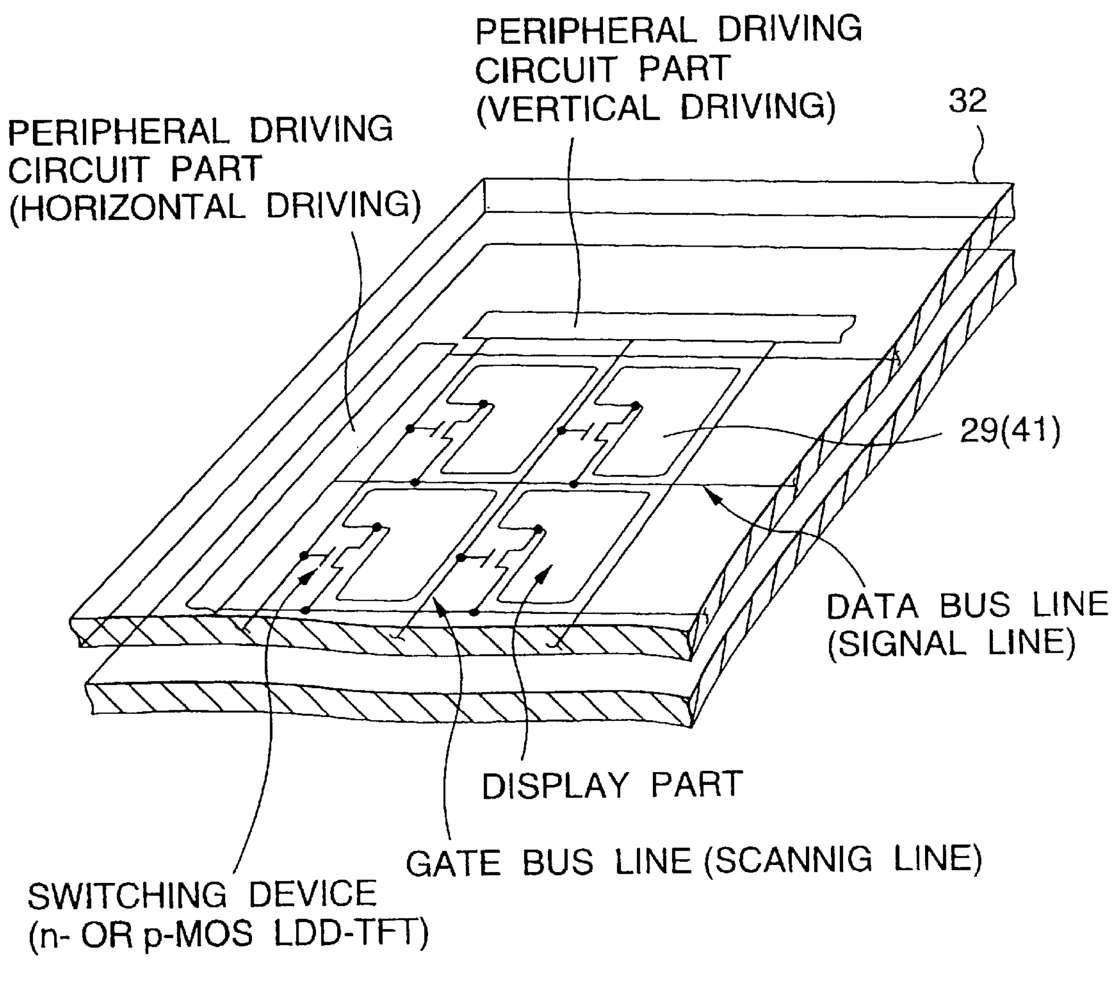
FIG. 2 is a perspective view showing a schematic layout of the whole of the LCD (liquid crystal display device) according to the first embodiment of the invention.

As shown in FIG. 2, the active matrix reflection type LCD has a flat panel structure formed by adhering a main substrate 1 (which constitutes an active matrix substrate) and a counter substrate 32 through a spacer (which is not shown in the figure), and a liquid crystal (which is not shown in the figure) is sealed between the substrates 1 and 32. A display part comprising a pixel electrode 29 (or 41) arranged in a matrix form and a switching element driving the pixel electrode, and a peripheral driving circuit part connected to the display part are provided on the surface of the main substrate 1.

The switching element of the display part is constituted with a top gate type MOS TFT having an LDD structure comprising the nMOS, pMOS or cMOS according to the invention. In the peripheral driving circuit part, a top gate type MOS TFT comprising cMOS, nMOS, PMOS TFT or mixtures thereof according to the invention is formed as a circuit element. The peripheral driving circuit part of one side is a horizontal driving circuit, which drives the TFT of the respective pixels per the horizontal line by supplying a data signal, and the peripheral driving circuit part of the other side is a vertical driving circuit, which drives a gate of the TFT of the respective pixels per the scanning line, which are generally arranged on both edges of the display part. The driving circuits may be either the dot sequential analog system or the line sequential digital system.

Figure 3:
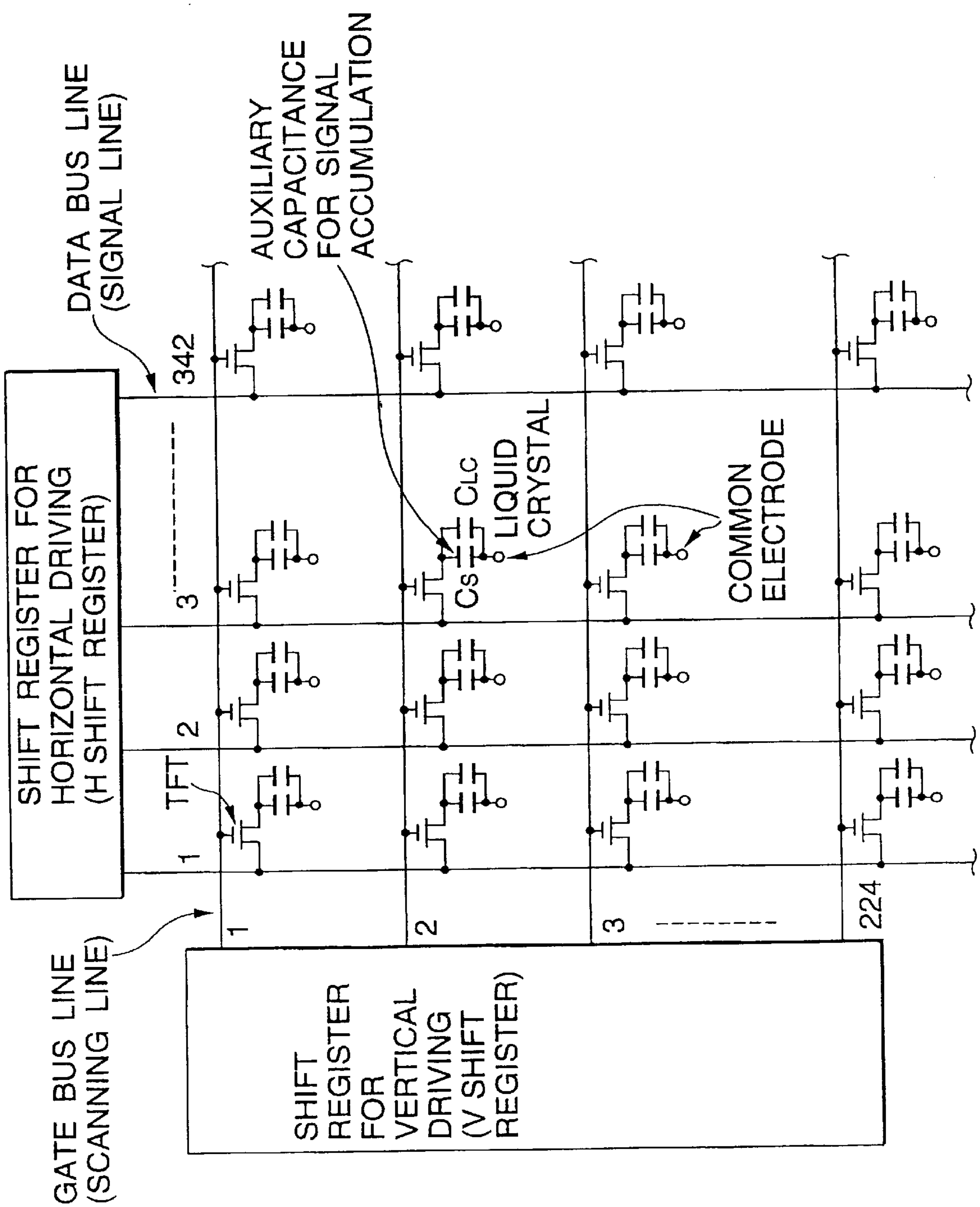
FIG. 3 is an equivalent circuit diagram of the LCD shown in FIG. 2.

As shown in FIG. 3, the TFT is arranged at the point of intersection of the gate bus line and the data bus line crossing perpendicularly, and image information is written in the liquid crystal capacitance ($C_{LC}$) through the TFT, which is maintained until the next information is loaded. In this case, because the information cannot be maintained only by the channel resistance of the TFT, it is possible that an accumulation capacitance (auxiliary capacitance) ($C_S$) is added in parallel to the liquid crystal capacitance to supplement the same, so that the decrease in liquid crystal voltage due to the leakage electric current is compensated. In the TFT for an LCD of this type, the characteristics of the TFT used in the pixel part (display part) and the characteristics of the TFT used in the peripheral driving circuit are different in demanded performance, and the control of the off electric current and the maintenance of the on electric current become an important factor in the TFT of the pixel part. Accordingly, by providing a TFT having an LDD structure described later in the display part, a structure, in which an electric field is difficult to be applied between the gate and the drain, is formed, to lower the substantive electric field applied to the channel region, so that the off electric current can be lowered, and the change in characteristics can be suppressed. However, it brings about problems, such as a complex process, a large element size and lowering of the on electric current, and therefore the optimum design corresponding to the respective usage is necessary.

Examples of the liquid crystal that can be used include a TN liquid crystal (a nematic liquid crystal used for a TN mode of active matrix driven), as well as liquid crystals for various modes, such as STN (super twisted nematic), GH (guest host), PC (phase change), an FLC (ferrodielectric liquid crystal), an AFLC (anti-ferrodielectric liquid crystal) and a PDLC (polymer dispersion type liquid crystal).

The mode of circuit and the driving mode thereof of the peripheral driving circuit will be briefly described with reference to FIG. 4. The driving circuit is divided into a gate side driving circuit and a data side driving circuit, and both the gate side and the data side necessarily constitute a shift resister. The shift register generally include one using both a PMOS TFT and an nMOS TFT (so-called CMOS circuit) and one using only one of them, and a cMOS TFT or a CMOS circuit are generally employed from the standpoint of operation speed, reliability and consuming electric power.

The scanning side driving circuit is constituted with a shift register and a buffer, and a pulse synchronized with the horizontal scanning interval is supplied to the respective lines via the shift register. On the other hand, examples of the data side driving circuit include the dot sequential system and the line sequential system, and in the dot sequential system shown in the figure, the constitution of the circuit is relatively simple, in which the display signal is directly written in the respective pixels through an analog switch with controlling by the shift register. The signal is written in the respective pixels one by one within one interval of the horizontal scanning time. (In the figure, the pixels are schematically shown for each colors by R, G and B.)

The active matrix reflection type LCD according to this embodiment will be described by the production process thereof with reference to FIGS. 5A to 13F. In FIGS. 5A to 10R, the diagrams on the left side show the production steps of the display part, and the diagrams on the right side show the production steps of the peripheral driving circuit part.

Figure 5A:
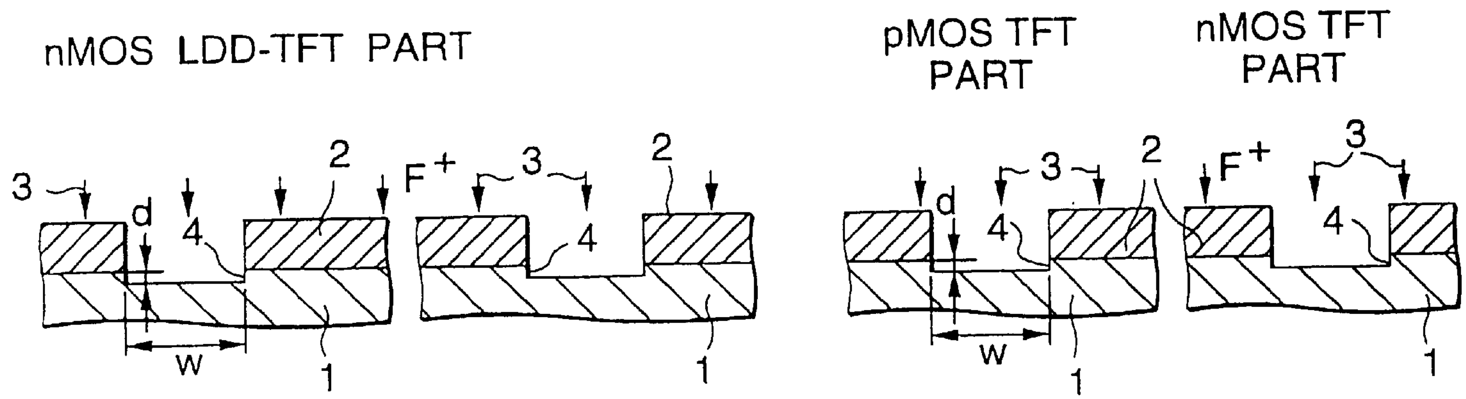

As shown in FIG. 5A, on one primary surface of an insulating substrate 1, such as quartz glass and transparent crystalline glass, a photoresist 2 is formed to have a prescribed pattern at least in the TFT forming region, and the substrate is irradiated, for example, with an F+ ion 3 of a $CF_4$ plasma using the photoresist 2 as a mask, so as to form plural numbers of steps 4 having suitable shape and dimension on the substrate 1 by a general purpose photolithography, such as reactive ion etching (RIE), and etching (photoetching).

In this case, a highly heat resistant substrate (from 8 to 12 inches in diameter, from 700 to 800 $\mu$m in thickness), such as quartz glass, transparent crystalline glass and ceramics can be used as the insulating substrate 1, provided that an opaque ceramics substrate and crystalline glass having low transparency cannot be used for a transmission LCD described later. The step 4 becomes a seed on epitaxial growth of single crystal silicon described later, and may have a depth d of from 0.1 to 0.4 $\mu$m, a width w of from 2 to 10 $\mu$m, and a length (in the direction perpendicular to the paper) of from 10 to 20 $\mu$m, in which the angle (bottom angle) formed by the bottom edge and the side wall is a right angle. On the surface of the substrate 1, in order to prevent diffusion of Na ion or the like from the glass substrate, an SiN film (for example, having a thickness of from 50 to 200 nm) and, depending on necessity, a silicon oxide film (hereinafter referred to as an $SiO_2$ film) (for example, having a thickness of about 100 nm) may be continuously formed.

Figure 5B:
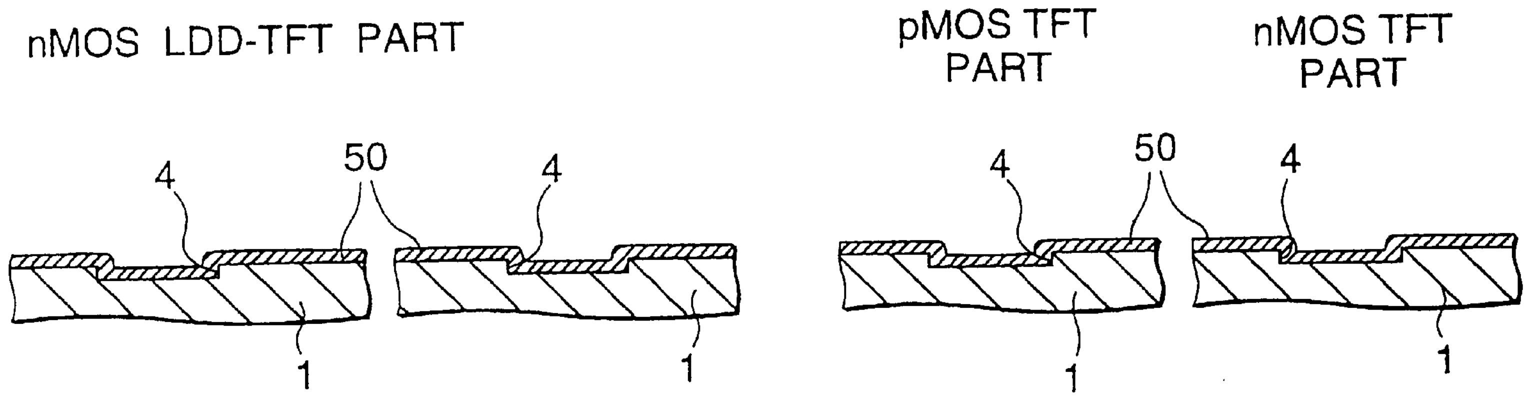

As shown in FIG. 5B, after removal of the photoresist 2, a crystalline sapphire film 50 (having a thickness of from 20 to 200 nm) is formed at least on the TFT forming region including the step 4 on the one primary surface of the insulating substrate 1. The crystalline sapphire film 50 is formed by oxidizing and crystallizing a trimethylaluminum gas with an oxidative gas (such as oxygen and moisture) by a high-density plasma CVD method or acatalyst CVD method (as described in JP-A-63-40314). A highly heat resistant glass substrate (from 8 to 12 inches in diameter, from 700 to 800 $\mu$m in thickness) can be used as the insulating substrate 1.

As shown in FIG. 5C, a silicon-indium molten liquid 6 containing about 1% by weight of silicon is coated on the substrate 1 heated to a temperature of from 900 to 930° C. on the whole surface of the crystalline sapphire film 50 including the step 4. Alternatively, it is possible that the substrate 1 is dipped into the molten liquid, or the substrate 1 is floated by gradually moving on the surface of the molten liquid. A spray method and a contact method under application of ultrasonic vibration can also be employed.

Figure 6D:
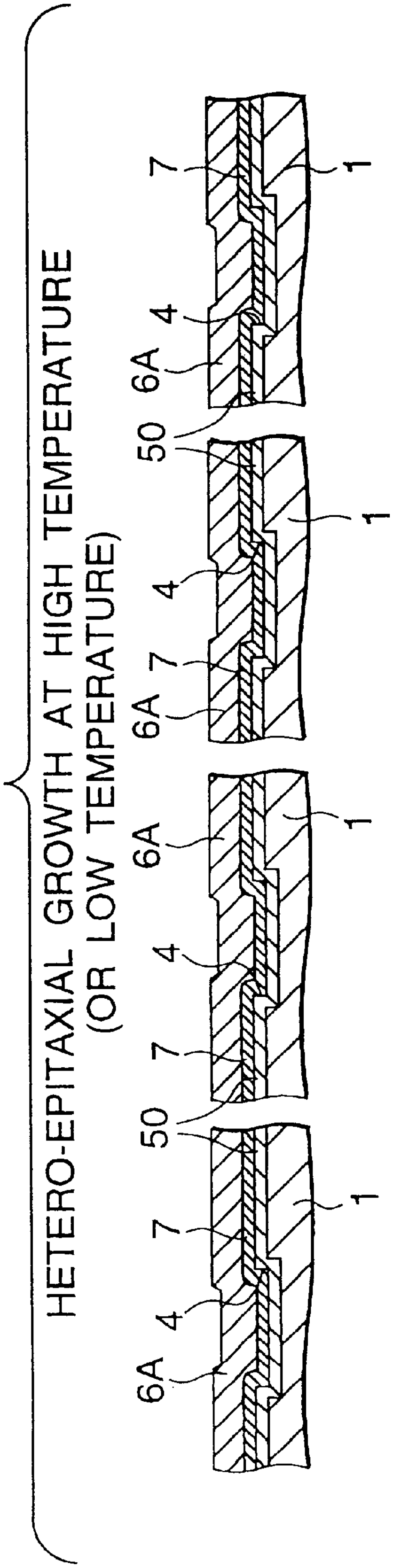
FIGS. 6D to 6F are cross sectional views stepwise showing the production process of the same LCD.

After the substrate 1 is maintained for several minutes to several tens minutes, it is gradually cooled (gradually withdrawn in the case of dipping), so that silicon dissolved in indium is subjected to hetero-epitaxial growth with the crystalline sapphire film 50 as a seed (and further the corner at the bottom of the step 4) as shown in FIG. 6D, to deposit as a P-type single crystal silicon layer 7 having a thickness, for example, of about 0.1 $\mu$m. In the case of the dipping method and the floating method, the composition and temperature of the molten liquid and the withdrawing rate are easily controlled, and therefore the thickness of the epitaxially grown layer and the concentration of the P-type carrier impurity can be easily controlled.

Figure 12A:
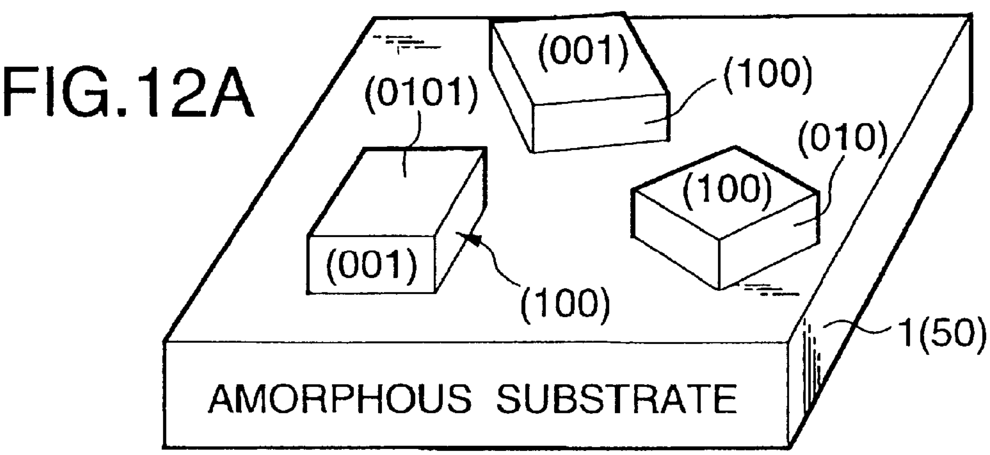
FIGS. 12A and 12B are schematic perspective views showing the state of growth of a silicon crystal on an amorphous substrate.
Figure 12B:
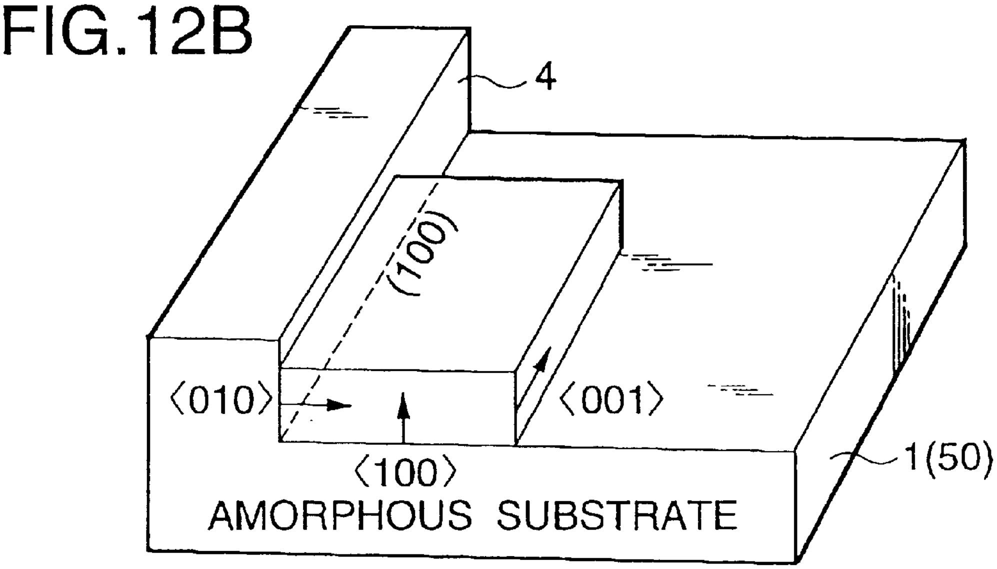
Figure 13A:
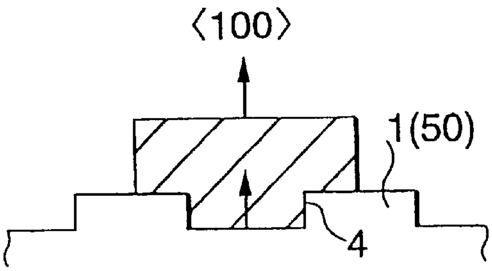
FIGS. 13A to 13F are schematic cross sectional views showing the relationship between various shapes of steps and the azimuth of crystal growth of silicon in the grapho-epitaxial growing technique.
Figure 13B:
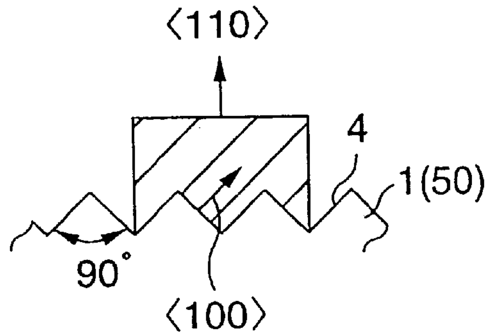
Figure 13C:
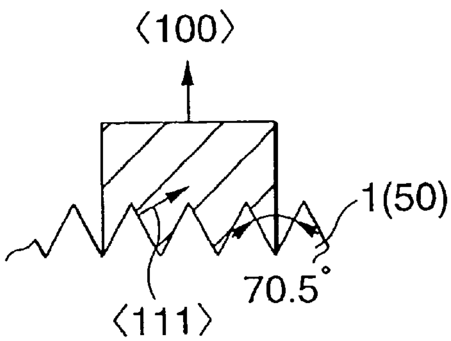
Figure 13D:
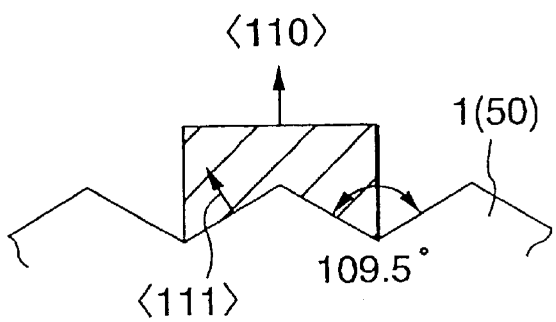
Figure 13E:
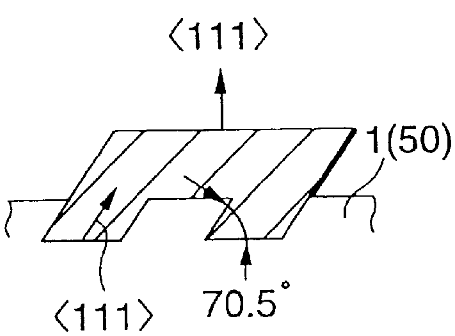
Figure 13F:
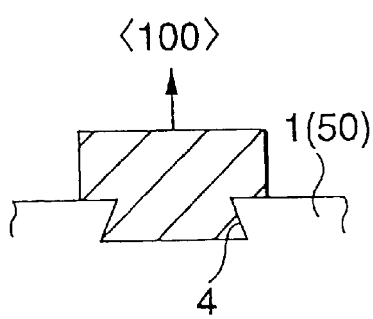

In the single crystal silicon layer 7 thus accumulated, the (100) plane, for example, is hetero-epitaxially grown on the substrate because the crystalline sapphire film 50 exhibits good lattice matching with single crystal silicon. In this case, the step 4 also contributes to the hetero-epitaxial growth including the known phenomenon called the grapho-epitaxial growth, and the single crystal silicon layer 7 having higher crystallinity can be obtained. With respect to this phenomenon, as shown in FIGS. 12A and 12B, when a vertical wall like the step 4 is formed on an amorphous substrate (glass) 1, and an epitaxy layer is formed thereon, the layer having random plane azimuth as shown in FIG. 12A is subjected to crystal growth, in which the (100) plane grows along the wall of the step 4 as shown in FIG. 12B. While the size of the single crystal particle increases in proportion to the temperature and the time, the interval of the step is necessarily made smaller when the temperature and the time are decreased and shortened. Furthermore, by variously changing the shape of the step as shown in FIGS. 13A to 13F, the crystal azimuth of the growing layer can be controlled. In the case where a MOS transistor is formed, the (100) plane is most frequently employed. In other words, in the cross sectional shape of the step 4, the angle at the edge of the bottom (bottom angle) may be a right angle, or the side wall may be slanted from the upper end to the lower end toward the inside or the outside, and it is sufficient that it has a plane of a particular azimuth in that crystal growth liable to occur. In general, the bottom angle of the step 4 is preferably 90° or less, and it is also preferred that the edge part of the bottom surface has a small curvature.

Figure 6E:
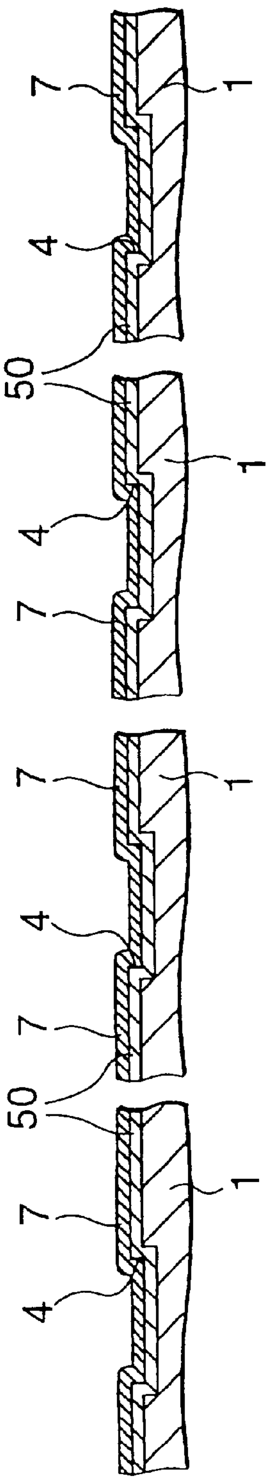

After thus depositing the single crystal silicon layer 7 on the substrate 1 by the hetero-epitaxial growth, as shown in FIG. 6E, the indium film 6A deposited on the upper surface is dissolved and removed with hydrochloric acid or sulfuric acid (at which a post treatment is conducted not to form a lower silicon oxide film), and a top gate type MOS TFT having a channel region comprising the single crystal silicon layer 7 is then produced.

Figure 6F:
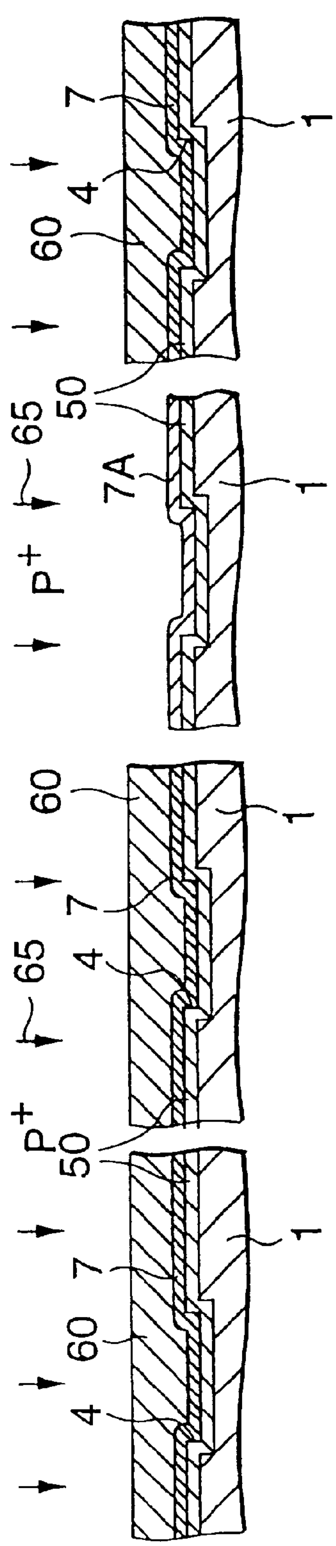

The single crystal silicon layer 7 formed by the hetero-epitaxial growth is of P-type due to inclusion of indium, but the concentration of the P-type impurity is scattered. Therefore, the p-channel MOS TFT part is masked with a photoresist (not shown in the figure), and doping is conducted with a P-type impurity ion (for example, $B^+$) at 10 kV to a dose amount of $2.7\times10^{11}$ atoms/cm$^2$, so as to adjust the specific resistance. As shown in FIG. 6F, in order to control the concentration of the impurity in the pMOS TFT forming region, the nMOS TFT part is masked with a photoresist 60, and doping is conducted with an N-type impurity ion (for example, P+) 65 at 10 kV to a dose amount of $1\times10^{11}$ atoms/cm, so as to form an N-type well 7A.

Figure 7G:
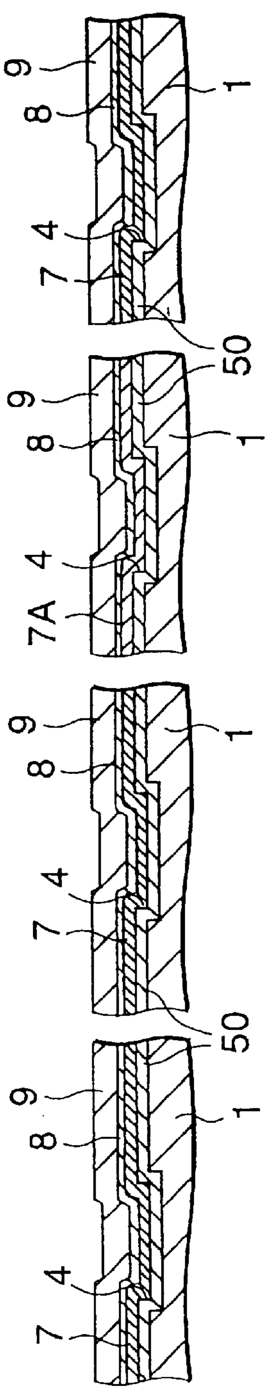
FIGS. 7G to 7I are cross sectional views stepwise showing the production process of the same LCD.

As shown in FIG. 7G, $SiO_2$ (having a thickness of about 200 nm) and SiN (having a thickness of about 100 nm) are then continuously formed in this order on the whole surface of the single crystal silicon layer 7 by a plasma CVD method, a high density plasma CVD method or a catalyst CVD method, to form a gate insulating film 8, and a sputtering film 9 (having a thickness of from 500 to 600 nm) comprising molybdenum-tantalum (Mo.Ta) alloy is further formed.

Figure 7H:
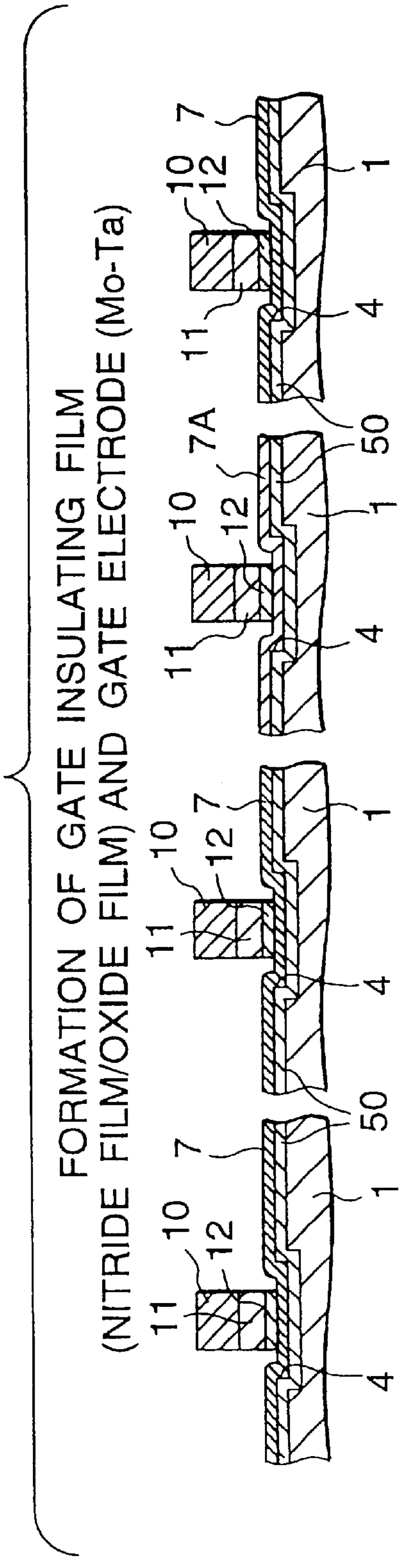

As shown in FIG. 7H, a photoresist pattern 10 is formed on the step part (inside the concave part) of the TFT part of the display region and the TFT part of the peripheral driving circuit region by a general purpose photolithography technique, and a gate electrode 11 comprising Mo.Ta alloy and a gate insulating film ($SiN/SiO_2$) 12 are formed by continuous etching, so as to expose the single crystal silicon film 7. The Mo.Ta alloy film 9 is treated with an acidic etching liquid, the SiN is treated by plasma etching with a $CF_4$ gas, and the S102 is treated with a hydrofluoric acid series etching liquid.

Figure 7I:
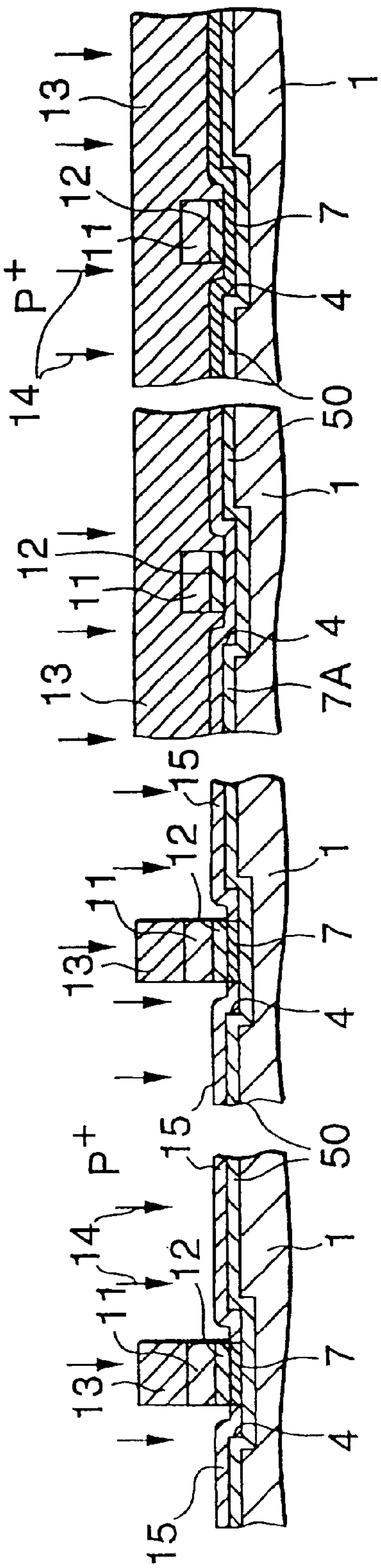

As shown in FIG. 7I, all the nMOS and PMOS TFT of the peripheral driving circuit region and the gate part of the nMOS TFT of the display part region are covered with a photoresist 13, and the exposed source/drain region of the nMOS TFT is doped (ion implantation) with a phosphorous ion 14, for example, at 20 kV to a dose amount of $5\times10^{13}$ atoms/cm$^2$, so as to form an LDD part 15 comprising an $N^-$-type layer in a self aligning manner.

Figure 8J:
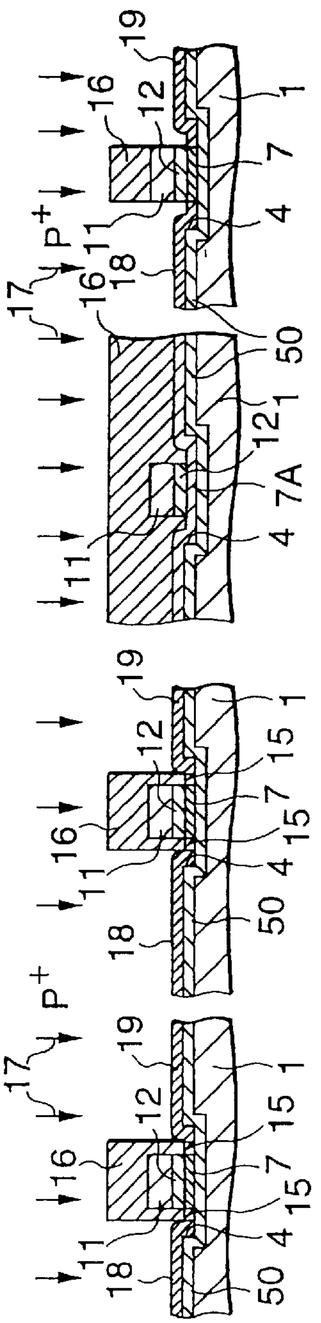
FIGS. 8J to 8L are cross sectional views stepwise showing the production process of the same LCD.

As shown in FIG. 8J, the whole of the pMOS TFT of the peripheral driving circuit region, the gate part of the nMOS TFT of the peripheral driving circuit region, and the gate and the LDD part of the nMOS TFT of the display part region are covered with a photoresist 16, and the exposed region is doped (ion implantation) with a phosphorous or arsenic ion 17, for example, at 20 kV to a dose amount of $5\times10^{15}$ atoms/cm$^2$, so as to form a source part 18, a drain part 19 and an LDD part 15 comprising an $N^+$-type layer of the nMOS TFT.

Figure 8K:
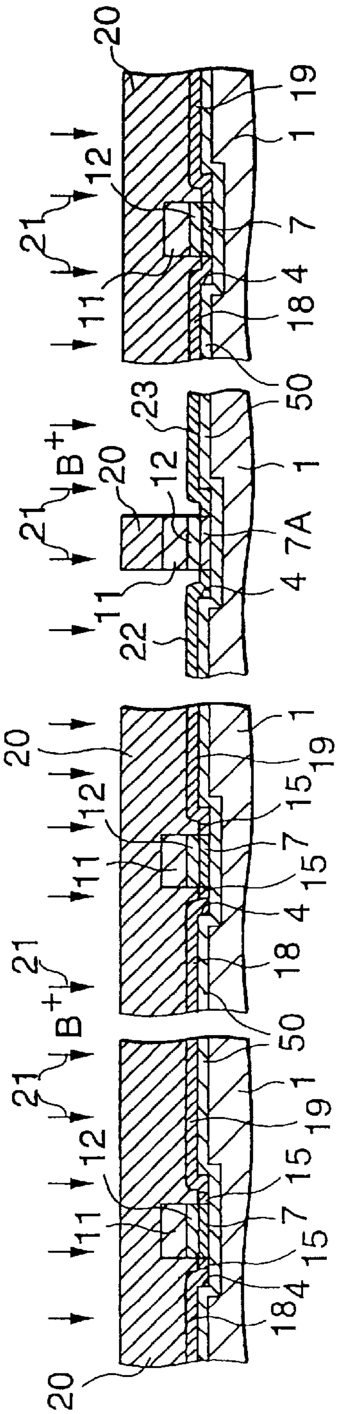

As shown in FIG. 8K, the nMOS TFT of the peripheral driving circuit region, the whole of the nMOS TFT and the gate part of the pMOS TFT of the display part region are covered with a photoresist 20, and the exposed region is doped (ion implantation) with a boron ion 21, for example, at 10 kV to a dose amount of $5\times10^{15}$ atoms/cm$^2$, so as to form a source part 22 and a drain part 23 of the $P^+$-layer of the pMOS TFT. In the case of the nMOS peripheral driving circuit, this operation is unnecessary since there is no PMOS TFT.

Figure 8L:
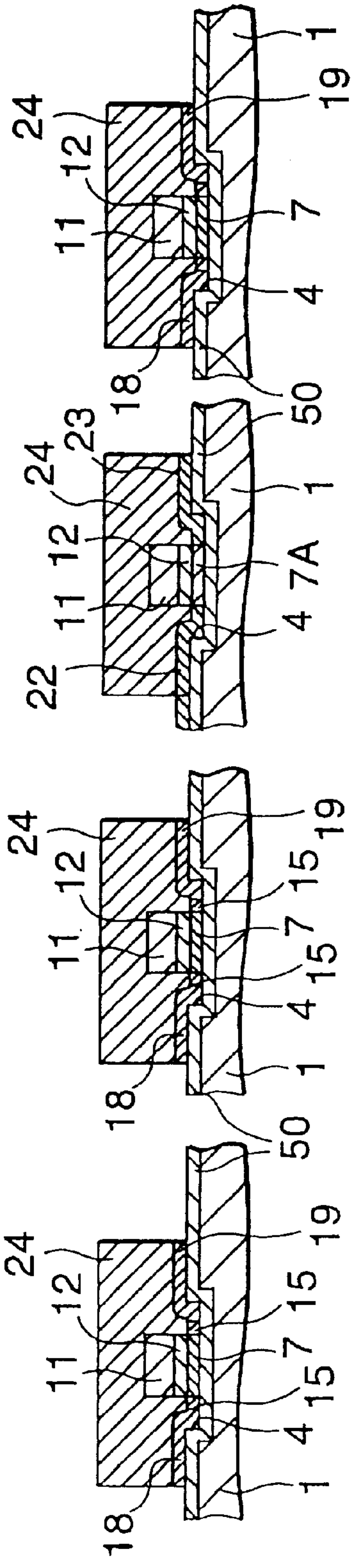

As shown in FIG. 8L, in order to form an island of the active element part, such as a TFT and a diode, and a passive element part, such as a resistance and an inductance, a photoresist 24 is then formed, and the single crystal silicon thin film layer other than the active element part and the passive element part on all the peripheral driving circuit region and the display part region is removed by a general purpose photolithography and etching technique. The etching liquid is hydrofluoric acid series.

Figure 9M:
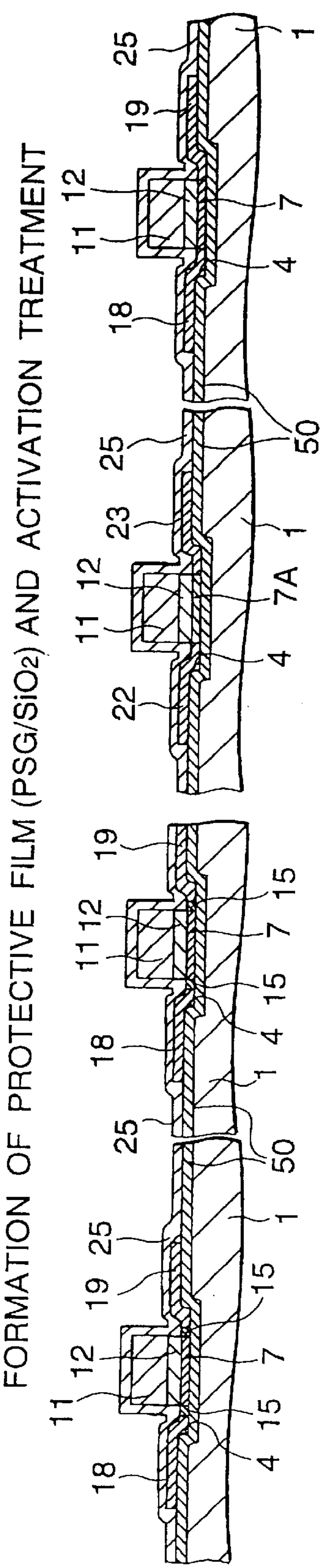
FIGS. 9M to 9O are cross sectional views stepwise showing the production process of the same LCD.

As shown in FIG. 9M, an $SiO_2$ film (having a thickness of about 200 nm) and a phosphorous silicate glass (PSG) film (having a thickness of about 300 nm) are continuously formed in this order on the whole surface by a plasma CVD method, a high density plasma CVD method or a catalyst CVD method, so as to form a protective film 25.

Thereafter, the single crystal silicon layer in this state is subjected to an activation treatment. In the activation treatment, the lamp annealing conditions, such as halogen, are at about 1,000° C. for about 10 seconds. A gate electrode material withstanding the treatment is necessary, and an Mo-Ta alloy having a high melting point is suitable. The gate electrode material can be not only provided in the gate part, but also drawn around a wide area as wiring. While expensive excimer laser annealing is not conducted in this embodiment, when it is used, the conditions thereof are preferably XeCl (wavelength: 308 nm) on the whole surface, or selective overlap scanning of 90% or more only for the active element part and the passive element part.

Figure 9N:
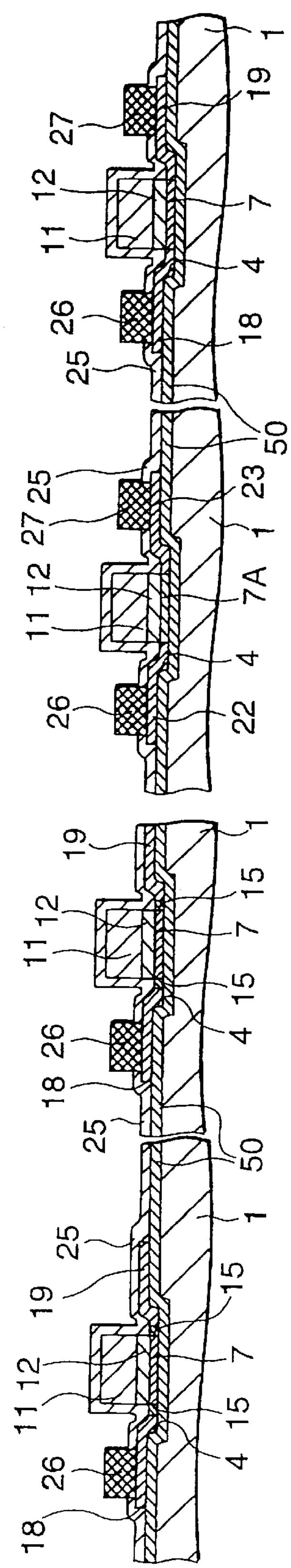

As shown in FIG. 9N, contact holes are formed in the source/drain parts of all the TFTs of the peripheral driving circuit and the source part of the TFT for display by a general purpose photolithography and etching technique.

A sputtering film, such as aluminum, an aluminum alloy, e.g., aluminum containing 1% of Si and aluminum containing from 1 to 2% of copper, and copper, having a thickness of from 500 to 600 nm is formed on the whole surface. A source electrode 26 of all the TFTs of the peripheral driving circuit and the display part and a drain electrode 27 of the peripheral driving circuit part are formed by a general purpose photolithography and etching technique, and simultaneously a data line and a gate line are formed. Thereafter, a sinter treatment is conducted in a forming gas ($N_2$+$H_2$) at about 400° C. for 1 hour.

Figure 9O:
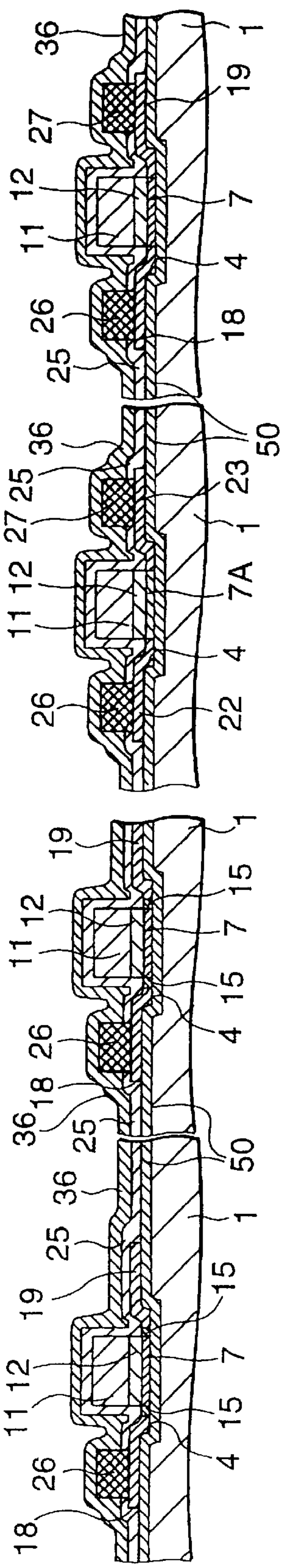

As shown in FIG. 9O, an insulating film 36 comprising a PSG film (having a thickness of about 300 nm) and an SiN film (having a thickness of about 300 nm) is formed on the whole surface by a plasma CVD method, a high density plasma CVD method or a catalyst CVD method. Contact holes in the drain part of the TFT for display are then formed. The $SiO_2$ film, the PSG film and the SiN film on the pixel part need not be removed.

Figure 10P:
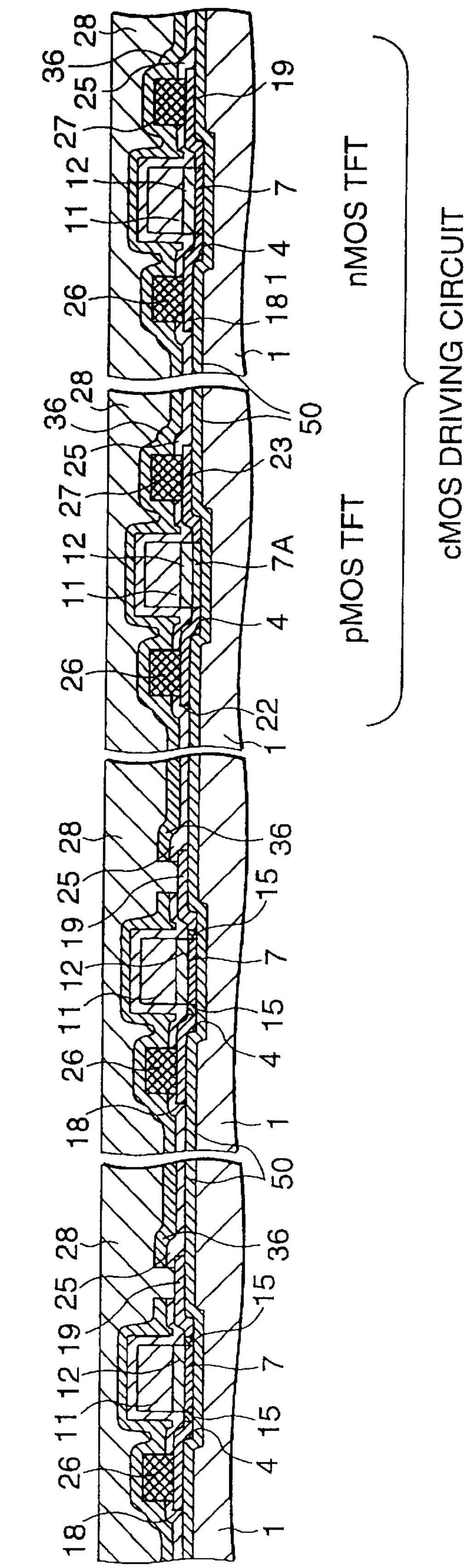
FIGS. 10P to 10R are cross sectional views stepwise showing the production process of the same LCD.
Figure 10Q:
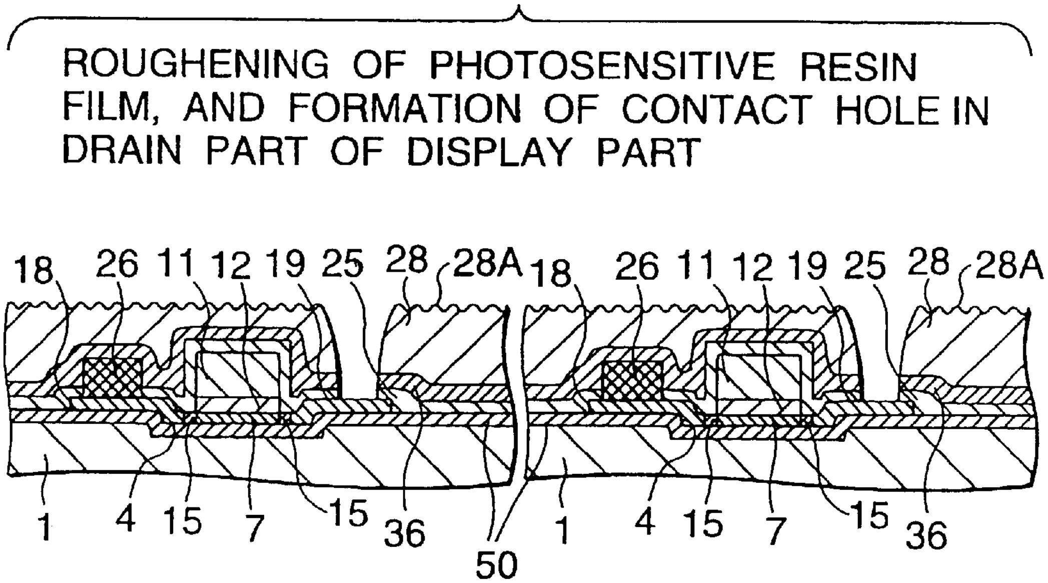

As a basic requirement of the reflection type liquid crystal display device, both a function of reflecting incident light into the interior of the liquid crystal panel and a function of scattering the light must be attained. This is because while the direction of the observer viewing the display is substantially constant, the direction of the incident light cannot be determined at once. Therefore, the reflection plate must be designed with considering the situations in that a point light source is present in an arbitrary direction. Accordingly, as shown in FIG. 10P, a photosensitive resin film 28 having a thickness of from 2 to 3 $\mu$m is formed on the whole surface by spin coating, and as shown in FIG. 10Q, an unevenness pattern for obtaining the optimum reflection characteristics and viewing angle characteristics is formed at least on the pixel part by a general purpose photolithography and etching technique, so as to form a lower part of the reflection face comprising an uneven roughened surface 28A by reflowing. Simultaneously, contact holes are formed in the resin film on the drain part of the TFT for display.

Figure 10R:
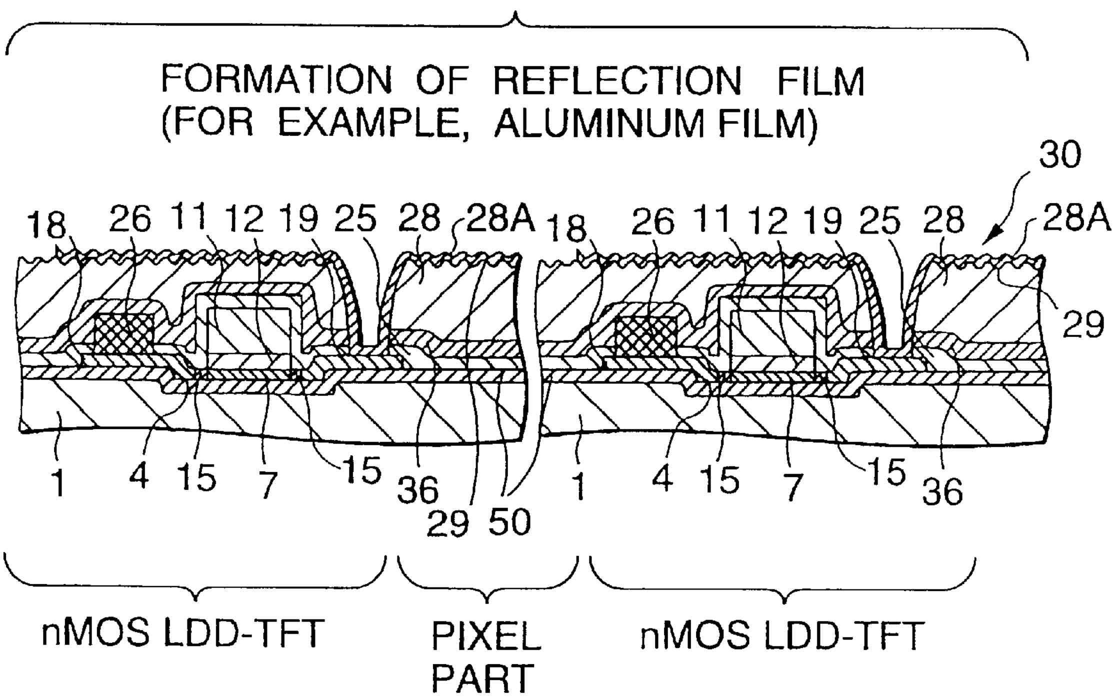

As shown in FIG. 10R, a sputtering film comprising aluminum or aluminum containing 1% of Si having a thickness of from 400 to 500 nm is formed on the whole surface, and the aluminum film other than on the pixel part is removed by a general purpose photolithography and etching technique, so as to form a reflection part 29 comprising aluminum having an uneven shape connected to the drain part 19 of the TFT for display. This is used as a pixel electrode for display. Thereafter, a sinter treatment is conducted in a forming gas at about 300° C. for 1 hour, to ensure the contact. In order to increase the reflectivity, silver and a silver alloy may be used instead of the aluminum series materials.

According to the procedures described above, an active matrix substrate 30, in which the display part and the peripheral driving circuit part are integrated, can be produced, which is formed in such a manner that the single crystal silicon layer 7 is formed by high temperature heteroepitaxial growth using the crystalline sapphire film 50 including the step 4 as a seed, and the CMOS circuit comprising the top gate type nMOS LDD-TFT, the pMOS TFT and the nMOS TFT is formed in the display part and the peripheral driving circuit part comprising the single crystal silicon layer 7.

A process for producing a reflection type liquid crystal display device (LCD) using the active matrix substrate (driving substrate) 30 will be described with reference to FIG. 11. Hereinafter, the active matrix substrate is called as a TFT substrate.

In the case where a liquid crystal cell of the LCD is produced by a face-to-face fabrication method (which is suitable for a medium scale to large scale liquid crystal panel having a size of 2 inches or more), polyimide oriented films 33 and 34 are formed on the element forming surfaces of the TFT substrate 30 and a counter substrate 32 having a solid ITO (indium tin oxide) electrode 31 on the whole surface thereof. The polyimide oriented film is formed by roll coating or spin coating to have a thickness of from 50 to 100 nm, and then hardened at 180° C. for 2 hours.

The TFT substrate 30 and the counter substrate 32 are subjected to a rubbing or photo-orientation treatment. Examples of a rubbing buff material include cotton and rayon, and cotton is more stable from the standpoint of buff dusts and retardation. The photo-orientation treatment is a non-contact orientation technique using irradiation of a linear polarized ultraviolet ray. The orientation can also be conducted by, other than rubbing, incidence of polarized or non-polarized light from a slanted direction to form a polymeric orientation film. Examples of such a polymer compound include a polymethyl methacrylate series polymer having azobenzene.

After washing, a common agent is coated on the TFT substrate 30, and a seal agent is coated on the counter substrate 32. In order to remove the rubbing buff dusts, they are washed with water or IPA (isopropyl alcohol). The common agent may be an acryl, epoxyacrylate or epoxy series adhesive containing a conductive filler, and the seal agent may be an acryl, epoxyacrylate or epoxy series adhesive. Hardening can be conducted by either heating, irradiation of an ultraviolet ray or a combination of heating and irradiation of an ultraviolet ray, and hardening by a combination of heating and irradiation of an ultraviolet ray is preferred from the standpoint of precision of overlap and workability.

A spacer for obtaining a prescribed gap is then scattered on the counter substrate 32, and it is overlapped with the TFT substrate 30 at a prescribed position. After an alignment mark on the counter substrate 32 and an alignment mark on the TFT substrate 30 are met each other with high precision, a seal agent is irradiated with an ultraviolet ray to be pre-hardened, and the whole is then hardened by heating.

The assembly is then subjected to scribe breaking to produce a single liquid crystal panel formed by overlapping the TFT substrate 30 and the counter substrate 32.

A liquid crystal 35 is then injected in the gap between the substrates 30 and 32, and after sealing the injection inlet with an ultraviolet adhesive, the assembly is washed with IPA. The species of the liquid crystal are not limited, and for example, a TN (twist nematic) mode of high speed response using a nematic liquid crystal is generally used.

The assembly is then subjected to heating and quenching, so that the liquid crystal 35 is subjected to orientation.

A flexible wiring is connected to a lead part of a panel electrode of the TFT substrate 30 by thermal compression bonding of an anisotropic conductive film, and a polarizing plate is adhered to the counter substrate 32.

In the case of the liquid crystal panel unit fabrication (which is suitable for producing a small scale liquid crystal panel having 2-inch size or smaller), as similar to the above, polyimide oriented films 33 and 34 are formed on the element forming surfaces of the TFT substrate 30 and the counter substrate 32, and the substrates are subjected to rubbing or non-contact orientation treatment with a linear polarizing ultraviolet ray.

The assembly of the TFT substrate 30 and the counter substrate 32 is divided into unit pieces by dicing or scribe breaking, and washed with water or IPA. A common agent is coated on the TFT substrate 30, and a seal agent containing a spacer is coated on the counter substrate 32, which are overlapped each other. The subsequent steps are the same as above.

In the reflection type LCD described above, the counter substrate 32 is a CF (color filter) substrate, in which a color filter layer 46 is formed under the ITO electrode 31. Incident light from the side of the counter substrate 32 is effectively reflected by the reflection film 29, and emitted from the side of the counter substrate 32.

Figure 11:
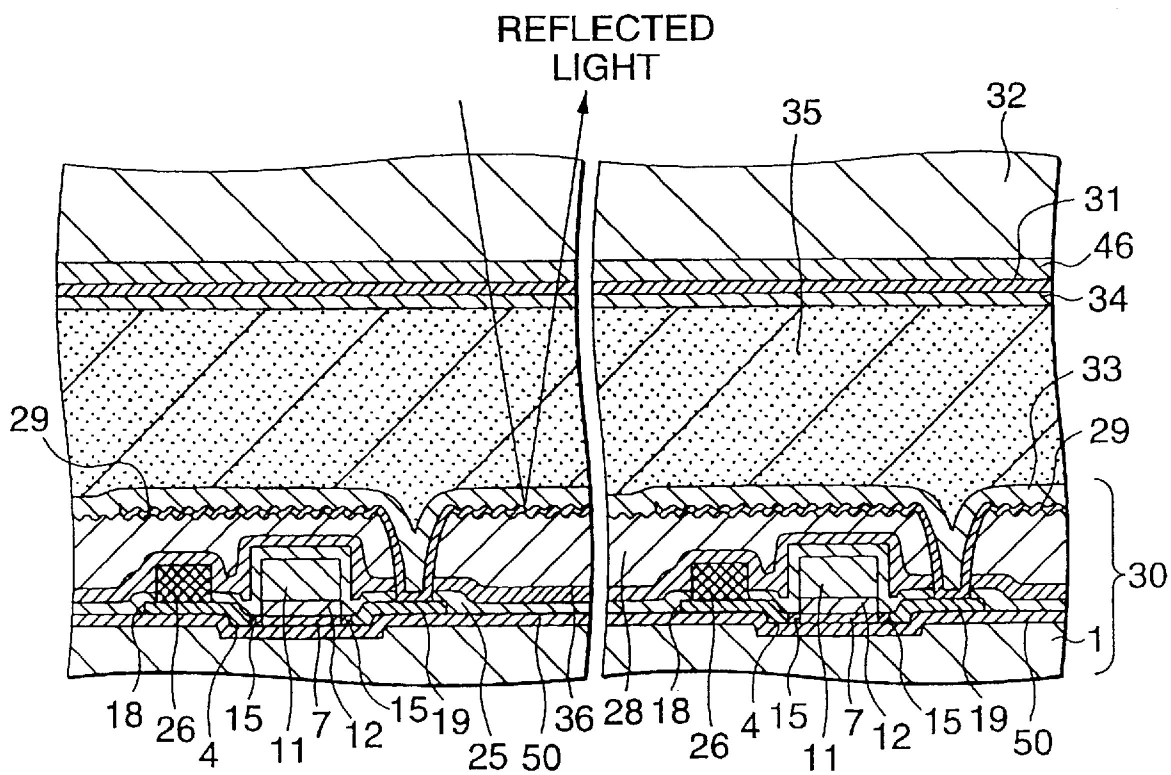
FIG. 11 is a cross sectional view showing an important part of the same LCD.

On the other hand, other than the substrate structure shown in FIG. 11, the TFT substrate 30 may be a TFT substrate having an on-chip color filter (OCCF) structure, in which a color filter is provided in the TFT substrate 30. In this case, a solid ITO electrode (or a solid ITO electrode with a black mask) is formed on the whole surface of the counter substrate 32.

In the case where an auxiliary capacitance Cs is installed in the pixel part as shown in FIG. 3, the dielectric layer (not shown in the figure) provided on the substrate 1 is connected to the drain region 19 of the single crystal silicon.

According to the embodiment described above, the following considerable effects can be obtained.

(a) The crystalline sapphire film 50 is formed on the substrate 1 provided with the step 4 having the prescribed shape and dimension, and the high temperature hetero-epitaxial growth is conducted by using the crystalline sapphire film 50 as a seed (provided that, the heating temperature on growth is relatively low as from 900 to 930° C.), so that the single crystal silicon thin film 7 having a high electron mobility of 540 $cm^2/v\cdot sec$ or more can be obtained. Thus, an LCD having a high performance driver installed therein can be produced. Because the step 4 accelerates the hetero-epitaxial growth, the single crystal silicon layer 7 having higher crystallinity can be obtained.

(b) Because the single crystal silicon layer exhibits a higher electron and hole mobility equivalent to a single crystal silicon substrate than the conventional amorphous silicon thin film and the conventional polycrystalline silicon thin film, a single crystal silicon top gate type MOS TFT can have a structure, in which a display part comprising cMOS, nMOS or pMOS TFT having an LDD structure of high switching characteristics and a low leakage electric current and a peripheral driving circuit part comprising cMOS, nMOS, pMOS TFT or mixtures thereof having a high driving performance are integrated, and a display panel of a high image quality, high minuteness, a small frame, a large image area and high efficiency is realized. Because the single crystal silicon layer 7 exhibits a sufficiently high hole mobility, a peripheral driving circuit driving either a sole electron or hole, or a combination thereof can be produced, and a panel, in which the TFT for display having an LDD structure of nMOS, PMOS or cMOS is integrated with the peripheral driving circuit, can be realized. In the case of a small scale to medium scale panel, there is a possibility of omitting one of the pair of peripheral vertical driving circuits.

(c) Because the heat treatment temperature on the hetero-epitaxial growth can be 930° C. or lower, the single crystal silicon film 7 can be uniformly formed on the insulating substrate at a relatively low temperature (for example, from 900 to 930° C.). As the substrate, for example, quartz glass, crystalline glass and a ceramic substrate can be used.

(d) Because annealing of a long period of time at a medium temperature and excimer laser annealing as in the solid phase growing method are unnecessary, the production cost can be reduced since the productivity is high, and an expensive production equipment is not necessary.

(e) In the high temperature hetero-epitaxial growth, because a single crystal silicon thin layer having wide ranges of the concentration of a p-type impurity and a high mobility can be obtained by adjusting the crystallinity of the crystalline sapphire film, the compositional ratio of indium and silicon, the shape of the step, the heat temperature to the substrate the temperature of the molten liquid, the cooling rate and the concentrations of the N-type or P-type carrier impurities added, the adjustment of Vth (threshold value) can be easily conducted, and high speed operation due to a low resistance can be realized.

(f) When the color filter is installed on the display array part, improvement in opening ratio and illuminance of the display panel, and reduction in production cost by omission of a color filter substrate and improvement in productivity can be realized.

(g) Since the crystalline sapphire film functions as a diffusion barrier of various atoms, diffusion of an impurity from the glass substrate can be suppressed.

Second Embodiment

The second embodiment of the invention will be described with reference to FIGS. 14A to 16D.

Figure 14A:
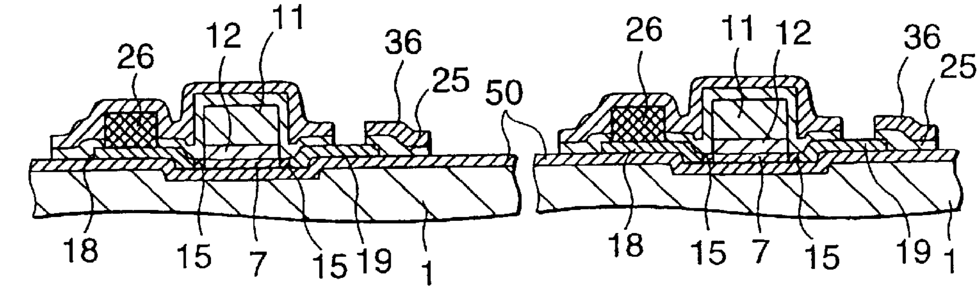
FIGS. 14A to 14C are cross sectional views stepwise showing the production process of the LCD according to the second embodiment of the invention.

This embodiment has a top gate type MOS TFT in the display part and the peripheral driving circuit part as similar to the first embodiment, but relates to a transmission LCD as different from the first embodiment. That is, although this embodiment is the same as the steps from FIG. 5A to FIG. 9O, after these steps, a contact hole 19 for the drain part of the TFT for display is formed in the insulating films 25 and 36, and simultaneously the unnecessary $SiO_2$, PSG and SiN films on the pixel opening part are removed to improve the transmissibility, as shown in FIG. 14A.

Figure 14B:
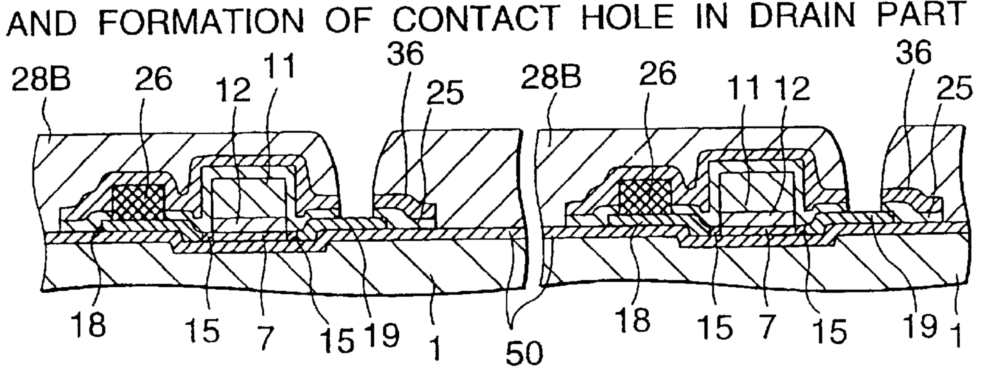

As shown in FIG. 14B, a flattening film 28B comprising a photosensitive acryl series transparent resin having a thickness of from 2 to 3 $\mu$m is then formed by spin coating on the whole surface, and a contact hole is formed in the transparent resin 28B on the drain side of the TFT for display by a general purpose photolithography, followed by subjecting hardening under a prescribed condition.

Figure 14C:
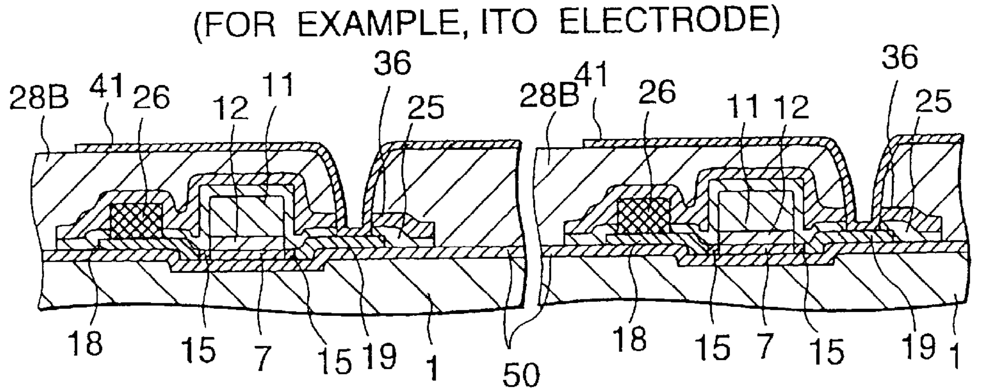

As shown in FIG. 14C, an ITO sputtering film having a thickness of from 130 to 150 nm is then formed on the whole surface, and an ITO transparent electrode 41 in contact with the drain part 19 of the TFT for display is formed by a general purpose photolithography and etching technique. Thereafter, the contact resistance between the drain of the TFT for display and the ITO is lowered, and the transparency of the ITO is improved by a heat treatment in a forming gas at a temperature of from 200 to 250° C. for 1 hour.

Figure 15:
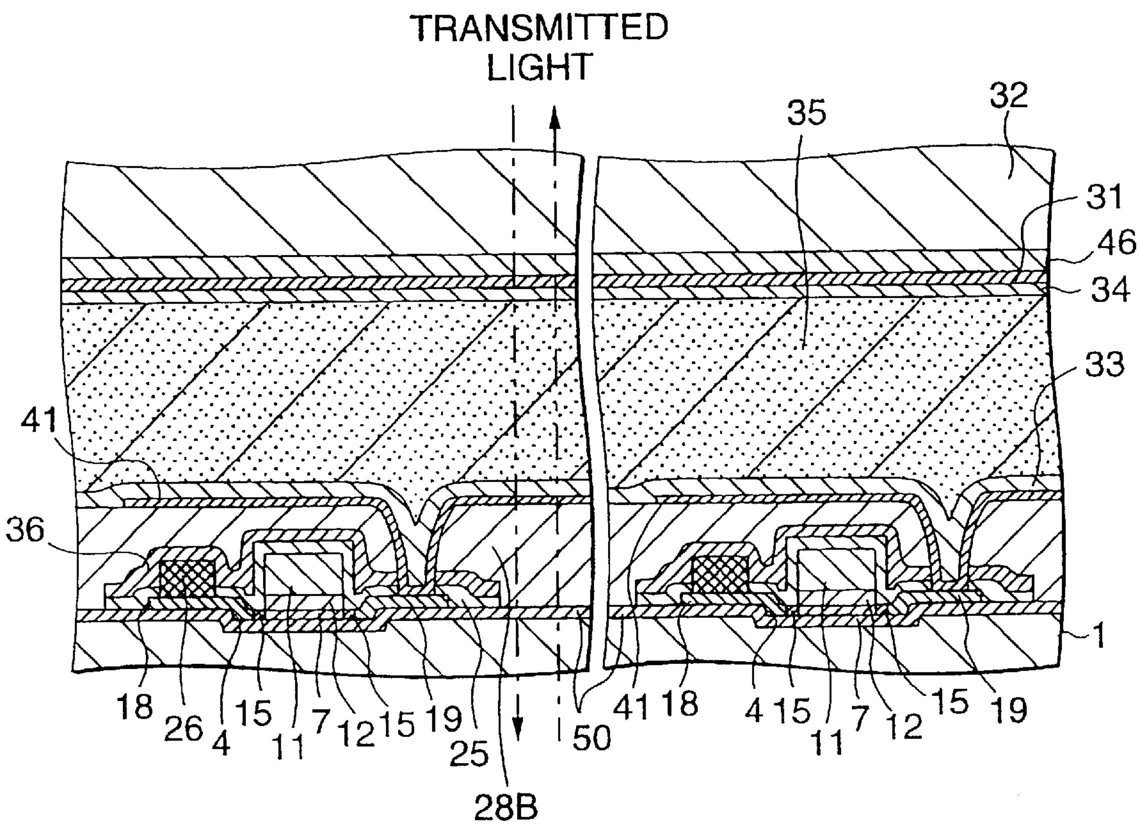
FIG. 15 is a cross sectional view showing an important part of the same LCD.

As shown in FIG. 15, the substrate is combined with a counter substrate 32 to fabricate a transmission type LCD in the similar manner as in the first embodiment, provided that a polarizing plate is also adhered on the TFT substrate side. In this transmission type LCD, transmission light indicated by the solid line is obtained, and also transmission light indicated by the chain line can be obtained from the side of the counter substrate 32.

In this transmission type LCD, an on-chip color filter (OCCF) structure and an on-chip black (OCB) structure can be produced.

Figure 16A:
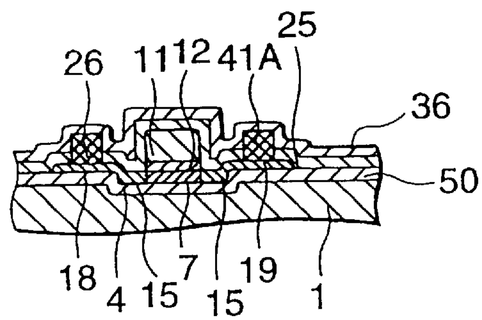
FIGS. 16A to 16D are cross sectional views stepwise showing the production process of the same LCD.

The steps of FIGS. 5A to 9N are conducted in the similar manner as above. Thereafter, as shown in FIG. 16A, after a contact hole is also formed in the drain part of the insulating film 25 of PSG/$SiO_2$, an aluminum embedded layer 41A for a drain electrode is formed, and an insulating film of SiN/PSG 36 is formed.

Figure 16B:
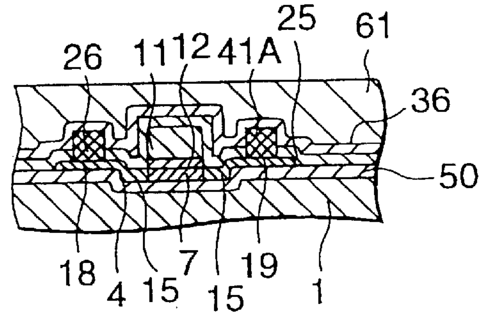
Figure 16C:
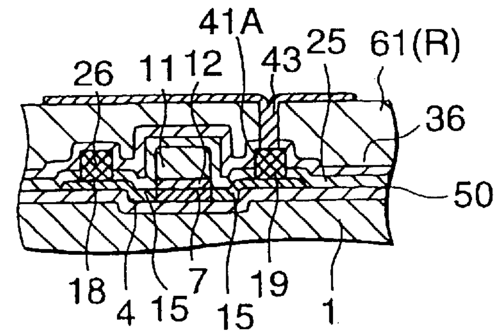

As shown in FIG. 16B, a photoresist 61 having a pigment dispersed therein corresponding to the respective segments of R, G and B having a prescribed thickness (from 1 to 1.5 μm) is formed, and as shown in FIG. 16C, color filter layers 61(R), 61(G) and 61(B) are formed by patterning, in which the layer is left at prescribed positions (respective pixel parts), using a general purpose photolithography technique (on-chip color filter structure). At this time, a contact hole for the drain part is also formed. An opaque ceramic substrate and a substrate comprising glass or a heat resistant resin having a low transmissibility cannot be used.

As shown in FIG. 16C, a contact hole connecting to the drain of the TFT for display is formed, and a light shielding layer 43 to be a black mask layer is formed by patterning a metal over the color filter layer. For example, a molybdenum film having a thickness of from 200 to 250 nm is formed by a sputtering method, and the film is patterned into a prescribed shape to shield from light to cover the TFT for display (on-chip black structure).

Figure 16D:
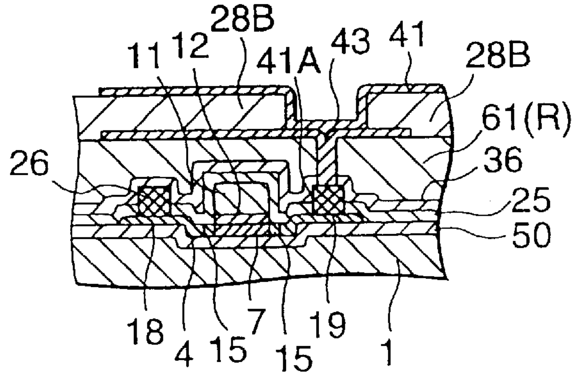

As shown in FIG. 16D, a flattening film 28B comprising a transparent resin is then formed, and an ITO transparent electrode 41 is formed on a contact hole formed in the flattening film to connect to the light shielding layer 43.

By installing the color filter 61 and the black mask 43 on the display array part in this embodiment, the opening ratio of the liquid crystal panel is improved, and the consuming electric power of the display module including a backlight can be lowered.

Thrid Embodiment

The third embodiment of the invention will be described.

This embodiment relates to an active matrix reflection type liquid crystal display device (LCD), in which the step (concave part) 4 and the crystalline sapphire film 50 are formed on a glass substrate having a low distortion point; a single crystal silicon layer is grown by low temperature hetero-epitaxial growth from a molten liquid of indium-gallium-silicon or gallium-silicon by using the step and the sapphire film as a seed; and a top gate type MOS TFT is formed by using the single crystal silicon layer.

In this embodiment, in comparison to the first embodiment, a glass substrate comprising glass having a low distortion point or a low maximum usable temperature of, for example, about 600° C., such as borosilicate glass and aluminosilicate glass, is used as the substrate 1 as show in FIG. 5A. Such a glass substrate is inexpensive and can be easily made large scale, and when it is formed into a large scale thin plate (for example, 500×600× 0.1 to 1.1 mm in thickness), it can be made into a roll and a continuous web. A quartz substrate and a crystalline glass substrate can also be employed.

After forming the step 4 and the crystalline sapphire film 50 in the same manner as above, a molten liquid of indium-gallium (or a molten liquid of gallium) containing silicon is coated on the crystalline sapphire film 50 as shown in FIG. 5C.

The silicon dissolved in indium-gallium (or gallium) is, by being gradually cooled, hetero-epitaxially grown with the crystalline sapphire film 50 (further a corner part at the bottom of the step 4) as a seed as shown in FIG. 6D, to be deposited as a single crystal silicon layer 7 having a thickness of, for example, about 0.1 μm.

In this case, the single crystal silicon layer 7 is formed by hetero-epitaxially growing the (100) plane on the substrate as similar to the above, and the crystal azimuth of the growing layer can be controlled by changing the shape of the step as shown in FIGS. 13A to 13F.

After thus depositing the single crystal silicon layer 7 on the substrate 1 by the low temperature hetero-epitaxial growth, the indium-gallium (or gallium) on the surface is dissolved and removed with hydrochloric acid or sulfuric acid as shown in FIG. 6E.

Thereafter, a top gate type MOS TFT is produced on the display part and the peripheral driving circuit part using the single crystal silicon layer 7 in the same manner as in the first embodiment. The structure shown in FIG. 11 may be applied to this embodiment.

According to this embodiment, the following considerable effects can be obtained in addition to the effects described for the first embodiment.

(a) The silicon single crystal thin film 7 can be uniformly formed on the glass substrate 1 by the hetero-epitaxial growth at a low temperature of about from 300 to 600° C. or from 420 to 600° C.

(b) Therefore, because the silicon single crystal thin film can be formed on an insulating substrate, such as an organic substrate as well as the glass substrate, a substrate material of a low distortion point and low cost with good physical property can be arbitrary selected, and the substrate can be large scale. Because the glass substrate and the organic substrate can be produced with a low cost in comparison to the quartz substrate and the ceramic substrate and can be formed into a thin plate, a continuous web and a roll, a large scale glass substrate in the form of a rolled continuous web having a silicon single crystal thin film formed thereon can be produced with good productivity at low cost. In the case where glass having a low glass distortion point (or maximum usable temperature) (for example, 500° C.) is used as the glass substrate, and the constitutional element is diffused from the interior of the glass to a layer formed thereon to affect the transistor characteristics, a barrier layer thin film (for example, a silicon nitride film having a thickness of about from 50 to 200 nm) may be formed to prevent the diffusion. The barrier layer can be omitted by the diffusion prevention effect of the crystalline sapphire film 50.

(c) In the low temperature hetero-epitaxial growth, because a wide range of the P-type impurity concentration and a single crystal silicon thin film having a high mobility can be easily obtained by adjusting the indium/gallium composition ratio of the indium-gallium film, the heating temperature and the cooling rate, the adjustment of vth can be easily conducted, and operation at higher speed by low resistance can be realized.

Fourth Embodiment

The fourth embodiment of the invention will be described.

In comparison to the third embodiment described above, this embodiment relates to a transmission type LCD, and in the production process thereof, as similar to the second embodiment described above, a single crystal silicon thin film can be formed by low temperature hetero-epitaxial growth using a molten liquid of indium-gallium.

A transmission type LCD can be produced by using the single crystal silicon thin film through the steps shown in FIGS. 14A to 16D as similar to the second embodiment described above. However, an opaque ceramic substrate, an opaque organic substrate or an organic substrate having a low transmissibility is not suitable.

Therefore, this embodiment can have the excellent effects of the third embodiment and those of the second embodiment. That is, in addition to the effect obtained by the first embodiment, the substrate 1 comprising borosilicate glass or an organic substrate, such as heat resistant polyimide, which is low cost and can be formed into a thin plate and a continuous web, can be used; the adjustment of the conductive type and Vth of the single crystal silicon thin film 7 can be easily conducted by the composition ratio of indium/gallium; and by installing the color filter 42 and the black mask 43 above the display array part, the opening ratio of the liquid crystal display panel can be improved, and the consuming electric power of the display module including a backlight can be reduced.

Fifth Embodiment

The fifth embodiment of the invention will be described with reference to FIGS. 17A to 25K.

In this embodiment, the peripheral driving circuit part is constituted with a CMOS driving circuit comprising a pMOS TFT and an nMOS TFT of a top gate type as similar to the first embodiment. The display part, which is a reflection type, is constituted with various combinations, in which the TFT is of various gate structures.

Figure 17A:
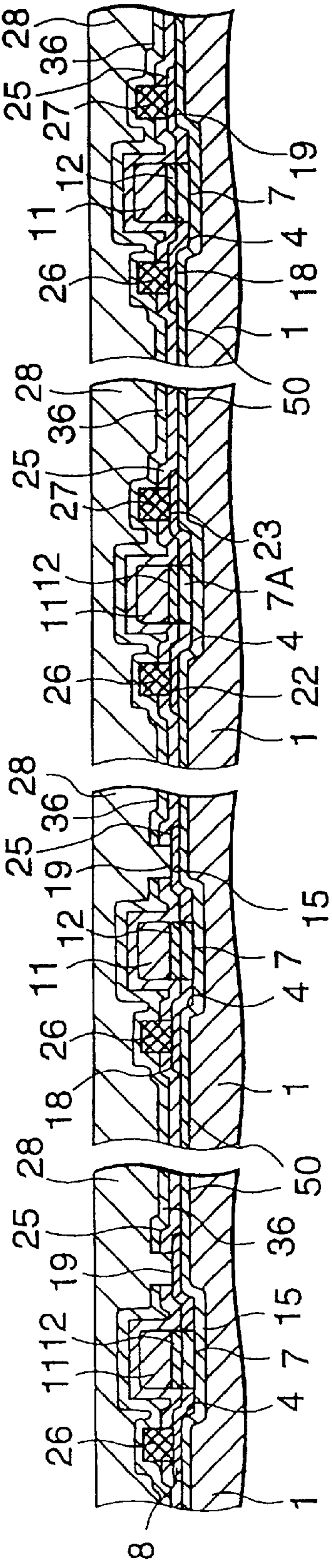
FIGS. 17A to 17C are cross sectional views showing important parts of the LCD according to the fifth embodiment of the invention.
Figure 17B:
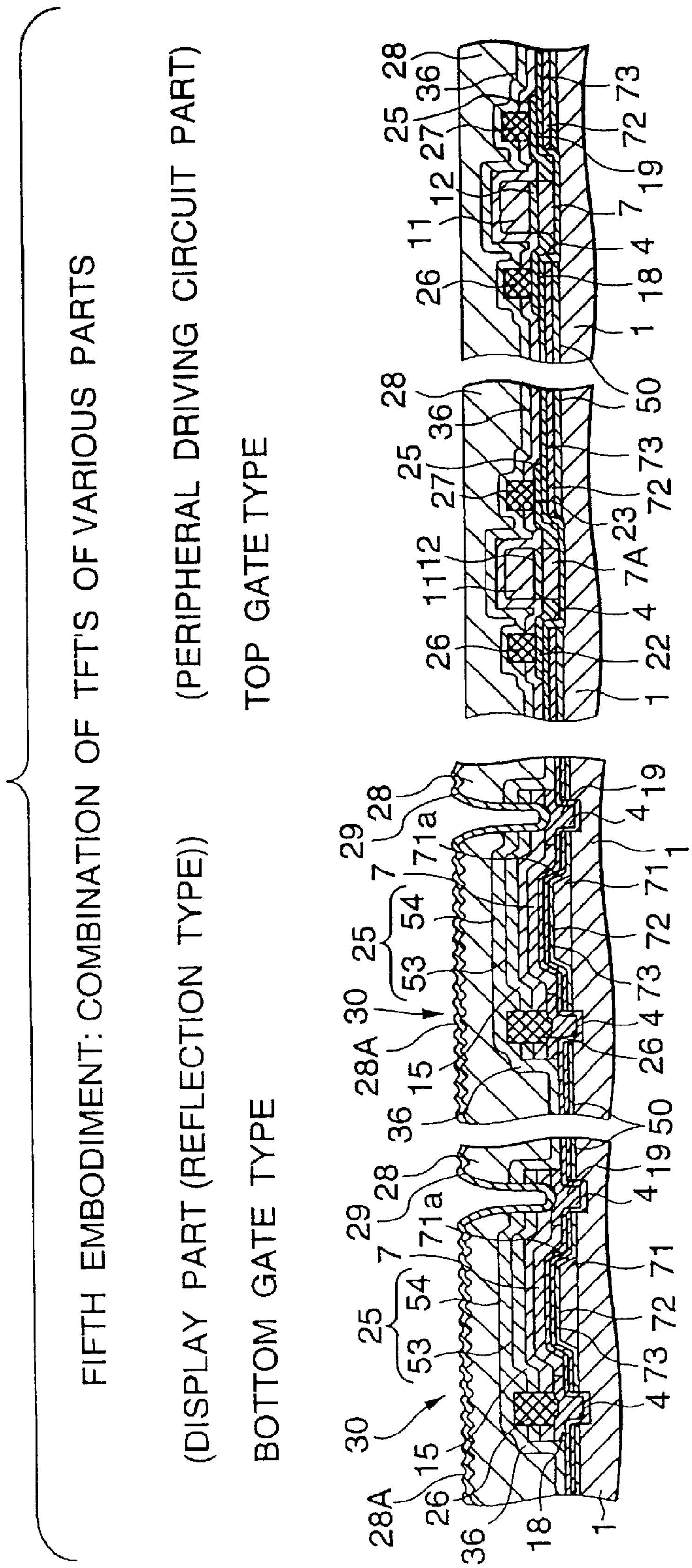
Figure 17C:
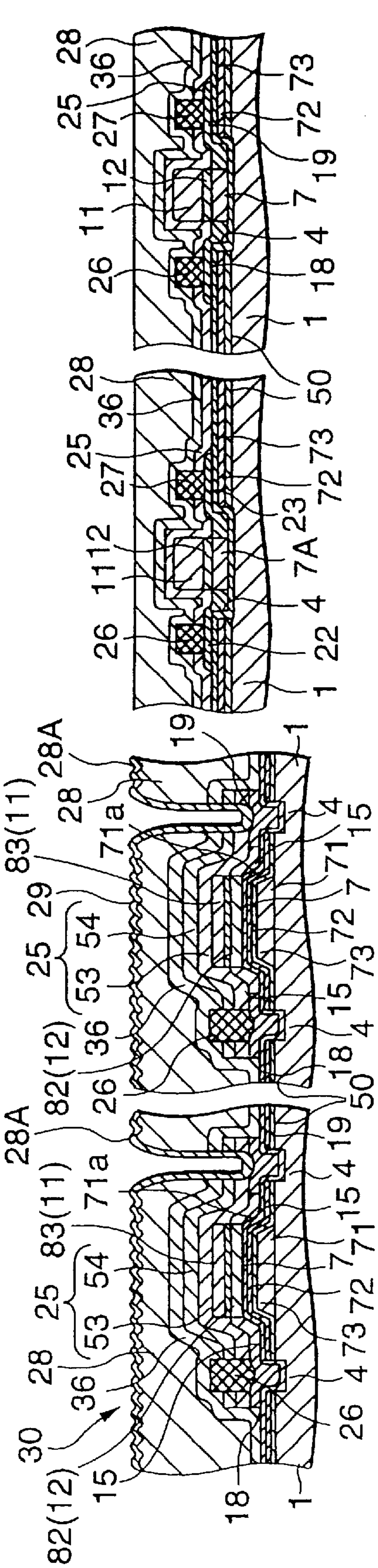

That is, while an nMOS LDD-TFT of a top gate type is provided in the display part as similar to the first embodiment shown in FIG. 17A, an nMOS LDD-TFT of a bottom gate type is provided in the display part shown in FIG. 17B, and an nMOS LDD-TFT of a dual gate type is provided in the display part of FIG. 17C. The MOS TFTs of the bottom gate type and the dual gate type can be produced in the similar steps as the top gate type MOS TFT of the peripheral driving circuit part as described later. Particularly, in the case of the dual gate type, the driving performance is improved by the upper and lower gate parts to be suitable for high speed switching, and the MOS TFT can be operated as either the top gate type or the bottom gate type by selecting either the upper or lower gate part.

In the bottom gate type MOS TFT shown in FIG. 17B, numeral 71 denotes a gate electrode comprising, for example, Mo.Ta, 72 denotes a SiN film, and 73 denotes an $SiO_2$ film, provided that the films 72 and 73 form a gate insulating film, and a channel region using the single crystal silicon layer similar to the top gate type MOS TFT is formed on the gate insulating film. In the dual gate type MOS TFT shown in FIG. 17C, the lower gate part is the same as the bottom gate type MOS TFT, and with respect to the upper gate part, a gate insulating film 73 is formed with an $SiO_2$ film and an SiN film, and the upper gate electrode 74 is formed thereon. In both the structures, the gate part is formed outside the step 4, which is a seed on the hetero-epitaxial growth, having a function of accelerating the growth of the single crystal silicon film and increase the crystallinity thereof.

The production process of the bottom gate type MOS TFT will be described with reference to FIGS. 18A to 22C, and the production process of the dual gate type MOS TFT will be described with reference to FIGS. 23A to 25K. Since the production process of the top gate type MOS TFT of the peripheral driving circuit part is the same as described in FIGS. 5A to 10R, the description with figures thereof is omitted herein.

In order to produce a bottom gate type MOS TFT in the display part, a sputtering film 71 of a molybdenum-tantalum (Mo.Ta) alloy (having a thickness of from 500 to 600 nm) is formed on a substrate 1 as shown in FIG. 18A.

As shown in FIG. 18B, a photoresist 70 is then formed in a prescribed pattern, and the Mo.Ta film 71 is subjected to taper etching, so as to form a gate electrode 71 having a side edge part 71*a* is gently slanted at 20 to 45° in a trapezoidal shape by using the photoresist 70 as a mask.

As shown in FIG. 18C, after removing the photoresist 70, an SiN film 72 (having a thickness of about 100 nm) and a $SiO_2$ film 73 (having a thickness of about 200 nm) are then formed on the substrate 1 including the molybdenum-tantalum alloy film 71 by a plasma CVD method, so as to form a gate insulating film comprising the SiN film 72 and the S102 film 73 accumulated with each other.

Figure 18D:
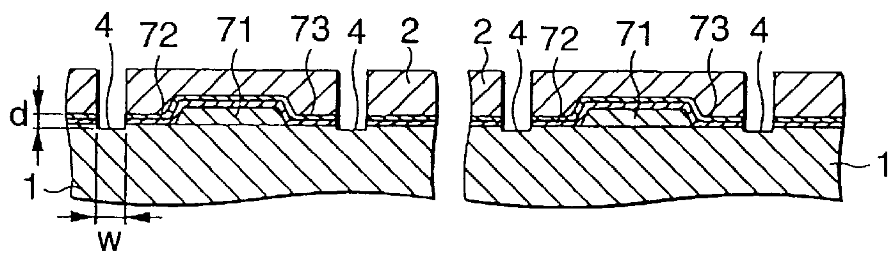

As shown in FIG. 18D, a photoresist 2 is formed in a prescribed pattern on at least the TFT forming region in the same step as in FIG. 5A, and plural steps 4 having a suitable shape and dimension are formed in the gate insulating film on the substrate 1 (or further formed in the substrate 1) in the same manner as described above by using the photoresist 2 as a mask. The step 4 is a seed for hetero-epitaxial growth of a single crystal silicon layer described later, and at the same time, has a function of accelerating the growth of the single crystal silicon film and increasing the crystallinity thereof. The step 4 may have a depth d of from 0.3 to 0.4 $\mu$m, a width w of from 2 to 3 $\mu$m, and a length (direction perpendicular to the paper) of from 10 to 20 Fm, in which an angle (bottom angle) formed by the bottom surface and the side wall is a right angle.

Figure 18E:
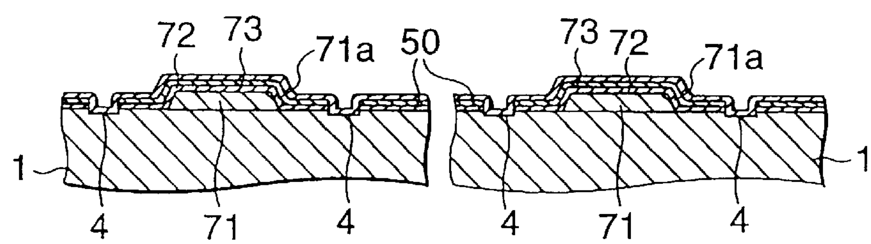

As shown in FIG. 18E, after removing the photoresist 2, a crystalline sapphire film (having a thickness of from 20 to 200 nm) 50 is formed on at least the TFT forming region including the step 4 on one primary surface of the insulating substrate 1 in the same manner described in FIG. 5B.

Figure 19F:
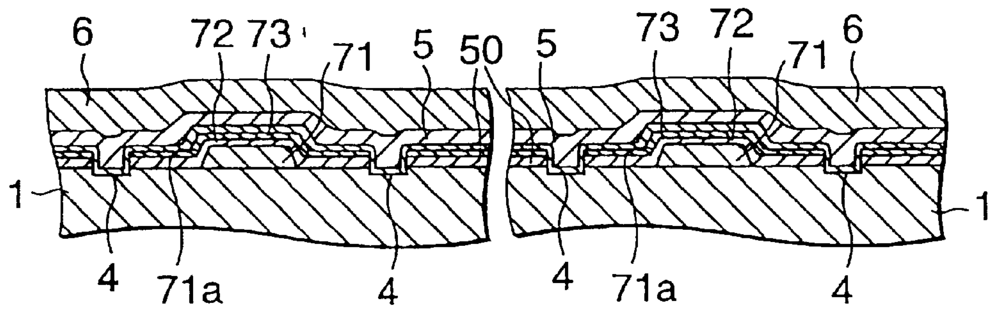
FIGS. 19F to 19I are cross sectional views stepwise showing the production process of the same LCD.

As shown in FIG. 19F, a molten liquid 6 of indium (or indium-gallium or gallium) containing silicon is coated in the same manner described in FIG. 5C.

Figure 19G:
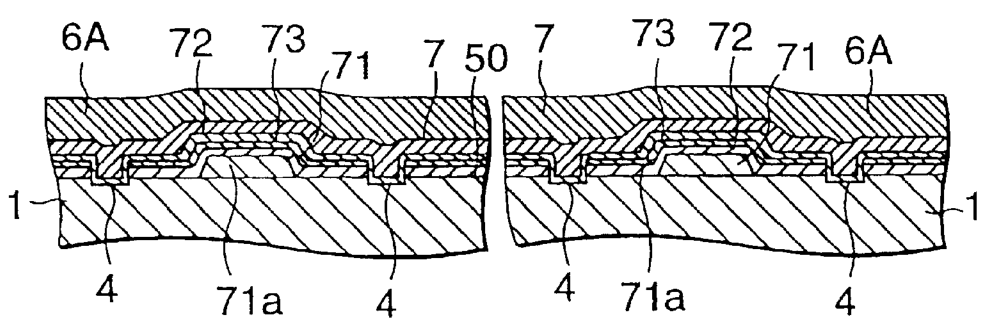

As described in FIG. 19G, a single crystal silicon is hetero-epitaxially grown in the same manner as in FIG. 6D, so as to deposit a single crystal silicon layer 7 having a thickness of, for example about 0.1 $\mu$m. At this time, because the side edge part 71*a* of the gate electrode 71 is a gentle slope surface, the hetero-epitaxial growth by the step 4 is not inhibited on that surface, and the single crystal silicon layer 7 is grown without interruption by the step.

Figure 19H:
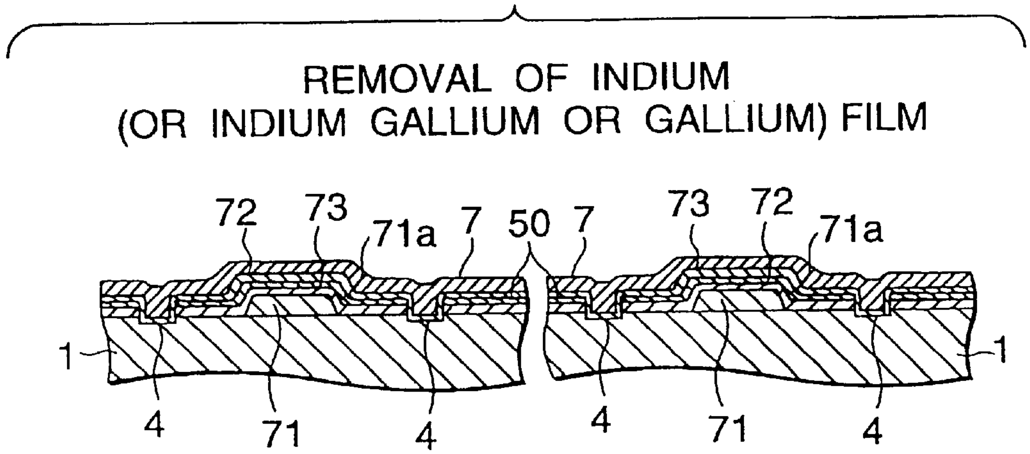
Figure 19I:
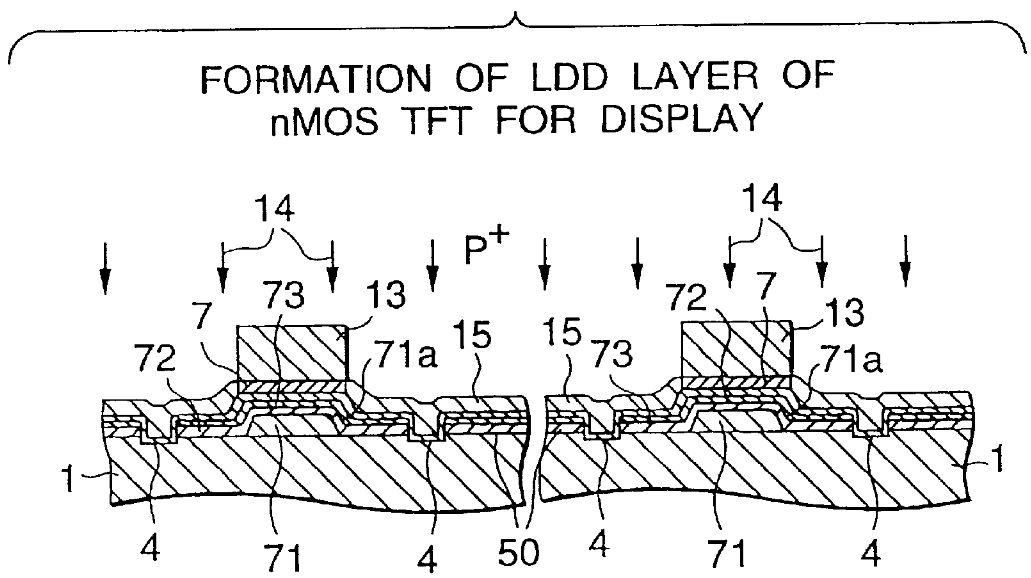

As shown in FIG. 19H, after removing the film 6A of indium, the steps of from FIGS. 6F to 7H are conducted. As shown in FIG. 19I, in the same manner as in FIG. 7I, the gate part of the nMOS TFT of the display part is covered with a photoresist 13, and the exposed source/drain region of the nMOS TFT is doped (ion implantation) with a phosphorous ion 14, so as to form an LDD part 15 comprising an $N^-$-type layer in a self aligning manner. At this time, the unevenness (or pattern) of the surface can be easily determined by the presence of the bottom gate electrode 71, and the positional alignment of the photoresist 13 (mask alignment) can be easily conducted, so that the alignment is difficult to deviate.

Figure 20J:
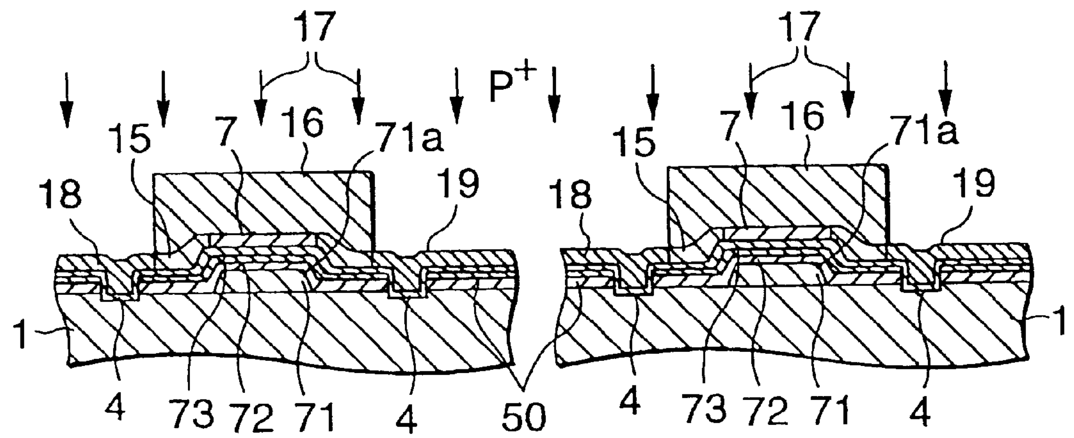
FIGS. 20J to 20M are cross sectional views stepwise showing the production process of the same LCD.

As shown in FIG. 20J, the gate part and the LDD part of the nMOS TFT are covered with a photoresist 16, and the exposed region is doped (ion implantation) with a phosphorous or arsenic ion 17, so as to form a source part 18 and a drain part 19 comprising $N^+$-type layer of the nMOS TFT in the same manner described in FIG. 8J.

Figure 20K:
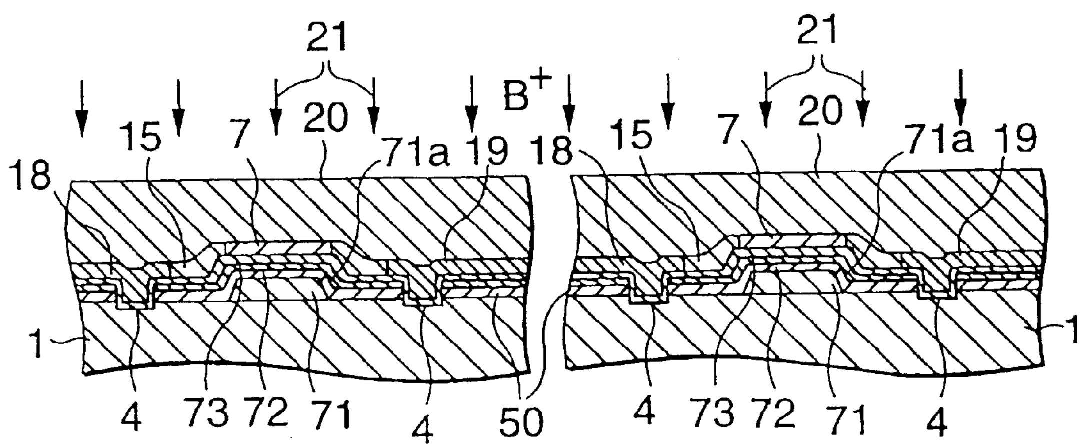

As shown in FIG. 20K, the whole of the nMOS TFT is covered with a photoresist 20, and doping (ion implantation) of a boron ion 21 is conducted to form a source part and a drain part of a $P^+$-type layer of the pMOS TFT of the peripheral driving circuit part in the same manner described in FIG. 8K.

Figure 20L:
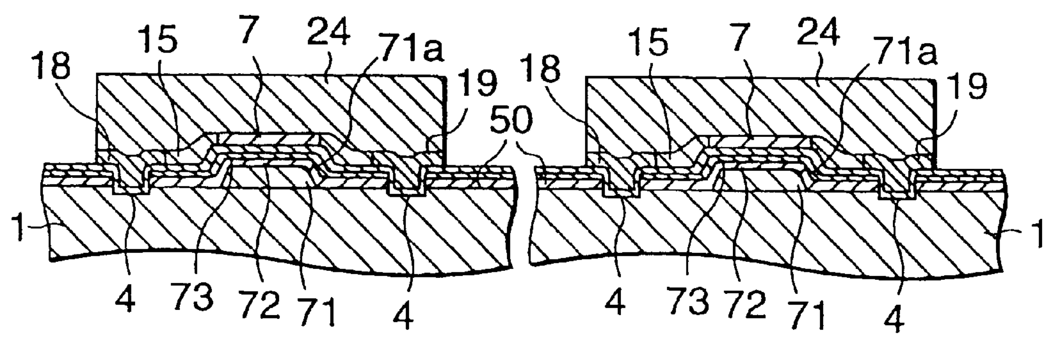

As shown in FIG. 20L, in order to form islands of the active element part and the passive element part, a photoresist 24 is provided, and the single crystal silicon thin film layer is selectively removed by a general purpose photolithography and etching technique in the same manner described in FIG. 8L.

Figure 20M:
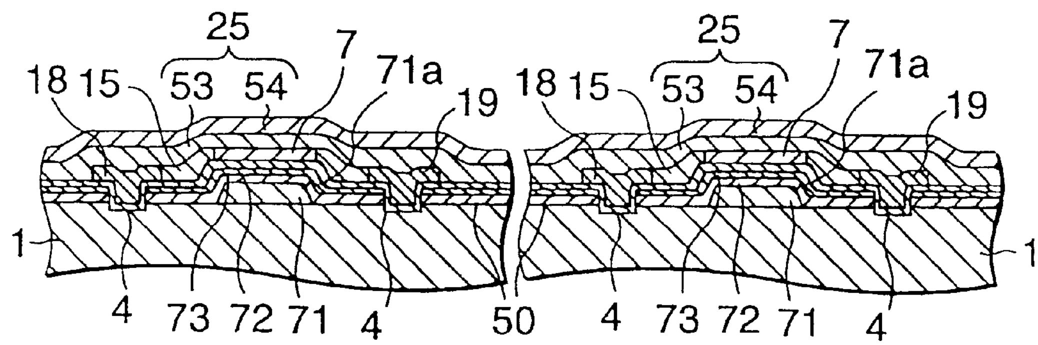

As shown in FIG. 20M, an $SiO_2$ film 53 (having a thickness of about 300 nm) and a phosphorous silicate glass (PSG) film 54 (having a thickness of about 300 nm) are formed in this order on the whole surface by a plasma CVD method, a high density plasma CVD method or a catalyst CVD method in the same manner described in FIG. 9M. The $SiO_2$ film 53 and the PSG film 54 correspond to the protective film 25 described above. With maintaining that state, the single crystal silicon film is subjected to the activation treatment in the same manner as above.

Figure 21N:
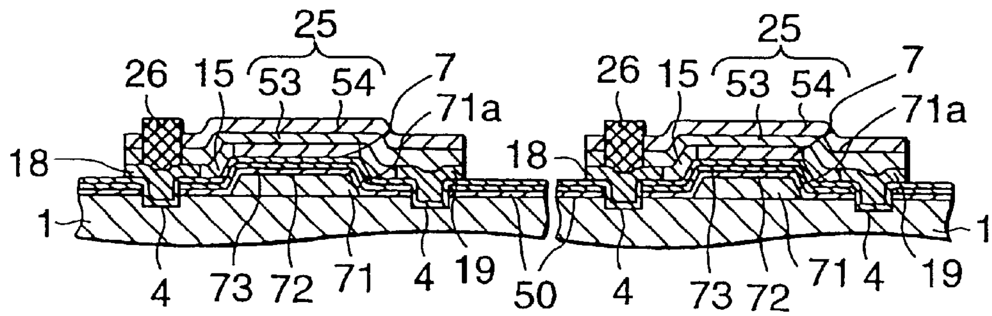
FIGS. 21N to 21Q are cross sectional views stepwise showing the production process of the same LCD.

As shown in FIG. 21N, a contact hole is formed in the source part by a general purpose photolithography and etching technique in the same manner described in FIG. 9N. After a sputtering film comprising, for example, aluminum having a thickness of from 400 to 500 nm is formed on the whole surface, a source electrode 26 of the TFT is formed by a general purpose photolithography and etching technique, and at the same time, a data line and a gate line are formed. Thereafter, a sinter treatment is conducted in a forming gas at about 400° C. for 1 hour.

Figure 21O:
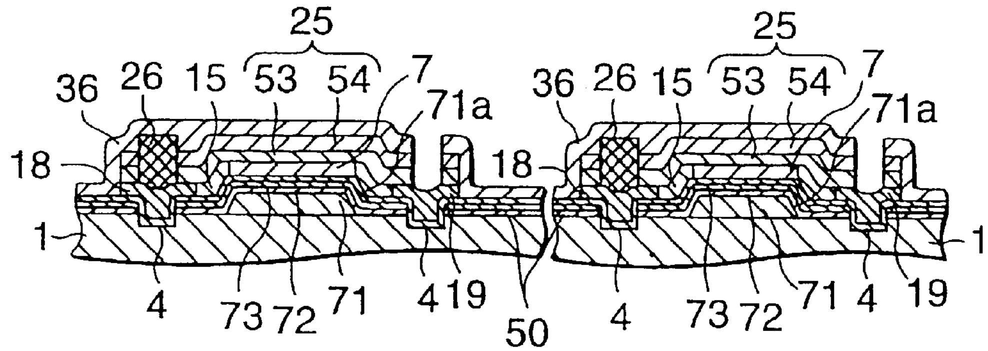

As shown in FIG. 21O, an insulating film 36 comprising a PSG film (having a thickness of about 300 nm) and an SiN film (having a thickness of about 300 nm) is formed on the whole surface by a high density plasma CVD method or a catalyst CVD method, and a contact hole is formed in the drain part of the TFT for display, in the same manner as in FIG. 9O.

Figure 21P:
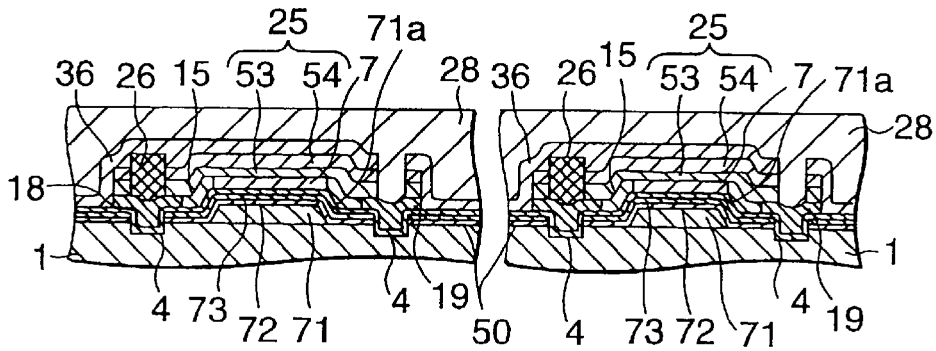
Figure 21Q:
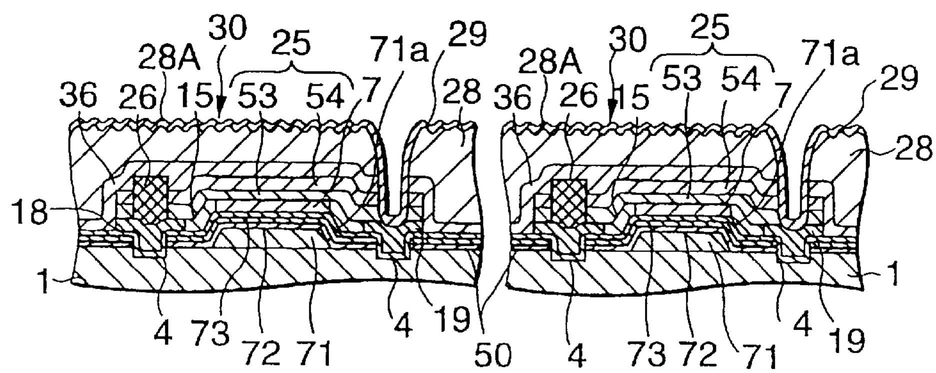

As shown in FIG. 21P, a photosensitive resin film 28 having a thickness of from 2 to 3 $\mu$m is coated by spin coating in the same manner described in FIG. 10P. As shown in FIG. 21Q, an unevenness pattern for obtaining the optimum reflection characteristics and viewing angle characteristics is formed at least on the pixel part by a general purpose photolithography and etching technique, so as to form a lower part of the reflection face comprising an uneven roughened surface 28A by reflowing. Simultaneously, contact holes are formed in the resin film on the drain part of the TFT for display.

As shown in FIG. 21Q, a sputtering film comprising, for example, aluminum having a thickness of from 400 to 500 nm is formed on the whole surface, and a reflection part 29 comprising aluminum having an uneven shape connected to the drain part 19 of the TFT for display is formed by a general purpose photolithography and etching technique, in the same manner described in FIG. 10R.

According to the procedures described above, an active matrix substrate 30, in which the display part and the peripheral driving circuit part are integrated, can be produced, which is formed in such a manner that the single crystal silicon layer 7 is formed by high temperature heteroepitaxial growth using the crystalline sapphire film 50 including the step 4 as a seed, and the bottom gate type nMOS LDD-TFT (a CMOS driving circuit comprising the pMOS TFT and the nMOS TFT of the top gate type in the peripheral part) is formed in the display part comprising the single crystal silicon layer 7.

An example, in which a gate insulating film of the bottom gate type MOS TFT in the display part is formed by an anodic oxidation method of Mo.Ta, will be described with reference to FIGS. 22A to 22C.

Figure 22A:
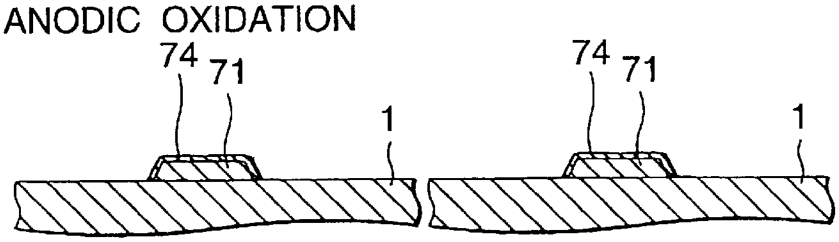
FIGS. 22A to 22C are cross sectional views stepwise showing the production process of the same LCD.

After the step of FIG. 18B, the molybdenum-tantalum alloy film 71 is subjected to an anodic oxidation treatment, to form on the surface a gate insulating film 74 comprising $Ta_2O_5$ having a thickness of from 100 to 200 nm, as shown in FIG. 22A.

Figure 22B:
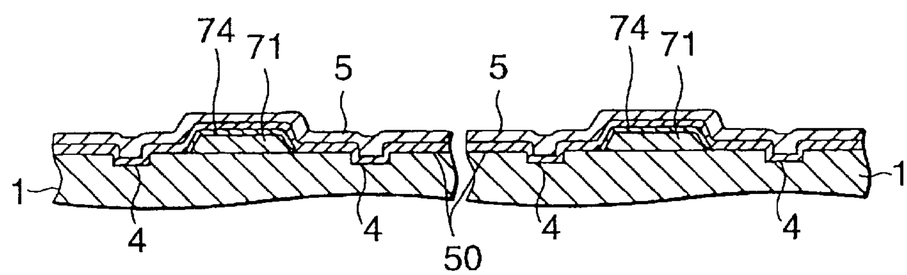
Figure 22C:
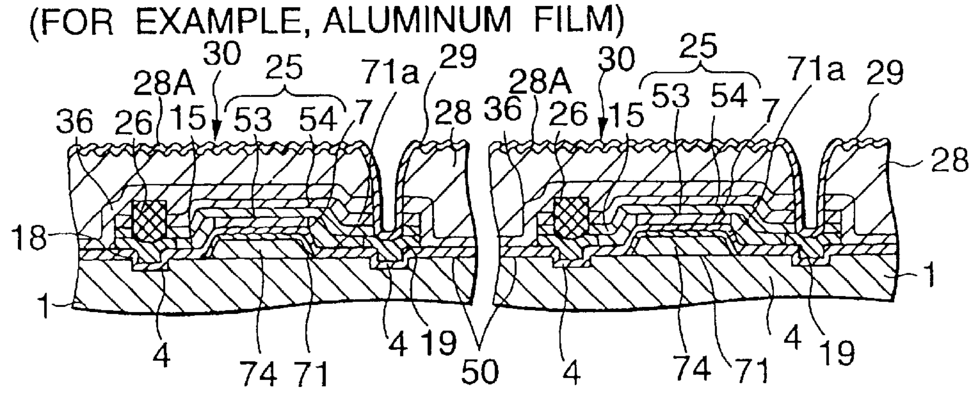

After that step, as shown in FIG. 22B, a step 4 and a crystalline sapphire film 50 are formed, and a single crystal silicon film 7 is hetero-epitaxially grown in the same manner described in FIGS. 18D to 19H, and further as shown in FIG. 22C, an active matrix substrate 30 is produced in the same manner described in FIGS. 19I to 21Q.

In order to produce a dual gate type MOS TFT in the display part, the same procedures as in FIGS. 18A to 19H are conducted.

That is, as shown in FIG. 23A, a step 4 is formed on the insulating films 72 and 73 and the substrate 1, and a single crystal silicon layer 7 is hetero-epitaxially grown by using the crystalline sapphire film 50 and the step 4 as a seed. In the same manner described in FIG. 7G, an $SiO_2$ film (having a thickness of about 200 nm) and an SiN film (having a thickness of 100 nm) are continuously formed in this order on the whole surface of the single crystal silicon thin film 7 by a plasma CVD method or a catalyst CVD method to form an insulating film 80 (which corresponds to the insulating film 8), and a sputtering film 81 of an Mo.Ta alloy (having a thickness of from 500 to 600 nm) (which corresponds to the sputtering film 9) is then formed.

As shown in FIG. 23B, a photoresist pattern 10 is then formed, a top gate electrode 82 (which corresponds to the gate electrode 12) comprising the Mo.Ta alloy and a gate insulating film 83 (which corresponds to the gate insulating film 11) are formed by continuous etching, so as to expose the single crystal silicon thin film layer 7, in the same manner described in FIG. 7H.

Figure 23C:
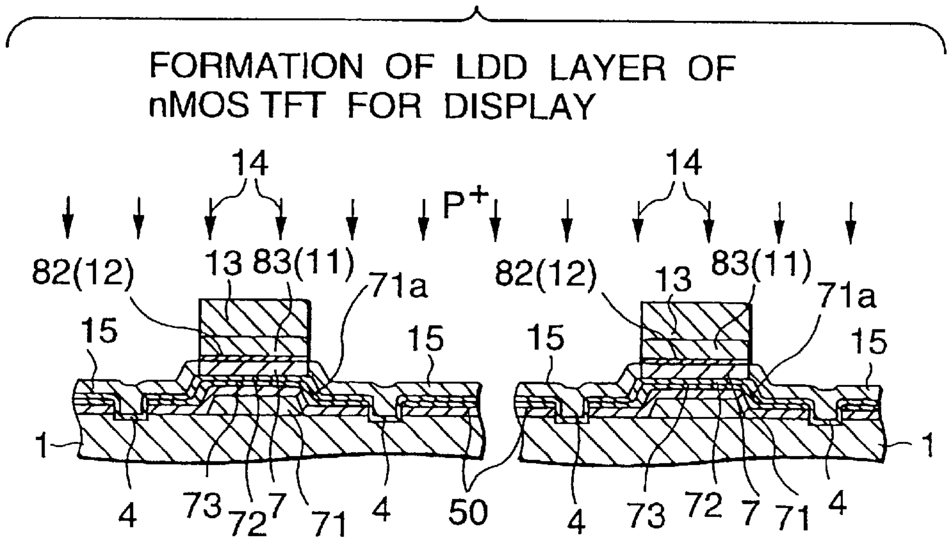

As shown in FIG. 23C, the top gate part of the nMOS TFT is covered with a photoresist 13, and the exposed source/drain region of the nMOS TFT for display is doped (ion implantation) with a phosphorous ion 14, so as to form an LDD part 15 of an $N^-$-type layer, in the same manner described in FIG. 7I.

Figure 23D:
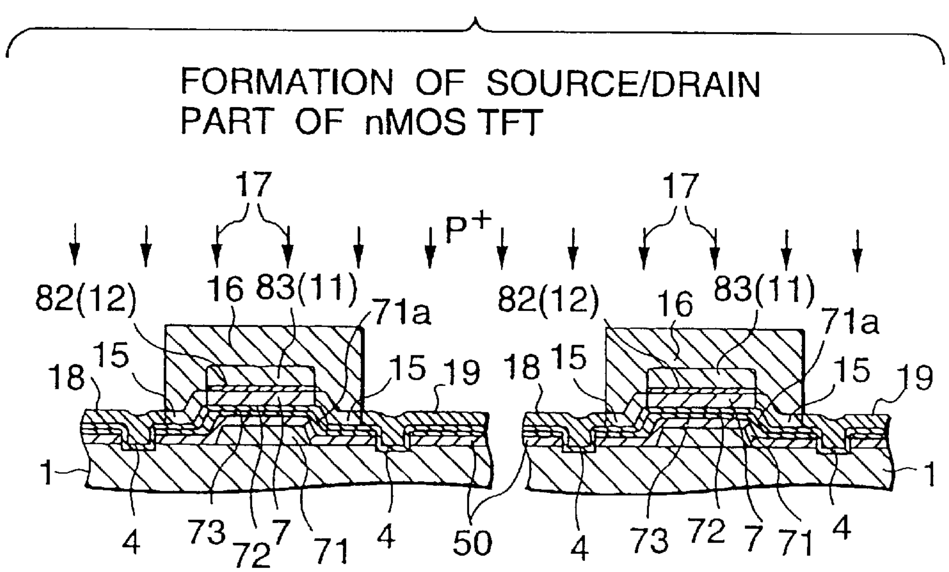

As shown in FIG. 23D, the gate part and the LDD part of the nMOS TFT are covered with a photoresist 16, and the exposed region is doped (ion implantation) with a phosphorous or arsenic ion 17, so as to form a source part 18 and a drain part 19 comprising an $N^+$-type layer of the nMOS TFT, in the same manner described in FIG. 8J.

Figure 24E:
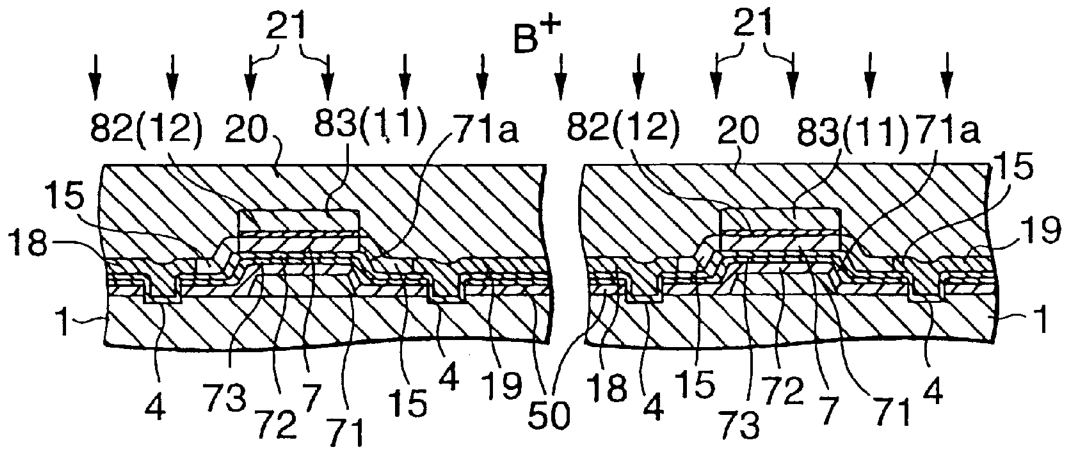
FIGS. 24E to 24H are cross sectional views stepwise showing the production process of the same LCD.

As shown in FIG. 24E, the gate part of the pMOS TFT is covered with a photoresist 20, and the exposed region is doped (ion implantation) with a boron ion 21, so as to form a source part and a drain part of a $P^+$-type layer of the pMOS TFT a peripheral driving circuit part, in the same manner described in FIG. 8K.

Figure 24F:
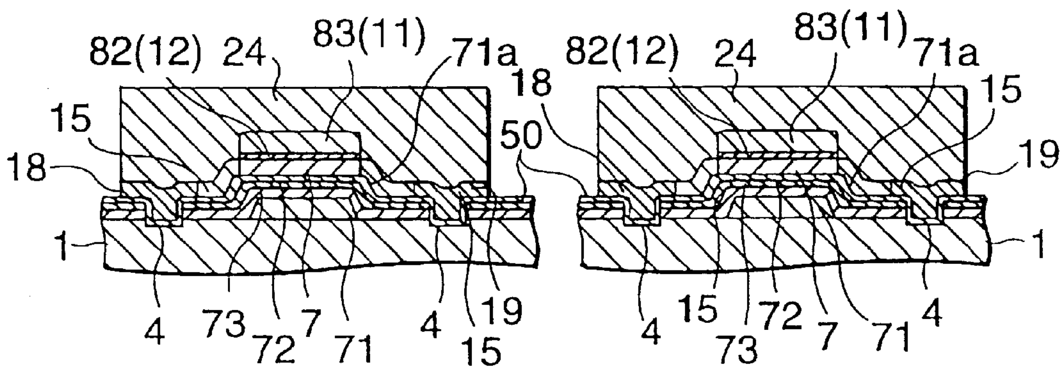

As shown in FIG. 24F, in order to form islands of the active element part and the passive element part, a photoresist 24 is formed, and the single crystal silicon thin film layer other than the active element part and the passive element part is selectively removed by a general purpose photolithography and etching technique, in the same manner described in FIG. 8L.

Figure 24G:
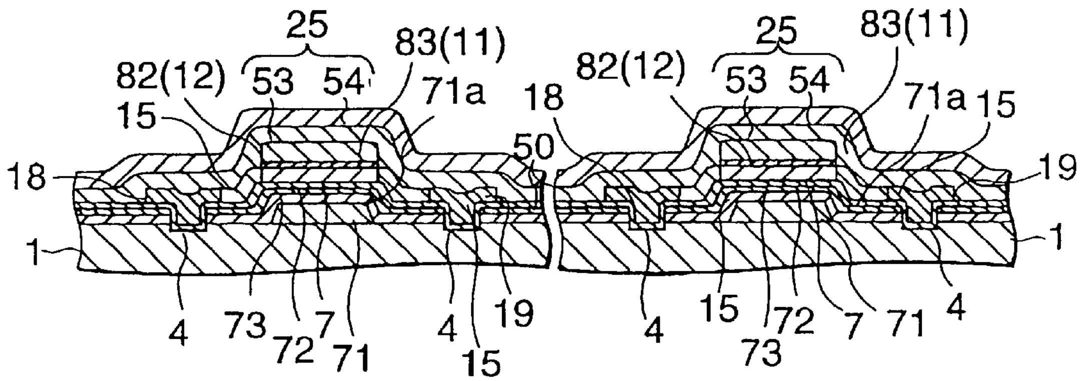

As shown in FIG. 24G, an $SiO_2$ film 53(having a thickness of about 200 nm) and a phosphorous silicate glass (PSG) film 54 (having a thickness of about 300 nm) are formed on the whole surface by a plasma CVD method, a high density plasma CVD method or a catalyst CVD method in the same manner described in FIG. 9M. The films 53 and 54 correspond to the protective film 25. The single crystal silicon layer 7 is then subjected to an activation treatment.

Figure 24H:
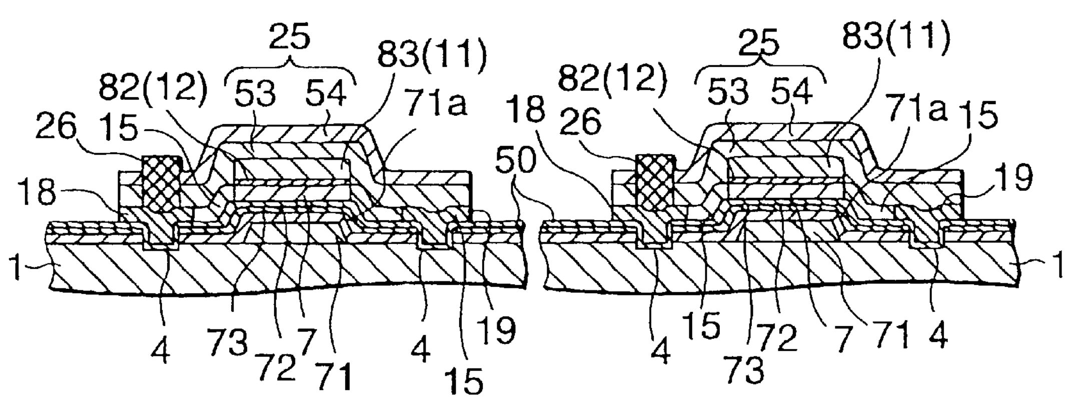

As shown in FIG. 24H, a contact hole is formed on the source part in the same manner described in FIG. 9N. After a sputtering film comprising, for example, aluminum having a thickness of from 400 to 500 nm is formed on the whole surface, a source electrode 26 is formed by a general purpose photolithography and etching technique, and at the same time, a data line and a gate line are formed.

Figure 25I:
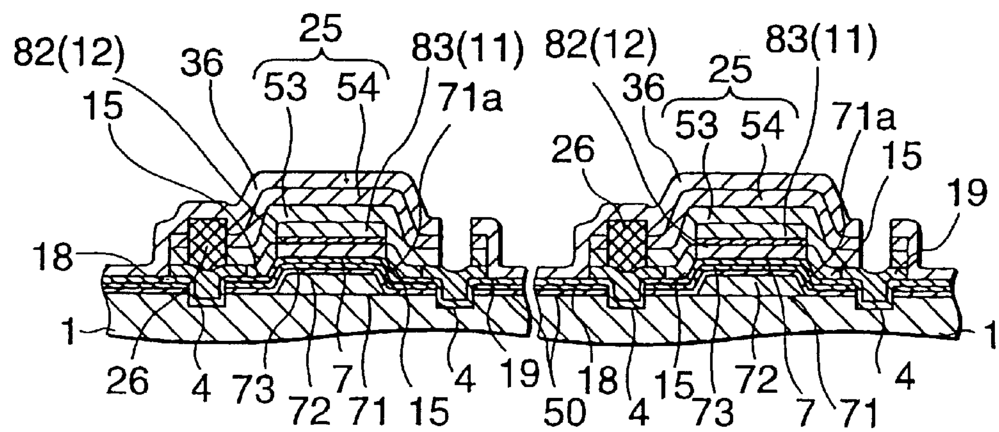
FIGS. 25I to 25K are cross sectional views stepwise showing the production process of the same LCD.

As shown in FIG. 25I, an insulating film 36 comprising a PSG film (having a thickness of about 300 nm) and an SiN film (having a thickness of about 300 nm) is formed on the whole surface, and a contact hole is formed on the drain part of the TFT for display, in the same manner described in FIG. 9O.

Figure 25J:
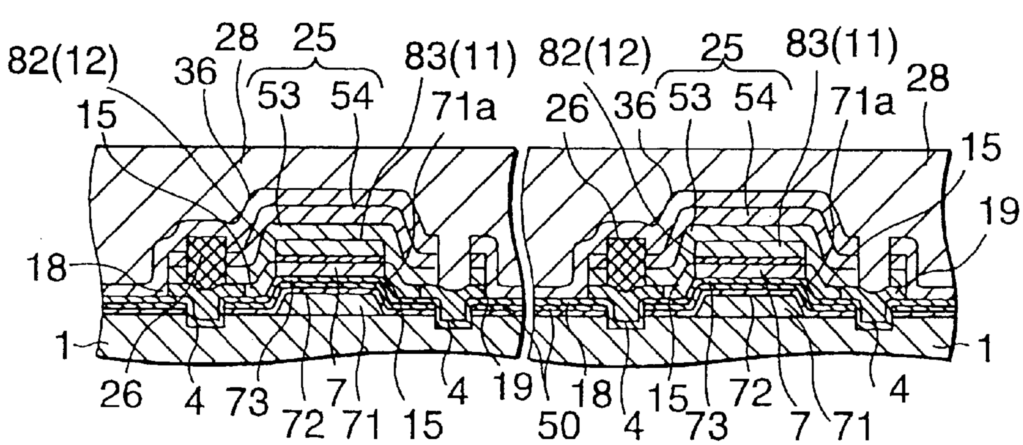
Figure 25K:
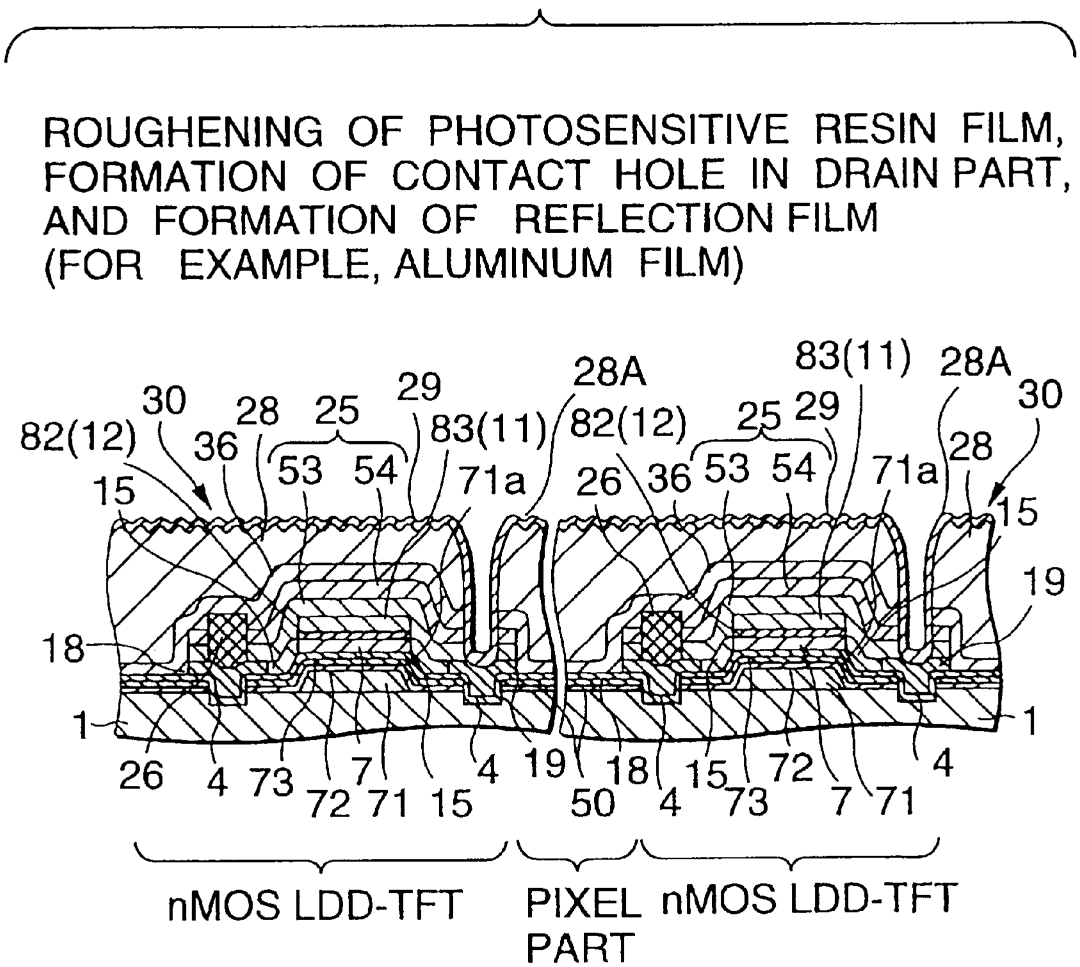

As shown in FIG. 25J, a photosensitive resin film 28 having a thickness of from 2 to 3 $\mu$m is formed on the whole surface by spin coating. As shown in FIG. 25K, a lower part of the reflection face comprising an uneven roughened surface 28A is formed at least in the pixel part, and simultaneously a contact hole is formed in the drain part of the TFT for display to connect to the drain part 19 of the TFT for display, in the same manner described in FIGS. 10Q and 10R. A reflection part 29 comprising, for example, aluminum having an uneven shape is formed to obtain the optimum reflection characteristics and viewing angle characteristics.

According to the procedures described above, an active matrix substrate 30, in which the display part and the peripheral driving circuit part are integrated, can be produced, which is formed in such a manner that the single crystal silicon layer 7 is formed by hetero-epitaxial growth using the crystalline sapphire film 50 and the step 4 as a seed, and the dual gate type nMOS LDD-TFT is formed in the display part, whereas a CMOS driving circuit comprising the pMOS TFT and the nMOS TFT of the top gate type is formed in the peripheral driving circuit part.

Sixth Embodiment

The sixth embodiment of the invention will be described with reference to FIGS. 26A to 31O.

In this embodiment, as different from the embodiments described in the foregoing, a gate electrode of a top gate part is formed with a material having a relatively low heat resistance, such as aluminum.

Figure 26A:
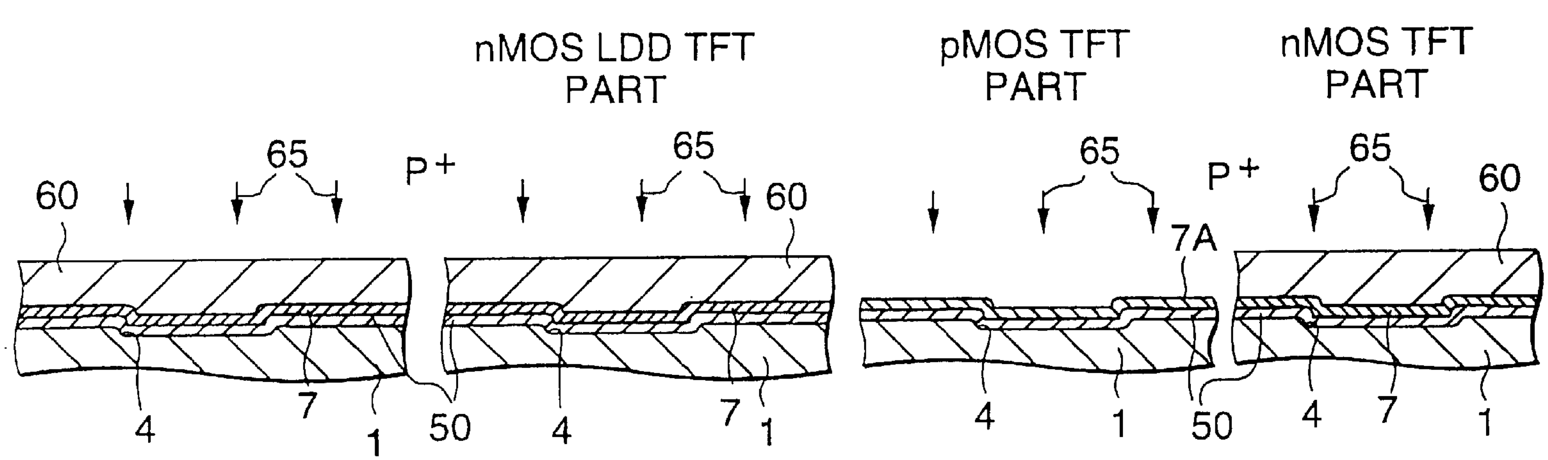
FIGS. 26A and 26B are cross sectional views stepwise showing the production process of the LCD according to the sixth embodiment of the invention.

In the case where a top gate type MOS TFT is formed in both the display part and the peripheral driving circuit part, the procedures described in FIGS. 5A to 6F for the first embodiment are conducted, so as to form an N-type well 7A in the pMOS TFT part of the peripheral driving circuit part as shown in FIG. 26A.

Figure 26B:
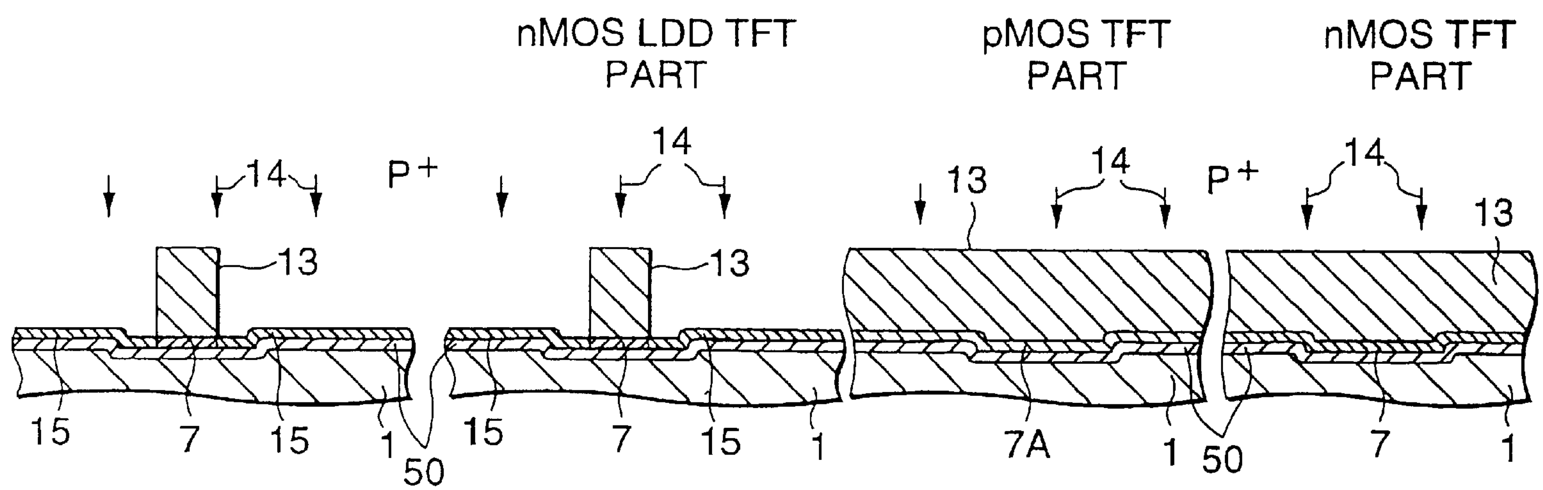

As shown in FIG. 26B, all the nMOS and PMOS TFTs of the peripheral driving circuit region and the gate part the nMOS TFT of the display part region are covered with a photoresist 13, and the exposed source/drain region of the nMOS TFT is doped (ion implantation) with an phosphorous ion 14 at 20 kV to a dose amount of $5\times10^{13}$ atoms/cm$^2$, so as to form an LDD part 15 comprising an $N^-$-type layer in a self aligning manner.

Figures 27C, 27D:
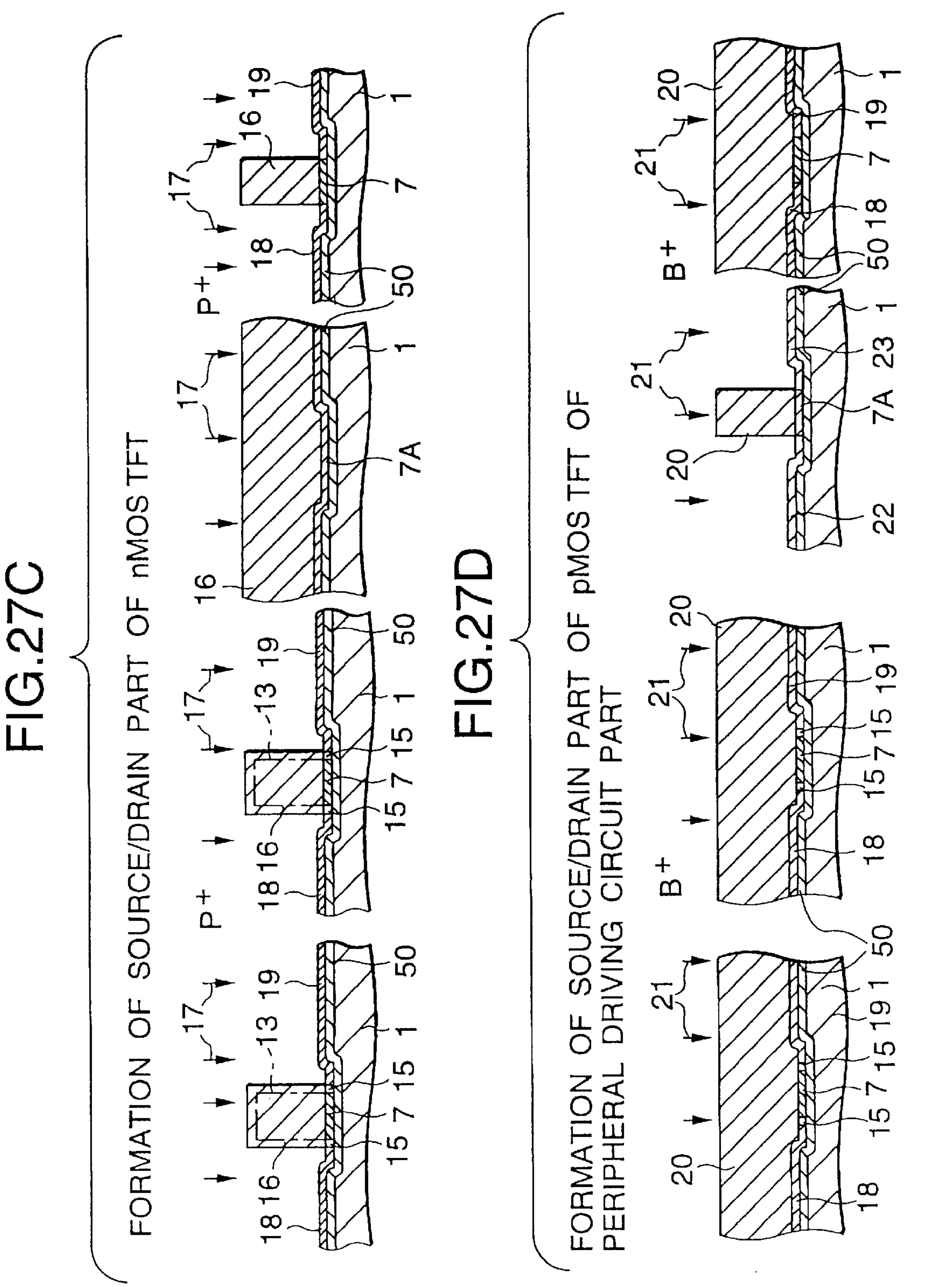
FIGS. 27C to 27E are cross sectional views stepwise showing the production process of the same LCD.

As shown in FIG. 27C, all the pMOS TFT of the peripheral driving circuit region, the gate part of the nMOS TFT of the peripheral driving circuit region, and the gate part and the LDD part of the nMOS TFT in the display part region are covered with a photoresist 16, and the exposed region is doped (ion implantation) with a phosphorous or arsenic ion 17 at 20 kv to a dose amount of $5\times10^{15}$ atoms/cm$^2$, so as to form a source part 18, a drain part 19 and an LDD part 15 comprising an $N^+$-type layer of the nMOS TFT. In this case, when the resist 13 is left as shown by the virtual line, and the resist 16 is provided to cover the same, the positional alignment of the mask for forming the resist 16 can be conducted by using the resist 13 as a standard, and thus the mask alignment can be easily conducted with deviation of alignment being suppressed.

As shown in FIG. 27D, the nMOS TFT of the peripheral driving circuit region, the whole nMOS TFT of the display part region, and the gate part of the PMOS TFT in the display part region are covered with a photoresist 20, and the exposed region is doped (ion implantation) with a boron ion 21 at 10 kV to a dose amount of $5\times10^{15}$ atoms/cm$^2$, so as to form a source part 22 and a drain part 23 of a $P^+$-type layer of the pMOS TFT.

Figure 27E:
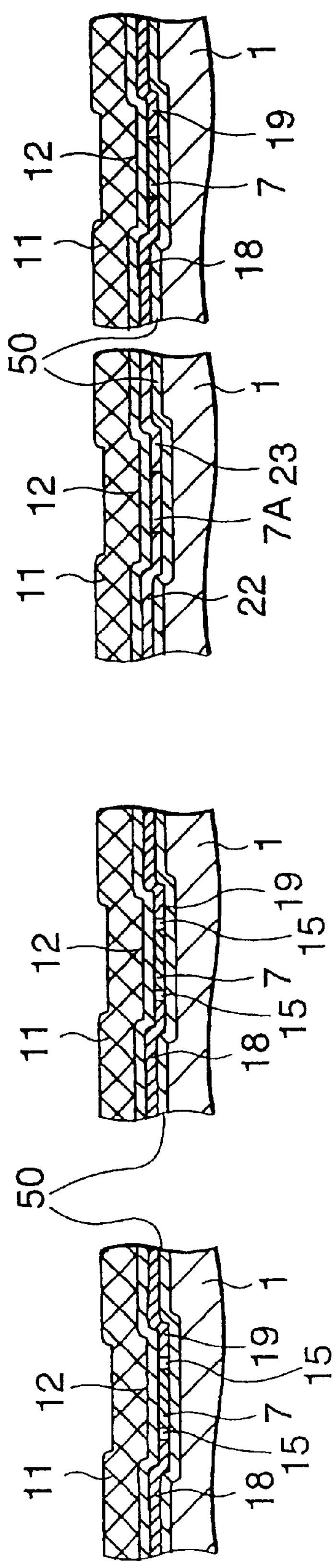

After removing the resist 20, as shown in FIG. 27E, the single crystal silicon layers 7 and 7A are subjected to the activation treatment in the same manner as above, and a gate insulating film 12 and a gate electrode material layer (such as aluminum or aluminum containing 1% of Si) 11 are formed on the surface thereof. The gate electrode material layer 11 can be formed by a vacuum deposition method or a sputtering method.

Figure 28F:
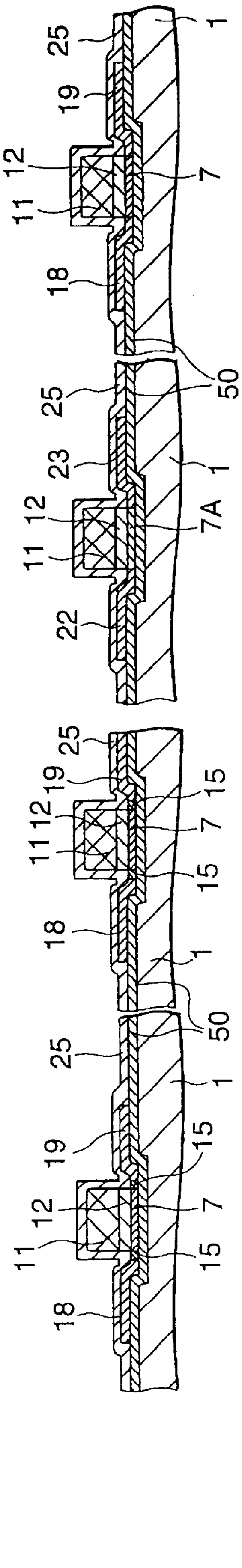
FIGS. 28F and 28G are cross sectional views stepwise showing the production process of the same LCD.

After patterning the respective gate parts in the same manner as above, the active element part and the passive element part are formed into islands, and furthermore as shown in FIG. 28F, an $SiO_2$ film (having a thickness of about 200 nm) and a phosphorous silicate glass (PSG) film (having a thickness of about 300 nm) are continuously formed in this order on the whole surface, so as to form a protective film 25.

Figure 28G:
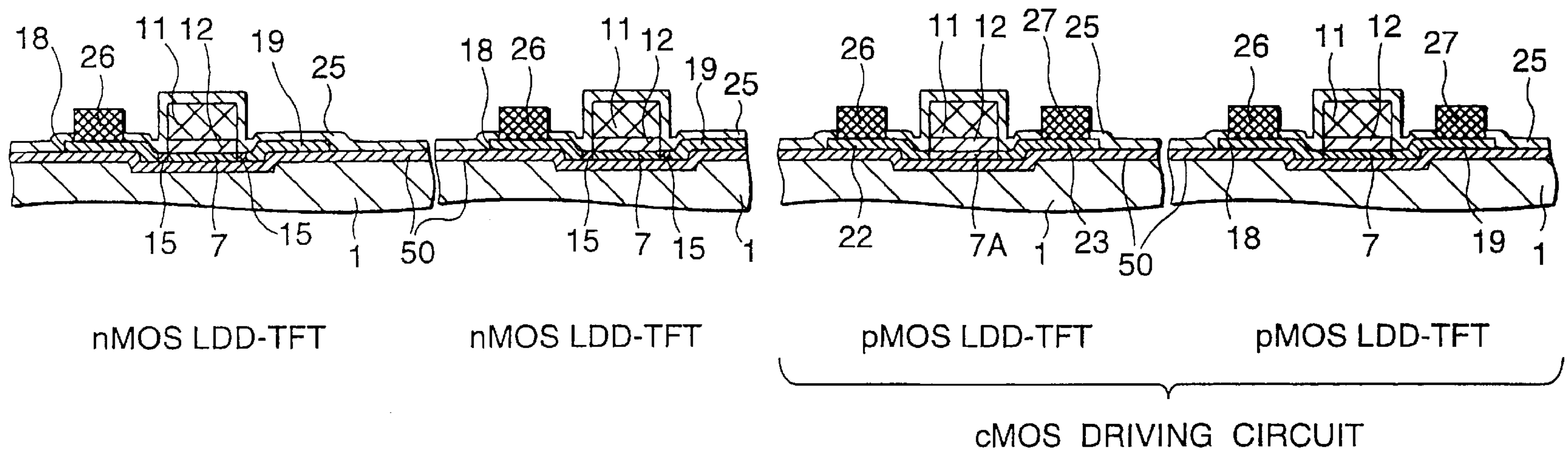

As shown in FIG. 28G, contact holes are formed in the source/drain part of all the TFTs in the peripheral driving circuit and a source part of the TFT for display by a general purpose photolithography and etching technique.

After forming a sputtering film comprising, for example, aluminum having a thickness of from 500 to 600 nm on the whole surface, a source electrode 26 of all the TFTs in the peripheral driving circuit and the display part, and a drain electrode 27 of the peripheral driving circuit part are formed by the general purpose photolithography and etching technique, and at the same time, a data line and a gate line are formed. Thereafter, a sinter treatment is conducted in a forming gas ($N_2$+$H_2$) at about 400° C. for 1 hour.

According to the same manner described in FIGS. 9O to 10R, an active matrix substrate 30, in which the display part and the peripheral driving circuit part are integrated, can be produced, which is formed in such a manner that the CMOS driving circuit comprising the top gate type nMOS LDD-TFT, the pMOS TFT and the nMOS TFT of the top gate type having a gate electrode comprising, for example, aluminum or aluminum containing 1% of Si is formed in each of the display part and the peripheral driving circuit part comprising the single crystal silicon layer 7.

In this embodiment, because the gate electrode 11 comprising, for example, aluminum or aluminum containing 1% of Si is formed after the activation treatment of the single crystal silicon layer 7, the heat resistance of the gate electrode material has no relationship to the influence of the heat on the activation treatment, and aluminum and aluminum containing 1% of Si having a relatively low heat resistance but a low cost can be used as the electrode material of the top gate, so that the range of selection of the electrode material is broadened. This is the same as in the case where the display part is a bottom gate type MOS TFT.

In the case where a dual gate type MOS TFT is formed in the display part, and a top gate type MOS TFT is formed in the peripheral driving circuit part, the steps shown in FIGS. 18A to 19H of the fifth embodiment are similarly conducted, and an N-type well 7A is formed in the pMOS TFT part of the peripheral driving circuit part as shown in FIG. 29H.

As shown in FIG. 29I, the TFT part of the display part is doped with a phosphorous ion 14 to form an LDD part 15 in the same manner described in FIG. 26B.

Figure 30J:
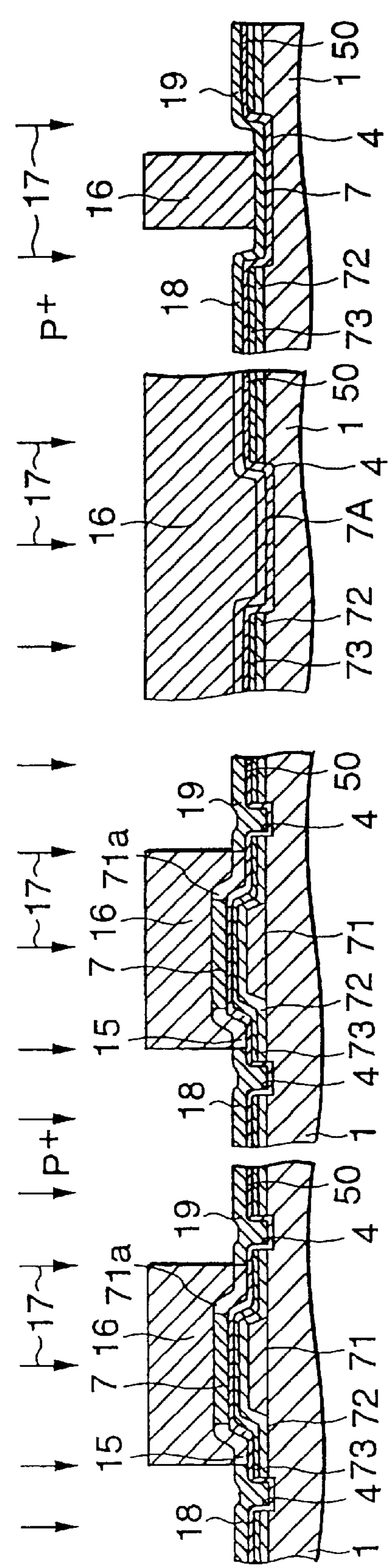
FIGS. 30J to 30L are cross sectional views stepwise showing the production process of the same LCD.

As shown in FIG. 30J, the nMOS TFT parts of the display part and the peripheral driving circuit part are doped with a phosphorous ion 17, so as to form a source region 18 and a drain region 19 of an $N^+$-type, in the same manner described in FIG. 27C.

Figure 30K:
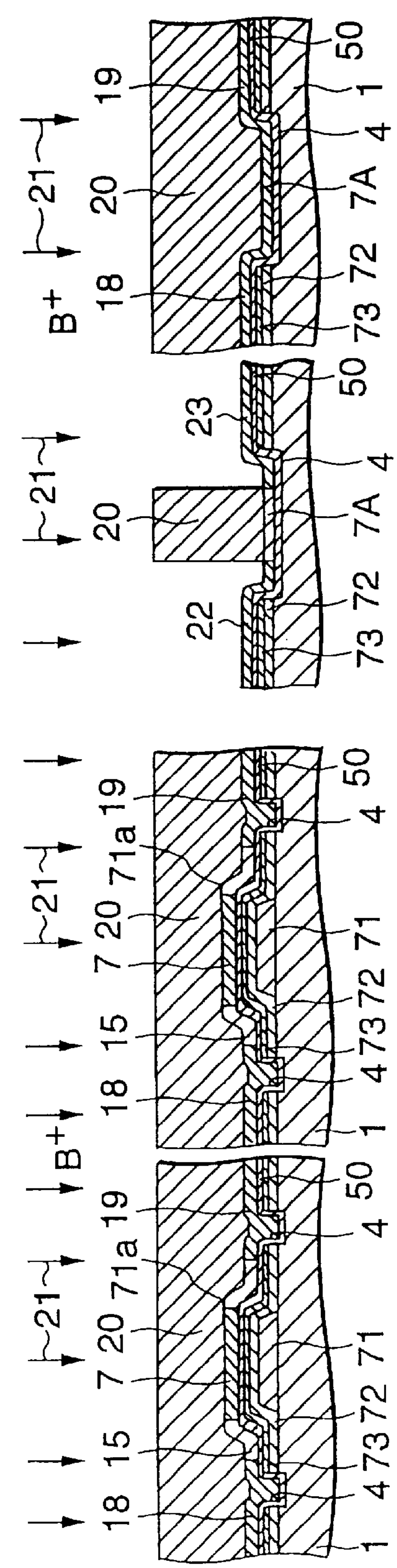

As shown in FIG. 30K, the pMOS TFT part of the peripheral driving circuit part is doped with a boron ion 21, so as to form a source region 22 and a drain region 23 of $P^+$-type, in the same manner described in FIG. 27D.

Figure 30L:
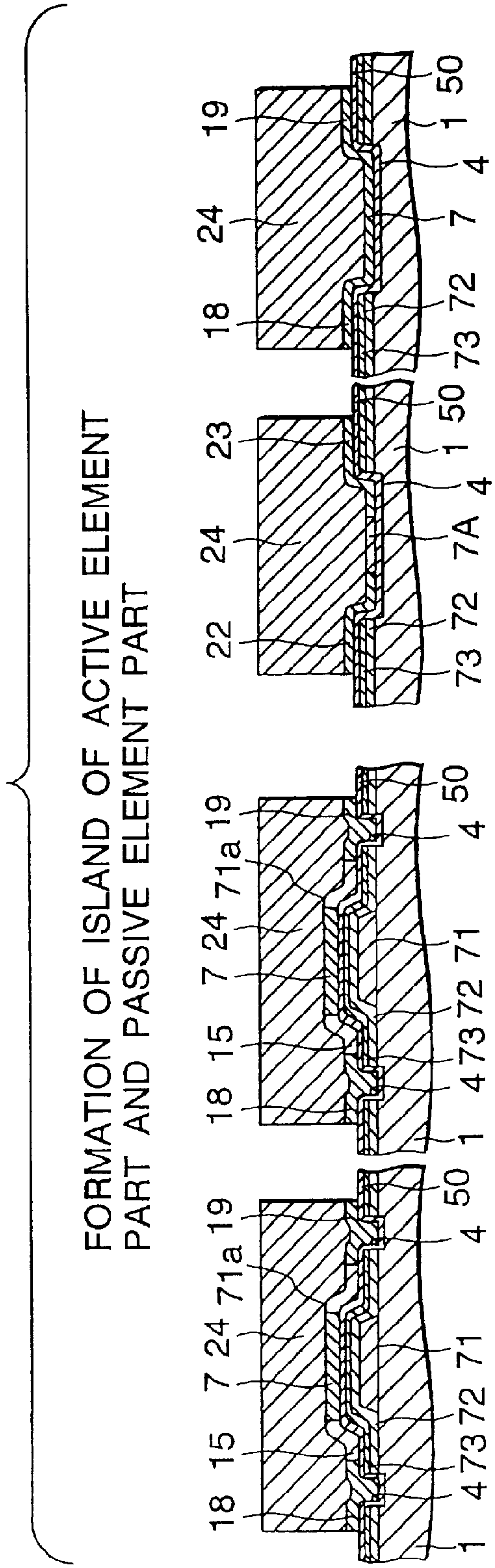
Figure 31M:
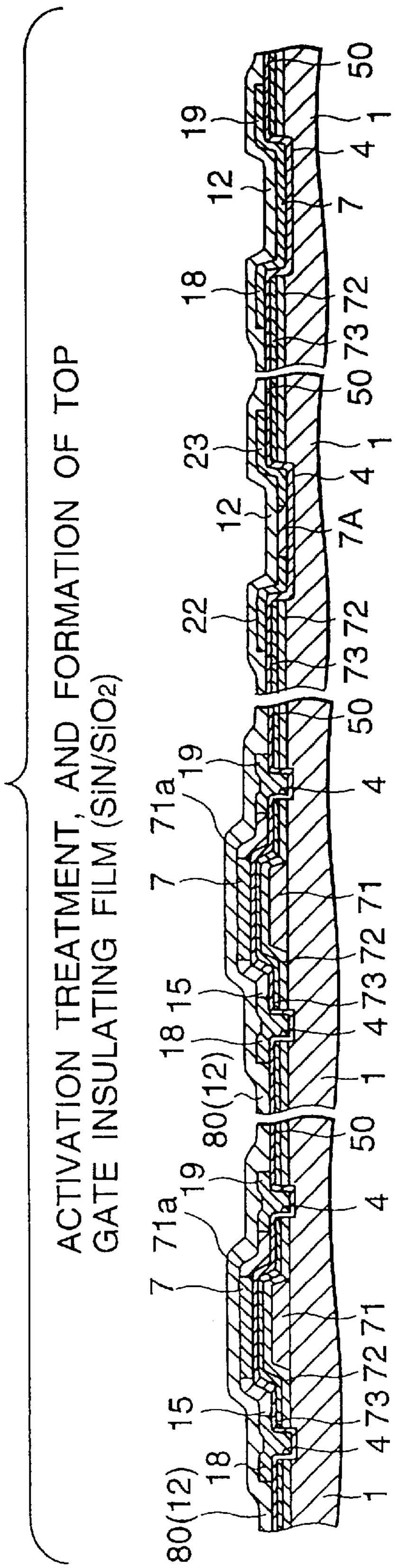
FIGS. 31M to 31O are cross sectional views stepwise showing the production process of the same LCD.

After removing the resist 20, as shown in FIG. 30L, the single crystal silicon layer 7 is patterned to form islands of the active element part and the passive element part. Thereafter, as shown in FIG. 31M, the single crystal silicon layers 7 and 7A are subjected to the activation treatment in the same manner as above, and a gate insulating film 80 is formed on the surface of the display part, whereas a gate insulating film 12 is formed on the surface of the peripheral driving circuit part.

Figure 31N:
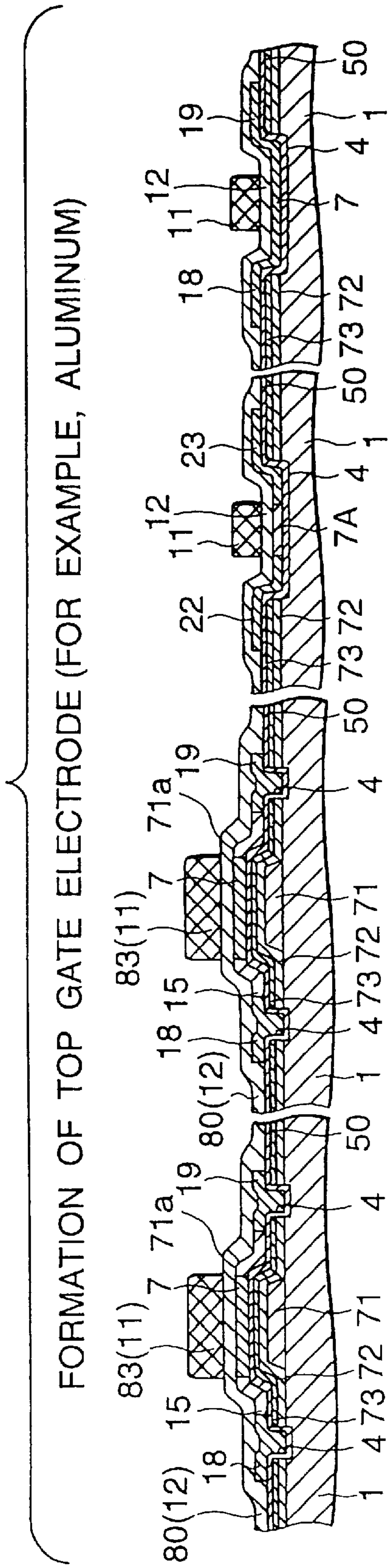

As shown in FIG. 31N, a film comprising, for example, aluminum or aluminum containing 1% of Si formed on the whole surface by a sputtering method is patterned to form a upper gate electrode 83 of the display part and a gate electrode 11 of the peripheral driving circuit part.

Figure 31O:
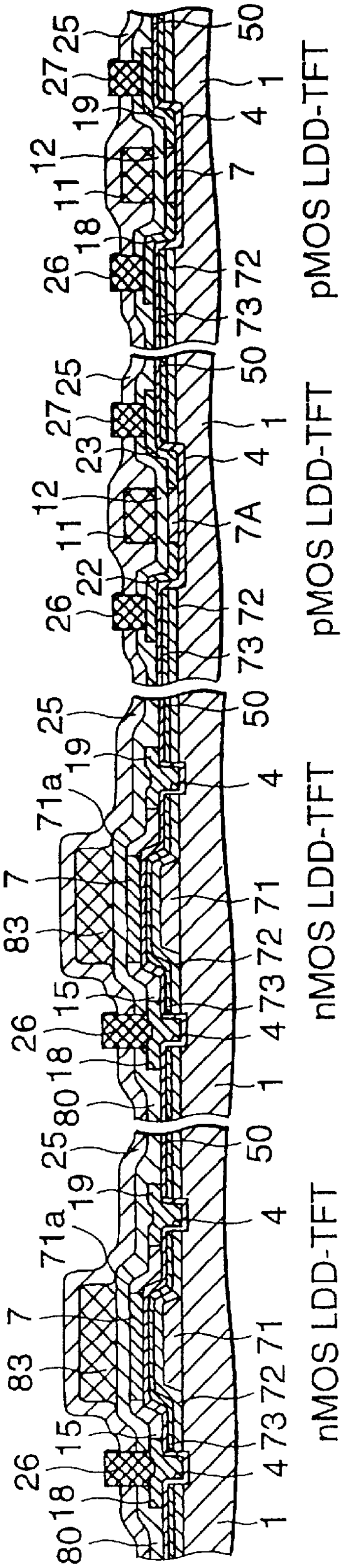

As shown in FIG. 31O, an $SiO_2$ film (having a thickness of about 200 nm) and a phosphorous silicate glass (PSG) film (having a thickness of about 300 nm) are continuously formed in this order on the whole surface, so as to form a protective film 25.

According to the same manner as above, a source electrode 26 of all the TFTs in the peripheral driving circuit part and the display part, and a drain electrode 27 of the peripheral driving circuit part are formed, and thus an active matrix substrate 30, in which the display part and the peripheral driving circuit part are integrated, can be produced, which is formed in such a manner that the CMOS driving circuit comprising the dual gate type nMOS LDD-TFT, and the pMOS TFT and the nMOS TFT of the top gate type, which comprise the gate electrode comprising, for example, aluminum, is formed in each of the display part and the peripheral driving circuit part comprising the single crystal silicon layer 7.

In this embodiment, because the gate electrodes 11 and 83 comprising, for example, aluminum are formed after the activation treatment of the single crystal silicon layer 7, the heat resistance of the gate electrode material has no relationship to the influence of the heat on the activation treatment, and aluminum having a relatively low heat resistance but a low cost can be used as the electrode material of the top gate, so that the range of selection of the electrode material is broadened. In the step of FIG. 31N, the source electrode 26 (as well as the drain electrode) can be simultaneously formed, and such a procedure is advantageous from the standpoint of production.

Figure 32A:
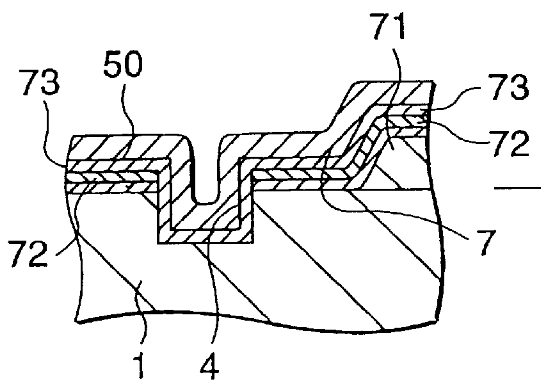
FIGS. 32A to 32C are cross sectional views showing important parts on production of the same LCD.
Figure 32B:
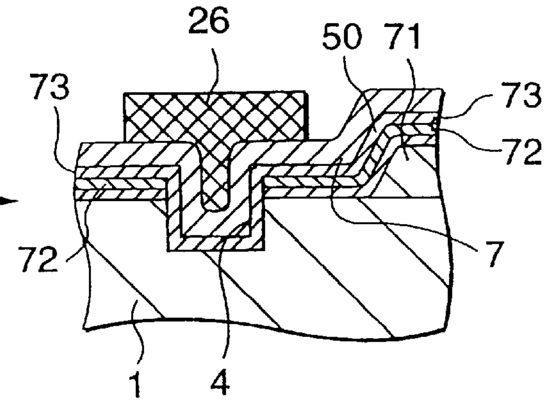
Figure 32C:
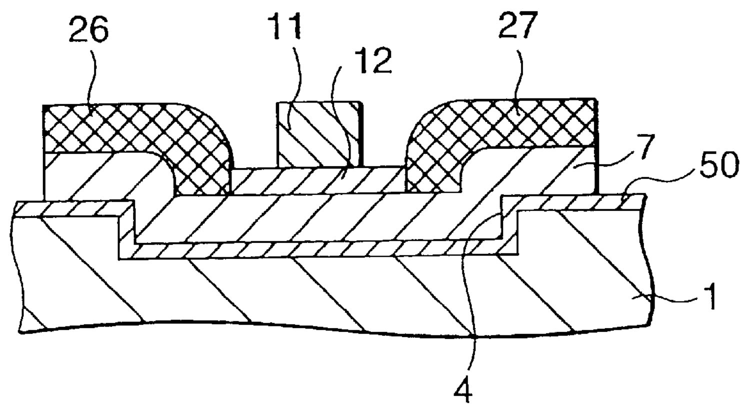

In all the embodiments described above, when a MOS TFT of a bottom gate type, a top gate type or a dual gate type is formed, there is a case where a step interruption (connection defect) or narrowing (increase in resistance) occurs in the single crystal silicon layer 7 because of the thinness thereof by forming the step 4 as schematically shown in FIG. 32A. Therefore, in order to certainly connect to the source electrode 26 (or the drain electrode), the electrode is preferably adhered on the region containing the step 4 as shown in FIGS. 32B and 32C.

In the step shown in FIG. 26B or 29I, it is possible that after forming the top gate insulating film on the single crystal silicon layer 7, the ion implantation and the activation treatment are conducted, and thereafter the top gate electrode and the source and drain electrodes are simultaneously formed with aluminum.

Figure 33A:
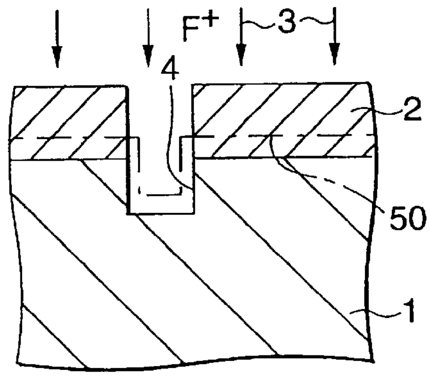
FIGS. 33A to 33E are cross sectional views showing important parts on production of the same LCD.
Figure 33B:
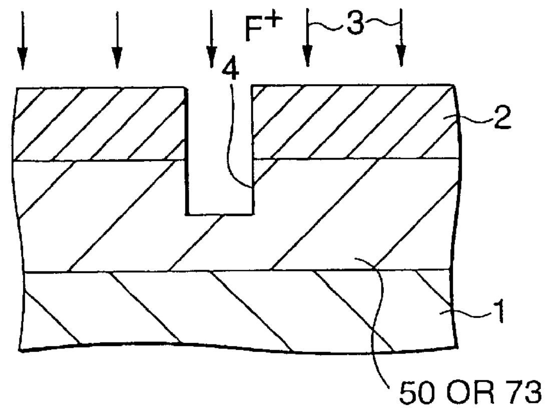
Figure 33C:
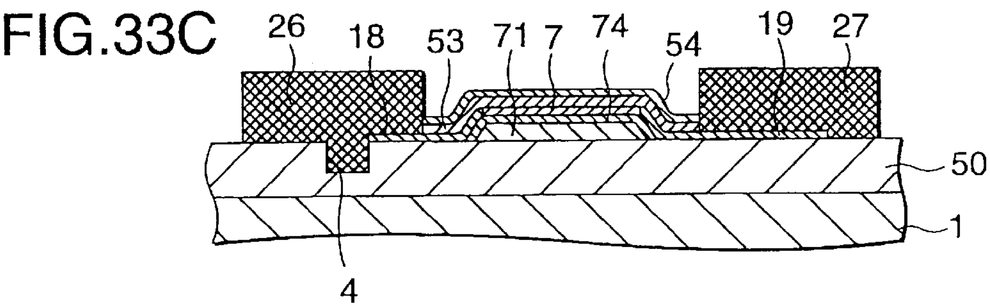
Figure 33D:
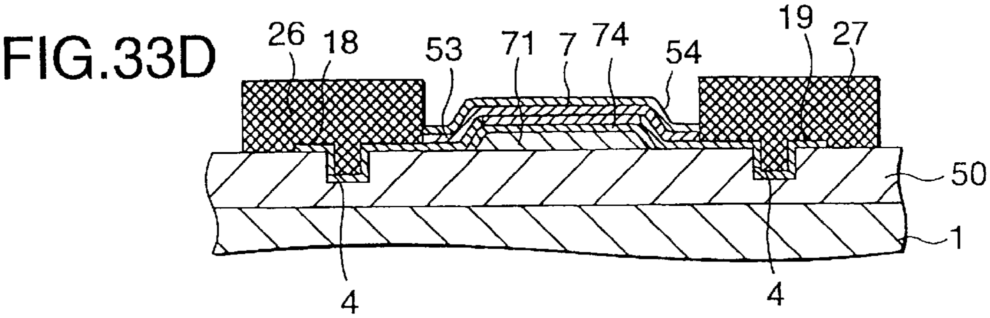
Figure 33E:
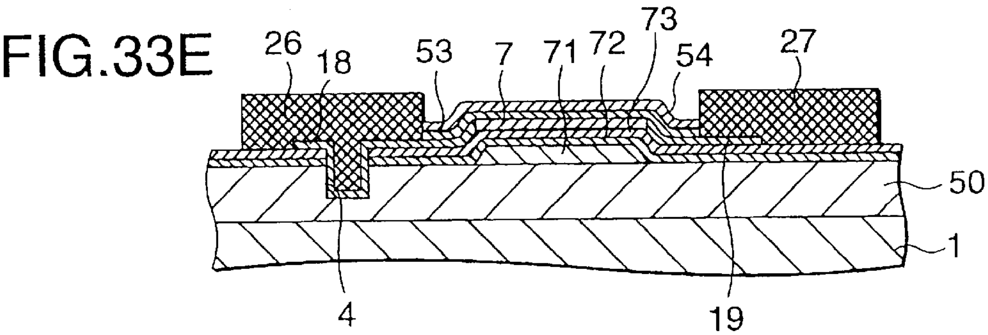

While the step 4 is formed on the substrate 1 (and further on the film, such as the SiN film, formed thereon) in the embodiments described above as shown in FIG. 33A, it may be formed in the crystalline sapphire film 50 (which has a function of stopping the ion diffusion from the glass substrate 1) on the substrate 1 as shown in FIG. 33B. It is possible that the gate insulating films 72 and 73 are formed instead of the crystalline sapphire film 50 or under the crystalline sapphire film 50, and the step 4 is formed therein. Examples in which the step 4 is formed on the crystalline sapphire film 50 are shown in FIGS. 33C, 33D and 33E.

Seventh Embodiment

The seventh embodiment of the invention will be described with reference to FIGS. 34A to 36B.

In this embodiment, examples, in which the TFTs are formed outside the step 4 (i.e., on the substrate 1 other than the step), are described. The single crystal silicon layer 7 and the gate/source/drain electrodes 26 and 27 are schematically shown.

Figure 34A:
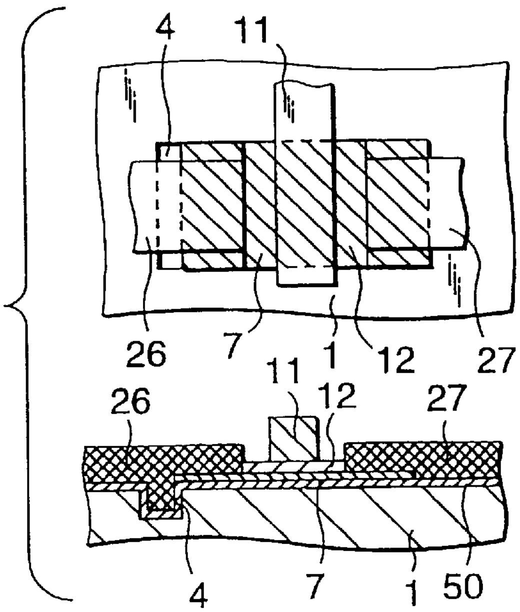
FIGS. 34A to 34E are plan views and cross sectional views showing various TFTs of the LCD according to the seventh embodiment of the invention.
Figure 34B:
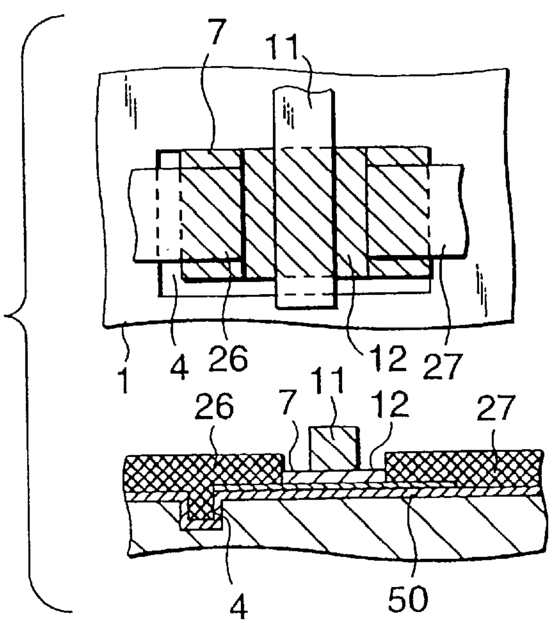
Figure 34C:
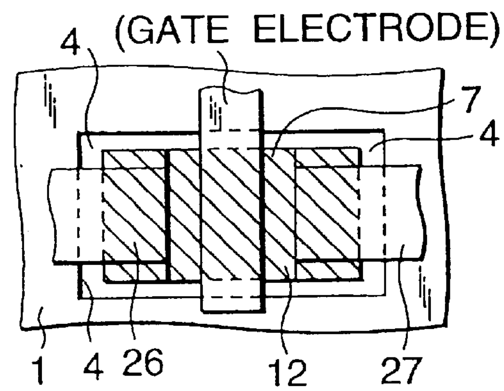
Figure 34D:
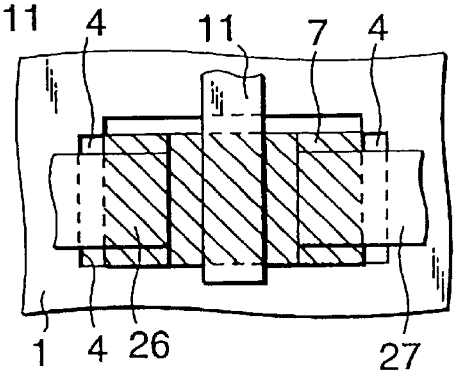
Figure 34E:
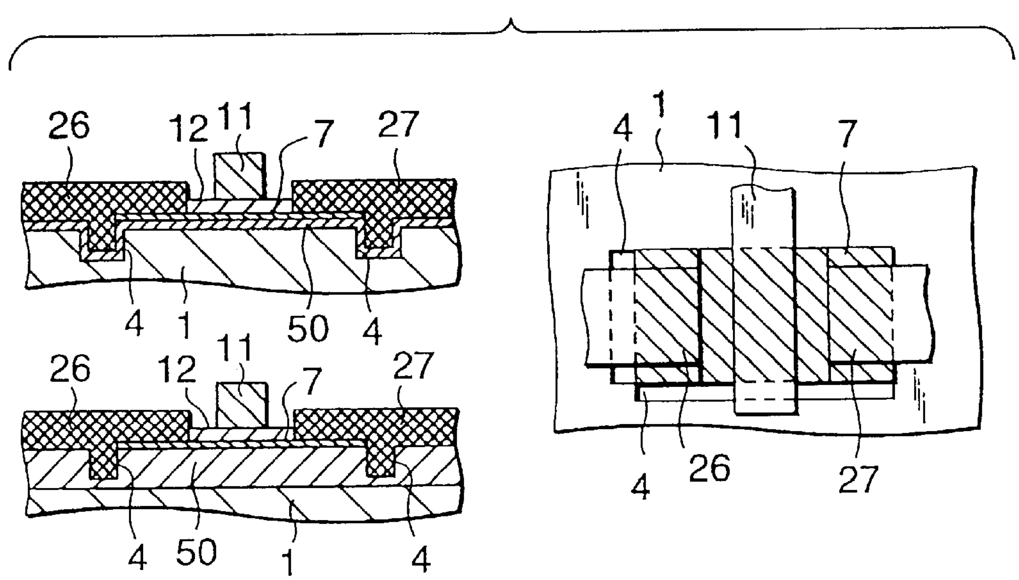

FIGS. 34A to 34E show a top gate type TFT. In FIG. 34A, the concave part 4 formed by the step is formed on one edge of the source side along the source region, and the gate insulating film 12 and the gate electrode 11 are formed on the flat surface of the substrate other than the concave part on the single crystal silicon layer 7. FIG. 34B shows an example, in which the concave part 4 formed by the step is formed in an L shape along the two edges of the drain region not only on the source region but also in the channel direction. FIG. 34C shows an example, in which the concave part 4 is formed in a square form along the four edges surrounding the TFT active region. FIG. 34D shows an example, in which the concave part 4 is formed along the three edges, and FIG. 34E shows an example, in which the concave part 4 is formed in an L shape along the two edges, but in these cases, the concave parts 4 adjacent to each other are not connected.

Because the concave part 4 can be formed in various patterns, and the TFT is formed on the flat surface other than the concave part 4, the production of the TFT can be easily conducted.

Figure 35A:
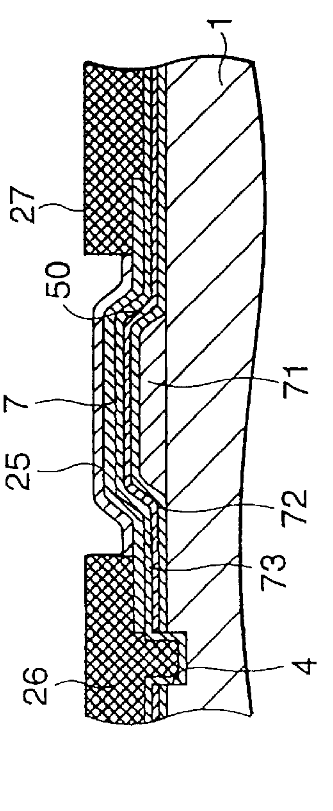
FIGS. 35A to 35D are cross sectional views showing the various TFTs on the production of the same LCD
Figure 35B:
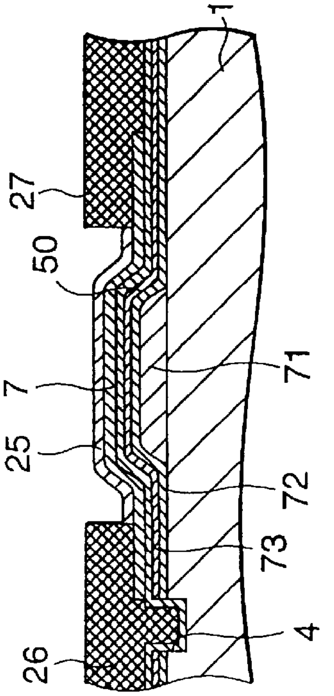
Figure 35C:
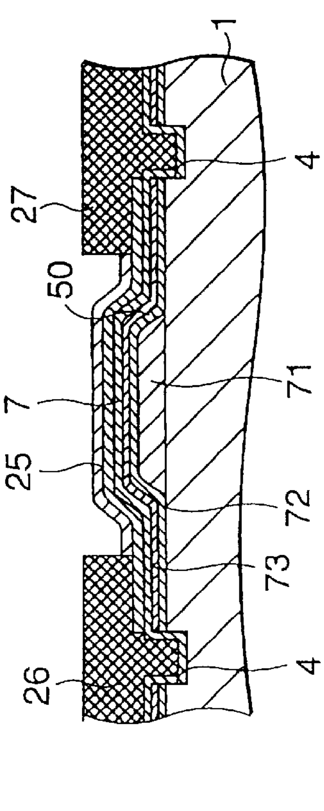
Figure 35D:
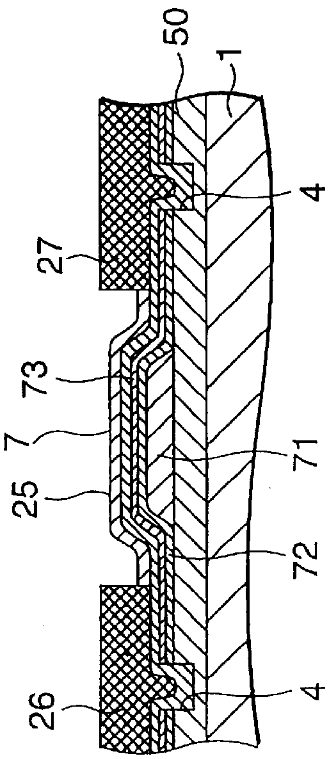

FIGS. 35A to 35D show a bottom gate type TFT, in which the step (or concave part) having the various patterns shown in FIGS. 34A to 34E can be formed. FIG. 35A shows an example corresponding to FIG. 34A, in which the bottom gate type MOS TFT is formed on the flat surface other than the concave part 4 formed by the step. FIG. 35B shows an example corresponding to 34B, and FIG. 35C shows an example corresponding to FIGS. 34C and 34D. FIG. 35D shows an example, in which the step 4 is formed on the crystalline sapphire film 50.

Figure 36A:
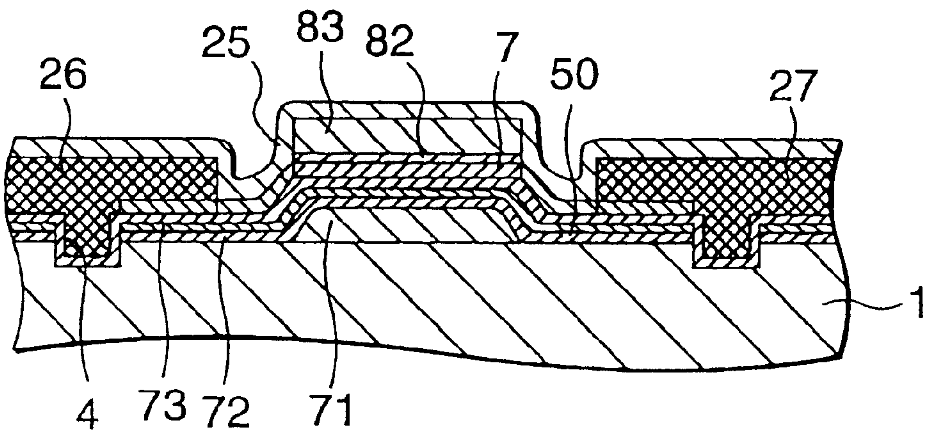
FIGS. 36A and 36B are cross sectional views showing important parts of the same LCD.
Figure 36B:
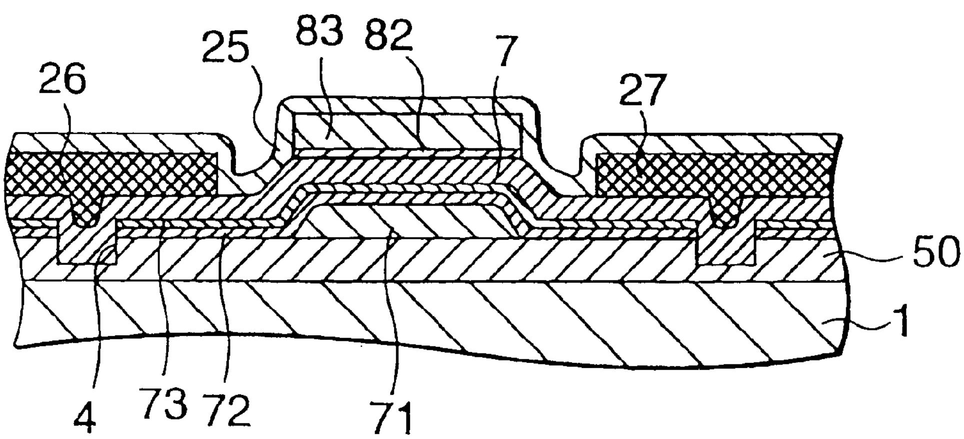

FIGS. 36A and 36B show a dual gate type MOS TFT, in which the step (or concave part) 4 can be formed in the various patterns shown in FIGS. 34A to 34E. For example, as shown in FIG. 34C, the dual gate type MOS TFT can be formed on the flat surface on the region inside the step 4.

Eighth Embodiment

The eighth embodiment of the invention will be described with reference to FIGS. 37 to 39.

FIG. 37 shows an example relating to a double gate type MOS TFT, in which plural TFTs having a self aligning type LDD structure, such as top gate type LDD-TFTs, are arranged.

According to this example, the gate electrode 11 is branched into two, one of which is used as the first gate for the first LDD-TFT, and the other of which is used as the second gate for the second LDD-TFT (provided that an $N^+$-type region 100 is formed between the gate electrodes in the central part of the single crystal silicon layer, so as to realize a low resistance). In this case, different voltages may be applied to the respective gates, and when one of the gates becomes inoperative due to a certain reason, the carrier can be moved between the source and the drain by using the remaining gate, and thus a device of high reliability can be provided. Because the thin film transistor driving the respective pixels by connecting the first LDD-TFT and the second LDD-TFT in series is formed, the voltage applied between the source and the drain of the respective thin film transistors in an off state can be greatly lowered. Therefore, the leakage electric current on the off state can be reduced, and thus the contrast and the image quality of the liquid crystal display can be improved. Furthermore, because the two LDD transistors are connected by using only the same semiconductor layer as the low concentration drain region of the LDD transistor, the connection distance between the transistors can be shortened, and even when the two LDD transistors are connected to each other, the required area is prevented from broadening. The first and second gates may be completely separated and operated independently.

Figure 38A:
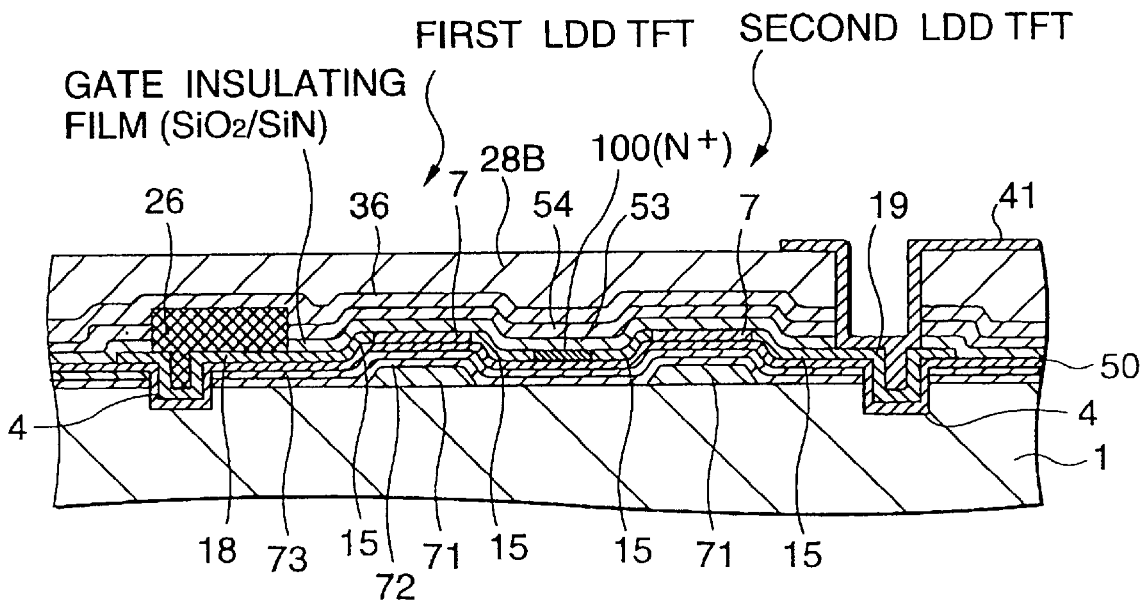
FIGS. 38A and 38B are cross sectional views showing important parts of the various TFTs of the same LCD.
Figure 38B:
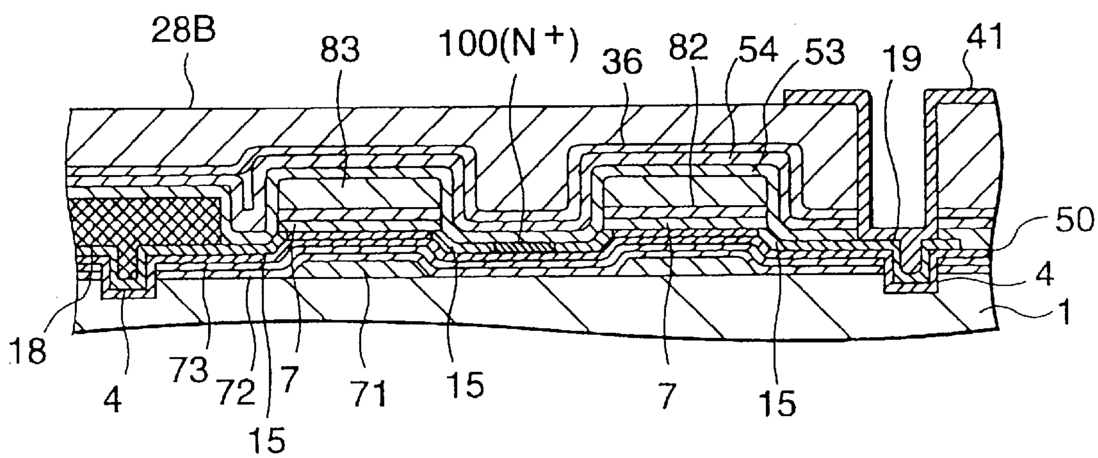

FIG. 38A shows an example, in which the bottom gate type MOS TFT has a double gate structure, and FIG. 38B shows an example, in which the dual gate MOS TFT has a double gate structure.

While these double gate type MOS TFTs also have the same advantages as the top gate type, the dual gate type has further advantages in that even when one of the upper and lower gate parts becomes inoperative, the remaining gate part can be used.

Figure 39:
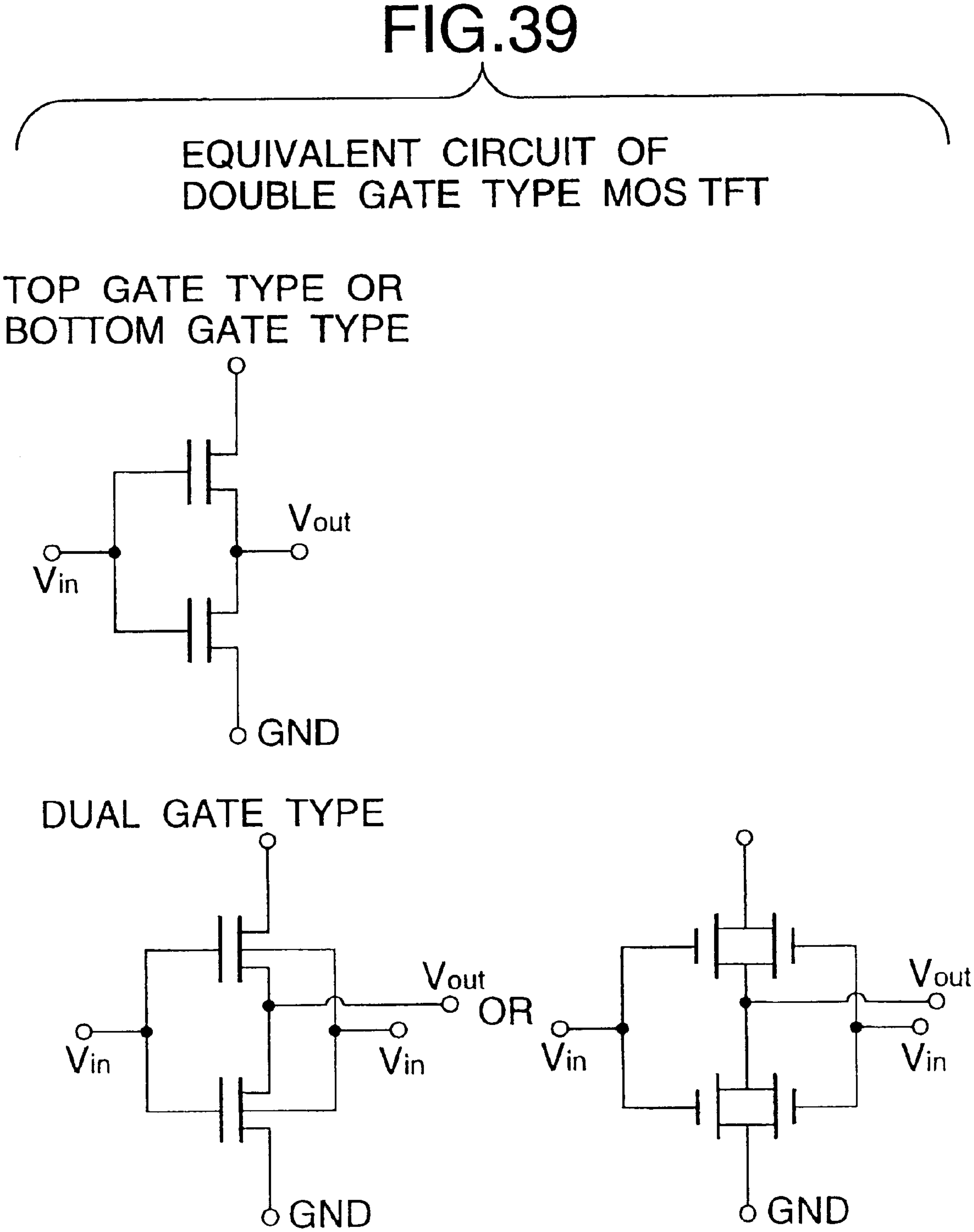
FIG. 39 is an equivalent circuit diagram of the TFT of the same LCD.

FIG. 39 shows the equivalent circuit diagrams of the respective double gate type MOS TFTs. While the gate is branched into two in this embodiment, it may be branched into three or more. In the double gate or multi-gate structure, it is possible that two or more of branched gate electrodes of the same electric potential may be present in a channel region, or divided gate electrodes of the different potentials or the same potential may be present.

Ninth Embodiment

Figure 40A:
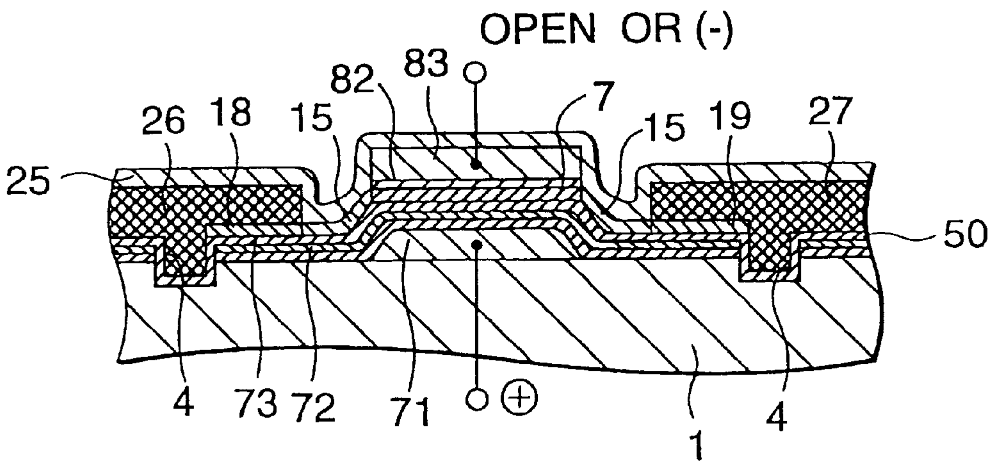
FIGS. 40A and 40B are cross sectional views showing important parts of the TFT of the LCD according to the ninth embodiment of the invention.
Figure 40B:
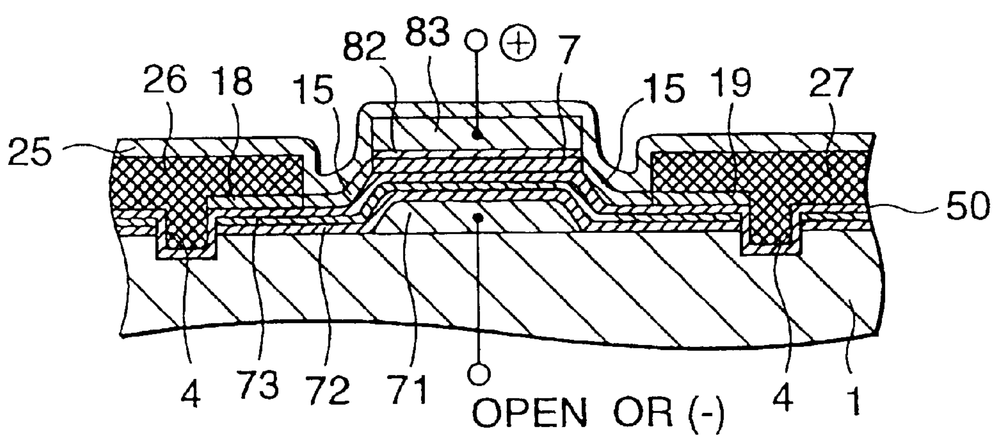

FIGS. 40A and 40B show the ninth embodiment of the invention, in which in the TFT having a dual gate type structure of an nMOS TFT, one of the upper and lower gate parts is operated as a transistor, but the other is operated in the following manner.

That is, in the nMOS TFT shown in FIG. 40A, the leakage electric current of the back channel is reduced by applying an arbitrary negative voltage to the gate electrode of the top gate side. In the case where the top gate electrode is open, it is used as the bottom gate type. In FIG. 40B, an arbitrary negative voltage is always applied to the gate electrode of the bottom gate side, so as to reduce the leakage electric current of the back channel. In this case, when the bottom gate electrode is open, it can be used as a top gate type. In the case of a pMOS TFT, the leakage electric current of the back channel can be reduced by always applying an arbitrary positive voltage to the gate electrode.

Since the interface between the single crystal silicon layer 7 and the insulating film is poor in crystallinity, the leakage electric current is liable to flow, but the leakage electric current can be interrupted by the application of a negative voltage to the electrode. This is advantageous in combination with the effect of the LDD structure. There may be the case where a leakage electric current flows due to light incident from the side of the glass substrate 1, the leakage electric current can be reduced since the light is shielded by the bottom gate electrode.

Tenth Embodiment

The tenth embodiment of the invention will be described with reference to FIGS. 41A to 46.

This embodiment relates to an active matrix reflection type liquid crystal display device (LCD), in which the step (concave part) is not formed on the substrate, but the substance layer (for example, the crystalline sapphire film) is formed on the flat surface of the substrate to hetero-epitaxially grow the single crystal silicon layer by using the substance layer as a seed, and a top gate type MOS TFT is constituted with the single crystal silicon layer.

The production process of the active matrix reflection type LCD according to this embodiment will be described with reference to FIGS. 41A to 46. In FIGS. 41A to 54Q, the diagrams on the left side show the production steps of the display part, and the diagrams on the right side show the production steps of the peripheral driving circuit part.

Figures 41A, 41B:
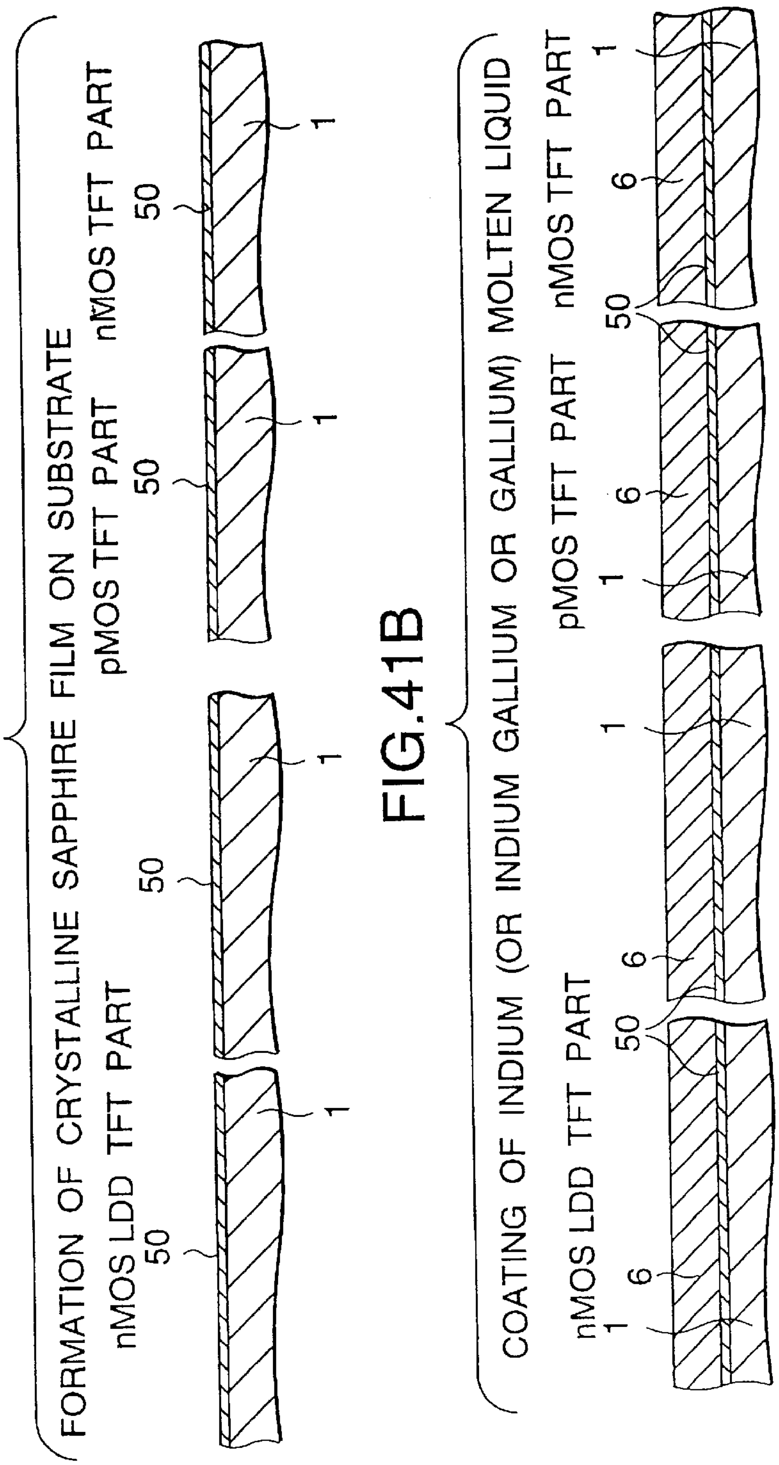
FIGS. 41A to 41C are cross sectional views stepwise showing the production process of an LCD according to the tenth embodiment of the invention.

As shown in FIG. 41A, on one primary surface of an insulating substrate 1, such as quartz glass and transparent crystalline glass, a crystalline sapphire film (having a thickness of from 20 to 200 nm) 50 is formed on at least a TFT forming region. The crystalline sapphire film 50 is formed by oxidizing and crystallizing a trimethylammonium gas with an oxidative gas (such as oxygen and moisture) by a high density plasma CVD method and a catalyst CVD method (described in JP-A-63-40314). As the insulating substrate 1, a highly heat resistant glass substrate (8 to 12 inches in diameter and 700 to 800 $\mu$m in thickness) can be used.

As shown in FIG. 41B, on the whole surface of the crystalline sapphire film 50, a molten liquid 6 of silicon-indium containing 1% by weight of silicon is coated on the substrate 1 heated to a temperature of from 900 to 930° C. as similar in FIG. 5C. Alternatively, the substrate 1 may be dipped in the molten liquid, may be floated by moving on the surface of the molten liquid, or may be in contact with the molten liquid under a stream thereof or under action of ultrasonic vibration. A molten liquid of silicon-indium-gallium and a molten liquid of silicon-gallium can be used instead of the molten liquid of silicon-indium, and the molten liquid of silicon-indium will be described below as a representative example.

Figure 41C:
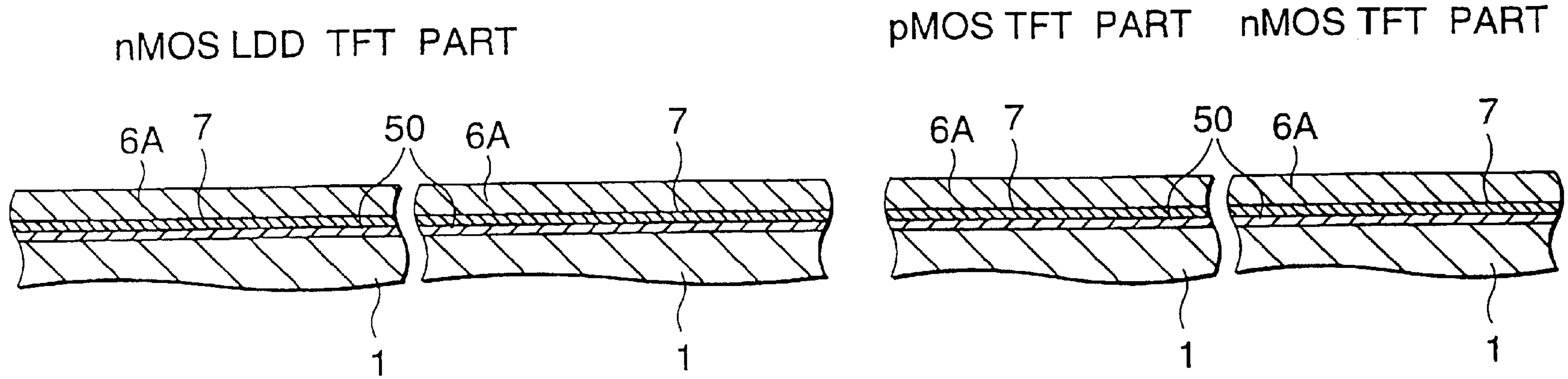

After the substrate 1 is maintained for several minutes to several tens minutes, it is gradually cooled (in the case of dipping, it is gradually withdrawn), so that the silicon dissolved in indium is hetero-epitaxially grown using the crystalline sapphire film 50 as a seed as shown in FIG. 41C, so as to deposit as a P-type single crystal silicon layer 7 having a thickness of, for example, about 0.1 $\mu$m. In the dipping method and the floating method, the composition and the temperature of the molten liquid and the withdrawing rate can be easily controlled, and the thickness of the epitaxially grown layer and the concentration of the P-type carrier impurity can be easily controlled.

Because the crystalline sapphire film 50 exhibit good lattice matching with single crystal silicon, the (100) plane, for example, of the thus accumulated single crystal silicon layer 7 is hetero-epitaxially grown on the substrate.

Figure 42D:
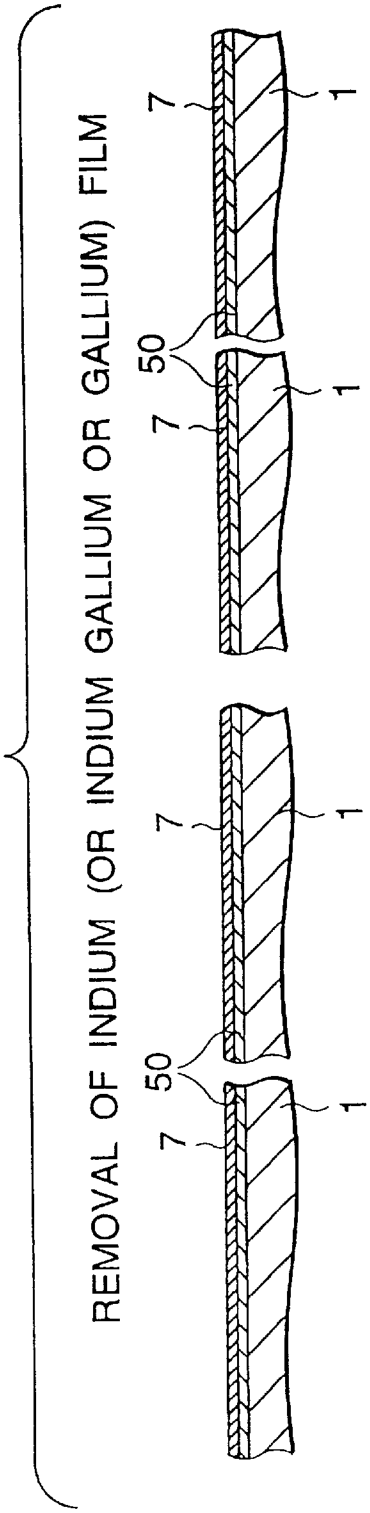
FIGS. 42D to 42G are cross sectional views stepwise showing the production process of the same LCD.

After depositing the single crystal silicon layer 7 on the substrate 1 by the hetero-epitaxial growth, the indium film 6A on the substrate is dissolved and removed with hydrochloric acid or sulfuric acid as shown in FIG. 42D, and the production of a top gate type MOS TFT having a channel region comprising the single crystal silicon layer 7 is conducted.

Figure 42E:
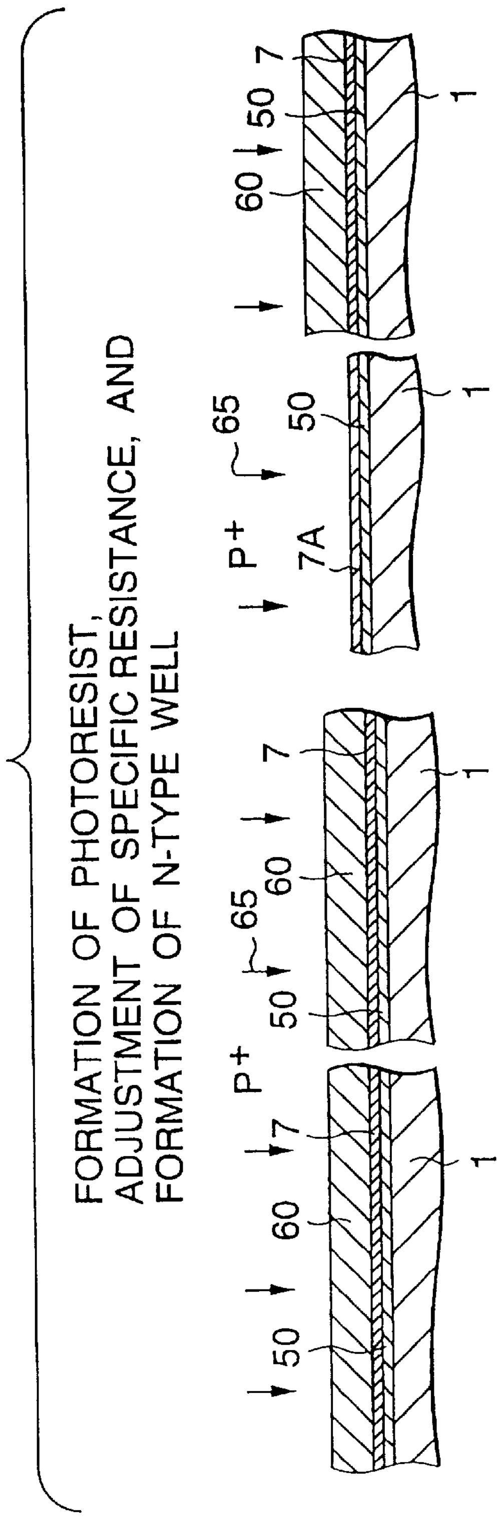

The whole surface of the single crystal silicon layer 7 by the hetero-epitaxial growth is doped with a P-type carrier impurity, such as a boron ion, in a suitable amount to adjust the specific resistance. Only the PMOS TFT forming region is selectively doped with an N-type carrier impurity to form an N-type well. For example, the p-channel TFT part is masked with a photoresist (not shown in the figure), doping of a p-type impurity ion (for example, $B^+$) is conducted at 10 kV in a dose amount of $2.7\times10^{11}$ atoms/cm$^2$, so as to adjust the specific resistance. As shown in FIG. 42E, in order to control the concentration of the impurity in the PMOS TFT forming region, the nMOS TFT part is masked with a photoresist 60, and doping of an N-type impurity ion (for example, $P^+$) 65 is conducted at 10 kV in a dose amount of $1\times10^{11}$ atoms/cm$^2$, so as to form an N-type well 7A.

Figure 42F:
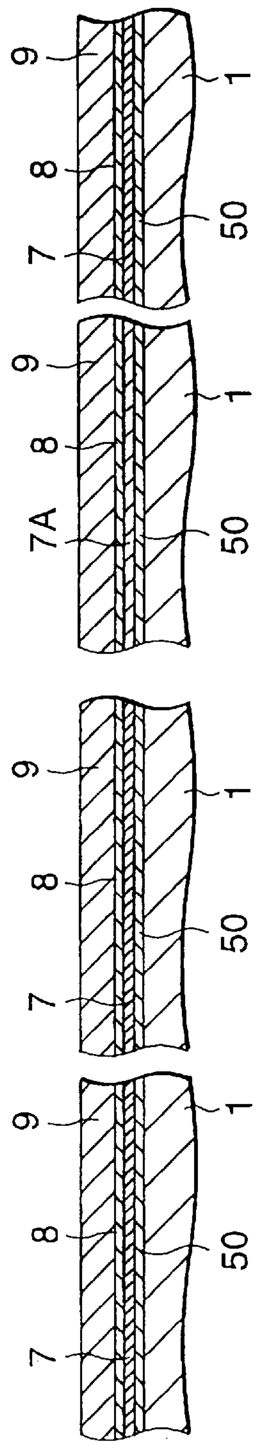

As shown in FIG. 42F, an SiO2 film (having a thickness of about 200 nm) and an SiN film (having a thickness of 100 nm) are continuously formed in this order on the whole surface of the single crystal silicon layer 7 by a plasma CVD method, a high density plasma CVD method or a catalyst CVD method, so as to form a gate insulating film 8. Furthermore, a sputtering film 9 of a molybdenum-tantalum (Mo.Ta) alloy (having a thickness of from 500 to 600 nm) is further formed.

Figure 42G:
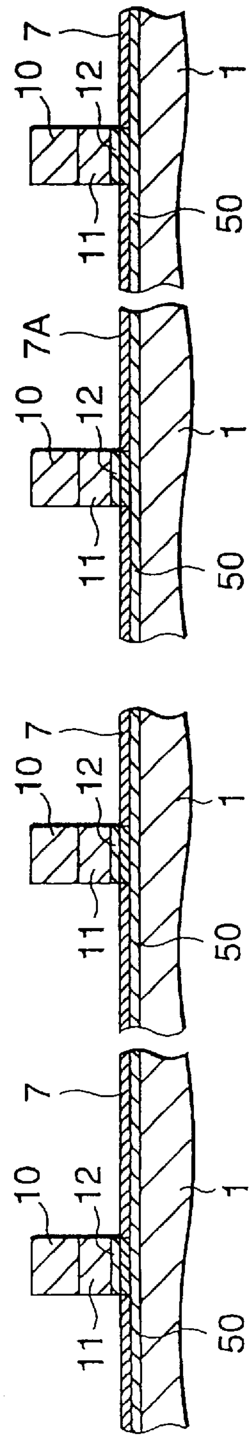

As shown in FIG. 42G, a photoresist pattern 10 is formed in the step region (concave part) of the TFT part of the display part region and the TFT part of the peripheral driving circuit region by a general purpose photolithography and etching technique, and the gate electrode 11 comprising an Mo.Ta alloy and a gate insulating film ($SiN/SiO_2$) 12 are formed by continuous etching, so as to expose the single crystal silicon layer 7. The Mo.Ta alloy film 9 is treated with an acidic etching solution, the SiN film is treated by plasma etching using a $CF_4$ gas, and the $SiO_2$ film is treated with a hydrofluoric acid series etching liquid.

Figures 43H, 43I:
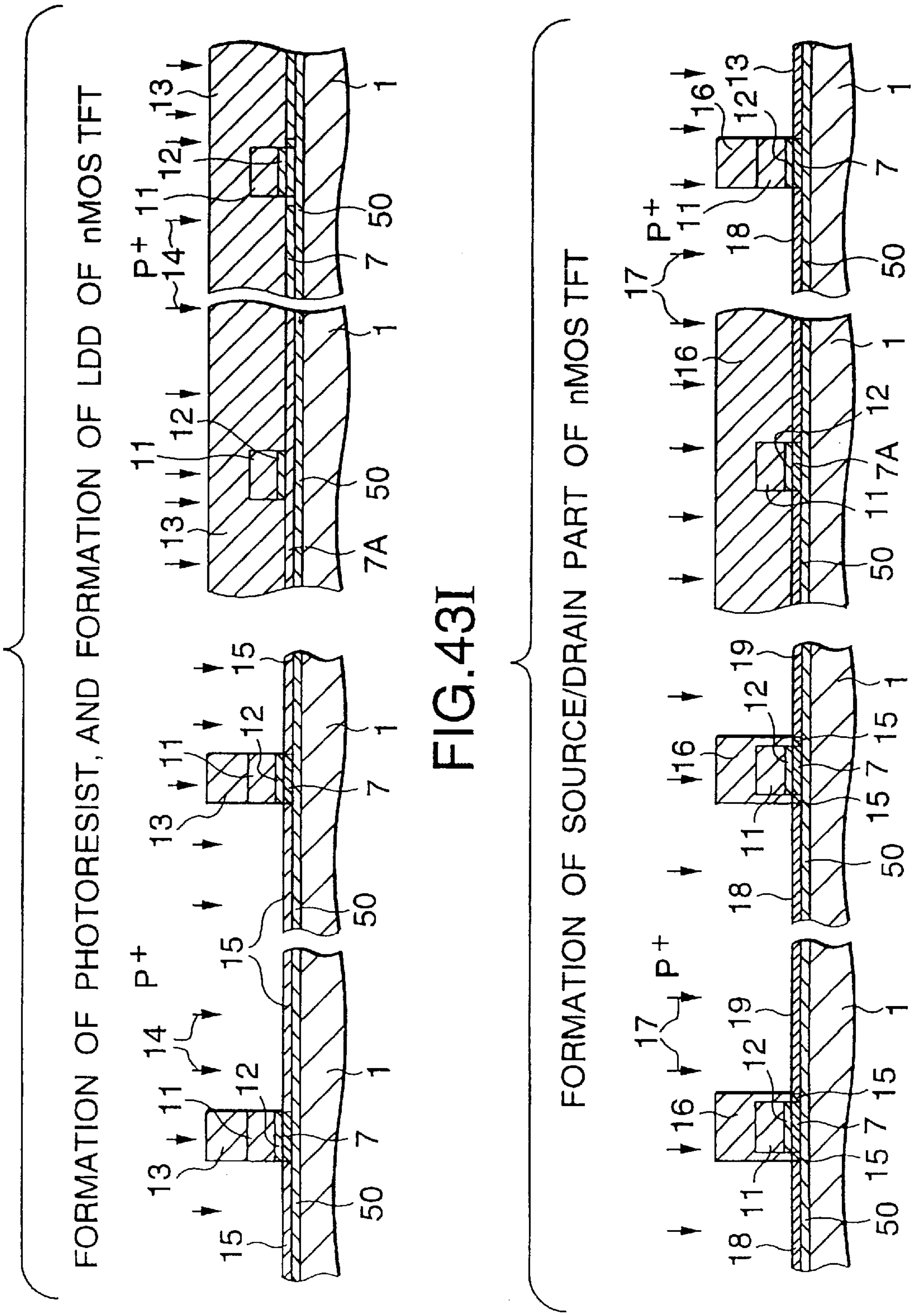
FIGS. 43H to 43J are cross sectional views stepwise showing the production process of the same LCD.

As shown in FIG. 43H, all the TFTs of nMOS and the pMOS of the peripheral driving circuit region and the gate part of the nMOS TFT of the display part region are covered with a photoresist 13, and the exposed source/drain region of the nMOS TFT is doped (ion implantation) with a phosphorous ion 14 at 20 kV in a dose amount of $5\times10^{13}$ atoms/cm$^2$, so as to form an LDD part 15 comprising an $N^-$-type layer in a self aligning manner.

As shown in FIG. 43I, the whole of the pMOS TFT of the peripheral driving circuit region, the gate part of the NMOS TFT of the peripheral driving circuit region, and the gate part and the LDD part of the nMOS TFT of the display part region are covered with a photoresist 16, and the exposed region is doped (ion implantation) with a phosphorous or arsenic ion 17 at 20 kV in a dose amount of $5\times10^{15}$ atoms/cm$^2$, so as to form a source part 18, a drain part 19 and an LDD part 15 comprising an $N^+$-type layer of the nMOS TFT.

Figure 43J:
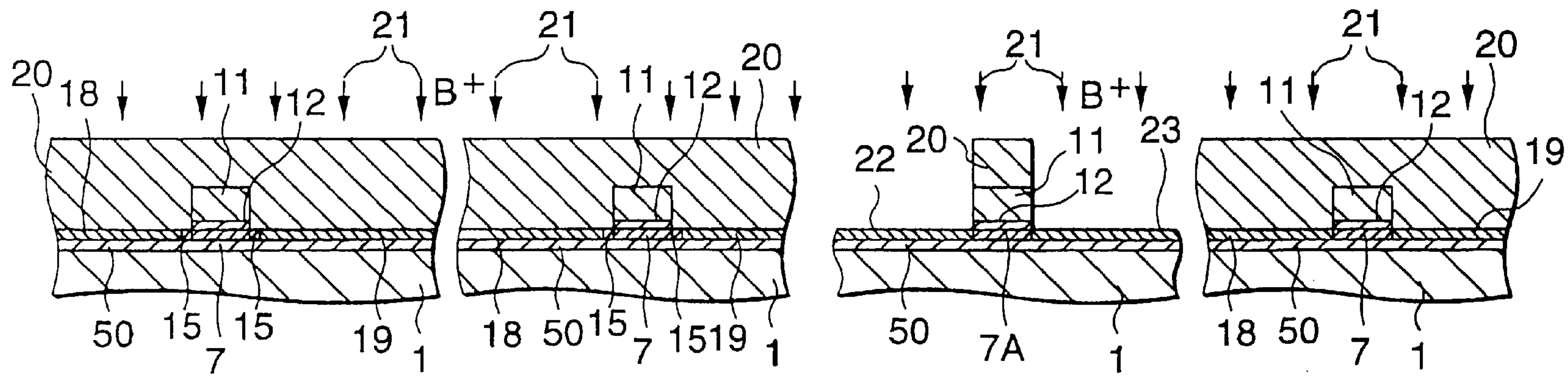

As shown in FIG. 43J, the nMOS TFT of the peripheral driving circuit region, and the whole of the nMOS TFT and the gate part of the pMOS TFT of the display (part) region are covered with a photoresist 20, and the exposed region is doped (ion implantation) with a boron ion 21 at 10 kV in a dose amount of $5\times10^{15}$ atoms/cm$^2$, so as to form a source part 22 and a drain part 23 of a $P^+$-type layer of the pMOS TFT. In the case of the nMOS peripheral driving circuit, there is no PMOS TFT, and this procedure is unnecessary.

Figures 44K, 44L:
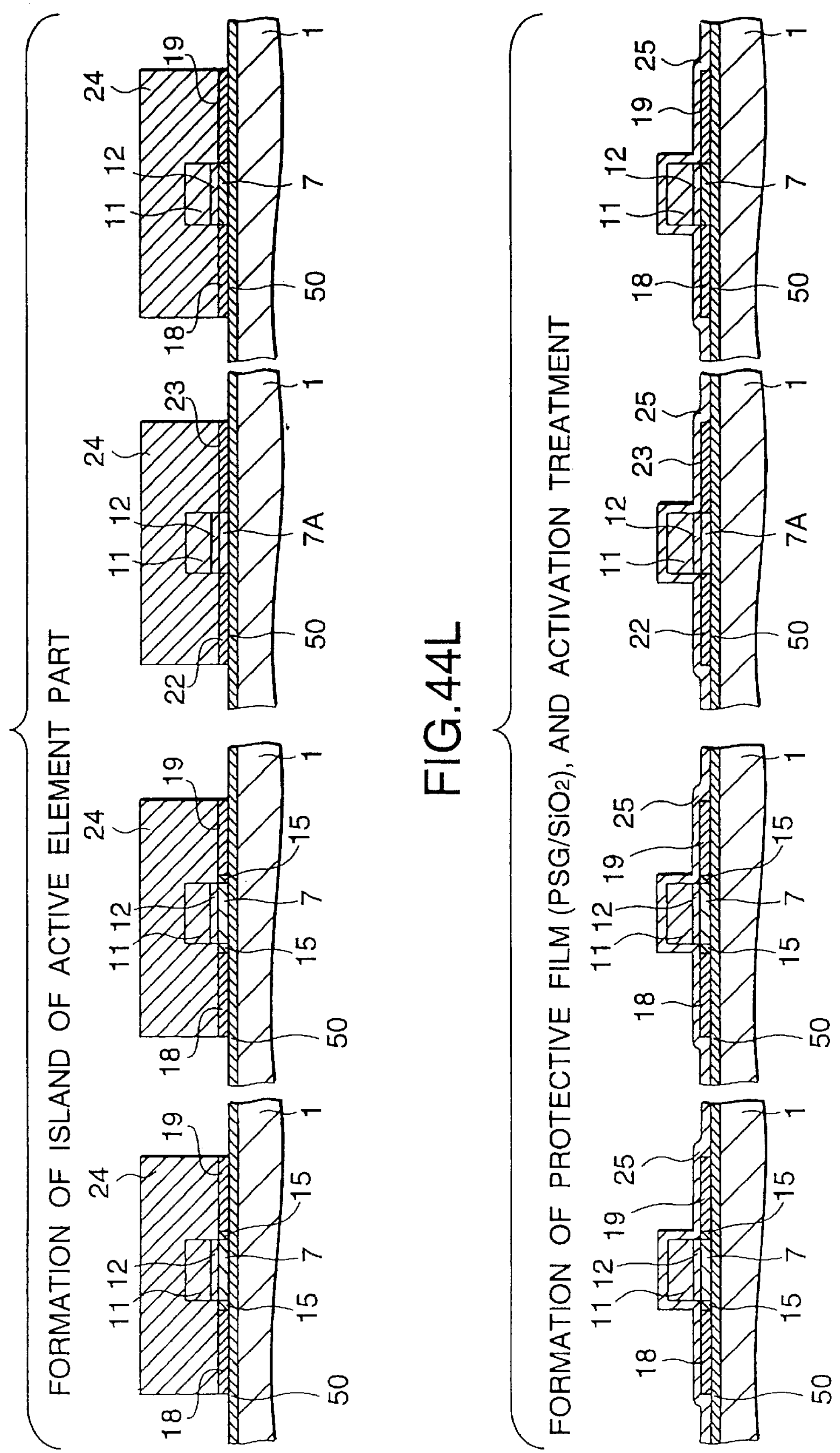
FIGS. 44K to 44N are cross sectional views stepwise showing the production process of the same LCD.

As shown in FIG. 44K, in order to form islands of the active element part, such as a TFT and a diode, and the passive element part, such as a resistance and an inductance, a photoresist 24 is provided, and the single crystal silicon thin film layer other than all the active elements and the passive elements of the peripheral driving circuit region and the display (part) region is removed by the general purpose photolithography and etching technique. A hydrofluoric acid series etching liquid is used.

As shown in FIG. 44L, an $SiO_2$ film (having a thickness of about 200 nm) and a phosphorous silicate glass (PSG) film (having a thickness of about 300 nm) are continuously formed in this order on the whole surface by a plasma CVD method, a high density plasma CVD method or a catalyst CVD method, so as to form a protective film 25.

Maintaining that state, the single crystal silicon layer is subjected to an activation treatment. In the activation treatment, the lamp annealing condition such as halogen is about 1,000° C. for about 10 seconds. Therefore, a gate electrode material withstanding thereto is necessary, and an Mo.Ta alloy having a high melting point is suitable thereto. The gate electrode material can be not only provided in the gate part, but also drawn around a wide area as wiring. While expensive excimer laser annealing is not conducted in this embodiment, when it is used, the conditions thereof are preferably XeCl (wavelength: 308 nm) on the whole surface, or selective overlap scanning of 90% or more only for the active element part and the passive element part.

Figure 44M:
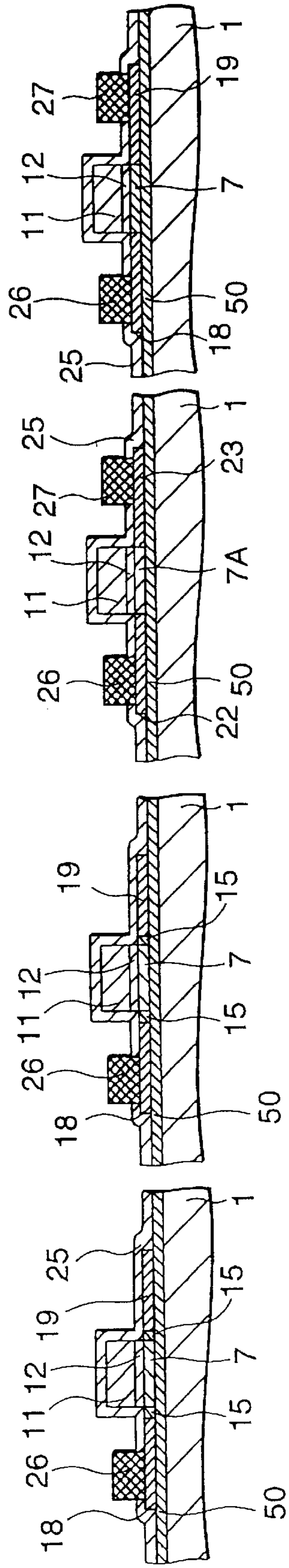

As shown in FIG. 44M, contact holes are formed in the source/drain parts of all the TFTs of the peripheral driving circuit and the source part of the TFT for display by a general purpose photolithography and etching technique.

A sputtering film, such as aluminum or aluminum containing 1% of Si, having a thickness of from 500 to 600 nm is formed on the whole surface. A source electrode 26 of all the TFTs of the peripheral driving circuit and the display part and a drain electrode 27 of the peripheral driving circuit part are formed by a general purpose photolithography and etching technique, and simultaneously a data line and a gate line are formed. Thereafter, a sinter treatment is conducted in a forming gas ($N_2$+$H_2$) at about 400° C. for 1 hour.

Figure 44N:
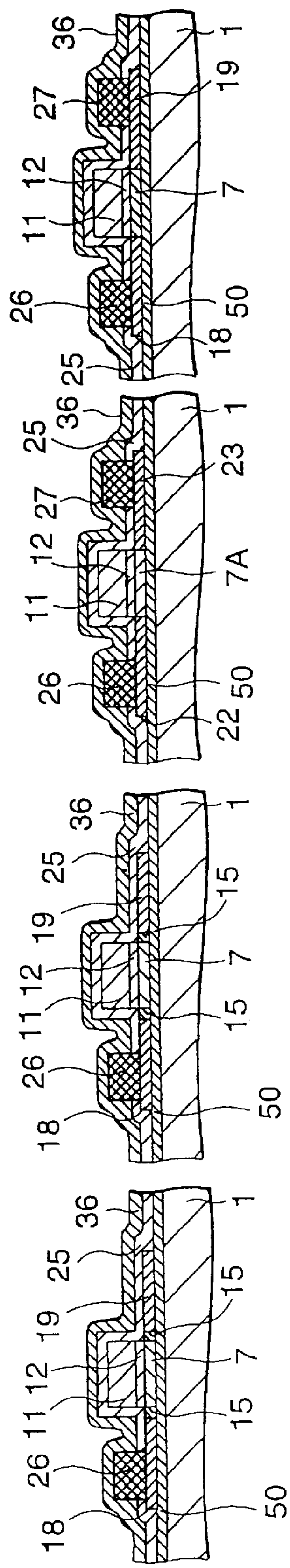

As shown in FIG. 44N, an insulating film 36 comprising a PSG film (having a thickness of about 300 nm) and an SiN film (having a thickness of about 300 nm) is formed on the whole surface by a plasma CVD method, a high density plasma CVD method or a catalyst CVD method. Contact holes in the drain part of the TFT for display are then formed. The $SiO_2$ film, the PSG film and the SiN film on the pixel part may not be removed.

Figure 45O:
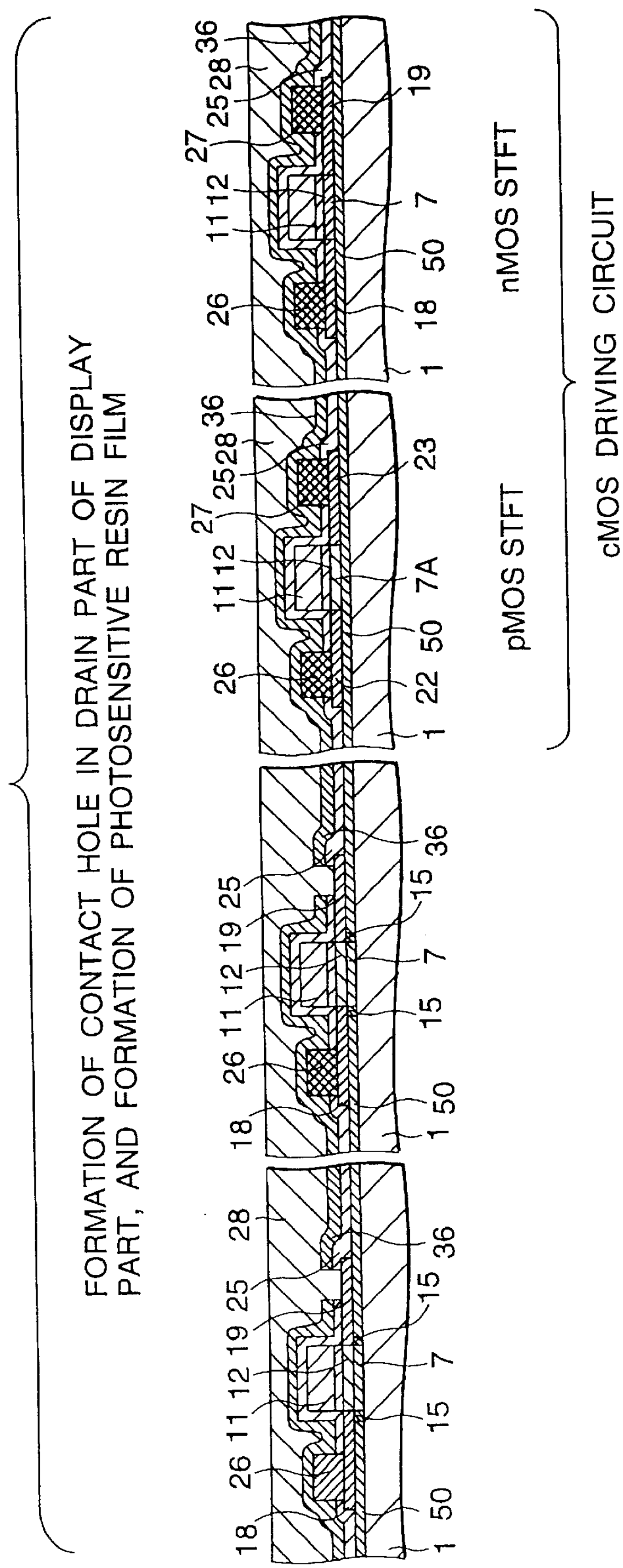
FIGS. 45O to 45Q are cross sectional views stepwise showing the production process of the same LCD.
Figure 45P:
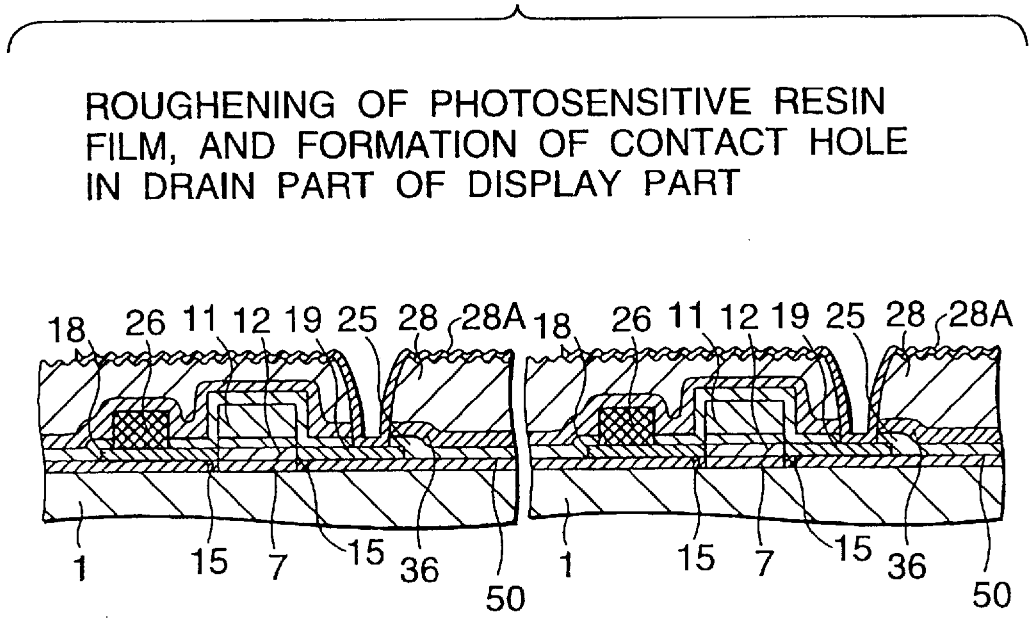

According to the same object described in FIG. 10Q, as shown in FIG. 45O, a photosensitive resin film 28 having a thickness of from 2 to 3 $\mu$m is formed on the whole surface by spin coating, and as shown in FIG. 45P, an unevenness pattern for obtaining the optimum reflection characteristics and viewing angle characteristics is formed at least on the pixel part by a general purpose photolithography and etching technique, so as to form a lower part of the reflection face comprising an uneven roughened surface 28A by reflowing. Simultaneously, contact holes are formed in the resin film on the drain part of the TFT for display.

Figure 45Q:
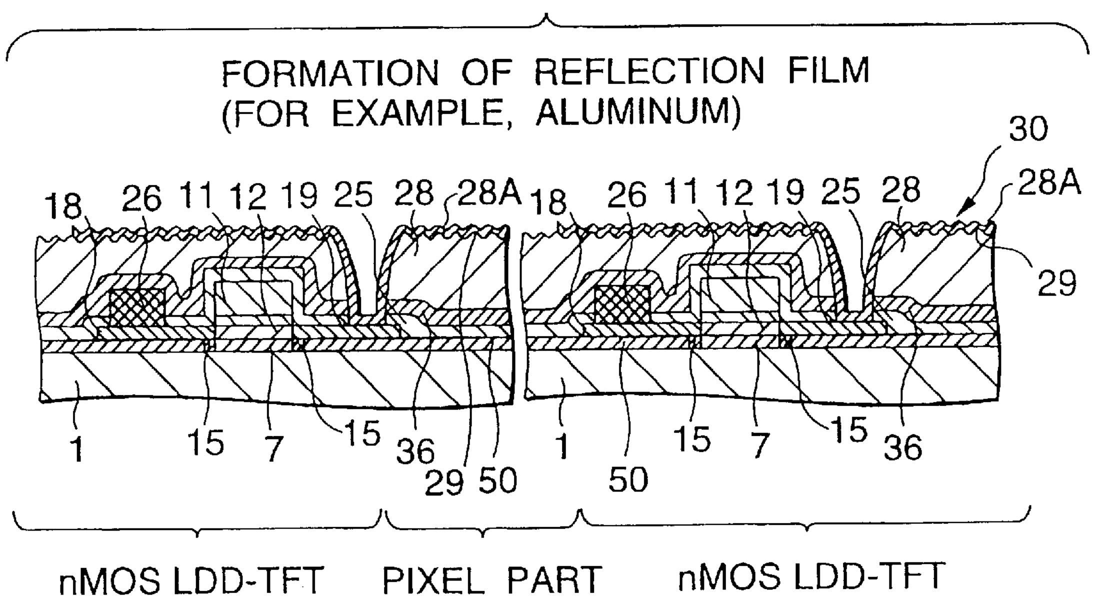

As shown in FIG. 45Q, a sputtering film comprising aluminum or aluminum containing 1% of Si having a thickness of from 400 to 500 nm is formed on the whole surface, and the aluminum film other than on the pixel part is removed by a general purpose photolithography and etching technique, so as to form a reflection part 29 comprising aluminum having an uneven shape connected to the drain part 19 of the TFT for display. This is used as a pixel electrode for display. Thereafter, a sinter treatment is conducted in a forming gas at about 300° C. for 1 hour, to ensure the contact. In order to increase the reflectivity, silver and a silver alloy may be used instead of the aluminum series materials.

According to the procedures described above, an active matrix substrate 30, in which the display part and the peripheral driving circuit part are integrated, can be produced, which is formed in such a manner that the single crystal silicon layer 7 is formed by high temperature hetero-epitaxial growth using the crystalline sapphire film 50 as a seed, and the CMOS circuit comprising the top gate type nMOS LDD-TFT, the PMOS TFT and the nMOS TFT is formed in the display part and the peripheral driving circuit part comprising the single crystal silicon layer 7.

Figure 46:
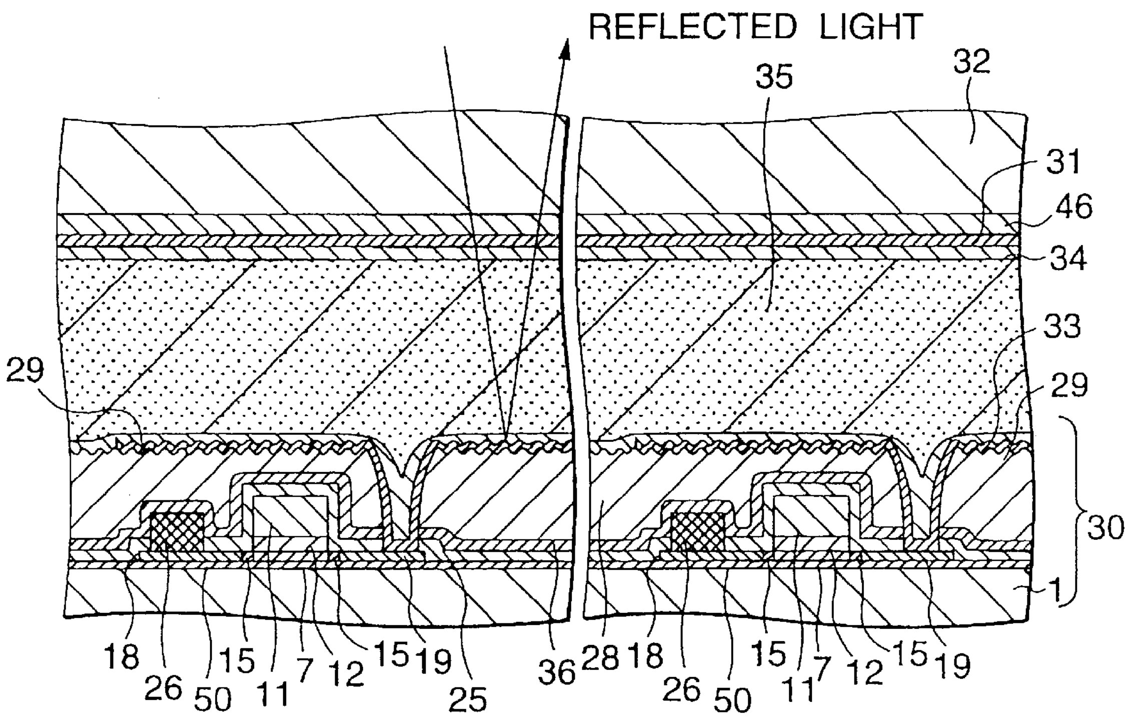
FIG. 46 is a cross sectional view showing an important part of the same LCD.

By using the resulting active matrix substrate (driving substrate) 30, a reflection type liquid crystal display device (LCD) shown in FIG. 46 in the same manner described in FIGS. 10P to 10R is produced.

It is apparent that the excellent effects obtained in the first embodiment are also obtained in this embodiment. Furthermore, because the single crystal silicon layer 7 is subjected to hetero-epitaxial growth without forming a step on the substrate 1 but using only the crystalline sapphire film 50, the step of forming the step is omitted to simplify the production process, and the problem of step interruption of the growing single crystal silicon layer can also be resolved.

Eleventh Embodiment

The eleventh embodiment of the invention will be described with reference to FIGS. 47A to 49D.

Figure 47A:
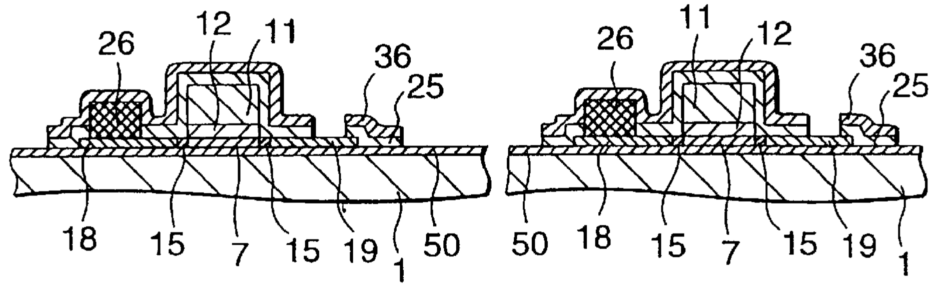
FIGS. 47A to 47C are cross sectional views stepwise showing the production process of an LCD according to the eleventh embodiment of the invention.

This embodiment has a top gate type MOS TFT in the display part and the peripheral driving circuit part as similar to the tenth embodiment, but relates to a transmission LCD as different from the tenth embodiment. That is, although this embodiment is the same as the steps from FIG. 40A to 44N, after these steps, a contact hole 19 for the drain part of the TFT for display is formed in the insulating films 25 and 36, and simultaneously the unnecessary $SiO_2$, PSG and SiN films on the pixel opening part are removed to improve the transmissibility, as shown in FIG. 47A.

Figure 47B:
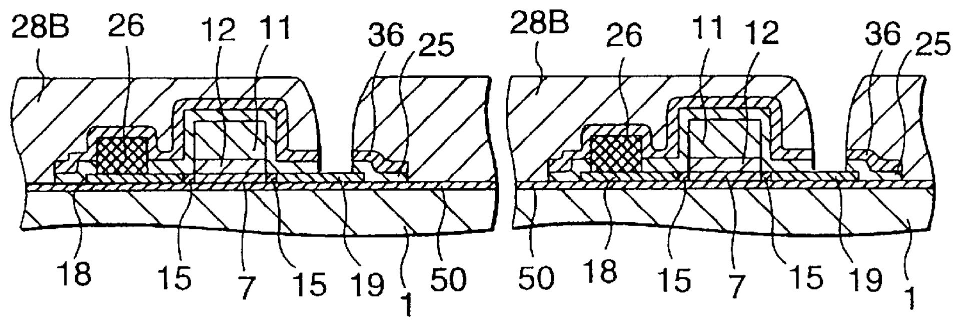

As shown in FIG. 47B, a flattening film 28B comprising a photosensitive acryl series transparent resin having a thickness of from 2 to 3 $\mu$m is then formed by spin coating on the whole surface, and a contact hole is formed in the transparent resin 28B on the drain side of the TFT for display by a general purpose photolithography, followed by subjecting hardening under a prescribed condition.

Figure 47C:
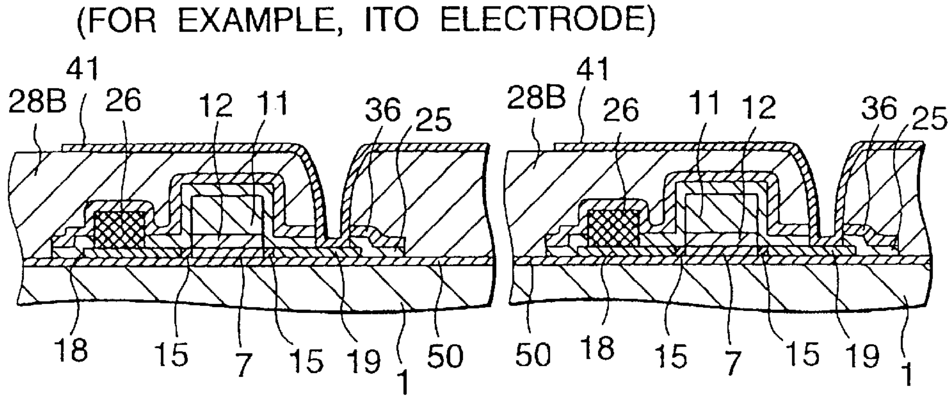

As shown in FIG. 47C, an ITO sputtering film having a thickness of from 130 to 150 nm is then formed on the whole surface, and an ITO transparent electrode 41 in contact with the drain part 19 of the TFT for display is formed by a general purpose photolithography and etching technique. Thereafter, the contact resistance between the drain of the TFT for display and the ITO is lowered, and the transparency of the ITO is improved by a heat treatment in a forming gas at a temperature of from 200 to 250° C. for 1 hour.

Figure 48:
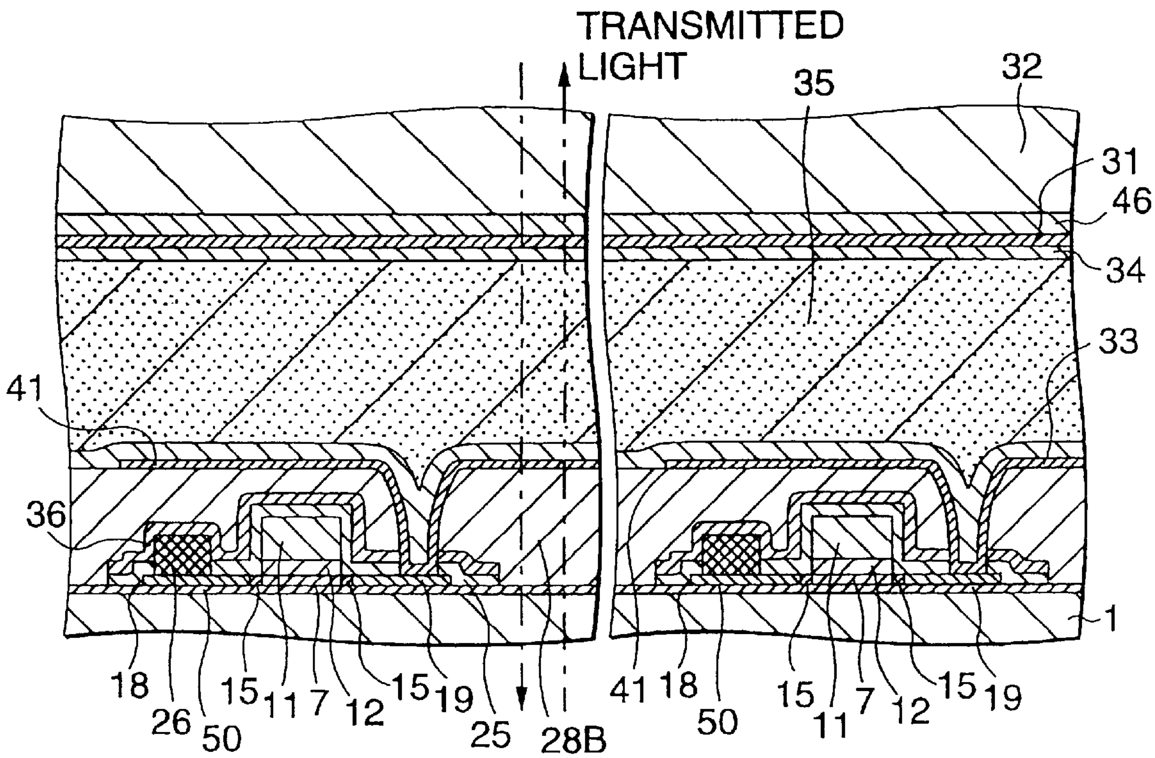
FIG. 48 is a cross sectional view showing an important part of the same LCD.

As shown in FIG. 48, the substrate is combined with a counter substrate 32 to fabricate a transmission type LCD in the similar manner as in the eighth embodiment, provided that a polarizing plate is also adhered on the TFT substrate side. In this transmission type LCD, transmission light indicated by the solid line is obtained, and also transmission light indicated by the chain line can be obtained from the side of the counter substrate 32.

In this transmission type LCD, an on-chip color filter (OCCF) structure and an on-chip black (OCB) structure can be produced.

Figure 49A:
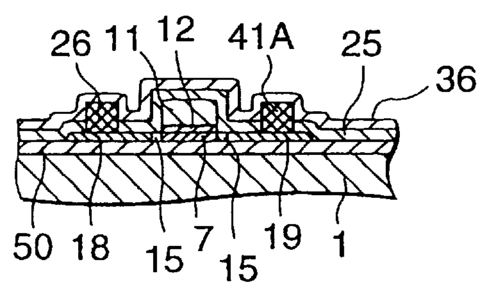
FIGS. 49A to 49D are cross sectional views stepwise showing the production process of the same LCD.

The steps of FIGS. 41A to 44M are conducted in the similar manner as above. Thereafter, as shown in FIG. 49A, after a contact hole is also formed in the drain part of the insulating film 25 of PSG/$SiO_2$, an aluminum embedded layer 41A for a drain electrode is formed, and an insulating film 36 of SiN/PSG is formed.

Figure 49B:
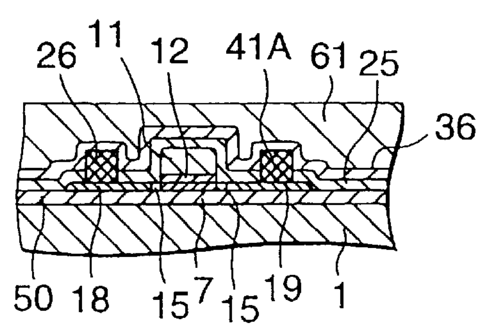
Figure 49C:
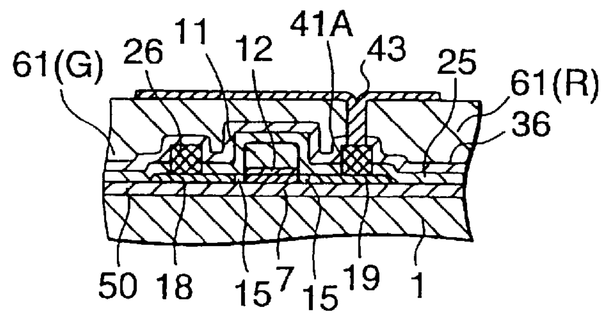

As shown in FIG. 49B, a photoresist 61 having a pigment dispersed therein corresponding to the respective segments of R, G and B having a prescribed thickness (from 1 to 1.5 $\mu$m) is formed, and as shown in FIG. 49C, color filter layers 61(R), 61(G) and 61(B) are formed by patterning, in which the layer is left at prescribed positions (respective pixel parts), using a general purpose photolithography technique (on-chip color filter structure). At this time, a contact hole for the drain part is also formed. An opaque ceramic substrate cannot be used.

As shown in FIG. 49C, a contact hole connecting to the drain of the TFT for display is formed, and a light shielding layer 43 to be a black mask layer is formed by patterning a metal over the color filter layer. For example, a molybdenum film having a thickness of from 200 to 250 nm is formed by a sputtering method, and the film is patterned into a prescribed shape to shield from light to cover the TFT for display (on-chip black structure).

Figure 49D:
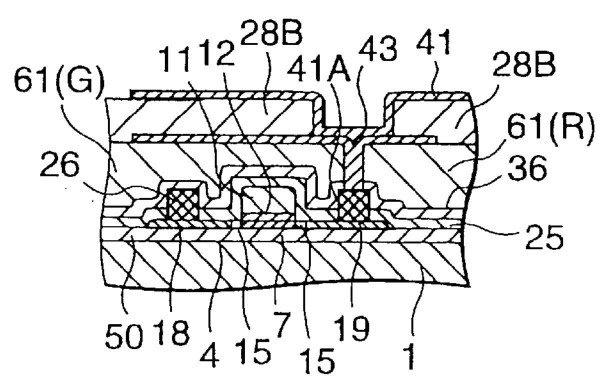

As shown in FIG. 49D, a flattening film 28B comprising a transparent resin is then formed, and an ITO transparent electrode 41 is formed on a contact hole formed in the flattening film to connect to the light shielding layer 43.

By installing the color filter 61 and the black mask 43 on the display array part in this embodiment, the opening ratio of the liquid crystal panel is improved, and the consuming electric power of the display module including a backlight can be lowered.

Twelfth Embodiment

The twelfth embodiment of the invention will be described with reference to FIGS. 50A to 58N.

In this embodiment, the peripheral driving circuit part is constituted with a CMOS driving circuit comprising a pMOS TFT and an nMOS TFT of a top gate type as similar to the tenth embodiment. The display part, which is a reflection type, is constituted with various combinations, in which the TFT is of various gate structures.

Figure 50A:
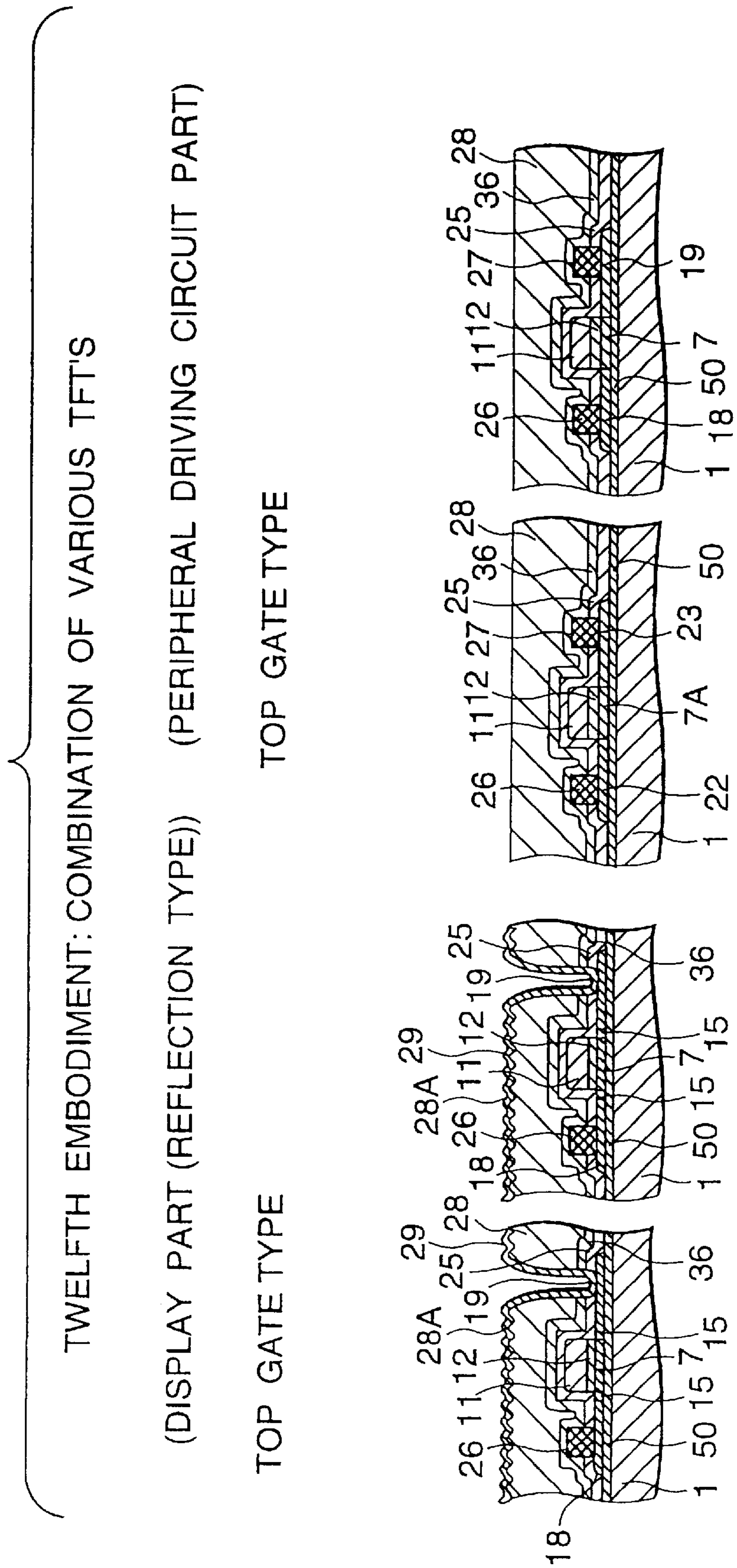
FIGS. 50A to 50C are cross sectional views showing important parts of the LCD according to the twelfth embodiment of the invention.
Figure 50B:
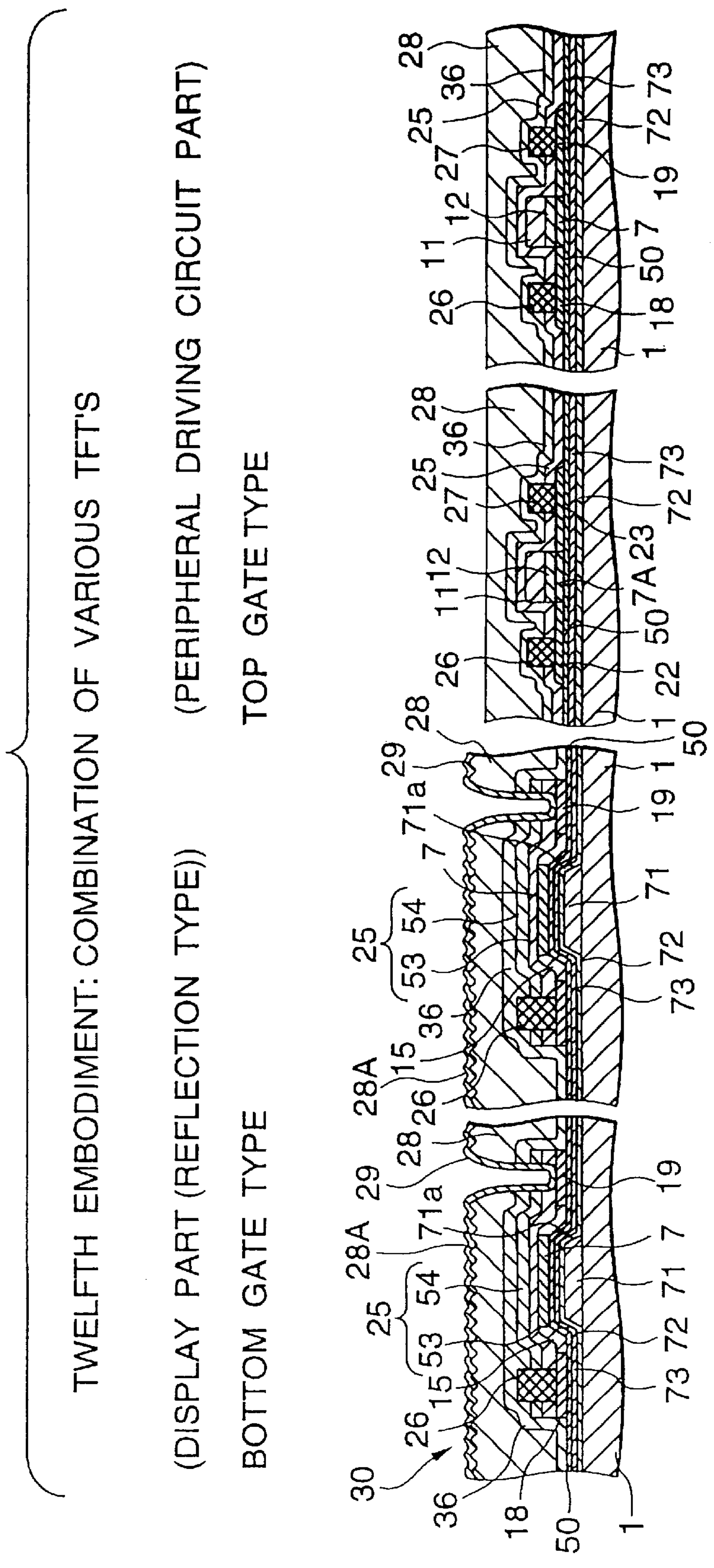
Figure 50C:
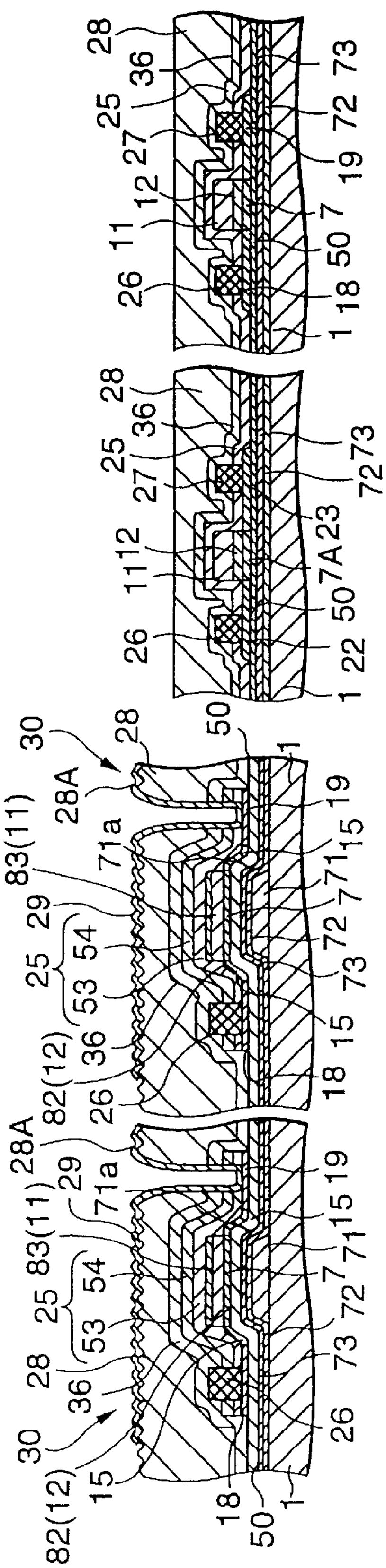

That is, while an nMOS LDD-TFT of a top gate type is provided in the display type as similar to the tenth embodiment shown in FIG. 50A, an nMOS LDD-TFT of a bottom gate type is provided in the display part shown in FIG. 50B, and an nMOS LDD-TFT of a dual gate type is provided in the display part of FIG. 50C. The MOS TFTs of the bottom gate type and the dual gate type can be produced in the similar steps as the top gate type MOS TFT of the peripheral driving circuit part as described later. Particularly, in the case of the dual gate type, the driving performance is improved by the upper and lower gate parts to be suitable for high speed switching, and the MOS TFT can be operated as either the top gate type or the bottom gate type by selecting either the upper or lower gate part.

In the bottom gate type MOS TFT shown in FIG. 50B, numeral 71 denotes a gate electrode comprising, for example, Mo.Ta, 72 denotes a SiN film, and 73 denotes an $SiO_2$ film, provided that the films 72 and 73 form an insulating film, and a channel-region using the single crystal silicon layer similar to the top gate type MOS TFT is formed on the insulating film. In the dual gate type MOS TFT shown in FIG. 50C, the lower gate part is the same as the bottom gate type MOS TFT, and with respect to the upper gate part, a gate insulating film 73 is formed with an $SiO_2$ film and an SiN film, and the upper gate electrode 74 is formed thereon.

The production process of the bottom gate type MOS TFT will be described with reference to FIGS. 51A to 55C, and the production process of the dual gate type MOS TFT will be described with reference to FIGS. 56D to 58N. Since the production process of the top gate type MOS TFT of the peripheral driving circuit part is the same as described in FIGS. 41A to 45Q, the description with figures thereof is omitted herein.

In order to produce a bottom gate type MOS TFT in the display part, a sputtering film 71 of a molybdenum-tantalum (Mo.Ta) alloy (having a thickness of from 500 to 600 nm) is formed on a substrate 1 as shown in FIG. 51A.

As shown in FIG. 51B, a photoresist 70 is then formed in a prescribed pattern, and the Mo.Ta film 71 is subjected to taper etching by using the photoresist 70 as a mask, so as to form a gate electrode 71 having a side edge part 71*a* is gently slanted at 20 to 45° in a trapezoidal shape.

As shown in FIG. 51C, after removing the photoresist 70, an SiN film 72 (having a thickness of about 100 nm) and a $SiO_2$ film 73 (having a thickness of about 200 nm) are then formed in this order on the substrate 1 including the molybdenum-tantalum alloy film 71 by a plasma CVD method, so as to form a gate insulating film comprising the SiN film 72 and the $SiO_2$ film 73 accumulated with each other.

Figure 52D:
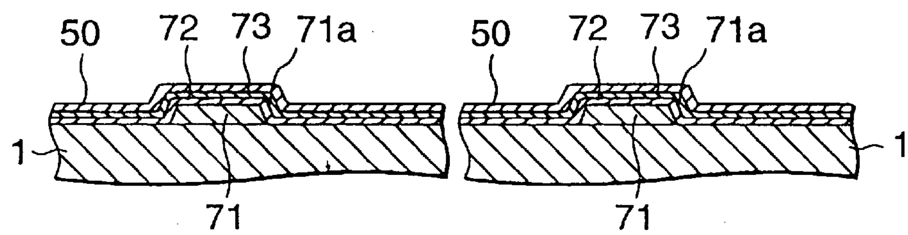
FIGS. 52D to 52F are cross sectional views stepwise showing the production process of the same LCD.

As shown in FIG. 52D, a crystalline sapphire film (having a thickness of from 20 to 200 nm) 50 is formed on at least the TFT forming region on one primary surface of the insulating substrate 1 in the same manner described in FIG. 41A.

Figure 52E:
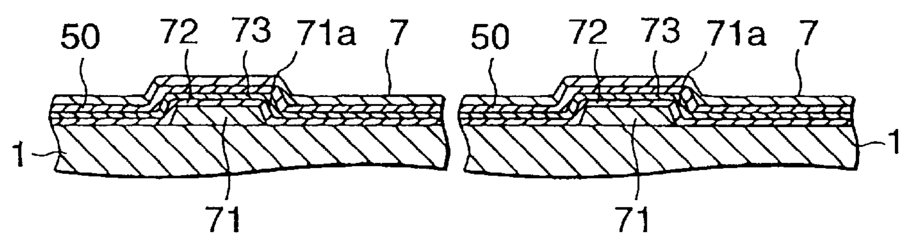

As described in FIG. 52E, a single crystal silicon is hetero-epitaxially grown in the same manner as in FIGS. 41B and 41C, so as to deposit a single crystal silicon layer 7 having a thickness of, for example about 0.1 $\mu$m. At this time, because the side edge part 71*a* of the gate electrode 71 is a gentle slope surface, the hetero-epitaxial growth by the step 4 is not inhibited on that surface, and the single crystal silicon layer 7 is grown without interruption by the step.

Figure 52F:
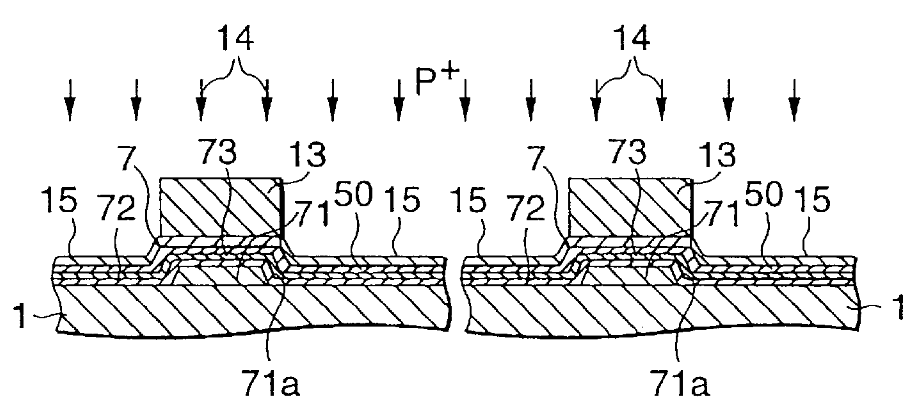

As shown in FIG. 52F, after conducting the procedures of FIGS. 42E to 42G, the gate part of the nMOS TFT of the display part is covered with a photoresist 13 in the same manner as in FIG. 43H, and the exposed source/drain region of the nMOS TFT is doped (ion implantation) with a phosphorous ion 14, to form an LDD part 15 comprising an $N^-$-type layer in a self aligning manner. At this time, the unevenness (or pattern) of the surface can be easily determined by the presence of the bottom gate electrode 71, and the positional alignment of the photoresist 13 (mask alignment) can be easily conducted, so that the alignment is difficult to deviate.

Figure 53G:
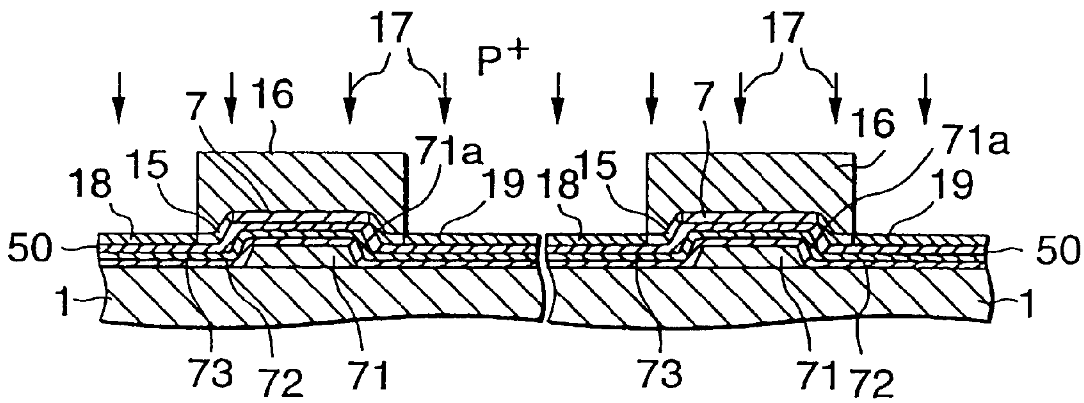
FIGS. 53G to 53J are cross sectional views stepwise showing the production process of the same LCD.

As shown in FIG. 53G, the gate part and the LDD part of the nMOS TFT are covered with a photoresist 16, and the exposed region is doped (ion implantation) with a phosphorous or arsenic ion 17, so as to form a source part 18 and a drain part 19 comprising $N^+$-type layer of the nMOS TFT in the same manner described in FIG. 43I.

Figure 53H:
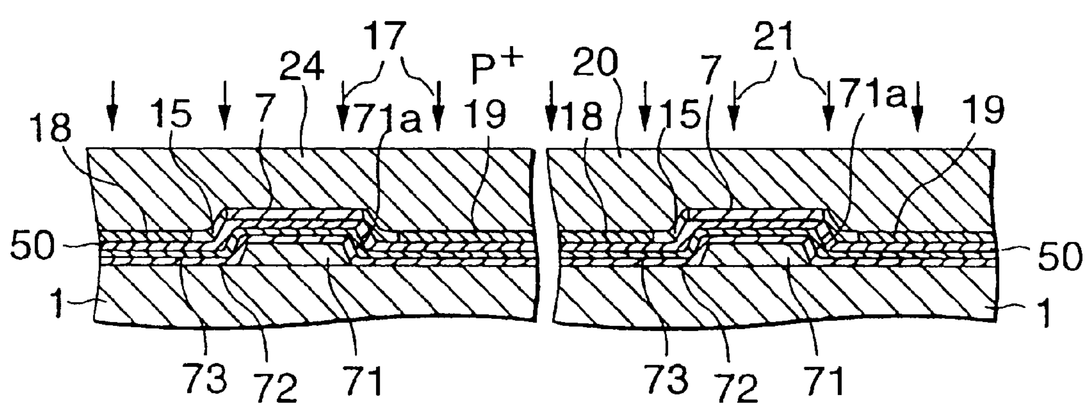

As shown in FIG. 53H, the whole of the nMOS TFT is covered with a photoresist 20, and doping (ion implantation) of a boron ion 21 is conducted to form a source part and a drain part of a $P^+$-type layer of the pMOS TFT of the peripheral driving circuit part in the same manner described in FIG. 43J.

Figure 53I:
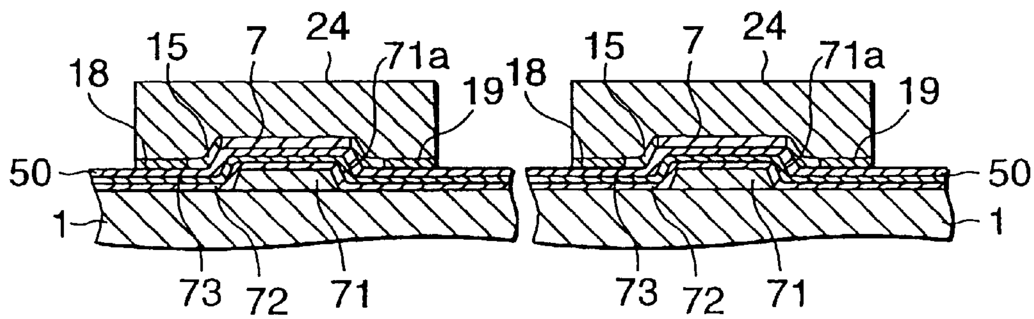

As shown in FIG. 53I, in order to form islands of the active element part and the passive element part, a photoresist 24 is provided, and the single crystal silicon thin film layer is selectively removed by a general purpose photolithography and etching technique in the same manner described in FIG. 44K.

Figure 53J:
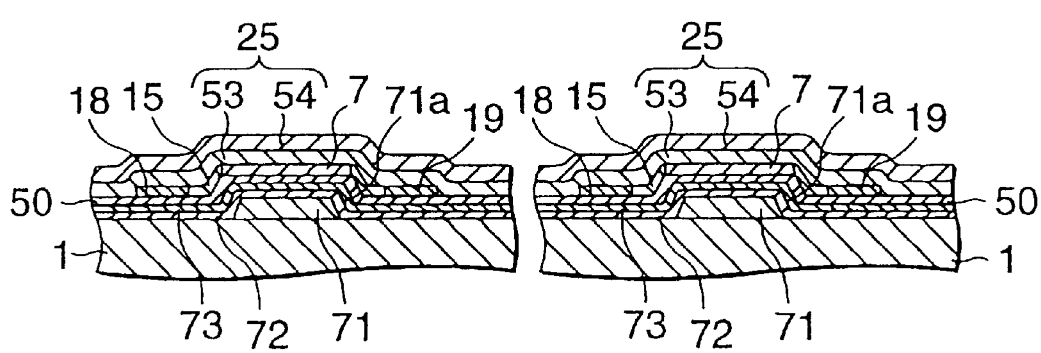

As shown in FIG. 53J, an $SiO_2$ film 53 (having a thickness of about 300 nm) and a phosphorous silicate glass (PSG) film 54 (having a thickness of about 300 nm) are formed in this order on the whole surface by a plasma CVD method, a high density plasma CVD method or a catalyst CVD method in the same manner described in FIG. 44L. The $SiO_2$ film 53 and the PSG film 54 correspond to the protective film 25 described above. With maintaining that state, the single crystal silicon film is subjected to the activation treatment in the same manner as above.

Figure 54K:
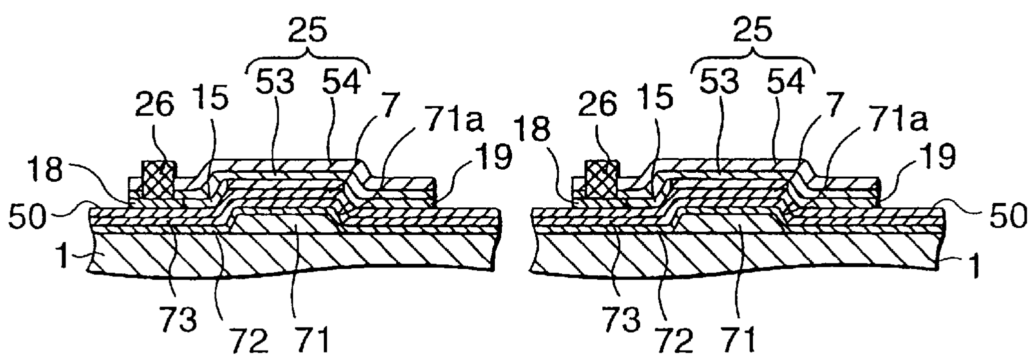
FIGS. 54K to 54N are cross sectional views stepwise showing the production process of the same LCD.

As shown in FIG. 54K, a contact hole is formed in the source part by a general purpose photolithography and etching technique in the same manner described in FIG. 44M. After a sputtering film comprising, for example, aluminum or aluminum containing 1% of Si, having a thickness of from 400 to 500 nm is formed on the whole surface, a source electrode 26 of the TFT is formed by a general purpose photolithography and etching technique, and at the same time, a data line and a gate line are formed. Thereafter, a sinter treatment is conducted in a forming gas at about 40020 C. for 1 hour.

Figure 54L:
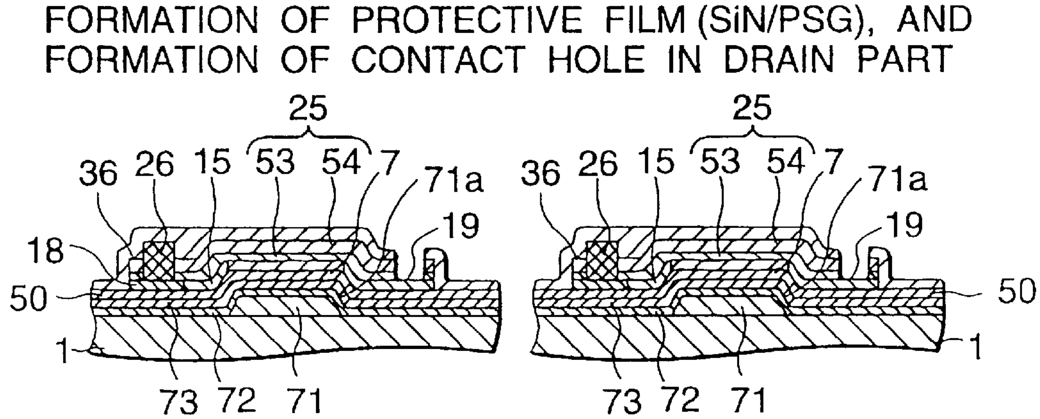

As shown in FIG. 54L, an insulating film 36 comprising a PSG film (having a thickness of about 300 nm) and an SiN film (having a thickness of about 300 nm) is formed on the whole surface by a high density plasma CVD method or a catalyst CVD method, and a contact hole is formed in the drain part of the TFT for display, in the same manner as in FIG. 44N.

Figure 54M:
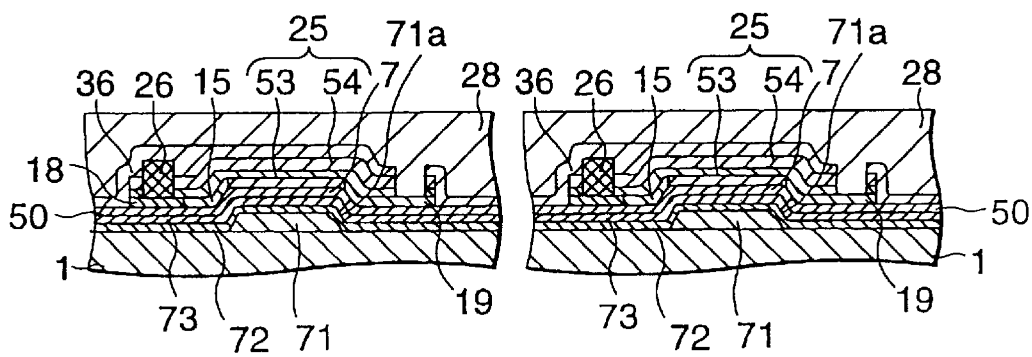
Figure 54N:
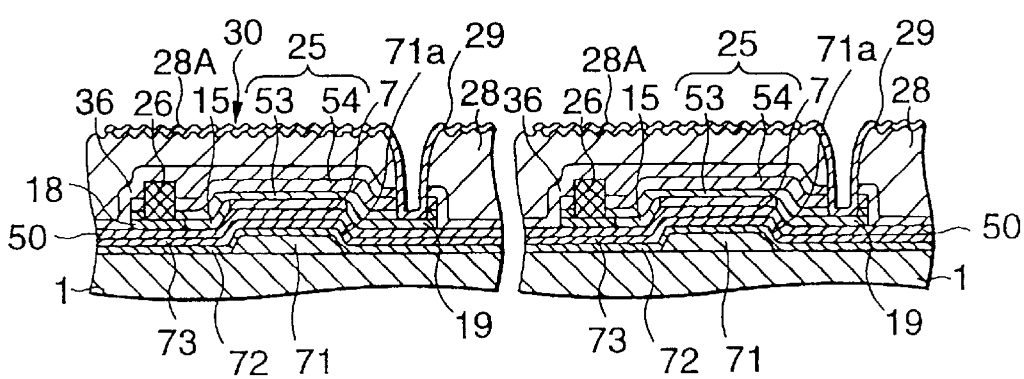

As shown in FIG. 54M, a photosensitive resin film 28 having a thickness of from 2 to 3 $\mu$m is formed by spin coating in the same manner described in FIG. 45O. As shown in FIG. 54N, an unevenness pattern for obtaining the optimum reflection characteristics and viewing angle characteristics is formed at least on the pixel part by a general purpose photolithography and etching technique, so as to form a lower part of the reflection face comprising an uneven roughened surface 28A by reflowing. Simultaneously, contact holes are formed in the resin film on the drain part of the TFT for display.

As shown in FIG. 54N, a sputtering film comprising, for example, aluminum or aluminum containing 1% of Si having a thickness of from 400 to 500 nm is formed on the whole surface, and a reflection part 29 comprising aluminum having an uneven shape connected to the drain part 19 of the TFT for display is formed by a general purpose photolithography and etching technique, in the same manner described in FIG. 45Q.

According to the procedures described above, an active matrix substrate 30, in which the display part and the peripheral driving circuit part are integrated, can be produced, which is formed in such a manner that the single crystal silicon layer 7 is formed by high temperature hetero-epitaxial growth using the crystalline sapphire film 50 as a seed, and the bottom gate type nMOS LDD-TFT (a CMOS driving circuit comprising the pMOS TFT and the nMOS TFT of the top gate type in the peripheral part) is formed in the display part comprising the single crystal silicon layer 7.

An example, in which a gate insulating film of the bottom gate type MOS TFT in the display part is formed by an anodic oxidation method of Mo.Ta, will be described with reference to FIGS. 55A to 55C.

Figure 55A:
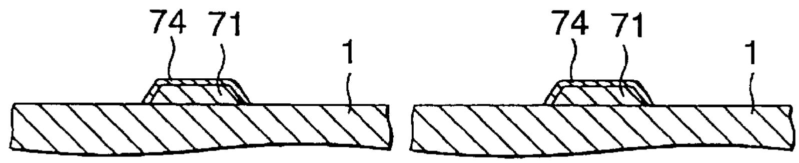
FIGS. 55A to 55C are cross sectional views stepwise showing the production process of the same LCD.

After the step of FIG. 51B, the molybdenum-tantalum alloy film 71 is subjected to a known anodic oxidation treatment, to form a gate insulating film 74 comprising $Ta_2O_5$ having a thickness of from 100 to 200 nm, as shown in FIG. 55A.

Figure 55B:
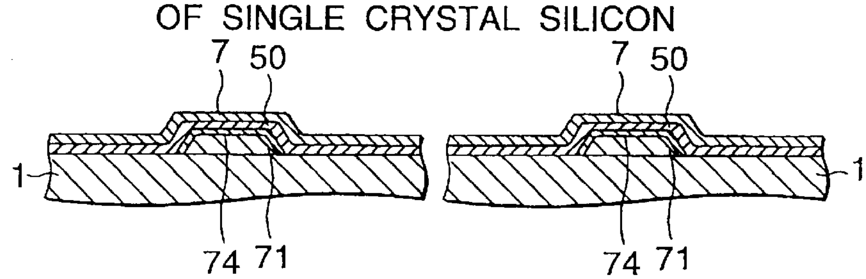
Figure 55C:
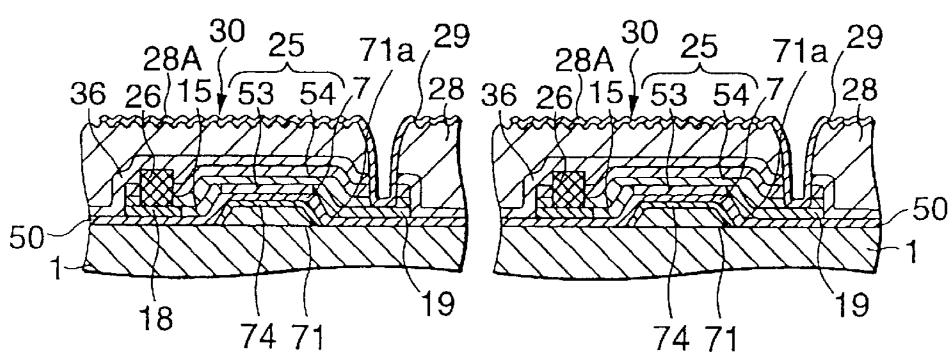

After that step, as shown in FIG. 55B, a crystalline sapphire film 50 is formed, and a single crystal silicon film 7 is hetero-epitaxially grown in the same manner described in FIGS. 52D and 52E, and further as shown in FIG. 55C, an active matrix substrate 30 is produced in the same manner described in FIGS. 52F to 54N.

In order to produce a dual gate type MOS TFT in the display part, the same procedures as in FIGS. 51A to 52E are conducted.

Th at is, as shown in FIG. 56D, a crystalline sapphire film 50 is formed on the insulating films 72 and 73 and the substrate 1, and a single crystal silicon layer 7 is hetero-epitaxially grown by using the crystalline sapphire film 50 as a seed. In the same manner described in FIG. 42F, an $SiO_2$ film (having a thickness of about 200 nm) and an SiN film (having a thickness of 100 nm) are continuously formed in this order on the whole surface of the single crystal silicon thin film 7 by a plasma CVD method or a catalyst CVD method to form an insulating film 80 (which corresponds to the insulating film 8), and a sputtering film 81 of an Mo.Ta alloy (having a thickness of from 500 to 600 nm) (which corresponds to the sputtering film 71) is then formed.

As shown in FIG. 56E, a photoresist pattern 10 is then formed, a top gate electrode 82 (which corresponds to the gate electrode 12) comprising the Mo.Ta alloy and a gate insulating film 83 (which corresponds to the gate insulating film 11) are formed by continuous etching, so as to expose the single crystal silicon thin film layer 7, in the same manner described in FIG. 42G.

Figure 56F:
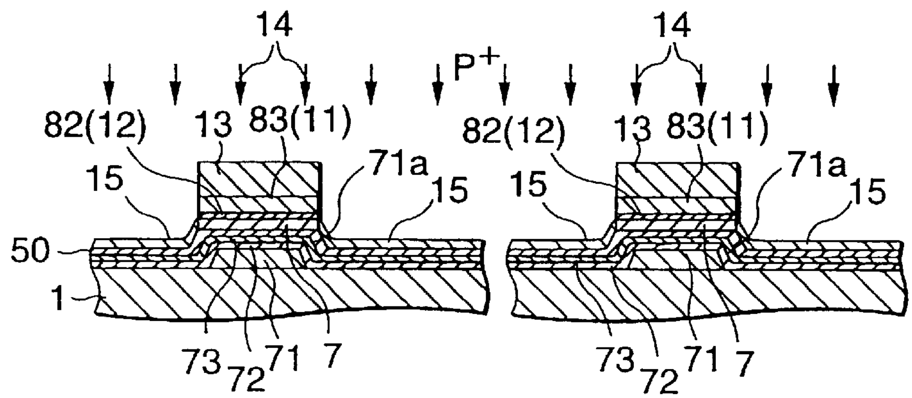

As shown in FIG. 56F, the top gate part of the nMOS TFT is covered with a photoresist 13, and the exposed source/drain region of the nMOS TFT for display is doped (ion implantation) with a phosphorous ion 14, so as to form an LDD part 15 of an $N^-$-type layer, in the same manner described in FIG. 43H.

Figure 56G:
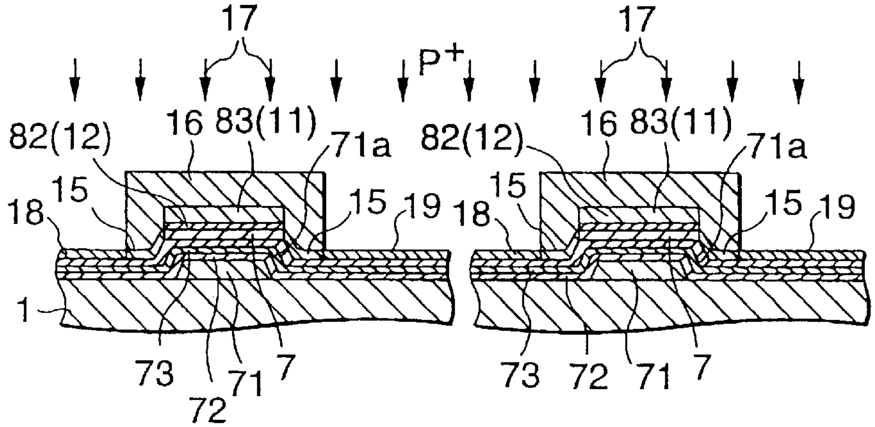

As shown in FIG. 56G, the gate part and the LDD part of the nMOS TFT are covered with a photoresist 16, and the exposed region is doped (ion implantation) with a phosphorous or arsenic ion 17, so as to form a source region 18 and a drain region 19 comprising an $N^+$-type layer of the nMOS TFT, in the same manner described in FIG. 43I.

Figure 57H:
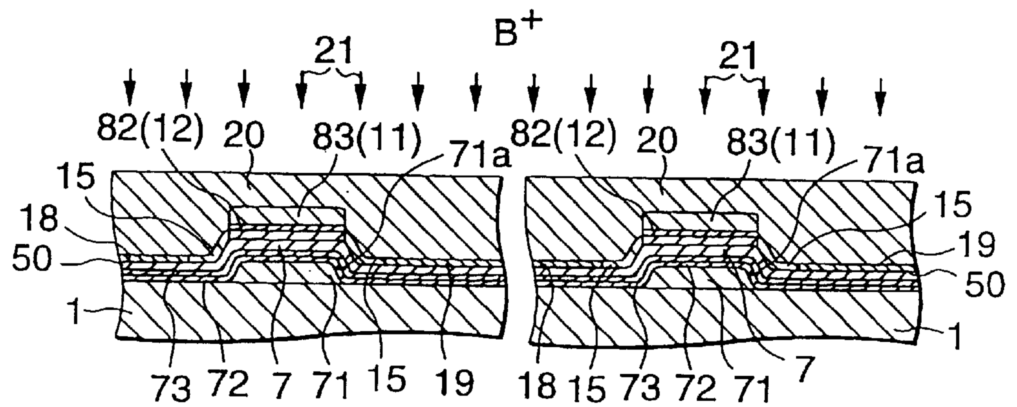
FIGS. 57H to 57K are cross sectional views stepwise showing the production process of the same LCD.

As shown in FIG. 57H, the gate part of the pMOS TFT is covered with a photoresist 20, and the exposed region is doped (ion implantation) with a boron ion 21, so as to form a source part and a drain part of a $P^+$-type layer of the PMOS TFT of the peripheral driving circuit part, in the same manner described in FIG. 43J.

Figure 57I:
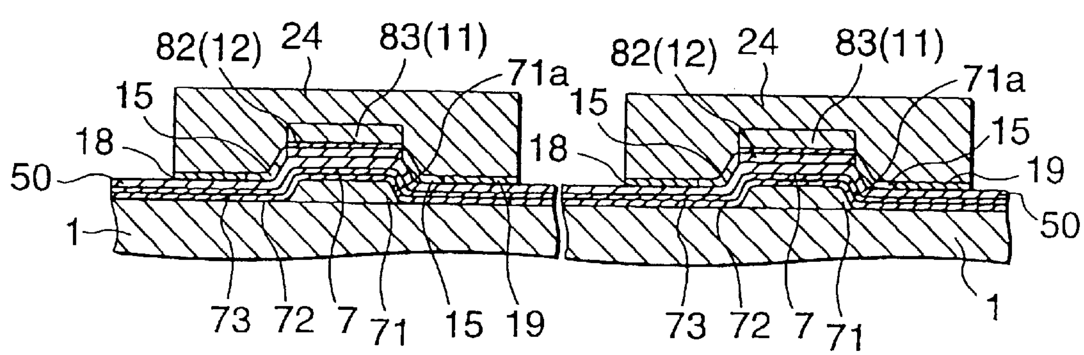

As shown in FIG. 57I, in order to form islands of the active element part and the passive element part, a photoresist 24 is formed, and the single crystal silicon thin film layer other than the active element part and the passive element part is selectively removed by a general purpose photolithography and etching technique, in the same manner described in FIG. 44K.

Figure 57J:
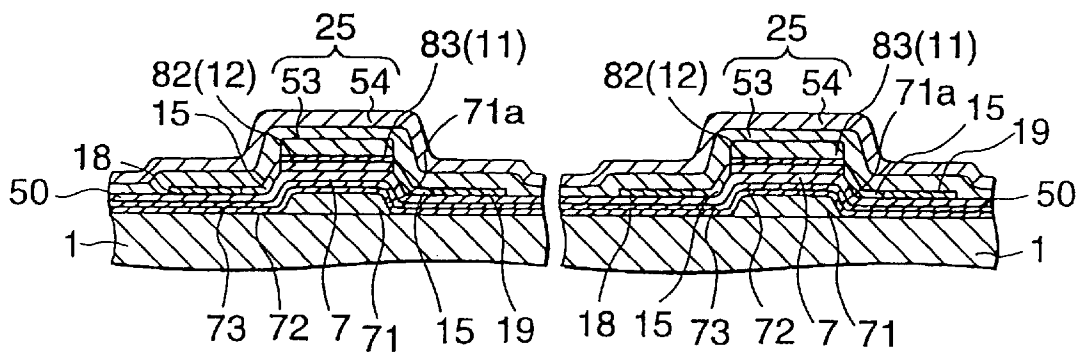

As shown in FIG. 57J, an $SiO_2$ film 53(having a thickness of about 200 nm) and a phosphorous silicate glass (PSG) film 54 (having a thickness of about 300 nm) are formed on the whole surface by a plasma CVD method, a high density plasma CVD method or a catalyst CVD method in the same manner described in FIG. 44L. The films 53 and 54 correspond to the protective film 25. The single crystal silicon layer 7 is then subjected to an activation treatment.

Figure 57K:
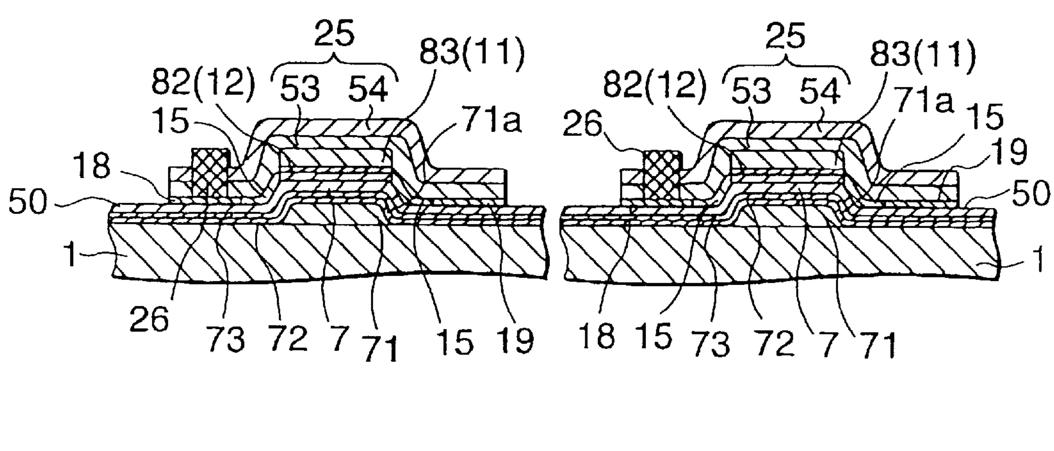

As shown in FIG. 57K, a contact hole is formed on the source part in the same manner described in FIG. 44M. After a sputtering film comprising, for example, aluminum or aluminum containing 1% of Si, having a thickness of from 400 to 500 nm is formed on the whole surface, a source electrode 26 is formed by a general purpose photolithography and etching technique, and at the same time, a data line and a gate line are formed.

Figure 58L:
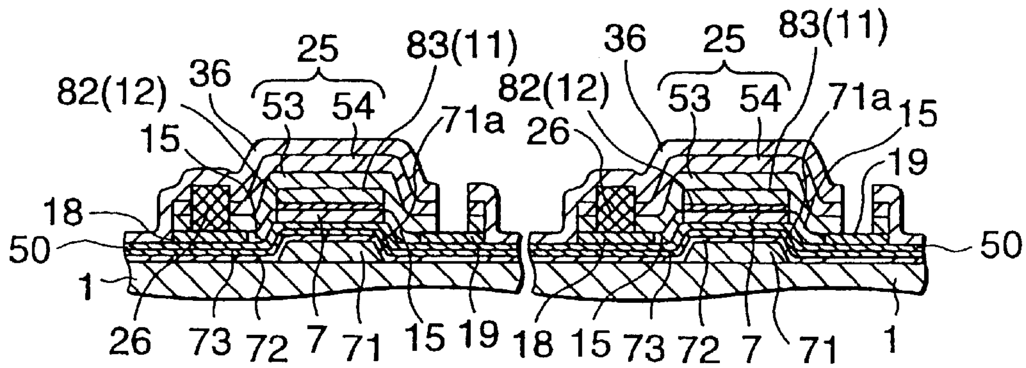
FIGS. 58L to 58N are cross sectional views stepwise showing the production process of the same LCD.

As shown in FIG. 58L, an insulating film 36 comprising a PSG film (having a thickness of about 300 nm) and an SiN film (having a thickness of about 300 nm) is formed on the whole surface, and a contact hole is formed on the drain part of the TFT for display, in the same manner described in FIG. 44N.

Figure 58M:
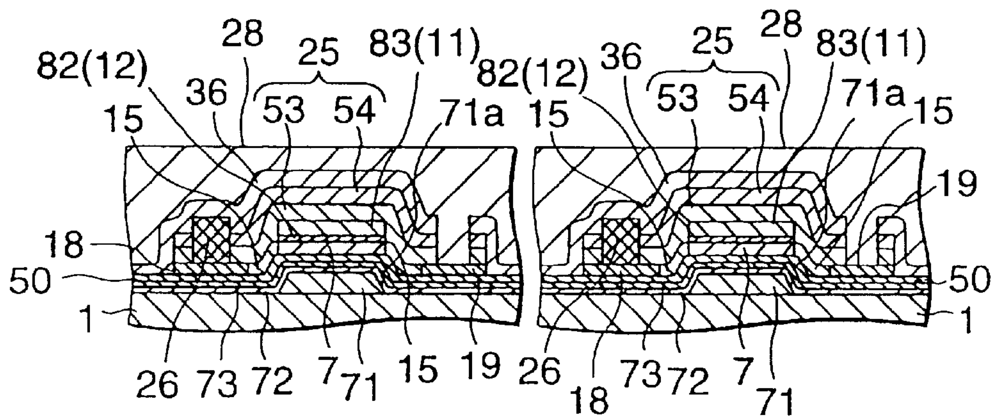
Figure 58N:
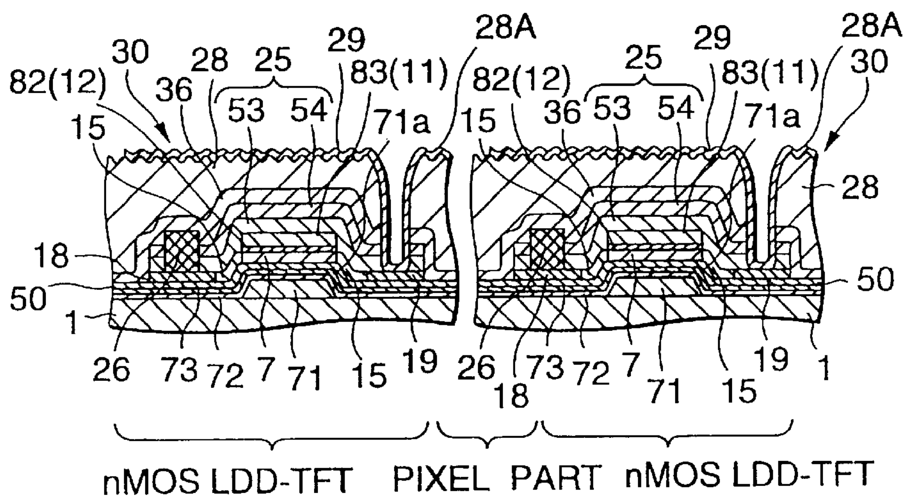

As shown in FIG. 58M, a photosensitive resin film 28 having a thickness of from 2 to 3 $\mu$m on the whole surface by spin coating is formed. As shown in FIG. 58N, a lower part of the reflection face comprising an uneven roughened surface 28A is formed at least in the pixel part, and simultaneously a contact hole is formed in the resin film on the drain part of the TFT for display to connect to the drain part 19 of the TFT for display, in the same manner described in FIGS. 45P and 45Q. A reflection part 29 comprising, for example, aluminum having an uneven shape is formed to obtain the optimum reflection characteristics and viewing angle characteristics.

According to the procedures described above, an active matrix substrate 30, in which the display part and the peripheral driving circuit part are integrated, can be produced, which is formed in such a manner that the single crystal silicon layer 7 is formed by hetero-epitaxial growth using the crystalline sapphire film 50 as a seed, and the dual gate type nMOS LDD-TFT is formed in the display part, whereas a CMOS driving circuit comprising the pMOS TFT and the nMOS TFT of the top gate type is formed in the peripheral driving circuit part.

Thirteenth Embodiment

The thirteenth embodiment of the invention will be described with reference to FIG. 59A to 61G.

In this embodiment, as different from the embodiments described in the foregoing, a gate electrode of a top gate part is formed with a material having a relatively low heat resistance, such as aluminum.

In the case where a top gate type MOS TFT is formed in both the display part and the peripheral driving circuit part, the procedures described in FIGS. 41A to 42E for the tenth embodiment are conducted, so as to form an N-type well 7A in the pMOS TFT part of the peripheral driving circuit part as shown in FIG. 59A.

Figure 59B:
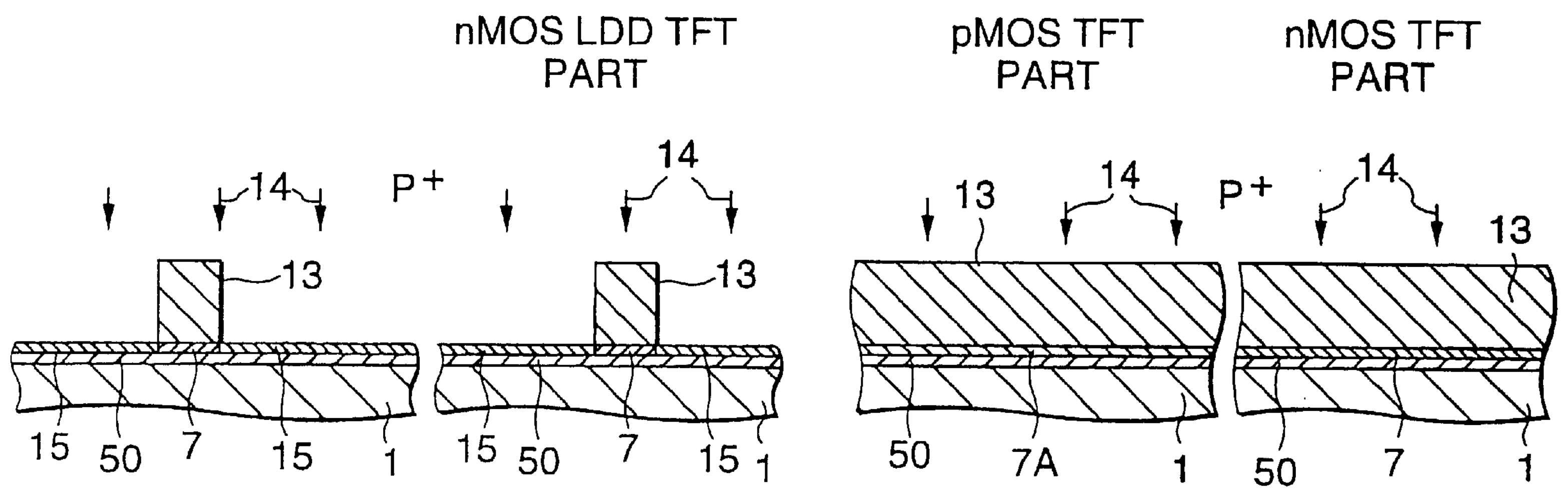

As shown in FIG. 59B, all the nMOS and pMOS TFTs of the peripheral driving circuit region and the gate part the nMOS TFT of the display part region are covered with a photoresist 13, and the exposed source/drain region of the nMOS TFT is doped (ion implantation) with an phosphorous ion 14 at 20 kV to a dose amount of $5\times10^{13}$ atoms/cm$^2$, so as to form an LDD part 15 comprising an $N^-$-type layer in a self aligning manner.

Figure 60C:
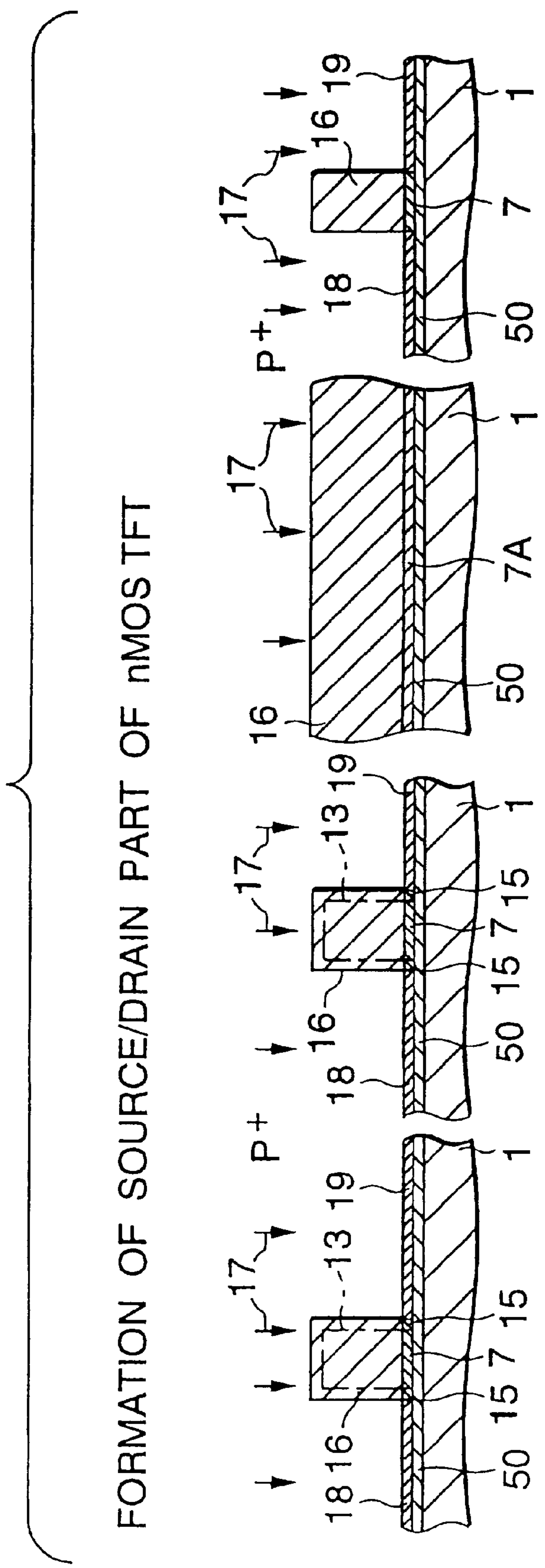
FIGS. 60C to 60E are cross sectional views stepwise showing the production process of the same LCD.

As shown in FIG. 60C, all the pMOS TFT of the peripheral driving circuit region, the gate part of the nMOS TFT of the peripheral driving circuit region, and the gate part and the LDD part of the nMOS TFT in the display part region are covered with a photoresist 16, and the exposed region is doped (ion implantation) with a phosphorous or arsenic ion 17 at 20 kV to a dose amount of $5\times10^{15}$ atoms/cm$^2$, so as to form a source part 18, a drain part 19 and an LDD part 15 comprising an $N^+$-type layer of the nMOS TFT. In this case, when the resist 13 is left as shown by the virtual line, and the resist 16 is provided to cover the same, the positional alignment of the mask for forming the resist 16 can be conducted by using the resist 13 as a standard, and thus the mask alignment can be easily conducted with deviation of alignment being suppressed.

Figure 60D:
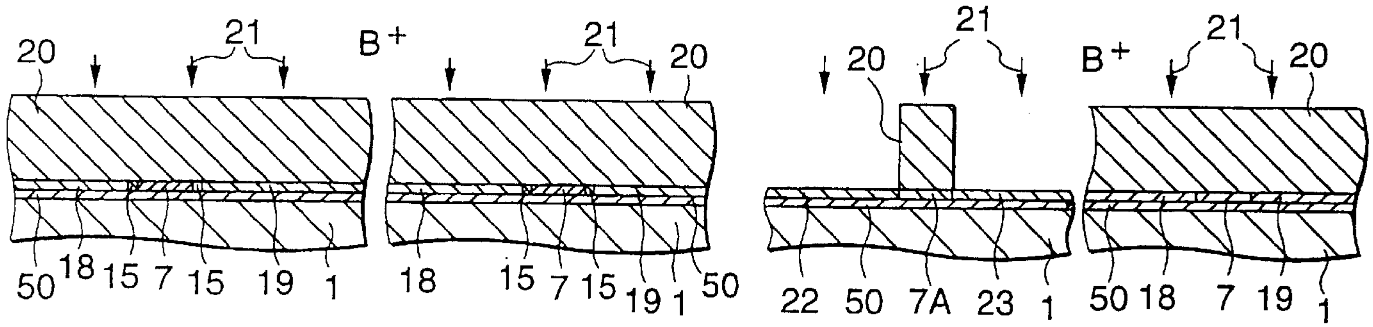

As shown in FIG. 60D, the nMOS TFT of the peripheral driving circuit region, the whole nMOS TFT of the display part region, and the gate part of the pMOS TFT are covered with a photoresist 20, and the exposed region is doped (ion implantation) with a boron ion 21 at 10 kV to a dose amount of $5\times10^{15}$ atoms/cm$^2$, so as to form a source part 22 and a drain part 23 of a $P^+$-type layer of the pMOS TFT.

Figure 60E:
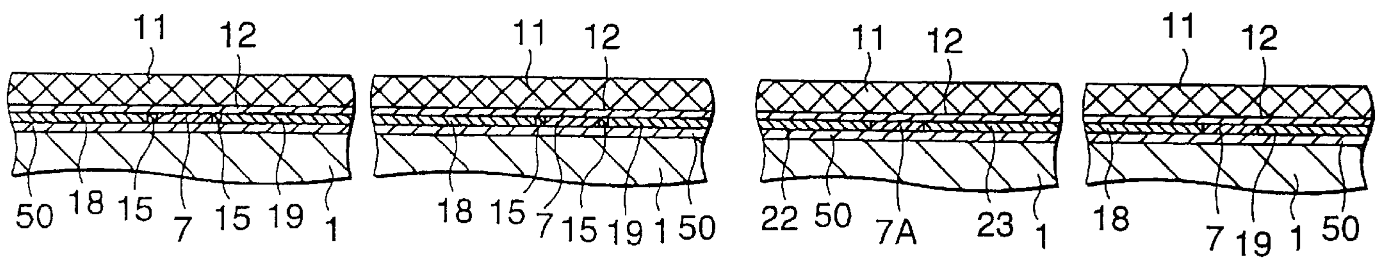

After removing the resist 20, as shown in FIG. 60E, the single crystal silicon layers 7 and 7A are subjected to the activation treatment in the same manner as above, and a gate insulating film 12 and a gate electrode material layer (such as aluminum or aluminum containing 1% of Si) 11 are formed on the surface thereof. The gate electrode material layer 11 can be formed by a vacuum deposition method or a sputtering method.

Figure 61F:
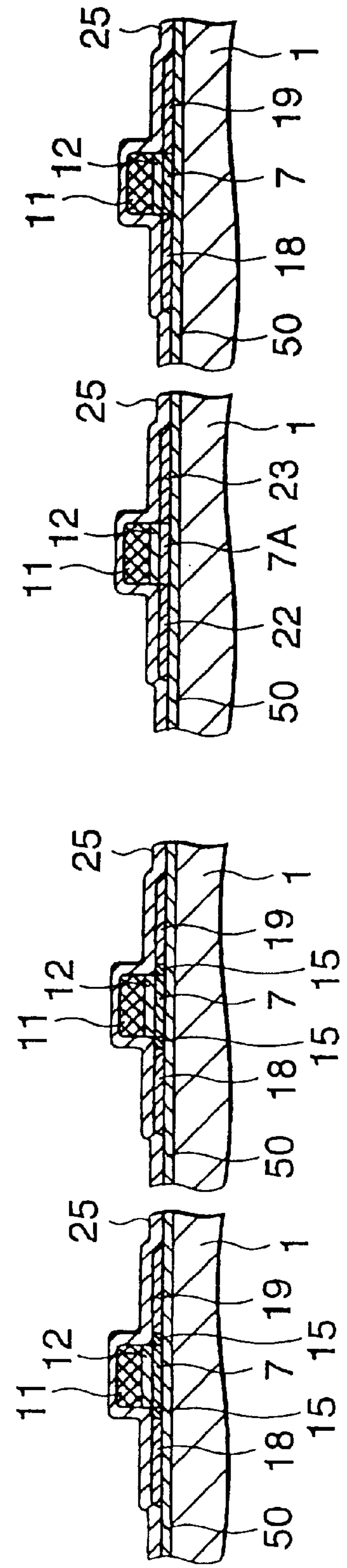
FIGS. 61F and 61G are cross sectional views stepwise showing the production process of the same LCD.

After patterning the respective gate parts in the same manner as above, the active element part and the passive element part are formed into islands, and furthermore as shown in FIG. 61F, an $SiO_2$ film (having a thickness of about 200 nm) and a phosphorous silicate glass (PSG) film (having a thickness of about 300 nm) are continuously formed in this order on the whole surface, so as to form a protective film 25.

Figure 61G:
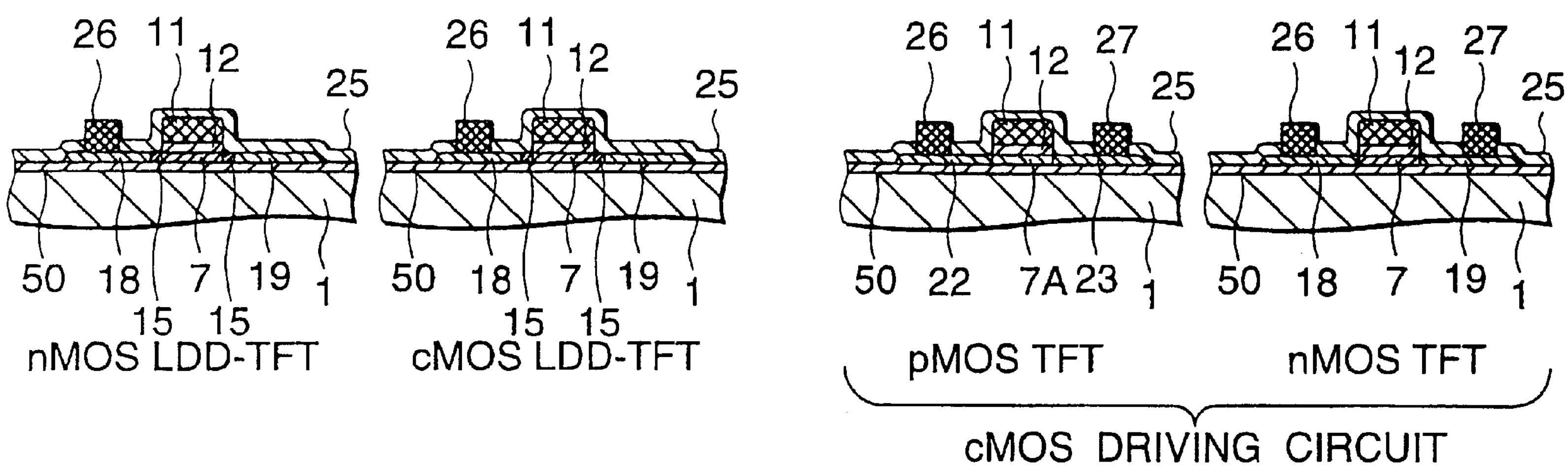

As shown in FIG. 61G, contact holes are formed in the source/drain part of all the TFTs in the peripheral driving circuit and a source part of the TFT for display by a general purpose photolithography and etching technique.

After forming a sputtering film comprising, for example, aluminum having a thickness of from 500 to 600 nm on the whole surface, a source electrode 26 of all the TFTs in the peripheral driving circuit and the display part, and a drain electrode 27 of the peripheral driving circuit part are formed by the general purpose photolithography and etching technique, and at the same time, a data line and a gate line are formed. Thereafter, a sinter treatment is conducted in a forming gas ($N_2$+$H_2$) at about 400° C. for 1 hour.

According to the same manner described in FIGS. 44N to 45Q, an active matrix substrate 30, in which the display part and the peripheral driving circuit part are integrated, can be produced, which is formed in such a manner that the CMOS driving circuit comprising the top gate type nMOS LDD-TFT, the pMOS TFT and the nMOS TFT of the top gate type having a gate electrode comprising, for example, aluminum or aluminum containing 1% of Si is formed in each of the display part and the peripheral driving circuit part comprising the single crystal silicon layer 7.

In this embodiment, because the gate electrode 11 comprising, for example, aluminum or aluminum alloy is formed after the activation treatment of the single crystal silicon layer 7, the heat resistance of the gate electrode material has no relationship to the influence of the heat on the activation treatment, and aluminum having a relatively low heat resistance but a low cost can be used as the electrode material of the top gate, so that the range of selection of the electrode material is broadened. This is the same as in the case where the display part is a bottom gate type MOS TFT.

In the case where a dual gate type MOS TFT is formed in the display part, and a top gate type MOS TFT is formed in the peripheral driving circuit part, the steps shown in FIGS. 29H to 31O of the sixth embodiment are similarly conducted, so that an active matrix substrate 30, in which the display part and the peripheral driving circuit part are integrated, can be produced, which is formed in such a manner that the CMOS driving circuit comprising the dual gate type nMOS LDD-TFT, pMOS TFT and the nMOS TFT of the top gate type having a gate electrode comprising, for example, aluminum is formed in each of the display part and the peripheral driving circuit part comprising the single crystal silicon layer 7.

Fourteenth Embodiment

The fourteenth embodiment of the invention will be described with reference to FIGS. 62 to 63B.

An example shown in FIG. 62 relates to a double gate type MOS TFT comprising, in the twelfth embodiment, plural TFTs of a self aligning LDD structure, for example top gate type LDD-TFTs, are arranged.

Figure 63A:
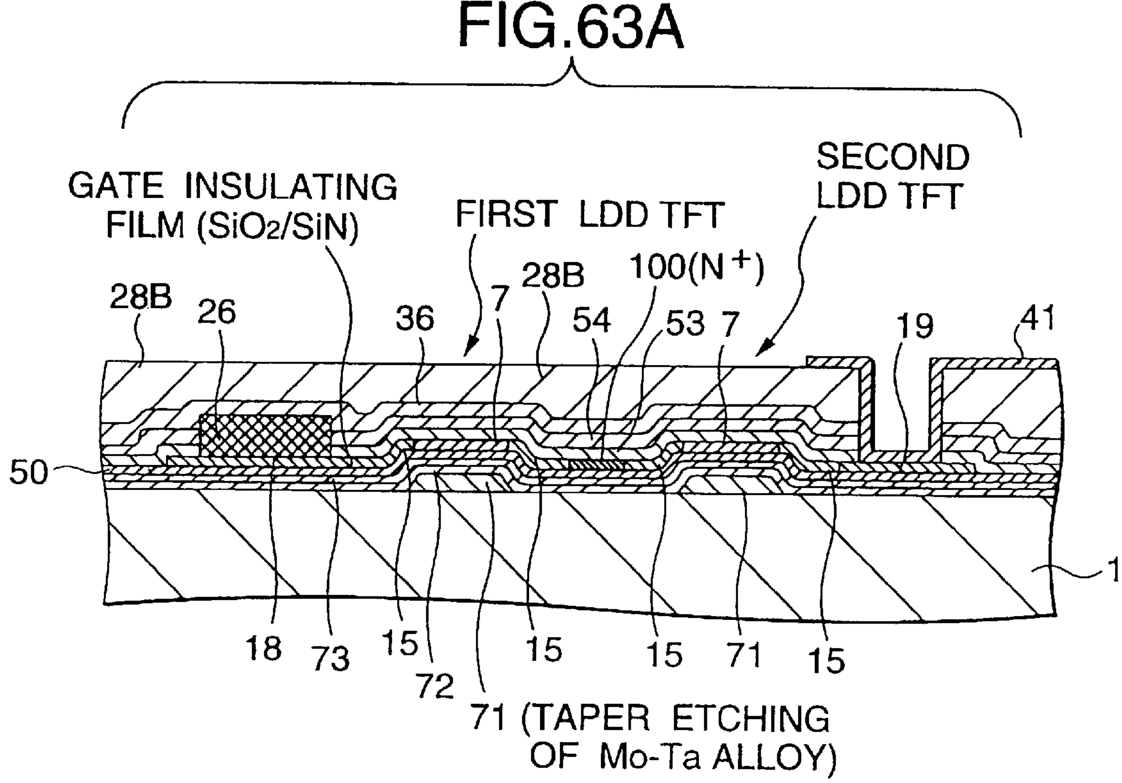
FIGS. 63A and 63B are cross sectional views showing important parts of the various TFTs of the same LCD.
Figure 63B:
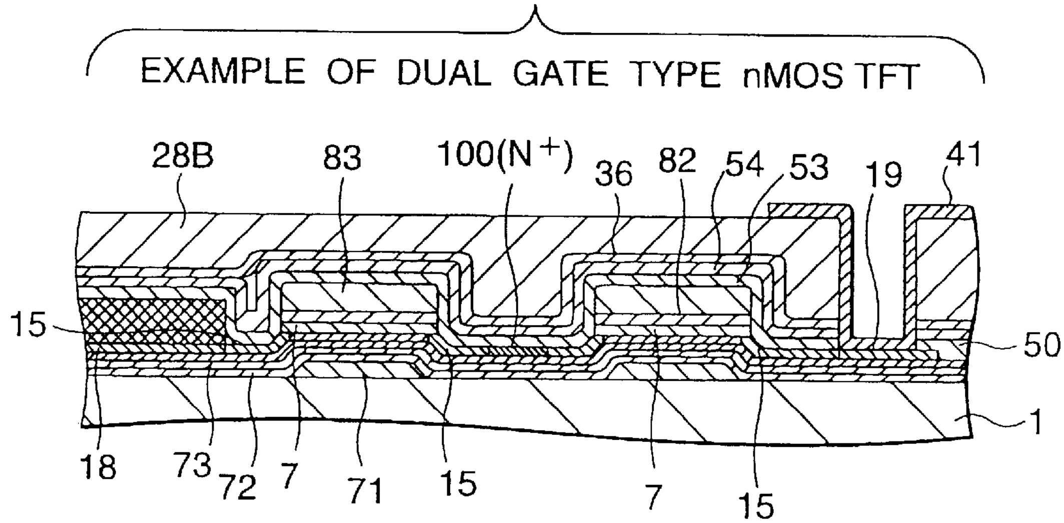

FIG. 63A shows an example, in which the bottom gate type MOS TFT has a double gate structure, and FIG. 63B shows an example, in which the dual gate MOS TFT has a double gate structure.

These double gate type MOS TFTs also have the same advantages as in FIGS. 37 to 38B.

Fifteenth Embodiment

The fifteenth embodiment of the invention will be described with reference to FIGS. 64 to 72.

As described in the foregoing, the TFTs of the top gate type, the bottom gate type and the dual gate type each have different functions and characteristics, and therefore, when they are employed in the display part and the peripheral driving circuit part, there may be the case where an advantage is obtained by combining various type of TFTs in the display part and the peripheral driving circuit part.

For example, in the case where one of a MOS TFT of the top gate type, the bottom gate type and the dual gate type in the display part as shown in FIG. 64 is employed, the peripheral driving circuit part may comprise at least the top gate type selected from the top gate type MOS TFT, the bottom gate type MOS TFT and the dual gate type MOS TFT, or may comprise a mixture of the top gate type and the other types. Twelve combinations (Nos. 1 to 12) can be exemplified. Particularly, when the dual gate structure is employed in the MOS TFT of the peripheral driving circuit, the dual gate type structure can be easily changed into any of the top gate type and the bottom gate type. In the case where a TFT of a large driving performance is required in a part of the peripheral driving circuit, there may be the case where the dual gate type becomes necessary. For example, it is considered that it is necessary when the invention is applied to an electrooptical apparatus other than an LCD, such as an organic EL and an FED.

Examples of the combinations (Nos. 1 to 216) of the MOS TFTs in the display part and the peripheral driving circuit part are shown in terms of the channel conductive type in FIGS. 65 to 72. FIGS. 65 and 66 show the case where the MOS TFT of the display part is not an LDD structure; FIGS. 67 and 68 show the case where the MOS TFT of the display part is an LDD structure; FIGS. 69 and 70 show the case where the MOS TFT of the peripheral driving circuit part includes a TFT of an LDD structure; and FIGS. 71 and 72 show the case where both the peripheral driving circuit part and the display part include a MOS TFT of an LDD structure.

Accordingly, specific examples of the combinations in terms of the gate structure shown in FIG. 64 are those shown in FIGS. 65 to 72. The same combinations are possible in the case where the peripheral driving circuit part comprises a MOS TFT comprising a mixture of the top gate type and other gate types. The combinations of the TFTs shown in FIGS. 64 to 72 can also be applied to the case where the channel regions of the TFT are formed with polycrystalline silicon and amorphous silicon (limited to the display part), but not limited to the case where they are formed with single crystal silicon.

Sixteenth Embodiment

The sixteenth embodiment of the invention will be described with reference to FIGS. 73A to 74.

In this embodiment, a TFT using the single crystal silicon layer according to the invention is used in the peripheral driving circuit part of an active matrix driving LCD from the standpoint of driving performance. However, this is not limited to the top gate type, but may be mixed with other gate types; the channel conductive type may also be variously changed; and a MOS TFT using a polycrystalline silicon layer other than the single crystal silicon layer may be included. The MOS TFT of the display part is preferably one using the single crystal silicon layer, but is not limited thereto, and those using a polycrystalline silicon layer and an amorphous silicon layer, and those having at least two kinds of silicon layers among the three kinds may also be used. However, when the display part is formed with an nMOS TFT, the use of the single crystal silicon layer and the polycrystalline silicon layer can reduce the area of the TFT, while the use of the amorphous silicon layer provides a practical switching speed. The use of the single crystal silicon layer and the polycrystalline silicon layer is also advantageous in reduction of pixel defects in comparison to the amorphous silicon. There may be the case where the so-called CGS (continuous grain silicon) structure, in which not only the single crystal silicon but also the polycrystalline silicon are simultaneously formed on the hetero-epitaxial growth, is included, and it can also be used for forming the active element and the passive element.

Figure 73A:
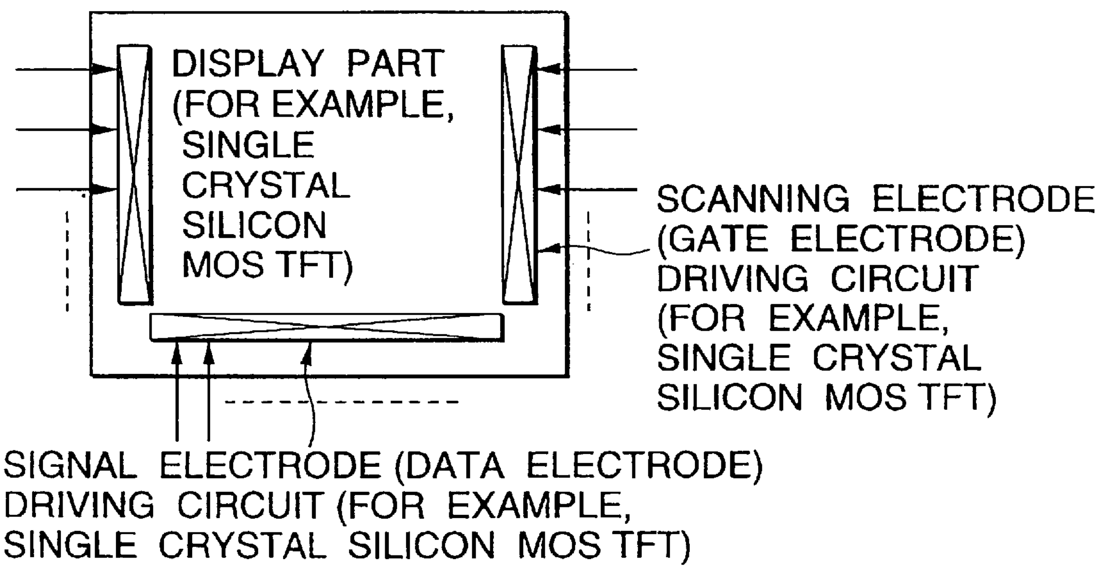
FIGS. 73A to 73C are diagrams showing schematic layouts of the LCDs according to the sixteenth embodiment of the invention.
Figure 73B:
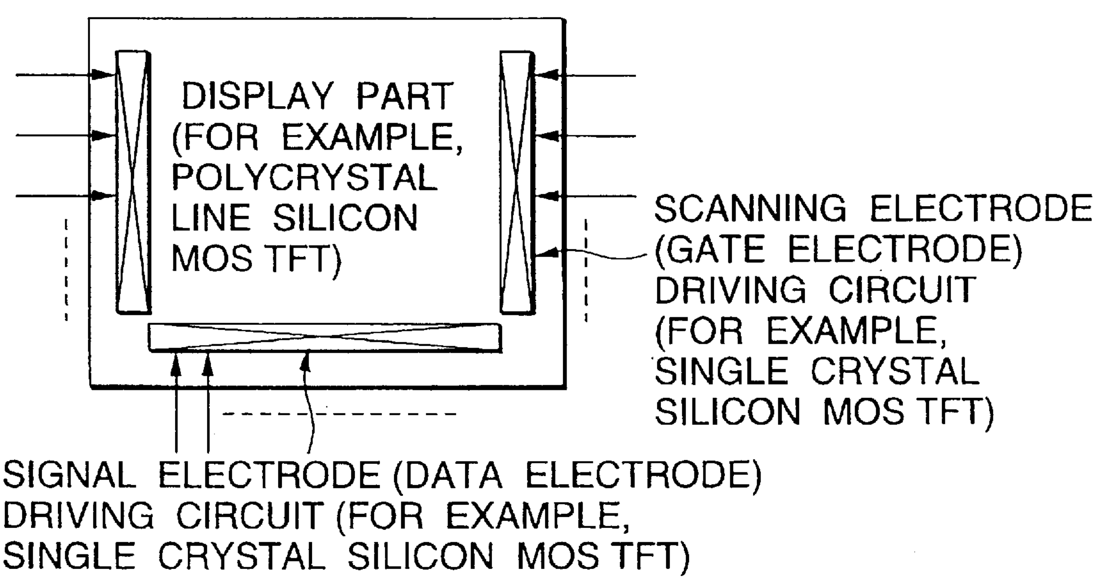
Figure 73C:
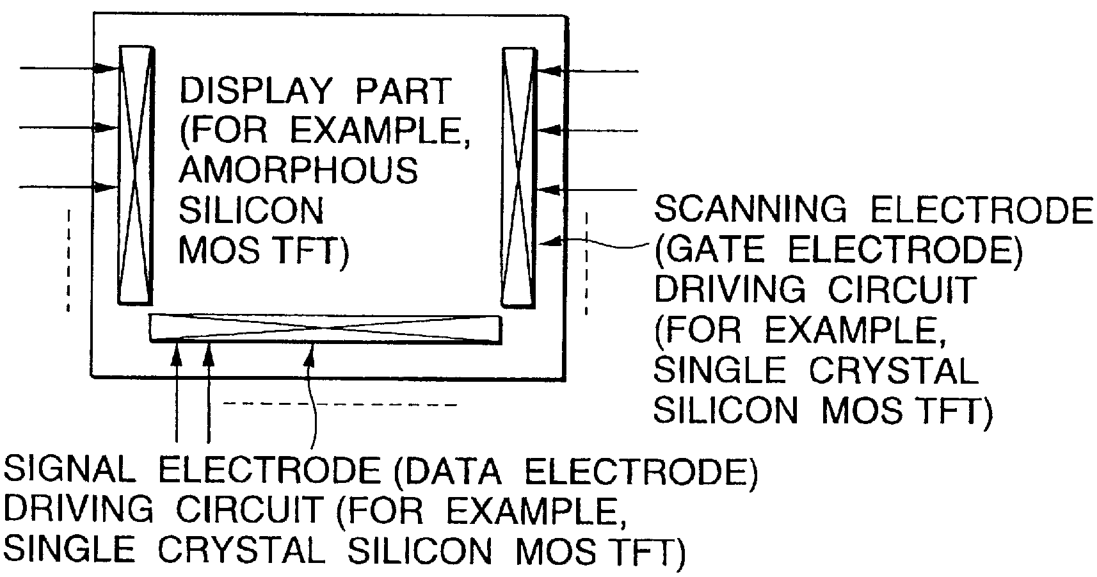

FIGS. 73A to 73C show the combinations of various MOS TFTs in the respective parts, and FIG. 74 shows the specific examples thereof. When the single crystal silicon is used, since the electric current driving performance is increased, the size of the device can be reduced, a large scale screen can be realized, and the opening ratio of the display part is increased.

It is also possible that in the peripheral driving circuit part, an electronic circuit having integrated therein not only the MOS TFT but also a diode, a capacitance, a resistance and an inductance may be unitedly formed on the insulating substrate (such as a glass substrate).

Seventeenth Embodiment

Figure 75:
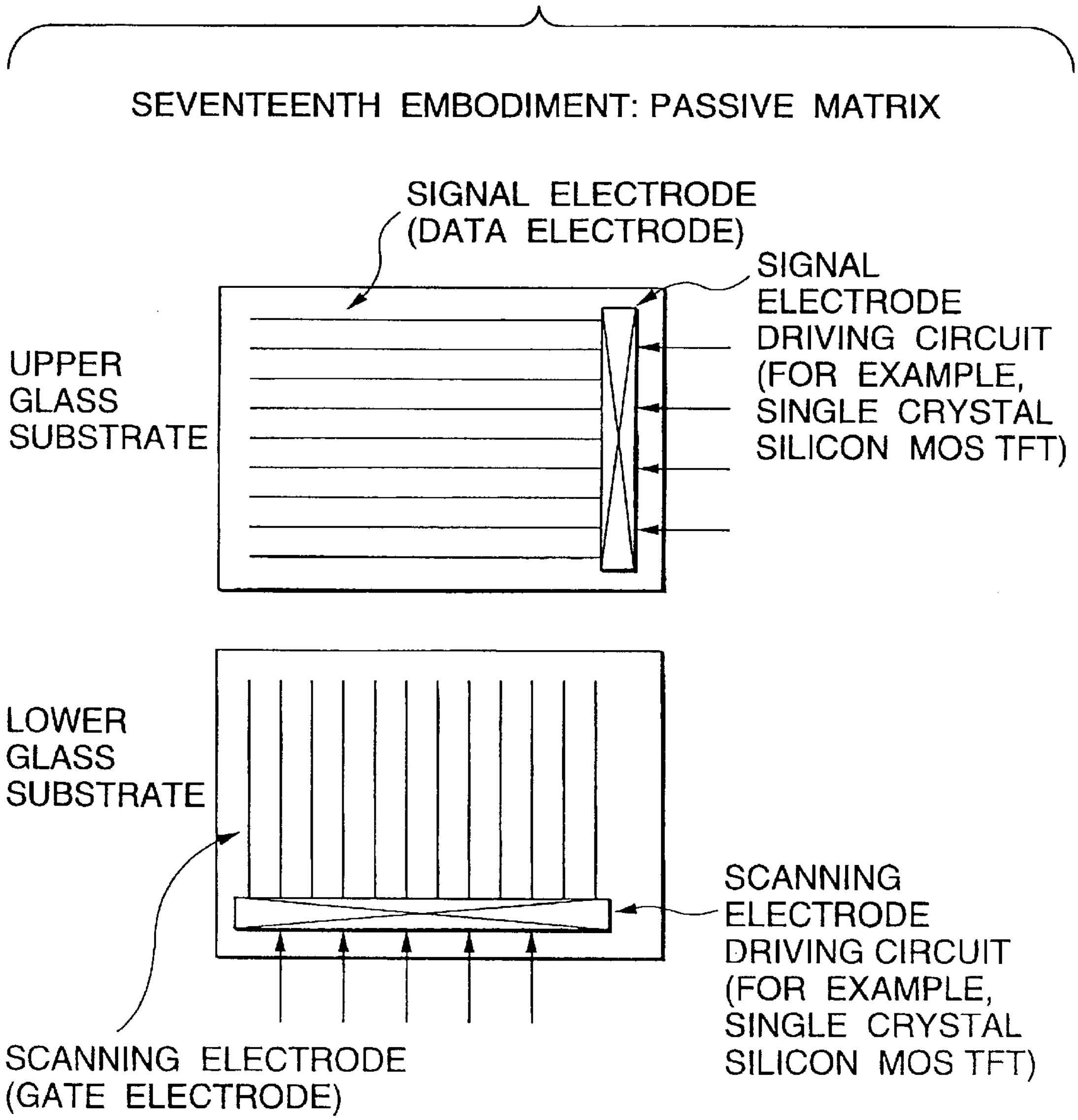
FIG. 75 is a diagram showing a schematic layout of the device according to the seventeenth embodiment of the invention.

The seventeenth embodiment of the invention will be described with reference to FIG. 75.

In this embodiment, the invention is applied to passive matrix driving, whereas the foregoing embodiments relate to examples of active matrix driving.

That is, in the display part, a switching element like the MOS TFT is not provided, but incident light or reflected light is controlled only by the potential difference formed by the voltage applied to a pair of electrodes formed on the substrates facing each other. Examples of such a light controlling device include a reflection type or transmission type LCD, an organic or inorganic EL device (electroluminescence display device), an FED device (field emission display device), an LEPD device (light emitting polymer display device) and an LED device (light emission diode display device).

Eighteenth Embodiment

The eighteenth embodiment of the invention will be described with reference to FIGS. 76A and 76B.

In this embodiment, the invention is applied to electrooptical apparatus other than an LCD, such as an organic or inorganic EL device (electroluminescence display device), an FED device (field emission display device), an LEPD device (light emitting polymer display device) and an LED device (light emission diode display device).

Figure 76A:
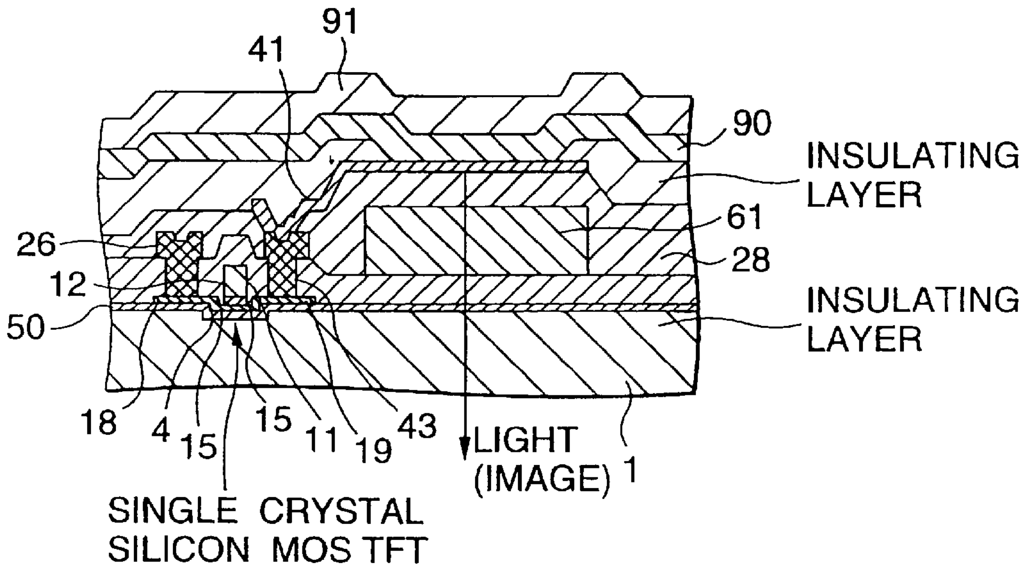
FIGS. 76A and 76B are cross sectional views showing important parts of the EL and the FED according to the eighteenth embodiment of the invention.

That is, FIG. 76A shows an EL device of active matrix driving, in which, for example, an organic EL layer comprising an amorphous organic compound (or an inorganic EL layer comprising ZnS:Mn) 90 is formed on a substrate 1; the transparent electrode (ITO) 41 described above is formed under the same; an cathode 91 is formed above the same; and light emission of a desired color can be obtained through a filter 61 by application of a voltage between both of the electrodes.

At this time, in order to apply a data voltage to the transparent electrode 41 by the active matrix driving, a single crystal silicon MOS TFT according to the invention using the single crystal silicon layer obtained by hetero-epitaxial growth using the crystalline sapphire film 50 (and further the step 4) as a seed on the substrate 1 (i.e., the nMOS LDD-TFT) is installed in the substrate 1. The similar TFT is also provided in the peripheral driving circuit part. Because the EL device is driven by the MOS LDD-TFT using the single crystal silicon layer, the switching speed is high, and the leakage electric current is small. In the case where the EL layer 90 emits light of a particular color, the filter 61 may be omitted.

In the case of the EL device, since the driving voltage is high, it is advantageous that a high voltage resistant driver element (such as a high voltage resistant cMOS TFT and a bipolar element) is provide in the peripheral driving circuit part, in addition to the MOS TFT.

Figure 76B:
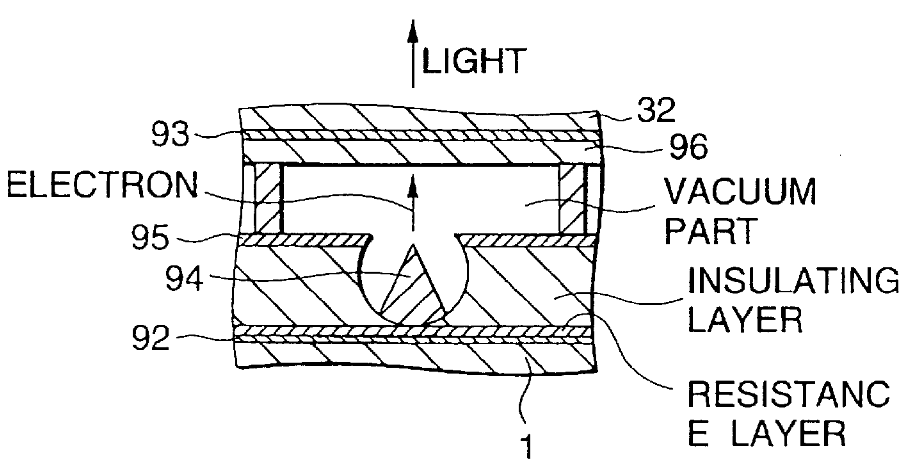

FIG. 76B shows an FED of passive matrix driven, in which in a vacuum part between glass substrates 1 and 32 facing each other, an electron emitted from a cold cathode 94 by voltage application to electrodes 92 and 93 is incident onto a counter fluorescent layer 96 by selecting a gate line 95, so as to obtain light emission of a prescribed color.

The emitter line 92 is connected to the peripheral driving circuit and driven by the data voltage. The peripheral driving circuit is equipped with the MOS TFT using the single crystal silicon layer according to the invention to contribute to the high speed operation of the emitter line 92. The FED can also be subjected to active matrix driving by connecting the MOS TFT to the respective pixels.

When a known light emission polymer is used instead of the EL layer 90 in the device shown in FIG. 76A, a light emission polymer display device (LEPD) of passive matrix driven or active matrix driven can be produced. Furthermore, a device similar to an FED, in which a diamond thin film is used on the cathode side in the device shown in FIG. 76B, can also be produced. In a light emission diode, a light emission part comprising, for example, a gallium series film (such as gallium-aluminum and arsenic) can be driven by the MOS TFT of single crystal silicon epitaxially grown according to the invention. Alternatively, it is considered that the film of the light emission part is grown as a single crystal according to the epitaxial growing method of the invention.

In the embodiments of the invention described in the foregoing, various modifications can be made based on the technical concept of the invention.

For example, when the polycrystalline silicon film or the amorphous silicon film 5 is doped with an element of Group 3 or Group 5 having a high solubility, such as boron, phosphorous, antimony, arsenic, aluminum, gallium, indium and bismuth, upon coating the molten liquid 6 of a low melting point metal, the channel conductive type of a P-type or an N-type of the growing silicon epitaxial growing layer 7 and the carrier concentration thereof can be arbitrarily controlled.

Furthermore, in order to prevent diffusion of an ion from the glass substrate, an SiN film (for example, having a thickness of from 50 to 200 nm), and further depending on necessity an $SiO_2$ film (for example, having a thickness of 100 nm) may be formed on the surface of the substrate, and the step 4 described in the foregoing may be formed in these films. The step described in the foregoing can also be formed by an ion milling method in addition to the RIE. It is also possible that the step 4 may be formed within the thickness of the crystalline sapphire film or a sapphire substrate, as well as the method in which the step 4 is formed on the substrate 1.

Instead of the sapphire ($Al_2O_3$) described above, a spinel structure (for example, magnesia spinel ($MgO.Al_2O_3$)) exhibiting good lattice matching with single crystal silicon, $CaF_2$, $SrF_2$, $BaF_2$, BP, $(Y_2O_3)_m$ and $(ZrO_2)_{1-m}$ may be used.

While the invention is suitable for a TFT of the peripheral driving circuit, an active region of an element, such as a diode, and a passive region, such as a resistance, a capacitance and an inductance, may be formed with the single crystal layer according to the invention.

In the invention, a single crystal semiconductor thin film, such as a single crystal silicon thin film, is formed by hetero-epitaxial growth from a molten liquid of a low melting point metal containing a semiconductor, such as silicon, using the substance layer having good lattice matching with the single crystal silicon, such as a crystalline sapphire film, as a seed, and the epitaxially grown layer is used as at least an active element of an active element, such as a top gate type MOS TFT of a peripheral driving circuit of a driving substrate, such as an active matrix substrate, and a top gate type MOS TFT of a peripheral driving circuit of an electrooptical apparatus, such as an LCD of a display part-peripheral driving circuit integrated type, and a passive element, such as a resistance, an inductance and a capacitance. Therefore, the following considerable effects (A) to (G) can be obtained.

(A) A single crystal semiconductor layer, such as a single crystal silicon layer having a high electron mobility of 540 $cm^2/v\cdot sec$ or more, is obtained by forming a substance layer having good lattice matching with the single crystal silicon (such as a crystalline sapphire film) on a substrate, and conducting hetero-epitaxial growth by using the substance layer as a seed. Therefore, an electrooptical apparatus, such as a thin film semiconductor device for display having a built-in high performance driver can be produced.

(B) In particular, a single crystal silicon top gate type (MOS) TFT using the single crystal silicon layer exhibits high switching characteristics, and can have a constitution in that the display part of the nMOS TFT, the PMOS TFT or the cMOS TFT having the LDD structure and the peripheral driving circuit part exhibiting high driving performance comprising the cMOS TFT, the nMOS TFT, the pMOS TFT or mixtures thereof are united, so as to realize a display panel of high image quality, high minuteness, a small frame, high efficiency and a large image area.

(C) Because the substance layer is used as a seed for hetero-epitaxial growth, and the molten liquid of a low melting point metal can be prepared on the substance layer at a low temperature (for example, 350° C.) and coated on the substrate heated at a temperature slightly higher than that temperature, a silicon single crystal film can be uniformly formed at a relatively low temperature (for example, from 300 to 400° C.).

(D) Because annealing at medium temperature and for a long period of time (about 600° C. for several tens hours) as in a solid phase growing method, and excimer laser annealing can be omitted, the productivity can be increased, and the production cost can be decreased since an expensive production equipment is not necessary.

(E) In the hetero-epitaxial growth, because a single crystal silicon thin layer having wide ranges of the concentration of a p-type impurity and a high mobility can be easily obtained by adjusting the crystallinity of the substance layer, such as a crystalline sapphire film, the compositional ratio of the molten liquid, the temperature of the molten liquid, the heating temperature of the substrate and the cooling rate, the adjustment of Vth (threshold value) can be easily conducted, and high speed operation due to a low resistance can be realized.

(F) When an impurity element of Group 3 or Group 5 (such as boron, phosphorous, antimony, arsenic, bismuth and aluminum) is separately doped in the molten liquid layer of a low melting point metal containing silicon, the species and/or the concentration of the impurity contained in the single crystal silicon thin film on the hetero-epitaxial growth, i.e., the conductive type of p-type or n-type and/or the carrier concentration, can be arbitrarily controlled.

(G) Since the substance layer, such as a crystalline sapphire film, functions as a diffusion barrier of various atoms, diffusion of an impurity from the glass substrate can be suppressed.

What is claimed is:

1. A process for producing an electrooptical apparatus comprising a first substrate having thereon a display art comprising a pixel electrode arranged therein and a peripheral driving circuit part arranged in a periphery of said display part, and a prescribed optical material intervening between said first substrate and a second substrate, said process comprising a step of forming, on one surface of said first substrate, a substance layer having good lattice matching with a single crystal semiconductor to be formed;

a step of forming, on a surface of said first substrate including said substance layer, a molten liquid layer of a low melting point metal containing a semiconductor material;

a step of depositing said semiconductor material contained in said molten liquid layer to form a single crystal semiconductor layer through hetero-epitaxial growth by a cooling treatment using said substance layer as a seed; and a step of forming, in said single crystal semiconductor layer, an active element.

2. A process for producing an electrooptical apparatus as claimed in claim 1, wherein said process comprises a step of forming, in said single crystal semiconductor layer, a channel region, a source region and a drain region, after depositing said single crystal semiconductor layer; and a step of forming a top gate type first thin film transistor, which has a gate part on said channel region, constituting at least a part of said peripheral driving circuit part.

3. A process for producing an electrooptical apparatus as claimed in claim 1, wherein said molten liquid of a low melting point metal containing silicon is coated on said first substrate heated, and after maintaining at a prescribed period of time, said cooling treatment is conducted.

4. A process for producing an electrooptical apparatus as claimed in claim 1, wherein a glass substrate or an organic substrate is used as said first substrate; said substance layer is formed with a substance selected from the group consisting of sapphire, a spinel structure, calcium fluoride, strontium fluoride, barium fluoride, boron phosphide, yttrium oxide and zirconium oxide; and said low melting point metal is at least one selected from the group consisting of indium, gallium, tin, bismuth, lead, zinc, antimony and aluminum.

5. A process for producing an electrooptical apparatus as claimed in claim 4, wherein said molten liquid layer is coated on said first substrate heated to a temperature of from 850 to 1,100° C. when said low melting point metal is indium; said molten liquid layer is coated on said first substrate heated to a temperature of from 300 to 1,100° C. when said low melting point metal is indium-gallium; and said molten liquid is coated on said first substrate heated to a temperature of from 400 to 1,100° C. when said low melting point metal is gallium.

6. A process for producing an electrooptical apparatus as claimed in claim 1, wherein a diffusion barrier layer is formed on said first substrate, and said molten liquid layer of said low melting point metal is formed thereon.

7. A process for producing an electrooptical apparatus as claimed in claim 1, wherein an impurity element of Group 3 or Group 5 is mixed in said molten liquid layer of said low melting point metal, so as to control the species and/or the concentration of an impurity contained in said single crystal silicon layer.

8. A process for producing an electrooptical apparatus as claimed in claim 2, wherein after depositing said single crystal silicon layer, a gate part comprising a gate insulating film and a gate electrode is formed on said single crystal silicon layer, and an impurity element of Group 3 or Group 5 is introduced into said single crystal silicon layer by using said gate part as a mask, so as to form said channel region, said source region and said drain region.

9. A process for producing an electrooptical apparatus as claimed in claim 2, wherein a thin film transistor of a top gate type, a bottom gate type or a dual gate type comprising a channel region formed in a polycrystalline or an amorphous silicon layer, and said gate part formed above and/or under said channel region, or at least one of a diode, a resistance, a capacitance and an inductance using said single crystal silicon layer, a polycrystalline silicon layer or an amorphous silicon layer is formed in said peripheral driving circuit part.

10. A process for producing an electrooptical apparatus as claimed in claim 2, wherein a switching element for switching said pixel electrode in said display part is formed on said first substrate.

11. A process for producing an electrooptical apparatus as claimed in claim 10, wherein a second thin film transistor of said top gate type, said bottom gate type or said dual gate type is formed as said switching element.

12. A process for producing an electrooptical apparatus as claimed in claim 11, wherein said gate electrode formed under said channel region is formed with a heat resistant material.

13. A process for producing an electrooptical apparatus as claimed in claim 10, wherein when said second thin film transistor is of said bottom gate type or said dual gate type, a lower gate electrode comprising a heat resistant material is formed under said channel region, and after forming a lower gate part by forming a gate insulating film on said gate electrode, said second thin film transistor is formed in the same steps as in said first thin film transistor including said step of forming said substance layer.

14. A process for producing an electrooptical apparatus as claimed in claim 13, wherein after forming said single crystal silicon layer on said lower gate part, an impurity element of Group 3 or Group 5 is introduced into said single crystal silicon layer to form a source region and a drain region, and then an activation treatment is conducted.

15. A process for producing an electrooptical apparatus as claimed in claim 14, wherein after forming said single crystal silicon layer, a source region and a drain region of said first and second thin film transistors are formed by ion implantation of said impurity element using a resist as a mask; after said ion implantation, said activation treatment is conducted; and after forming said gate insulating film, a gate electrode of said first thin film transistor is formed.

16. A process for producing an electrooptical apparatus as claimed in claim 11, wherein when said second thin film transistor is of a top gate type, after forming said single crystal silicon layer, a source region and a drain region of said second thin film transistor is formed by ion implantation of an impurity element by using a resist as a mask; after said ion implantation, an activation treatment is conducted; and then said gate parts comprising a gate insulating film and a gate electrode of said first and second thin film transistors are formed.

17. A process for producing an electrooptical apparatus as claimed in claim 11, wherein when said second thin film transistor is of a top gate type, after forming said single crystal silicon layer, said gate parts comprising a gate insulating film and a gate electrode comprising a heat resistant material of said first and second thin film transistors are formed; source regions and drain regions of said first and second thin film transistors are formed by ion implantation of an impurity element by using said gate part as a mask; and after said ion implantation, an activation treatment is conducted.

18. A process for producing an electrooptical apparatus as claimed in claim 11, wherein said thin film transistor of said peripheral driving circuit part and said display part comprises an n-channel type, p-channel type or complementary insulating gate field effect transistor.

19. A process for producing an electrooptical apparatus as claimed in claim 18, wherein said thin film transistor of said peripheral driving circuit comprises a combination of a complementary type and an n-channel type, a combination of a complementary type and a p-channel type, or a combination of a complementary type, an n-channel type and a p-channel type.

20. A process for producing an electrooptical apparatus as claimed in claim 11, wherein at least a part of said thin film transistor of said peripheral driving circuit part and/or said display part has an LDD (lightly doped drain) structure.

21. A process for producing an electrooptical apparatus as claimed in claim 20, wherein a resist mask used on forming said LDD structure is left, and ion implantation for forming a source region and a drain region is conducted by using said resist mask.

22. A process for producing an electrooptical apparatus as claimed in claim 14, wherein a single crystal, polycrystalline or amorphous silicon layer is formed on one surface of said first substrate; a channel region, a source region and a drain region are formed with said single crystal, polycrystalline or amorphous silicon layer; and said second thin film transistor having a gate part above and/or under the same is formed.

23. A process for producing an electrooptical apparatus as claimed in claim 22, wherein said thin film transistor of said peripheral driving circuit part is said first thin film transistor of an n-channel type, a p-channel type or a complementary type; and said thin film transistor of said display part is of an n-channel type, a p-channel type or a complementary type when said channel region comprises said single crystal silicon layer, an n-channel type, a p-channel type or a complementary type when said channel region comprises said polycrystalline silicon layer, and an n-channel type, a p-channel type or a complementary type when said channel region comprises said amorphous silicon layer.

24. A process for producing an electrooptical apparatus as claimed in claim 1, wherein a step is formed on said first substrate; said substance layer is formed on said first substrate including said step; and said single crystal silicon layer is formed on said substance layer.

25. A process for producing an electrooptical apparatus as claimed in claim 24, wherein said step is formed as a concave part, in which in a cross section of said concave part, a side wall forms a right angle or is slanted toward a lower end with respect to a bottom surface; and said step and said substance layer are used as a seed on said epitaxial growth of said single crystal silicon layer.

26. A process for producing an electrooptical apparatus as claimed in claim 24, wherein said first thin film transistor is formed inside and/or outside of said concave part of said substrate formed by said step, which is formed on said first substrate and/or a film formed thereon.

27. A process for producing an electrooptical apparatus as claimed in claim 24, wherein said step is formed along at least one edge of a element region formed by a channel region, a source region and a drain region of a thin film transistor as said active element.

28. A process for producing an electrooptical apparatus as claimed in claim 1, wherein a step is formed on said substance layer, and said single crystal silicon layer is formed on said substance layer including said step.

29. A process for producing an electrooptical apparatus as claimed in claim 28, wherein said step is formed as a concave part, in which in a cross section of said concave part, a side wall forms a right angle or is slanted toward a lower end with respect to a bottom surface; and said step and said substance layer are used as a seed on said epitaxial growth of said single crystal silicon layer.

30. A process for producing an electrooptical apparatus as claimed in claim 28, wherein said first thin film transistor is formed inside and/or outside of said concave part of said substrate formed by said step, which is formed on said first substrate and/or a film formed thereon.

31. A process for producing an electrooptical apparatus as claimed in claim 28, wherein said step is formed along at least one edge of a element region formed by a channel region, a source region and a drain region of a thin film transistor as said active element.

32. A process for producing an electrooptical apparatus as claimed in claim 22, wherein a step is formed on at least one surface of said first substrate; a single crystal, polycrystalline or amorphous silicon layer is formed on said first substrate including said step; said single crystal, polycrystalline or amorphous silicon layer is formed into a channel region, a source region and a drain region; and a second thin film transistor having a gate part above and/or under said channel region is formed.

33. A process for producing an electrooptical apparatus as claimed in claim 32, wherein said step is formed as a concave part, in which in a cross section of said concave part, a side wall forms a right angle or is slanted toward a lower end with respect to a bottom surface; and said step is used as a seed on said epitaxial growth of said single crystal silicon layer.

34. A process for producing an electrooptical apparatus as claimed in claim 32, wherein a source electrode or a drain electrode of said first and/or second thin film transistor is formed on a region including said step.

35. A process for producing an electrooptical apparatus as claimed in claim 32, wherein said second thin film transistor is formed inside and/or outside of said concave part of said substrate formed by said step, which is formed on said first substrate and/or a film formed thereon.

36. A process for producing an electrooptical apparatus as claimed in claim 32, wherein the species and/or the concentration of said impurity of Group 3 or Group 5 contained in said single crystal, polycrystalline or amorphous silicon layer is controlled.

37. A process for producing an electrooptical apparatus as claimed in claim 32, wherein said step is formed along at least one edge of a element region formed by said channel region, said source region and said drain region of said second thin film transistor.

38. A process for producing an electrooptical apparatus as claimed in claim 32, wherein a gate electrode under said single crystal, polycrystalline or amorphous silicon layer has a side edge part having a trapezoidal shape.

39. A process for producing an electrooptical apparatus as claimed in claim 32, wherein a diffusion barrier layer is formed between said first substrate and said single crystal, polycrystalline or amorphous silicon layer.

40. A process for producing an electrooptical apparatus as claimed in claim 1, wherein said first substrate comprises a glass substrate or a heat resistant organic substrate.

41. A process for producing an electrooptical apparatus as claimed in claim 1, wherein said first substrate is optically opaque or transparent.

42. A process for producing an electrooptical apparatus as claimed in claim 1, wherein a pixel electrode is formed as one for said display part of a reflection type or transparent type.

43. A process for producing an electrooptical apparatus as claimed in claim 1, wherein said display part comprises a laminated structure comprising said pixel electrode and a color filter layer.

44. A process for producing an electrooptical apparatus as claimed in claim 1, wherein when said pixel electrode is a reflection electrode, unevenness is formed on a resin film, and said pixel electrode is formed thereon; and when said pixel electrode is a transparent electrode, a surface thereof is flattened by a transparent flattening film, and said pixel electrode is formed thereon.

45. A process for producing an electrooptical apparatus as claimed in claim 10, wherein said display part is so constituted that emission and control of light are conducted by driving of said switching element.

46. A process for producing an electrooptical apparatus as claimed in claim 10, wherein plurality of said pixel electrodes are arranged in a matrix form in said display part, and said switching element is connected to said respective pixel electrodes.

47. A process for producing an electrooptical apparatus as claimed in claim 1, wherein said electrooptical apparatus is constituted as a liquid crystal display device, an electroluminescence display device, a field emission display device, a light emitting polymer display device and a light emission diode display device.

48. A process for producing a driving substrate for an electrooptical apparatus comprising a substrate having thereon a display part comprising a pixel electrode arranged therein and a peripheral driving circuit part arranged in a periphery of said display part, said process comprising a step of forming, on one surface of said substrate, a substance layer having good lattice matching with a single crystal semiconductor to be formed;

a step of forming, on a surface of said substrate including said substance layer, a molten liquid layer of a low melting point metal containing a semiconductor material;

a step of depositing said semiconductor material contained in said molten liquid layer to form a single crystal semiconductor layer through hetero-epitaxial growth by a cooling treatment using said substance layer as a seed; and a step of conducting a prescribed treatment to form at least an active element in said single crystal semiconductor layer.

* * * * *